US006349054B1

(12) United States Patent
Hidaka

(10) Patent No.: US 6,349,054 B1
(45) Date of Patent: Feb. 19, 2002

(54) THIN FILM MAGNETIC MEMORY DEVICE INCLUDING MEMORY CELLS HAVING A MAGNETIC TUNNEL JUNCTION

(75) Inventor: Hideto Hidaka, Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/852,087

(22) Filed: May 10, 2001

(30) Foreign Application Priority Data

Dec. 25, 2000 (JP) ....................................... 2000-393213

(51) Int. Cl.[7] ................................................ G11C 11/15

(52) U.S. Cl. ....................... 365/173; 365/171; 365/158; 365/190; 365/189.11; 365/203; 365/189.05; 365/209; 365/210; 365/51; 365/63; 365/230.07

(58) Field of Search ................................ 365/171, 173, 365/148, 158, 189.11, 190, 203, 189.05, 210, 209, 207, 51, 63, 230.06, 230.07

(56) References Cited

U.S. PATENT DOCUMENTS

| | | | | |
|---|---|---|---|---|
| 5,640,343 A | | 6/1997 | Gallagher et al. | 365/171 |
| 5,650,958 A | | 7/1997 | Gallagher et al. | 365/173 |
| 5,734,605 A | | 3/1998 | Zhu et al. | 365/173 |
| 5,835,314 A | | 11/1998 | Moodera et al. | 360/324.2 |
| 5,841,692 A | * | 11/1998 | Gallagher et al. | 365/173 |
| 5,917,749 A | * | 6/1999 | Chen et al. | 365/173 |
| 5,959,880 A | * | 9/1999 | Shi et al. | 365/158 |

OTHER PUBLICATIONS

"*A 10ns Read and Write Non–Volatile Memory Array Using a Magnetic Tunnel Junction and FET Switch in each Cell*", ISSCC Digest of Technical Papers, TA7.2, Feb. 2000, pp. 128–129, 94–95 & 409–410.

"*Nonvolatile RAM based on Magnetic Tunnel Junction Elements*", ISSCC Digest of Technical Papers, TA7.3, Feb. 2000, pp. 130–131, 96–97 and 410–411.

* cited by examiner

*Primary Examiner*—Andrew Q. Tran
(74) *Attorney, Agent, or Firm*—McDermott, Will & Emery

(57) ABSTRACT

In the data read operation, a memory cell and a dummy memory cell are respectively coupled to two bit lines of a selected bit line pair, and a data read current is supplied thereto. In the selected memory cell column, a read gate drives the respective voltages on a read data bus pair, according to the respective voltages on the bit lines. A data read circuit amplifies the voltage difference between the read data buses so as to output read data. The use of the read gate enables the read data buses to be disconnected from a data read current path. As a result, respective voltage changes on the bit lines are rapidly produced, whereby the data read speed can be increased.

15 Claims, 73 Drawing Sheets

THIN FILM MAGNETIC MEMORY DEVICE INCLUDING MEMORY CELLS HAVING A MAGNETIC TUNNEL JUNCTION

BACKGROUND OF THE INVENTION

1. Field of the Invention

The present invention relates to a thin film magnetic memory device. More particularly, the present invention relates to a random access memory (RAM) including memory cells having a magnetic tunnel junction (MTJ).

2. Description of the Background Art

An MRAM (Magnetic Random Access Memory) device has attracted attention as a memory device capable of non-volatile data storage with low power consumption. The MRAM device is a memory device that stores data in a non-volatile manner using a plurality of thin film magnetic elements formed in a semiconductor integrated circuit and is capable of random access to each thin film magnetic element.

In particular, recent announcement shows that significant progress in performance of the MRAM device is achieved by using thin film magnetic elements having a magnetic tunnel junction (MTJ) as memory cells. The MRAM device including memory cells having a magnetic tunnel junction is disclosed in technical documents such as "A 10 ns Read and Write Non-Volatile Memory Array Using a Magnetic Tunnel Junction and FET Switch in each Cell", ISSCC Digest of Technical Papers, TA7.2, February, 2000, and "Nonvolatile RAM based on Magnetic Tunnel Junction Elements", ISSCC Digest of Technical Papers, TA7.3, February, 2000.

FIG. 83 is a schematic diagram showing the structure of a memory cell having a magnetic tunnel junction (hereinafter, also simply referred to as "MTJ memory cell").

Referring to FIG. 83, the MTJ memory cell includes a magnetic tunnel junction MTJ whose resistance value varies according to the storage data level, and an access transistor ATR. The access transistor ATR is formed from a field effect transistor, and is coupled between the magnetic tunnel junction MTJ and the ground voltage Vss.

For the MTJ memory cell are provided a write word line WWL for instructing a data write operation, a read word line RWL for instructing a data read operation, and a bit line BL serving as a data line for transmitting an electric signal corresponding to the storage data level in the data read and write operations.

FIG. 84 is a conceptual diagram illustrating the data read operation from the MTJ memory cell.

Referring to FIG. 84, the magnetic tunnel junction MTJ has a magnetic layer FL having a fixed magnetic field of a fixed direction (hereinafter, also simply referred to as "fixed magnetic layer FL"), and a magnetic layer VL having a free magnetic field (hereinafter, also simply referred to as "free magnetic layer VL"). A tunnel barrier TB formed from an insulator film is provided between the fixed magnetic layer FL and the free magnetic layer VL. According to the storage data level, either a magnetic field of the same direction as that of the fixed magnetic layer FL or a magnetic field of the direction different from that of the fixed magnetic layer FL has been written to the free magnetic layer VL in a non-volatile manner.

In reading the data, the access transistor ATR is turned ON in response to activation of the read word line RWL. As a result, a sense current Is flows through a current path formed by the bit line BL, magnetic tunnel junction MTJ, access transistor ATR and ground voltage Vss. The sense current Is is supplied as a constant current from a not-shown control circuit.

The resistance value of the magnetic tunnel junction MTJ varies according to the relative relation of the magnetic field direction between the fixed magnetic layer FL and the free magnetic layer VL. More specifically, in the case where the fixed magnetic layer FL and the free magnetic layer VL have the same magnetic field direction, the magnetic tunnel junction MTJ has a smaller resistance value as compared to the case where both magnetic layers have different magnetic field directions.

Accordingly, in the data read operation, a voltage change produced at the magnetic tunnel junction MTJ due to the sense current Is varies according to the magnetic field direction stored in the free magnetic layer VL. Thus, by starting supply of the sense current Is with the bit line BL precharged to a high voltage, the storage data level in the MTJ memory cell can be read by monitoring a voltage level change on the bit line BL.

FIG. 85 is a conceptual diagram illustrating the data write operation to the MTJ memory cell.

Referring to FIG. 85, in the data write operation, the read word line RWL is inactivated, and the access transistor ATR is turned OFF. In this state, a data write current for writing a magnetic field to the free magnetic layer VL is applied to the write word line WWL and the bit line BL. The magnetic field direction of the free magnetic layer VL is determined by combination of the respective directions of the data write current flowing FIG. 86 is a conceptual diagram illustrating the relation between the respective directions of the data write current and the magnetic field in the data write operation.

Referring to FIG. 86, a magnetic field Hx of the abscissa indicates the direction of a magnetic field H(WWL) produced by the data write current flowing through the write word line WWL. A magnetic field Hy of the ordinate indicates the direction of a magnetic field H(BL) produced by the data write current flowing through the bit line BL.

The magnetic field direction stored in the free magnetic layer VL is updated only when the sum of the magnetic fields H(WWL) and H(BL) reaches the region outside the asteroid characteristic line shown in the figure. In other words, the magnetic field direction stored in the free magnetic layer VL is not updated when a magnetic field corresponding to the region inside the asteroid characteristic line is applied.

Accordingly, in order to update the storage data of the magnetic tunnel junction MTJ by the data write operation, a current must be applied to both the write word line WWL and the bit line BL. Once the magnetic field direction, i.e., the storage data, is stored in the magnetic tunnel junction MTJ, it is held therein in a non-volatile manner until a new data write operation is conducted.

The sense current Is flows through the bit line BL in the data read operation. However, the sense current Is is generally set to a value that is smaller than the above-mentioned data write current by about one or two orders of magnitude. Therefore, it is less likely that the storage data in the MTJ memory cell is erroneously rewritten during the data read operation due to the sense current Is.

The above-mentioned technical documents disclose a technology of forming an MRAM device, a random access memory, having such MTJ memory cells integrated on a semiconductor substrate.

FIG. 87 is a conceptual diagram showing the MTJ memory cells arranged in rows and columns in an integrated manner.

Referring to FIG. 87, with the MTJ memory cells arranged in rows and columns on the semiconductor substrate, a highly integrated MRAM device can be realized. FIG. 87 shows the MTJ memory cells arranged in n rows by m columns (where n, m is a natural number).

As described before, the bit line BL, write word line WWL and read word line RWL must be provided for each MTJ memory cell. Accordingly, n write word lines WWL1 to WWLn, n read word lines RWL1 to RWLn, and m bit lines BL1 to BLm are required for the n×m MTJ memory cells.

Thus, the MTJ memory cells are generally provided with the independent word lines for the read and write operations.

FIG. 88 is a structural diagram of the MTJ memory cell provided on the semiconductor substrate.

Referring to FIG. 88, the access transistor ATR is formed in a p-type region PAR of the semiconductor main substrate SUB. The access transistor ATR has source/drain regions (n-type regions) 110, 120 and a gate 130. The source/drain region 110 is coupled to the ground voltage Vss through a metal wiring formed in a first metal wiring layer M1. A metal wiring formed in a second metal wiring layer M2 is used as the write word line WWL. The bit line BL is provided in a third metal wiring layer M3.

The magnetic tunnel junction MTJ is provided between the second metal wiring layer M2 of the write word line WWL and the third metal wiring layer M3 of the bit line BL. The source/drain region 120 of the access transistor ATR is electrically coupled to the magnetic tunnel junction MTJ through a metal film 150 formed in a contact hole, the first and second metal wiring layers M1 and M2, and a barrier metal 140. The barrier metal 140 is a buffer material for providing electrical coupling between the magnetic tunnel junction MTJ and the metal wirings.

As described before, the MTJ memory cell is provided with the read word line RWL independently of the write word line WWL. In addition, in the data write operation, a data write current for generating a magnetic field equal to or higher than a predetermined value must be applied to the write word line WWL and the bit line BL. Accordingly, the bit line BL and the write word line WWL are each formed from a metal wiring.

On the other hand, the read word line RWL is provided in order to control the gate voltage of the access transistor ATR, and a current need not be actively applied to the read word line RWL. Accordingly, from the standpoint of the improved integration degree, the read word line RWL is conventionally formed from a polysilicon layer, polycide structure, or the like in the same wiring layer as that of the gate 130 without providing an additional independent metal wiring layer.

As described in connection with FIG. 84, the data read operation of the MTJ memory cell is conducted based on the voltage change caused by the sense current (Is in FIG. 84) supplied to the magnetic tunnel junction MTJ serving as a resistive element. This voltage change cannot be quickly produced with a large RC (resistance-capacitance) time constant of the sense current path, making it impossible to increase the data read operation speed.

Moreover, as shown in FIG. 86, the data write operation is conducted based on the relation between the applied magnetic field and the asteroid characteristic line provided as a threshold. Accordingly, variation in asteroid characteristic line as produced in manufacturing the memory cells results in variation in data write margin to the memory cell.

FIG. 89 is a conceptual diagram illustrating the effects of the manufacturing variation on the data write margin.

Referring to FIG. 89, the design value of the asteroid characteristic line is denoted with ASd. It is now assumed that the asteroid characteristic line of the memory cell is deviated from the design value, as shown by ASa or ASb.

For example, in the MTJ memory cell having the asteroid characteristic line ASb, the data cannot be written even if the data write current according to the design value is supplied for application of the data write magnetic field.

On the other hand, in the MTJ memory cell having the asteroid characteristic line ASa, the data is written even if the data write magnetic field smaller than the design value is applied. As a result, the MTJ memory cell having such characteristics is extremely susceptible to the magnetic noise.

Such manufacturing variation in asteroid characteristic line may further be increased as the memory cells are miniaturized for improved integration. Accordingly, in order to ensure the manufacturing yield, there is a need not only for development of the manufacturing technology that reduces the manufacturing variation in asteroid characteristic line, but also for the adjustment technology for ensuring an appropriate data write margin corresponding to the variation in asteroid characteristic line.

Moreover, as described in connection with FIGS. 85 and 86, a relatively large data write current must be supplied to the bit line BL and the write word line WWL in the data write operation. As the data write current is increased, the current density in the bit line BL and the write word line WWL is also increased, which may possibly cause a phenomenon called electromigration.

Electromigration may cause disconnection or short-circuit of the wirings, thereby possibly degrading the operation reliability of the MRAM device. Moreover, an increased data write current may possibly produce a considerable amount of magnetic noise. It is therefore desirable to realize the structure capable of writing the data with a smaller data write current.

As described in connection with FIGS. 87 and 88, a large number of wirings are required to write and read the data to and from the MTJ memory cell, making it difficult to reduce the area of the memory array integrating the MTJ memory cells, and thus the chip area of the MRAM device.

An MTJ memory cell using a PN junction diode as an access element instead of the access transistor is known as a memory cell structure capable of achieving improved integration over the MTJ memory cell shown in FIG. 83.

FIG. 90 is a schematic diagram showing the structure of the MTJ memory cell using the diode.

Referring to FIG. 90, the MTJ memory cell using the diode includes a magnetic tunnel junction MTJ and an access diode DM. The access diode DM is coupled between the magnetic tunnel junction MTJ and the word line WL. Herein, the direction from the magnetic tunnel junction MTJ toward the word line WL is the forward direction. The bit line BL extending in such a direction that crosses the word line WL is coupled to the magnetic tunnel junction MTJ.

In the MTJ memory cell using the diode, the data write operation is conducted with the data write current being supplied to the word line WL and the bit line BL. As in the case of the memory cell using the access transistor, the direction of the data write current is set according to the write data level.

On the other hand, in the data read operation, the word line WL corresponding to the selected memory cell is set to the low voltage (e.g., ground voltage Vss) state. By precharging the bit line BL to the high voltage (e.g., power supply voltage Vcc) state, the access diode DM is rendered conductive, allowing the sense current Is to be supplied through the magnetic tunnel junction MTJ. The word lines WL corresponding to the non-selected memory cells are set to the high voltage state. Therefore, the corresponding access diodes DM are retained in the OFF state, and no sense current Is flows therethrough.

Thus, the data read and write operations can be conducted also in the MTJ memory cell using the access diode.

FIG. 91 is a structural diagram of the MTJ memory cell of FIG. 90 provided on the semiconductor substrate.

Referring to FIG. 91, the access diode DM is formed on the semiconductor substrate SUB from an N-type region NWL formed from, e.g., an N-type well, and a P-type region PRA formed thereon.

The N-type well NWL, which corresponds to the cathode of the access diode DM, is coupled to the word line WL provided in the metal wiring layer M1. The P-type region PRA, which corresponds to the anode of the access diode DM, is electrically coupled to the magnetic tunnel junction MTJ through the barrier metal 140 and the metal film 150. The bit line BL is provided in the metal wiring layer M2 so as to be coupled to the magnetic tunnel junction MTJ. Thus, by replacing the access transistor with the access diode, the MTJ memory cell that is advantageous in terms of improvement in integration degree can be obtained.

The data write current flows through the word line WL and the bit line BL in the data write operation. This causes a voltage drop on these lines. Such a voltage drop may turn ON the PN junction of the access diode DM of at least one of the MTJ memory cells that are not selected for the data write operation. As a result, a current may unexpectedly flow through the MTJ memory cell, causing an erroneous data write operation.

Thus, the conventional MTJ memory cell using the access diode is advantageous in terms of improved integration, but is problematic in view of the stability of the data write operation.

SUMMARY OF THE INVENTION

It is an object of the present invention to increase the data write speed in an MRAM device including MTJ memory cells.

It is another object of the present invention to provide the structure capable of easily adjusting the amount of data write current so as to assure a predetermined data write margin in the MRAM device including the MTJ memory cells, by compensating for variation in magnetic characteristics due to manufacturing variation.

It is a further object of the present invention to achieve improvement in operation reliability as well as suppression of magnetic noise in the MRAM device including the MTJ memory cells, by reducing the data write current.

It is a still further object of the present invention to provide the MTJ memory cell structure capable of improved integration and providing excellent operation reliability.

It is a yet further object of the present invention to suppress the chip area of the MRAM device including the MTJ memory cells arranged in an array, by improving the freedom of layout as well as reducing the number of wirings required for the entire memory array.

In summary, according to the present invention, a thin film magnetic memory device includes a memory array, a plurality of first bit lines, a plurality of read word lines, a first read data line, a read gate circuit, and a data read circuit. The memory array includes a plurality of magnetic memory cells arranged in rows and columns. Each of the plurality of magnetic memory cells has either a first or second resistance value according a storage data level thereof. The plurality of first bit lines are provided corresponding to the respective columns of the magnetic memory cells. The plurality of read word lines are provided corresponding to the respective rows of the magnetic memory cells, for electrically coupling the magnetic memory cells corresponding to an addressed row between the plurality of first bit lines set to a first voltage and a second voltage (Vss), respectively, so as to pass a data read current through the magnetic memory cells. The first read data line transmits read data. The read gate circuit sets a voltage of the first read data line according to a voltage on one of the plurality of first bit lines that corresponds to an addressed column. The data read circuit sets a level of the read data according to the voltage on the first read data line.

Therefore, a primary advantage of the present invention is that the data read speed can be increased by rapidly producing a voltage change on the first bit line by conducting the data read operation with a reduced RC constant of the data read current path, without supplying any data read current to the first read data line.

According to another aspect of the present invention, a thin film magnetic memory device having a normal operation mode and a test mode includes a memory array, a plurality of write word lines, a write word line driver, a data write circuit, and a plurality of bit line pairs. The memory array includes a plurality of magnetic memory cells arranged in rows and columns. Each of the plurality of magnetic memory cells has a different resistance value according to a level of storage data written when a data write magnetic field applied by first and second data write currents is larger than a predetermined magnetic field. The plurality of write word lines are provided corresponding to the respective rows of the magnetic memory cells, and selectively activated according a row selection result in a data write operation. The write word line driver supplies the first data write current to the activated word line in an amount corresponding to a voltage level on a first control node. The data write circuit supplies the second data write current in the data write operation in an amount corresponding to a voltage level on a second control node. The plurality of bit lines are provided corresponding to the respective columns of the magnetic memory cells, and selectively connected to the data write circuit according to a column selection result in the data write operation. At least one of the write word line driver and the data write circuit includes an input terminal for externally setting the voltage level of a corresponding one of the first and second control nodes in the test mode.

Accordingly, in the test mode, at least one of the first and second data write currents can be set from the outside. Thus, the manufacturing variation in magnetic characteristics of the MTJ memory cells can be compensated for, whereby the adjustment testing of the data write current amount for appropriately ensuring a data write margin can be facilitated.

According to a further aspect of the present invention, a thin film magnetic memory device includes a memory array, a plurality of bit lines, a plurality of write word lines, and a coupling circuit. The memory array includes a plurality of magnetic memory cells arranged in rows and columns. Each of the plurality of magnetic memory cells includes a magnetic storage portion having a different resistance value according to a level of storage data written when a data write magnetic field applied by first and second data write currents is larger than a predetermined magnetic field. The plurality of bit lines are provided corresponding to the respective columns of the magnetic memory cells, for passing the first data write current therethrough. The plurality of write word lines are provided corresponding to the respective rows of the magnetic memory cells, and selectively activated according an address selection result so as to pass the second data write current therethrough in a data write operation. Each of the write word lines includes first and second sub write word lines respectively formed in first and second metal wiring layers with the magnetic storage portions interposed therebetween in a vertical direction on a semiconductor substrate. The coupling circuit electrically couples the first and second sub write word lines to each other. The second data write current flows as a reciprocating current through the first and second sub write word lines electrically coupled to each other by the coupling circuit.

Thus, since the data write current flows as a reciprocating current through the first and second bit lines that are electrically coupled to each other, data write magnetic fields acting in the same direction can be generated in the magnetic storage portion. This reduces the amount of data write current required to generate a data write magnetic field of the same strength. As a result, reduced power consumption of the MRAM device, improved operation reliability resulting from the reduced current density of the bit line, and also reduced magnetic field noise in the data write operation can be realized.

According to a still further aspect of the present invention, a thin film magnetic memory device includes a memory array, a plurality of read word lines, a plurality of write word lines, and a plurality of bit lines. The memory array includes a plurality of magnetic memory cells arranged in rows and columns. Each of the plurality of magnetic memory cells includes a magnetic storage portion having a different resistance value according to a level of storage data written when a data write magnetic field applied by first and second data write currents is larger than a predetermined magnetic field. The plurality of read word lines are provided corresponding to the respective rows of the magnetic memory cells, and are driven to a first voltage according to a row selection result in a data read operation. The plurality of write word lines are provided corresponding to the respective rows, and are selectively activated according an address selection result so as to pass the first data write current therethrough in a data write operation. The plurality of bit lines are provided corresponding to the respective columns of the magnetic memory cells so as to extend in such a direction that crosses the plurality of write word lines, and are each coupled to the magnetic storage portions. One of the plurality of bit lines that is selected according to an address selection result passes therethrough a data read current and the second data write current in the data read operation and the data write operation, respectively. Each of the magnetic memory cells further includes a rectifying element connected between the corresponding magnetic storage portion and the corresponding read word line.

Such a magnetic memory cell using the rectifying element is advantageous in terms of improved integration, and the OFF state of the rectifying element can be reliably maintained in the non-selected magnetic memory cells. As a result, the improved integration can be achieved as well as the operation reliability can be ensured.

According to a yet further aspect of the present invention, a thin film magnetic memory device includes a memory array, a plurality of read word lines, a plurality of write word lines, a plurality of write data lines, and a plurality of read data lines. The memory array includes a plurality of magnetic memory cells arranged in rows and columns. Each of the plurality of magnetic memory cells includes a magnetic storage portion having a different resistance value according to a level of storage data written when a data write magnetic field applied by first and second data write currents is larger than a predetermined magnetic field, and a memory cell selection gate for passing a data read current therethrough into the magnetic storage portion in a data read operation. The plurality of read word lines are provided corresponding to the respective rows of the magnetic memory cells, for actuating the corresponding memory cell selection gate according to an address selection result in the data read operation. The plurality of write word lines are provided corresponding to the respective columns of the magnetic memory cells, and are selectively driven to an active state according to an address selection result so as to pass the first data write current therethrough in a data write operation. The plurality of write data lines are provided corresponding to the respective rows, for passing the second data write current therethrough in the data write operation. The plurality of read data lines are provided corresponding to the respective columns, for passing the data read current therethrough in the data read operation. Adjacent magnetic memory cells share a corresponding one of at least one of the plurality of write word lines, the plurality of read word lines and the plurality of data lines.

Thus, the read word lines and the write word lines are provided corresponding to the rows and columns of the magnetic memory cells, respectively, and respective circuits for selectively driving the read word lines and the write word lines are provided independently. Accordingly, the freedom of layout can be improved. Moreover, at least one of the write word lines, read word lines, write data lines, and read data lines are shared between corresponding adjacent memory cells, whereby a wiring pitch in the memory array can be widened. As a result, the integration degree of the MRAM device can be improved.

According to a yet further aspect of the present invention, a thin film magnetic memory device includes a memory array, a plurality of read word lines, a plurality of write data lines, a plurality of common lines, and a current control circuit. The memory array includes a plurality of magnetic memory cells arranged in rows and columns. Each of the plurality of magnetic memory cells includes a magnetic storage portion having a different resistance value according to a level of storage data written when a data write magnetic field applied by first and second data write currents is larger than a predetermined magnetic field, and a memory cell selection gate for passing a data read current (Is) therethrough into the magnetic storage portion in a data read operation. The plurality of read word lines are provided corresponding to the respective rows of the magnetic memory cells, for actuating the corresponding memory cell selection gate according to an address selection result in the data read operation. The plurality of write data lines are provided corresponding to the respective rows, for passing the first data write current therethrough in a data write operation. The plurality of common lines are provided corresponding to the respective columns of the magnetic memory cells. Each of the plurality of common lines selectively receives supply of the data read current according to the address selection result in the data read operation. Each of the plurality of common lines is selectively driven to a first voltage (Vcc) for passing the second data write current therethrough according to the address selection result in the data write operation. The current control circuit electrically couples and disconnects each of the common lines to and from a second voltage (Vss) in the data write operation and the data read operation, respectively. The second voltage is different from the first voltage. Adjacent magnetic memory cells share a corresponding one of at least one of the plurality of write data lines, the plurality of read word lines and the plurality of common lines.

Thus, each common line functions as a read data line in the data read operation, and as a write word line in the data write operation, whereby the number of wirings can be reduced. A circuit for selectively driving the read word lines and a circuit for selectively driving the common lines in the data write operation, i.e., the common lines functioning as write word lines, are provided independently, whereby the freedom of layout can be improved. Moreover, at least one of the read word lines, write data lines and common lines are shared between corresponding adjacent memory cells, whereby a wiring pitch in the memory array can be widened. As a result, the integration degree of the MRAM device can be improved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, embodiments of the present invention will be described in detail with reference to the accompanying drawings.

First Embodiment

Figure 1:
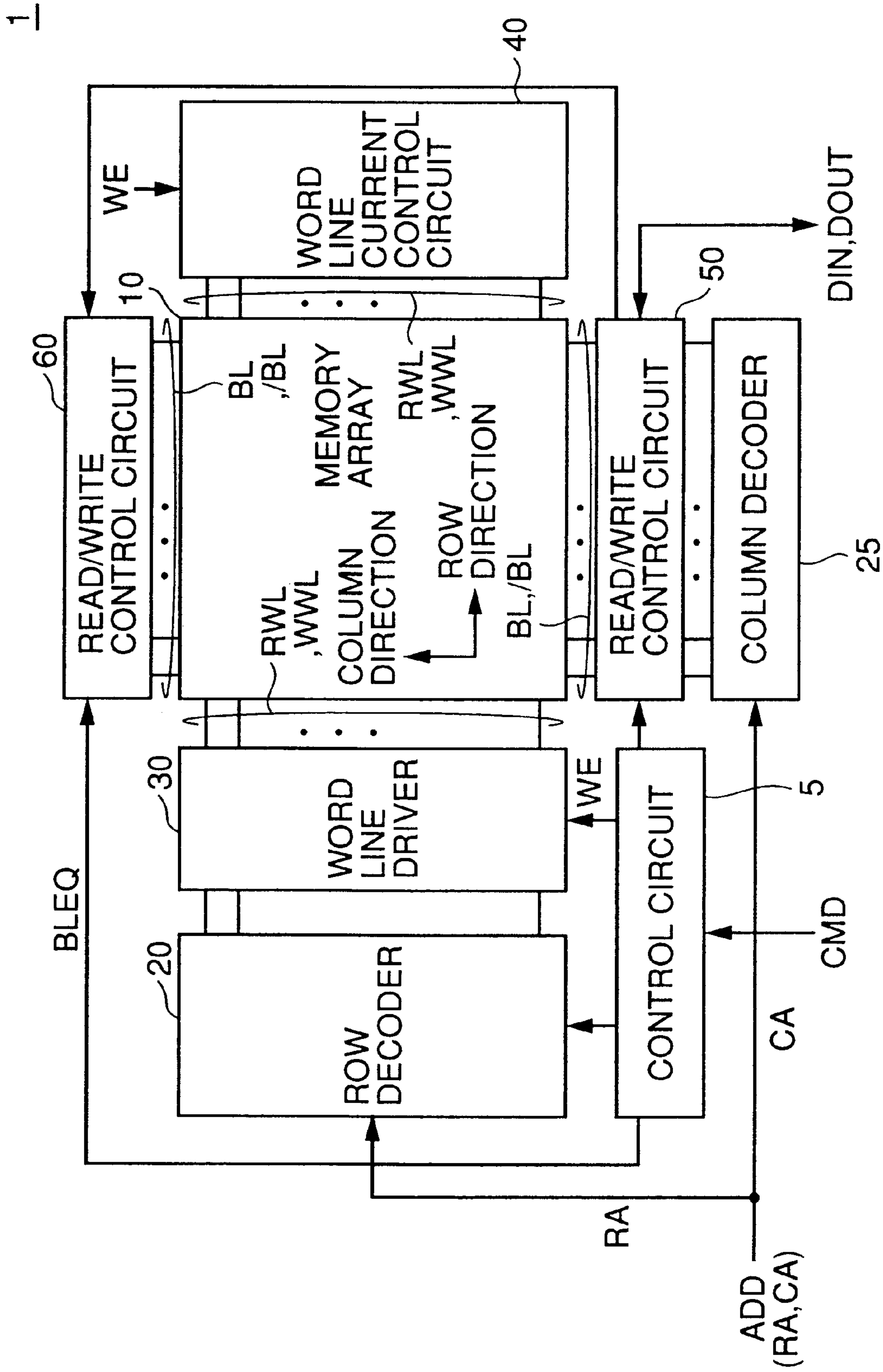
FIG. 1 is a schematic block diagram showing the overall structure of an MRAM device 1 according to a first embodiment of the present invention.

Referring to FIG. 1, an MRAM device 1 according to the first embodiment of the present invention conducts random access in response to an external control signal CMD and address signal ADD, thereby conducting input of write data DIN and output of read data DOUT.

The MRAM device 1 includes a control circuit 5 for controlling the overall operation of the MRAM device 1 in response to the control signal CMD, and a memory array 10 having a plurality of MTJ memory cells arranged in n rows by m columns. Although the structure of the memory array 10 will be described later in detail, a plurality of write word lines WWL and a plurality of read word lines RWL are provided corresponding to the respective MTJ memory cell rows. Folded bit line pairs are provided corresponding to the respective MTJ memory cell columns. Each bit line pair is formed from bit lines BL and /BL. Note that, hereinafter, a set of bit lines BL and /BL is also generally referred to as a bit line pair BLP.

The MRAM device 1 further includes a row decoder 20 for conducting row selection in the memory array 10 according to a row address RA indicated by the address signal ADD, a column decoder 25 for conducting column selection in the memory array 10 according to a column address CA indicated by the address signal ADD, a word line driver 30 for selectively activating the read word line RWL and write word line WWL based on the row selection result of the row decoder 20, a word line current control circuit 40 for applying a data write current to the write word line WWL in the data write operation, and read/write control circuits 50, 60 for applying a data write current ±Iw and a sense current Is in the data read and write operations.

Figure 2:
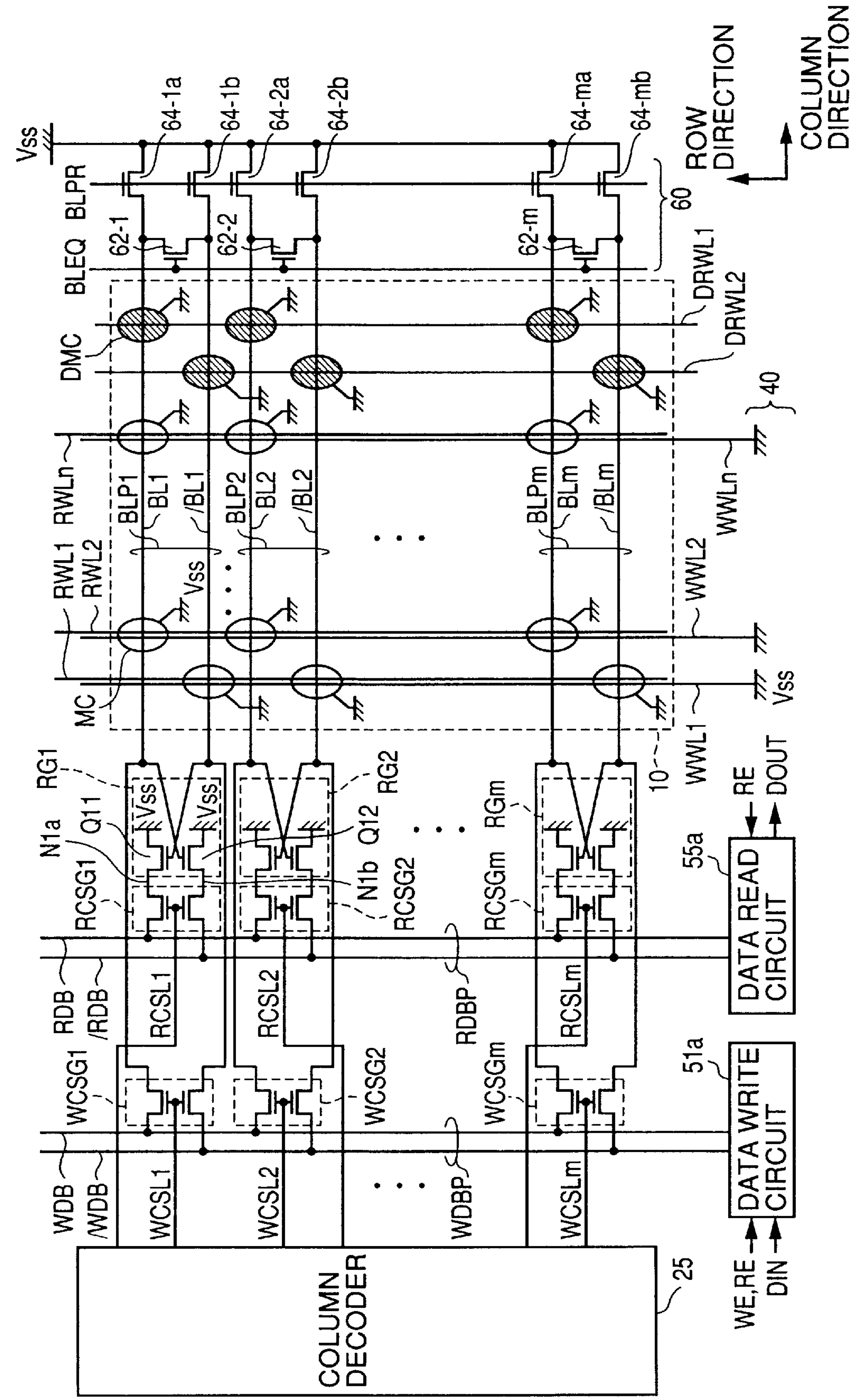
FIG. 2 is a diagram illustrating the structure of a memory array 10 and its peripheral circuitry according to the first embodiment.
Figure 83:
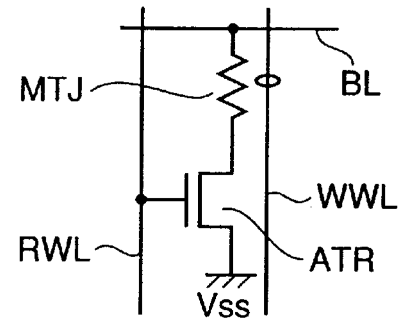
FIG. 83 is a schematic diagram showing the structure of a memory cell having a magnetic tunnel junction.
Figure 84:
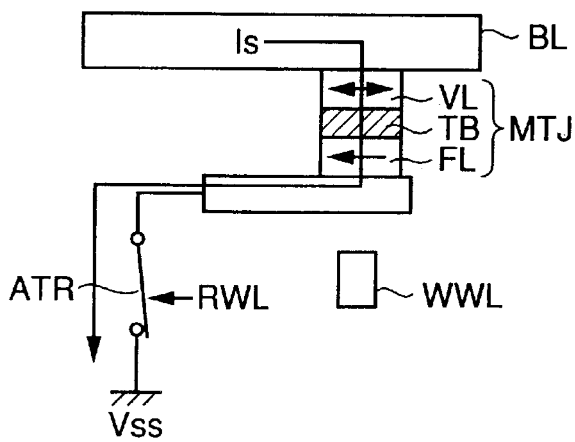
FIG. 84 is a conceptual diagram illustrating the data read operation from the MTJ memory cell.
Figure 85:
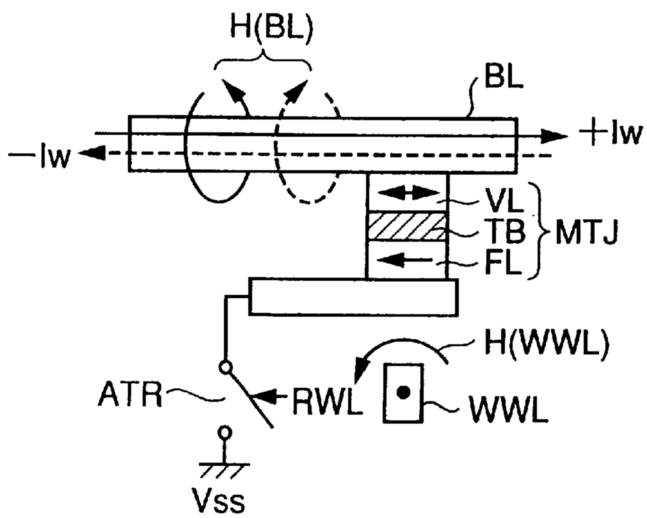
FIG. 85 is a conceptual diagram illustrating the data write operation to the MTJ memory cell.

Referring to FIG. 2, the memory array 10 includes the MTJ memory cells MC arranged in n rows by m columns (n, m: a natural number). The MTJ memory cells MC have the structure shown in FIG. 83. The read word lines RWL1 to RWLn and the write word lines WWL1 to WWLn are provided corresponding to the respective MTJ memory cell rows (hereinafter, also simply referred to as "memory cell rows"). The bit lines BL1, /BL1 to BLm, /BLm forming the bit line pairs BLP1 to BLPm are provided corresponding to the respective MTJ memory cell columns (hereinafter, also simply referred to as "memory cell columns").

The MTJ memory cells MC in each row are coupled to either the bit lines BL or the bit lines /BL in an alternate manner. For example, for the MTJ memory cells in the first memory cell column, the MTJ memory cell in the first row is coupled to the bit line /BL1, whereas the MTJ memory cell in the second row is coupled to the bit line BL1. Similarly, the MTJ memory cells in the odd rows are each connected to one bit line (/BL1 to /BLm) of a corresponding bit line pair, and the MTJ memory cells in the even rows are each connected to the other bit line (BL1 to BLm) of a corresponding bit line pair.

The memory array 10 further includes a plurality of dummy memory cells DMC respectively coupled to the bit lines BL1, /BL1 to BLm to /BLm. The dummy memory cells DMC are each coupled to either a dummy read word line DRWL1 or DRWL2, and are arranged in two rows by m columns. The dummy memory cells coupled to the dummy read word line DRWL1 are respectively coupled to the bit lines BL1, BL2, . . . BLm. The remaining dummy memory cells coupled to the dummy read word line DRWL2 are respectively coupled to the bit lines /BL1, /BL2, . . . /BLm.

As described before, the resistance value of the MTJ memory cell MC varies according to the storage data level. Assuming that the MTJ memory cell MC storing H-level data has a resistance value Rh and the memory cell MC storing L-level data has a resistance value R1, a resistance value Rd of the dummy memory cell DMC is set to an intermediate value of R1 and Rh. Note that R1<Rh in the embodiment of the present invention.

Hereinafter, the write word lines, read word lines, dummy read word lines, bit lines and bit line pairs are also generally denoted with WWL, RWL, DRWL, BL (/BL) and BLP, respectively. A specific write word line, read word line, bit line, and bit line pair are denoted with, for example, WWL1, RWL1, BL1 (/BL1) and BLP1, respectively.

The write word lines WWL1 to WWLn are coupled to the ground voltage Vss by the word line current control circuit 40. Thus, a data write current Ip is applied to a write word line WWL activated to the selected state (high voltage state: power supply voltage Vcc) by the word line driver 30.

Hereinafter, the high voltage state (power supply voltage Vcc) and low voltage state (ground voltage Vss) of a signal line are also simply referred to as H level and L level, respectively.

Write column selection lines WCSL1 to WCSLm for conducting column selection in the data write operation are provided corresponding to the respective memory cell columns. Similarly, read column selection lines RCSL1 to RCSLm for conducting column selection in the data read operation are provided corresponding to the respective memory cell columns.

In the data write operation, the column decoder 25 activates one of the write column selection lines WCSL1 to WCSLm to the selected state (H level) according to the decode result of the column address CA, i.e., the column selection result. In the data read operation, the column decoder 25 activates one of the read column selection lines RCSL1 to RCSLm to the selected state (H level) according to the column selection result.

Moreover, a write data bus pair WDBP for transmitting the write data and a read data bus pair RDBP for transmitting the read data are provided independently. The write data bus pair WDBP includes write data buses WDB and /WDB. Similarly, the read data bus pair RDBP includes read data buses RDB and /RDB.

The read/write control circuit 50 includes a data write circuit 51*a*, a data read circuit 55*a*, write column selection gates WCSG1 to WCSGm, read column selection gates RCSG1 to RCSGm and read gates RG1 to RGm. The write column selection gates WCSG1 to WCSGm, read column selection gates RCSG1 to RCSGm and read gates RG1 to RGm are provided corresponding to the respective memory cell columns.

One of the write column selection gates WCSG1 to WCSGm is turned ON according to the column selection result of the column decoder 25 so as to couple the write data buses WDB and /WDB of the write data bus pair WDBP to the corresponding bit lines BL and /BL, respectively.

For example, the write column selection gate WCSG1 includes an N-type MOS transistor coupled between the write data bus WDB and the bit line BL1, and an N-type MOS transistor electrically coupled between the write data bus /WDB and the bit line /BL1. These MOS transistors are turned ON/OFF according to the voltage level on the write column selection line WCSL1. More specifically, when the write column selection line WCSL1 is activated to the selected state (H level), the write column selection gate WCSG1 electrically couples the write data buses WDB and /WDB to the bit lines BL1 and /BL1, respectively. The write column selection gates WCSG2 to WCSGm provided respectively corresponding to the other memory cell columns also have the same structure as that described above.

The data write circuit 51*a* operates in response to a control signal WE that is activated (to H level) in the data write operation and a control signal RE activated (to H level) in the data read operation.

Note that, hereinafter, the read column selection lines RCSL1 to RCSLm, write column selection lines WCSL1 to WCSLm, read column selection gates RCSG1 to RCSGm, write column selection gates WCSG1 to WCSGm, and read gates RG1 to RGm are also generally denoted with RCSL, WCSL, RCSG, WCSG and RG, respectively.

Figure 3:
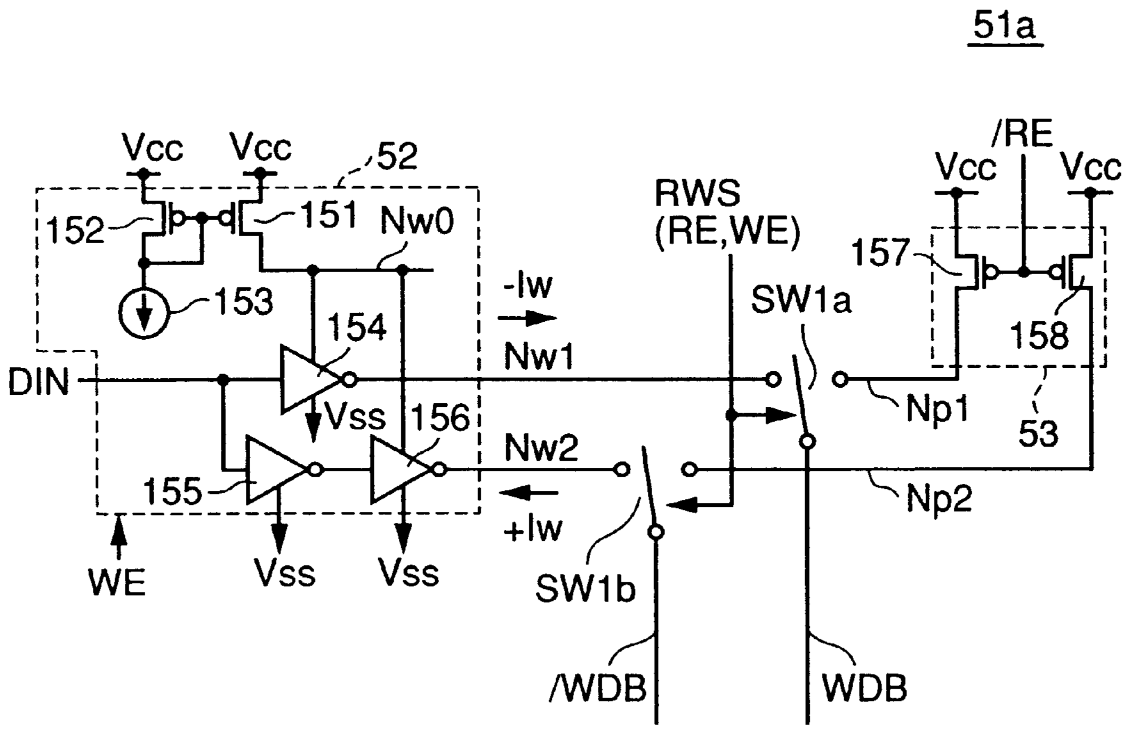
FIG. 3 is a circuit diagram showing the structure of a data write circuit 51*a* of FIG. 2.

Referring to FIG. 3, the data write circuit 51*a* includes a data write current supply circuit 52 for supplying the data write current ±Iw, and a pull-up circuit 53 for pulling up the bit line BL, /BL in the data read operation.

The data write current supply circuit 52 includes a P-type MOS transistor 151 for supplying a constant current to an internal node Nw0, and a P-type MOS transistor 152 and current source 153 which form a current-mirror circuit for controlling a passing current through the transistor 151.

The data write current supply circuit 52 further includes inverters 154, 155 and 156 operating in response to an operating current supplied from the internal node Nw0. The inverter 154 inverts the voltage level of the write data DIN for transmission to an internal node Nw1. The inverter 155 inverts the voltage level of the write data DIN for transmission to the input node of the inverter 156. The inverter 156 inverts the output of the inverter 155 for transmission to an internal node Nw2. Thus, the data write circuit 51*a* sets the voltage on the internal node Nw1 to one of the power supply voltage Vcc and ground voltage Vss and the voltage on the internal node Nw2 to the other, according to the voltage level of the write data DIN.

The pull-up circuit 53 includes P-type MOS transistors 157 and 158 electrically coupled between the power supply voltage Vcc and nodes Np1 and Np2, respectively. The transistors 157 and 158 receive an inverted signal /RE of the control signal RE at their gates.

The data write circuit 51*a* further includes a switch SW1*a* for selectively coupling one of the nodes Nw1 and Np1 to the write data bus WDB, and a switch SWb for selectively coupling one of the nodes Nw2 and Np2 to the write data bus /WDB. The switches SW1*a* and SW1*b* operate in response to a control signal RWS.

In the data write operation, the switches SW1*a* and SW1*b* connect the nodes Nw1 and Nw2 to the write data buses WDB and /WDB, respectively. As a result, in the data write operation, the voltage on the write data bus WDB is set to one of the power supply voltage Vcc and ground voltage Vss as well as the voltage on the write data bus /WDB to the other, according to the write data level, in order to supply the data write current ±Iw.

On the other hand, in the data read operation, the switches SW1*a* and SW1*b* couple the nodes Np1 and Np2 to the write data buses WDB and /WDB, respectively. As a result, in the data read operation, the write data buses WDB and /WDB are pulled up to the power supply voltage Vcc by the pull-up circuit 53.

Referring back to FIG. 2, since each of the read column selection gate RCSG1 to RCSGm and each of the read gates RG1 to RGm, both provided corresponding to the respective memory cell columns, have the same structure, the respective structures of the read column selection gate RCSG1 and the read gate RG1 provided corresponding to the bit lines BL1, /BL1 are herein described exemplarily.

The read column selection gate RCSG1 and the read gate RG1 are coupled in series between the read data bus RDB, /RDB and the ground voltage Vss.

The read column selection gate RCSG1 includes an N-type MOS transistor coupled between the read data bus RDB and a node N1*a*, and an N-type MOS transistor electrically coupled between the read data bus /RDB and a node N1*b*. These MOS transistors are turned ON/OFF according to the voltage on the read column selection line RCSL1. More specifically, when the read column selection line RCSL1 is activated to the selected state (H level), the read column selection gate RCSG1 electrically couples the read data buses RDB and /RDB to the nodes N1*a* and N1*b*, respectively.

The read gate RG1 includes N-type MOS transistors Q11 and Q12 electrically coupled between the ground voltage Vss and the nodes N1*a* and N1*b*, respectively. The transistors Q1 and Q2 have their gates coupled to the bit lines /BL1 and BL1, respectively. Accordingly, the voltages on the nodes N1*a* and N1*b* change according to the voltages on the bit lines /BL1 and BL1, respectively.

More specifically, when the voltage on the bit line BL1 is higher than that on the bit line /BL1, the node N1*b* are strongly pulled down toward the ground voltage Vss by the transistor Q12. Therefore, the voltage on the node N1*a* becomes higher than that on the node N1*b*. On the contrary, when the voltage on the bit line BL1 is lower than that on the bit line /BL1, the voltage on the node N1*b* becomes higher than that on the node N1*a*.

The voltage difference between the nodes N1*a* and N1*b* thus produced is transmitted into the voltage difference between the read data buses RDB and /RDB through the read column selection gate RCSG1. The data read circuit 55*a* amplifies the voltage difference between the read data buses RDB and /RDB of the read data bus pair RDBP so as to produce the read data DOUT.

Figure 4:
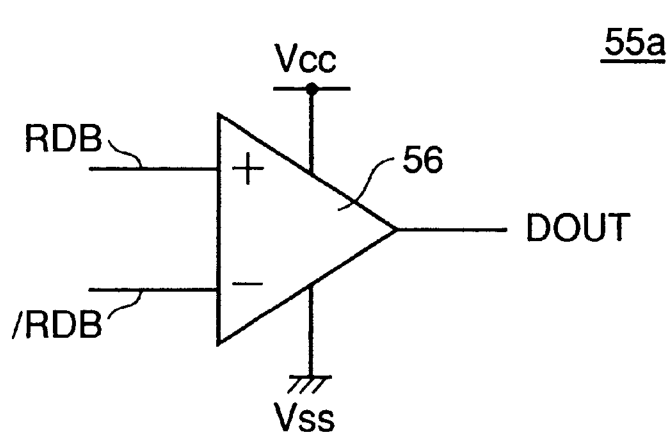
FIG. 4 is a circuit diagram showing the structure of a data read circuit 55*a* of FIG. 2.

Referring to FIG. 4, the data read circuit 55*a* includes a differential amplifier 56. In response to the voltages on the read data buses RDB and /RDB, the differential amplifier 56 amplifies the voltage difference therebetween so as to produce the read data DOUT.

Referring back to FIG. 2, the read/write control circuit 60 includes equalizing transistors 62-1 to 62-*m* that are turned ON/OFF according to a bit line equalizing signal BLEQ. The equalizing transistors 62-1 to 62-*m* are provided corresponding to the respective memory cell columns. For example, the equalizing transistor 62-1 corresponds to the first memory cell, and electrically couples the bit lines BL1 and /BL1 to each other in response to activation (H level) of the bit line equalizing signal BLEQ.

Similarly, the equalizing transistors 62-2 to 62-*m* respectively corresponding to the other memory cell columns electrically couple the bit lines BL and /BL of the bit line pair BLP to each other in the corresponding memory cell column, in response to activation of the bit line equalizing signal BLEQ.

The read/write control circuit 60 further includes precharging transistors 64-1*a*, 64-1*b* to 64-*ma*, 64-*mb* respectively provided between the ground voltage Vss and the bit lines BL1, /BL1 to bit lines BLm, /BLm. The precharging transistors 64-1*a*, 64-1*b* to 64-1*ma*, 64-1*mb* are turned ON in response to activation of a bit line precharging signal BLPR so as to precharge the bit lines BL1, /BL1 to bit lines BLm, /BLm to the ground voltage Vss, respectively.

Note that, hereinafter, the equalizing transistors 62-1 to 62-*m* and precharging transistors 64-1*a*, 64-1*b* to 64-1*ma*, 64-1*mb* are also generally referred to as equalizing transistors 62 and precharging transistors 64, respectively.

In the stand-by period of the MRAM device 1 as well as in the period other than the data read operation in the active period of the MRAM device 1, the bit line equalizing signal BLEQ produced by the control circuit 5 is activated to H level in order to short-circuit the bit lines BL and /BL of each folded bit line pair BL.

On the other hand, in the data read operation in the active period of the MRAM device 1, the bit line equalizing signal BLEQ is inactivated to L level. In response to this, the bit lines BL and /BL of each bit line pair BL in each memory cell column are electrically disconnected from each other.

The bit line precharging signal BLPR is also produced by the control circuit 5. In the active period of the MRAM device 1, the bit line precharging signal BLPR is activated to H level at least during a prescribed period before the data read operation. During the data read operation in the active period of the MRAM device 1, the bit line precharging signal BLPR is inactivated to L level, so that the precharging transistors 64 are turned OFF.

Hereinafter, the data read and write operations of the MRAM device according to the first embodiment will be described with reference to FIG. 5.

First, the data write operation will be described.

Figure 5:
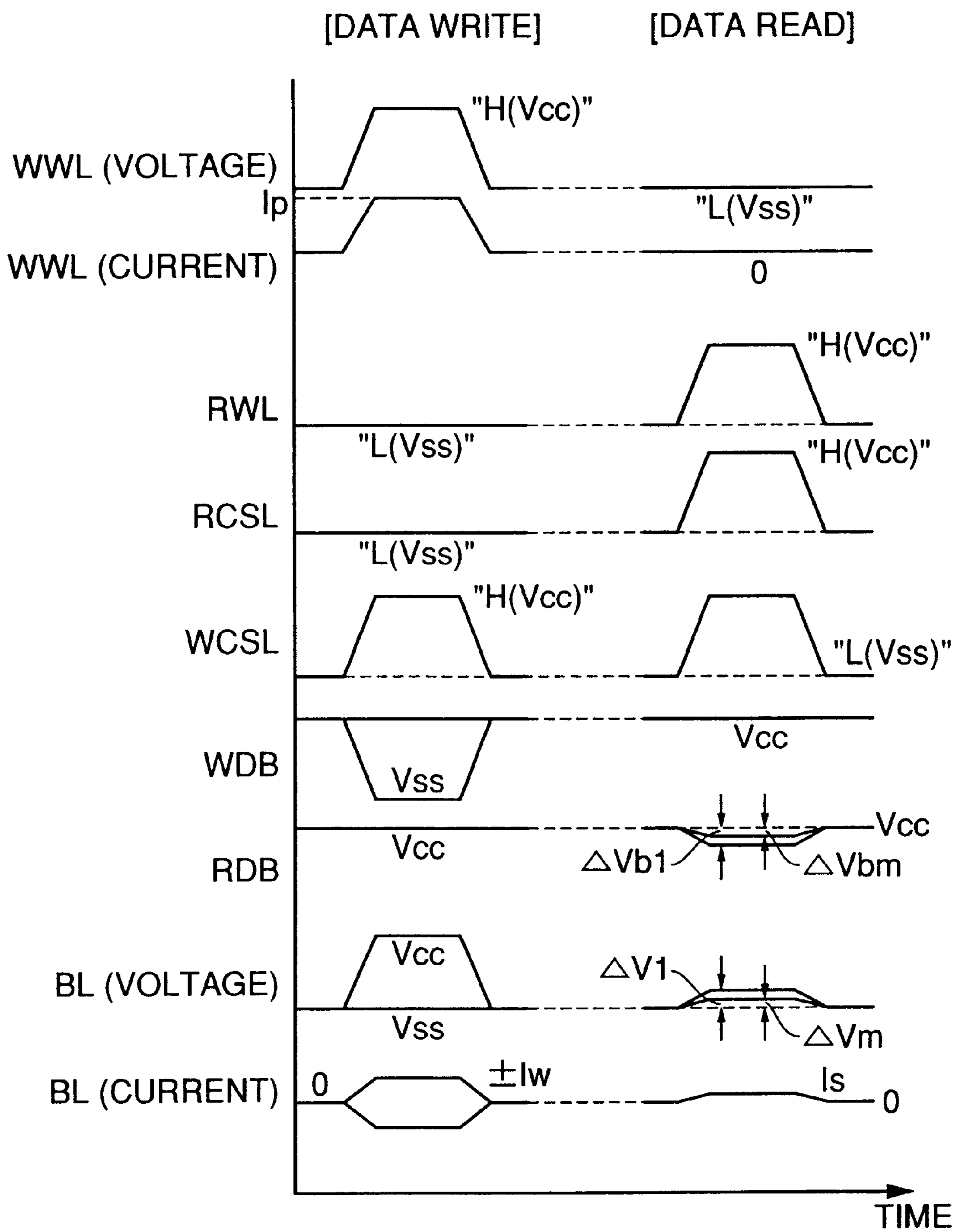
FIG. 5 is a timing chart illustrating the data read and write operations in the MRAM device according to the first embodiment.

Referring to FIG. 5, the write column selection line WCSL corresponding to the column selection result is activated to the selected state (H level), so that the corresponding write column selection gate WCSG is turned ON. In response to this, the bit lines BL and /BL corresponding to the column selection result are respectively coupled to the write data buses WDB and /WDB.

Moreover, in the data write operation, the equalizing transistor 62 is turned ON to short-circuit the bit lines BL and /BL.

As described before, the data write circuit 51*a* sets the voltage on the write data bus WDB to one of the power supply voltage Vcc and ground voltage Vss, and the voltage on the write data bus /WDB to the other. For example, in the case where the write data DIN is L-level data, the voltages on the nodes Nw2 and Nw1 shown in FIG. 3 are respectively set to the power supply voltage Vcc and the ground voltage Vcc. Therefore, the data write current −Iw for writing the L level data is applied to the write data bus WDB. The data write current −Iw is supplied to the bit line BL through the write column selection gate WCSG.

The data write current −Iw flowing through the bit line BL turns around at the equalizing transistor 62. Thus, the data write current +Iw of the opposite direction flows through the other bit line /BL. The data write current +Iw flowing through the bit line /BL is transmitted to the write data bus /WDB through the write column selection gate WCSG.

Moreover, one of the write word lines WWL is activated to the selected state (H level) according to the row selection result, and the data write current Ip is applied thereto. Accordingly, in the memory cell column corresponding to the column selection result, the data is written to the MTJ memory cell corresponding to the selected write word line WWL. At this time, the L-level data is written to the memory cell MC coupled to the bit line BL, whereas the H level data is written to the memory cell MC coupled to the bit line /BL.

In the case where the write data DIN is H-level data, the voltages on the nodes Nw1 and Nw2 are set in the opposite manner to that described above. Therefore, the data write current flows through the bit lines BL and /BL in the opposite direction to that described above for the data write operation. Thus, the data write current ±Iw having the direction corresponding to the level of the write data DIN is supplied to the bit lines BL and /BL.

In the data write operation, the read word lines RWL are retained in the non-selected state (L level).

For example, by activating the bit line precharging signal BLPR (to H level) in the data write operation, the voltages on the bit lines BL and /BL in the data write operation are set to the ground voltage Vss corresponding to the precharge voltage level for the data read operation.

Similarly, the read data buses RDB and /RDB are set to the power supply voltage Vcc corresponding to the precharge voltage for the data read operation. Thus, the voltages on the bit lines BL, /BL and the read data buses RDB, /RDB corresponding to the non-selected columns in the data write operation correspond to the precharge voltage for the data read operation. This eliminates the need to conduct an additional precharging operation before the data read operation, increasing the speed of the data read operation.

Hereinafter, the data read operation will be described.

Before the data read operation, the read data buses RDB, /RDB and the bit lines BL, /BL are precharged to the power supply voltage Vcc and the ground voltage Vss, respectively.

In the data read operation, the write data buses WDB and /WDB are pulled up to the power supply voltage Vcc by the pull-up circuit 53. Moreover, according to the column selection result, both a corresponding read column selection line RCSL and a corresponding write column selection line WCSL are activated to the selected state (H level).

Thus, the write data buses WDB and /WDB are electrically coupled to the bit lines BL and /BL of the selected column through the write column selection gate WCSG, respectively. Accordingly, in the data read operation, the bit lines BL and /BL corresponding to the selected memory cell column are pulled up to the power supply voltage Vcc.

One of the read word lines RWL is activated to the selected state (H level) according to the row selection result, whereby the corresponding memory cell MC is coupled to one of the bit lines BL and /BL.

Moreover, one of the dummy read word lines DRWL1 and DRWL2 is activated, whereby the other of the bit lines BL and /BL, which is not coupled to the MTJ memory cell MC, is coupled to the dummy memory cell DMC.

In the case where an odd row is selected according to the row selection result and the bit line /BL is coupled to the MTJ memory cell MC, the dummy read word line DRWL1 is activated, so that the bit line BL is coupled to the dummy memory cell DMC. On the contrary, in the case where an even row is selected according to the row selection result and the bit line BL is coupled to the MTJ memory cell MC, the dummy read word line DRWL2 is activated, so that the bit line /BL is coupled to the dummy memory cell DMC.

In the selected MTJ memory cell MC, the access transistor ATR is turned ON, whereby the sense current Is flows through a path of the pulled-up bit line BL or /BL, memory cell MC and ground voltage Vss. Accordingly, a voltage change ΔV1 corresponding to the stored data level is produced on one of the bit lines BL and /BL, which is coupled to the MTJ memory cell. FIG. 5 exemplarily shows a voltage change for the case where the MTJ memory cell MC to be read retains H-level data, that is, the MTJ memory cell MC to be read has a resistance value Rh.

As described above, the resistance value Rd of the dummy memory cell DMC is set to an intermediate value of the resistance values Rh and Rl of the MTJ memory cell MC. Accordingly, a voltage change ΔVm corresponding to the intermediate resistance value Rd is produced on the other of the bit lines BL and /BL, which is coupled to the dummy memory cell DMC.

Accordingly, the relative relation between the voltages on the bit lines BL and /BL of the bit line pair BLP corresponding to the selected memory cell column changes according to the read storage data level. With such a voltage difference between the bit lines BL and /BL, the read data buses RDB and /RDB are driven through the read gate.

More specifically, when the voltage on the bit line BL is higher than that on the bit line /BL, the read data bus /RDB is more strongly driven toward the ground voltage Vss through the read gate RG than is the read data bus RDB (the voltage change ΔVb1>ΔVbm in FIG. 5). The voltage difference between the read data buses RDB and /RDB thus produced is amplified by the data read circuit 55*a*, so that the H-level read data DOUT can be output.

On the contrary, in the case where the MTJ memory cell MC to be read retains L-level data, that is, in the case where the voltage on the bit line /BL is higher than that on the bit line BL, the read data bus RDB is more strongly driven toward the ground voltage Vss through the read gate RG than is the read data bus /RDB. The voltage difference between the read data buses RDB and /RDB thus produced is amplified by the data read circuit 52, so that the L-level read data DOUT can be output.

Thus, driving the read data buses RDB and /RDB through the read gate RG enables the data read operation to be conducted without applying the sense current to the read data buses RDB and /RDB. This reduces the RC load on the sense current path, whereby a voltage change required to read the data can be quickly produced on the bit lines BL and /BL. Thus, the data can be read at a high speed, whereby the access speed to the MRAM device can be increased.

Moreover, the pulled-up write data buses WDB and /WDB are respectively coupled to the bit lines BL and /BL through the write column selection gate WDSG so as to supply the sense current Is. Therefore, the sense current Is can be applied only to the bit lines BL and /BL corresponding to the memory cell column to be read. This can avoid unnecessary current consumption in the data read operation.

Moreover, the folded bit line pair causes the data write current to turn around at the equalizing transistor. Therefore, the data write current of the different directions can be supplied merely by controlling one end of the bit line BL to one of the power supply voltage Vcc and ground voltage Vss and one end of the bit line /BL to the other. Thus, a voltage of different polarity (negative voltage) is not necessary, and the direction of the current can be switched merely by setting the voltage on the write data bus WDB to one of the power supply voltage and ground voltage and the voltage on the write data bus /WDB to the other. Accordingly, the structure of the data write circuit 51*a* can be simplified. Moreover, the structure for sinking the data write current ±Iw (i.e., a current path to the ground voltage Vss) need not be provided in the read/write control circuit 60, and the data write current ±Iw can be controlled only with the equalizing transistor 62. As a result, the circuit structure associated with the data write current ±Iw within the read/write control circuits 50 and 60 can be reduced in size.

Moreover, since the data read operation is conducted using the dummy memory cells in the structure having the folded bit line pairs, a sufficient data read margin can be ensured.

First Modification of First Embodiment

Figure 6:
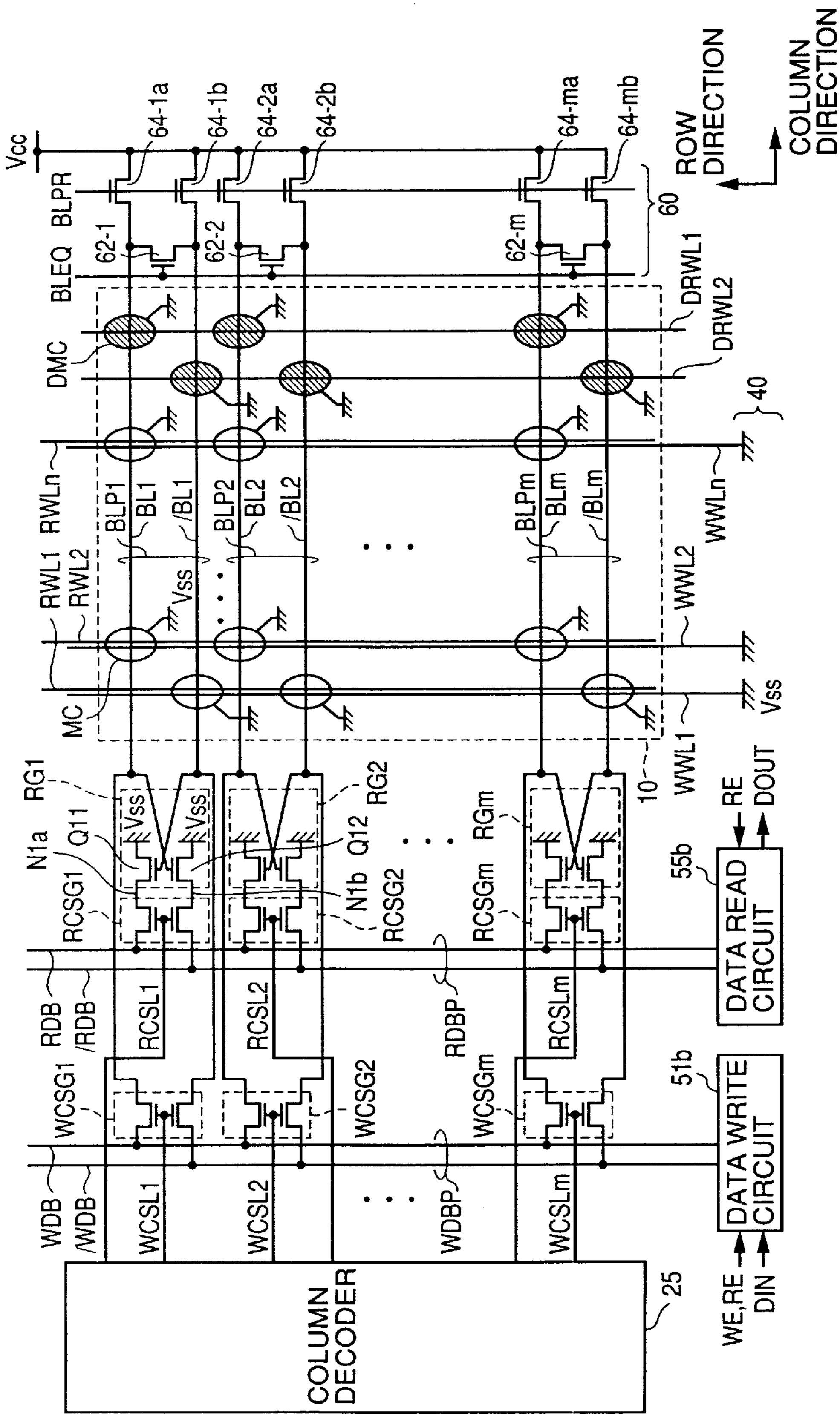
FIG. 6 is a diagram illustrating the structure of a memory array 10 and its peripheral circuitry according to a first modification of the first embodiment.

Referring to FIG. 6, the structure according to the first modification of the first embodiment is different from that of the first embodiment in that the precharging transistors 64-1*a*, 64-1*b* to 64-*m*1 to 64-1*mb* are provided in order to precharge the bit lines BL1, /BL1 to BLm, /BLm to the power supply voltage Vcc. Moreover, the data write circuit 51*a* and the data read circuit 55*a* are replaced with a data write circuit 51*b* and data read circuit 55*b*, respectively. Since the structure is otherwise the same as that of the first embodiment shown in FIG. 2, detailed description thereof will not be repeated.

Figure 7:
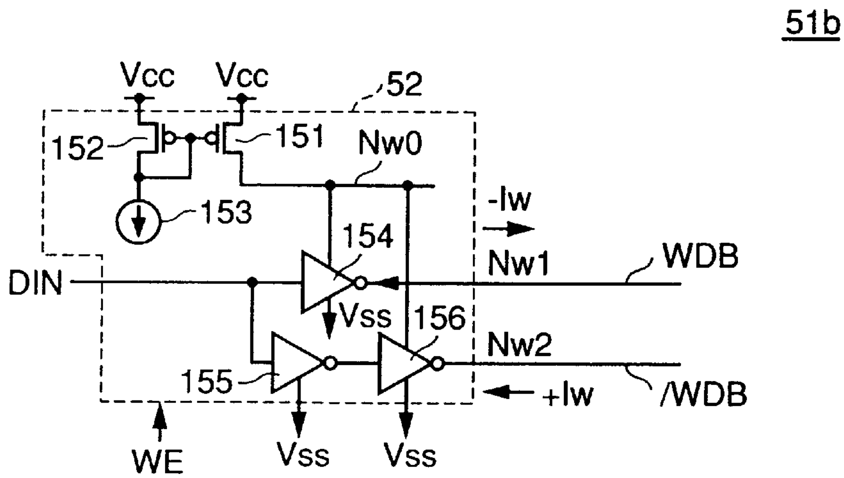
FIG. 7 is a circuit diagram showing the structure of a data write circuit 51*b* of FIG. 6.

Referring to FIG. 7, the data write circuit 51*b* includes the data write current supply circuit 52 shown in FIG. 3. The data write circuit 51*b* couples the output nodes Nw1 and Nw2 of the data write current supply circuit 52 directly to the write data bus pair WDB and /WDB, respectively. The data write circuit 51*b* does not include the pull-up circuit 53 and the switches SW1*a*, SW1*b*, and does not conduct the pull-up operation in the data read operation.

Figure 8:
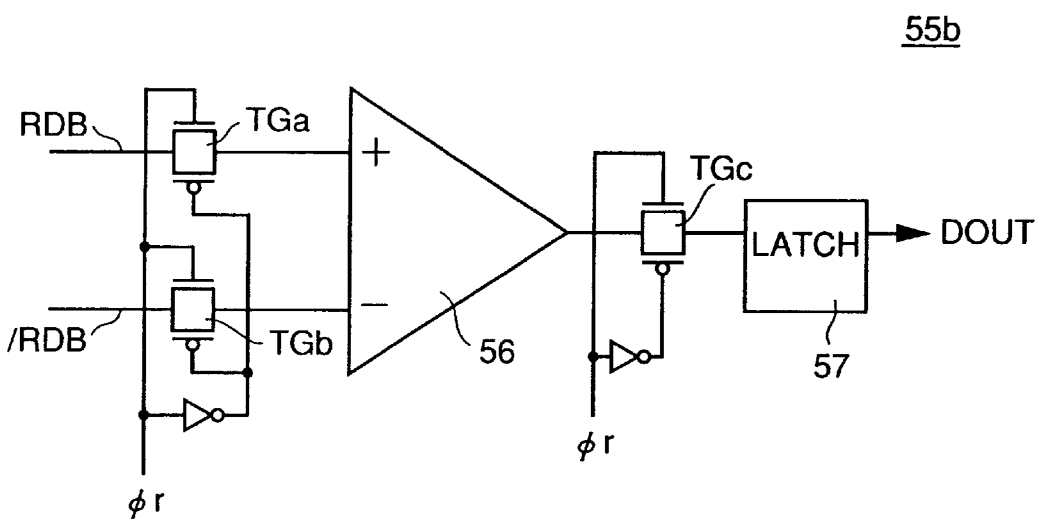
FIG. 8 is a circuit diagram showing the structure of a data read circuit 55*b* of FIG. 6.

Referring to FIG. 8, the data read circuit 55*b* includes transfer gates TGa and TGb respectively provided between the read data buses RDB, /RDB and the input nodes of the differential amplifier 56. The transfer gates TGa and TGb couple the read data buses RDB and /RDB to the respective input nodes of the differential amplifier 56 according to a trigger pulse ϕr.

The data read circuit 55*b* further includes a latch circuit 57 for latching the output of the differential amplifier 56, and a transfer gate TGc provided between the differential amplifier 56 and the latch circuit 57. Like the transfer gates TGa and TGb, the transfer gate TGc operates in response to the trigger pulse ϕr. The latch circuit 57 outputs the read data DOUT.

Accordingly, at the timing the trigger pulse ϕr is activated to H level, the data read circuit 55*b* amplifies the voltage difference between the read data buses RDB and /RDB so as to set the level of the read data DOUT. During the inactive (L level) period of the trigger pulse ϕr, the level of the read data DOUT is retained in the latch circuit 57.

Hereinafter, the data read and write operations of the MRAM device according to the first modification of the first embodiment will be described with reference to FIG. 9.

Figure 9:
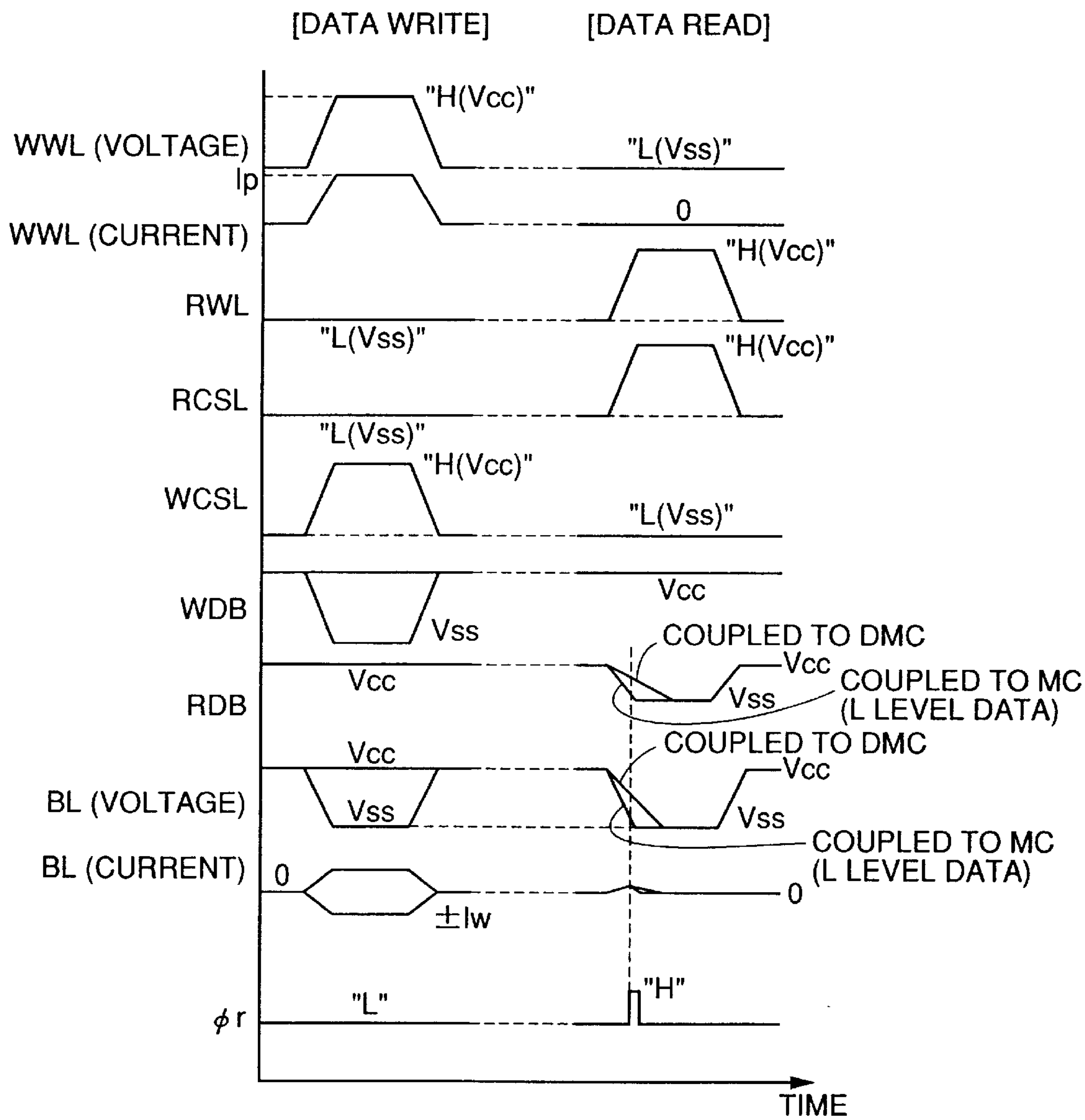
FIG. 9 is a timing chart illustrating the data read and write operations in an MRAM device according to the first modification of the first embodiment.

Referring to FIG. 9, the precharge voltage of the bit lines BL and /BL before the data write operation is set to the power supply voltage Vcc. In the data write operation, the trigger pulse ϕr is retained in the inactive state (L level). Since the data write operation is otherwise the same as that shown by the timing chart of FIG. 5, detailed description thereof will not be repeated.

Hereinafter, the data read operation will be described. Before the data read operation, the bit lines BL, /BL and the read data buses RDB, /RDB are precharged to the power supply voltage Vcc. On the other hand, the write column selection lines WCSL are retained in the inactive state (L level) in the data read operation. In other words, unlike the first embodiment, the bit lines BL and /BL are not pulled up to the power supply voltage Vcc in the data read operation.

With the bit lines BL and /BL precharged to the power supply voltage Vcc, the read word line RWL is selectively activated according to the row selection result. In response to this, the access transistor ATR is turned ON in the MTJ memory cell to be read, whereby the path of the sense current Is is formed. Thus, the voltage on the bit line BL, /BL starts reducing.

The voltage reducing rate of the bit line BL, /BL is determined based on the resistance value of the memory cell MC or dummy memory cell DMC coupled to the bit line BL, /BL. More specifically, the bit line BL, /BL coupled to the memory cell MC storing L-level data has a high voltage reducing rate, whereas the bit line BL, /BL coupled to the memory cell MC storing H-level data has a low voltage reducing rate. The bit line BL, /BL coupled to the dummy memory cell DMC has an intermediate voltage reducing rate.

FIG. 9 exemplarily shows the waveform of the bit line for the case where the MTJ memory cell MC to be read retains L-level data. FIG. 9 also shows the waveform of the bit line coupled to the dummy memory cell DMC.

As in the first embodiment, the voltage reduction on the bit line BL, /BL is transmitted to the read data bus RDB, /RDB through the read gate RG. Accordingly, the trigger pulse ϕr is activated at a prescribed timing during reduction in voltage on the read data bus RDB, /RDB, whereby the voltage difference between the read data buses RDB and /RDB is taken in the latch circuit 57. Thus, the data read operation can be conducted at a high speed as in the first embodiment.

Note that the structure according to the first modification of the first embodiment eliminates the need to supply the sense current Is in the data read operation, allowing for further reduction in power consumption.

Second Modification of First Embodiment

In the second modification of the first embodiment, the data read operation through the read gate RG as described in the first embodiment and the first modification thereof is applied to the open bit line structure.

Figure 10:
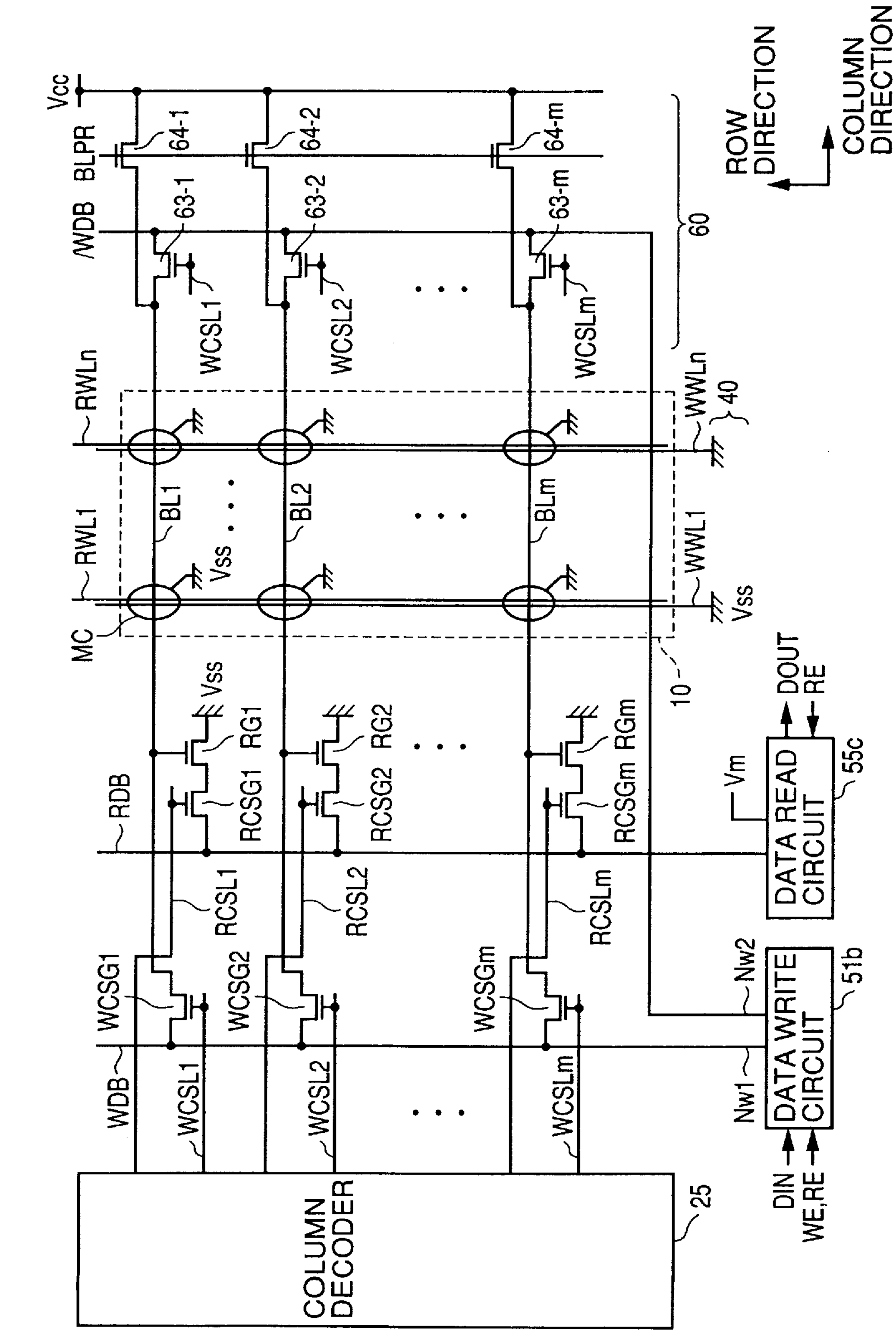
FIG. 10 is a diagram illustrating the structure of a memory array 10 and its peripheral circuitry according to a second modification of the first embodiment.

Referring to FIG. 10, in the structure according to the second modification of the first embodiment, open bit lines BL1 to BLm are provided corresponding to the respective memory cell columns. The write column selection gates WCSG1 to WCSGm are provided between the write data bus WDB and the bit lines BL1 to BLm, respectively. The write column selection gates WCSG1 to WCSGm are turned ON/OFF according to the voltage on the respective write column selection lines WCSL1 to WCSLm.

The read/write control circuit 60 includes bit line current control transistors 63-1 to 63-*m* provided between the write data bus /WDB and the bit lines BL1 to BLm, respectively. Like the write column selection gates WCSG1 to WCSGm, the bit line current control transistors 63-1 to 63-*m* are turned ON/OFF according to the voltage on the respective write column selection lines WCSL1 to WCSLm.

The precharging transistors 64-1 to 64-*m* precharge the respective bit lines BL1 to BLm to the power supply voltage Vcc in response to the bit line precharging signal BLPR.

As in the case of FIG. 6, the data write circuit 51*b* supplies the data write current ±Iw to the write data buses WDB and /WDB. With such a structure, the data write current can be supplied to the selected memory cell column as in the case of the first modification of the first embodiment.

In each memory cell column, the read column selection gate RCSG and the read gate RG are coupled in series between the read data bus RDB and the ground voltage Vss. For example, in the first memory cell column, the read column selection gate RCSG1 and the read gate RG1 are coupled in series between the read data bus RDB and the ground voltage Vss. The read column selection gate RCSG1 is formed from an N-type MOS transistor that is turned ON/OFF according to the read column selection line RCSL1, and the read gate RG1 is formed from an N-type MOS transistor having its gate coupled to the bit line BL1.

With such a structure, the read data bus RDB can be driven according to the voltage on the corresponding bit line BL through the read gate RG in the selected memory cell column. Accordingly, when the read word line RWL is activated with the bit lines BL1 to BLm precharged to the power supply voltage Vcc, a sense current path of the bit line BL (precharged to the power supply voltage Vcc), MTJ memory cell and ground voltage Vss can be formed in the selected memory cell.

Thus, the voltage on the corresponding bit line BL reduces at a rate corresponding to the storage data level in the selected MTJ memory cell MC. Accordingly, as in the first modification of the first embodiment, the voltage level on the bit line is taken in the data read circuit 55*c* at an appropriate timing during reduction in voltage on the read data bus RDB, and this voltage is compared with a reference voltage Vm determined based on the voltage reduction rate of the dummy memory cell DMC in the first modification of the first embodiment. As a result, the read data DOUT can be output. In other words, the structure of the data read circuit 55*c* can be implemented with the data read circuit 55*c* of FIG. 8 arranged such that one of the input nodes of the differential amplifier 56 receives the reference voltage Vm instead of the voltage on the read data bus /RDB.

Note that it is also possible to conduct the same data read operation as that in the first embodiment with the bit lines BL pulled up to the power supply voltage Vcc. In such a case, turning ON/OFF of the write column selection gate WCSG and bit line current control transistor 62 is controlled in the same manner as that in the first embodiment, and the data write circuit 51*b* is replaced with the data write circuit 51*a* including the pull-up circuit 53.

In this case, the write column selection gate WCSG is turned ON both in the data read and write operations according to the column selection result, but the bit line current control transistor 62 can be turned ON only in the data write operation.

Moreover, although the specific structure is not shown in the figure, the data read circuit 55*c* can be replaced with a differential amplifier for producing the read data DOUT according to the comparison result between the voltage on the write data bus WDB and the reference voltage that is set corresponding to the resistance value Rd of the dummy memory cell DMC.

Thus, the same data read and write operations as those of the first embodiment and the first modification thereof can be conducted even in the open bit line structure.

Third Modification of First Embodiment

In the third modification of the first embodiment, the number of gate circuits associated with column selection is reduced.

Figure 11:
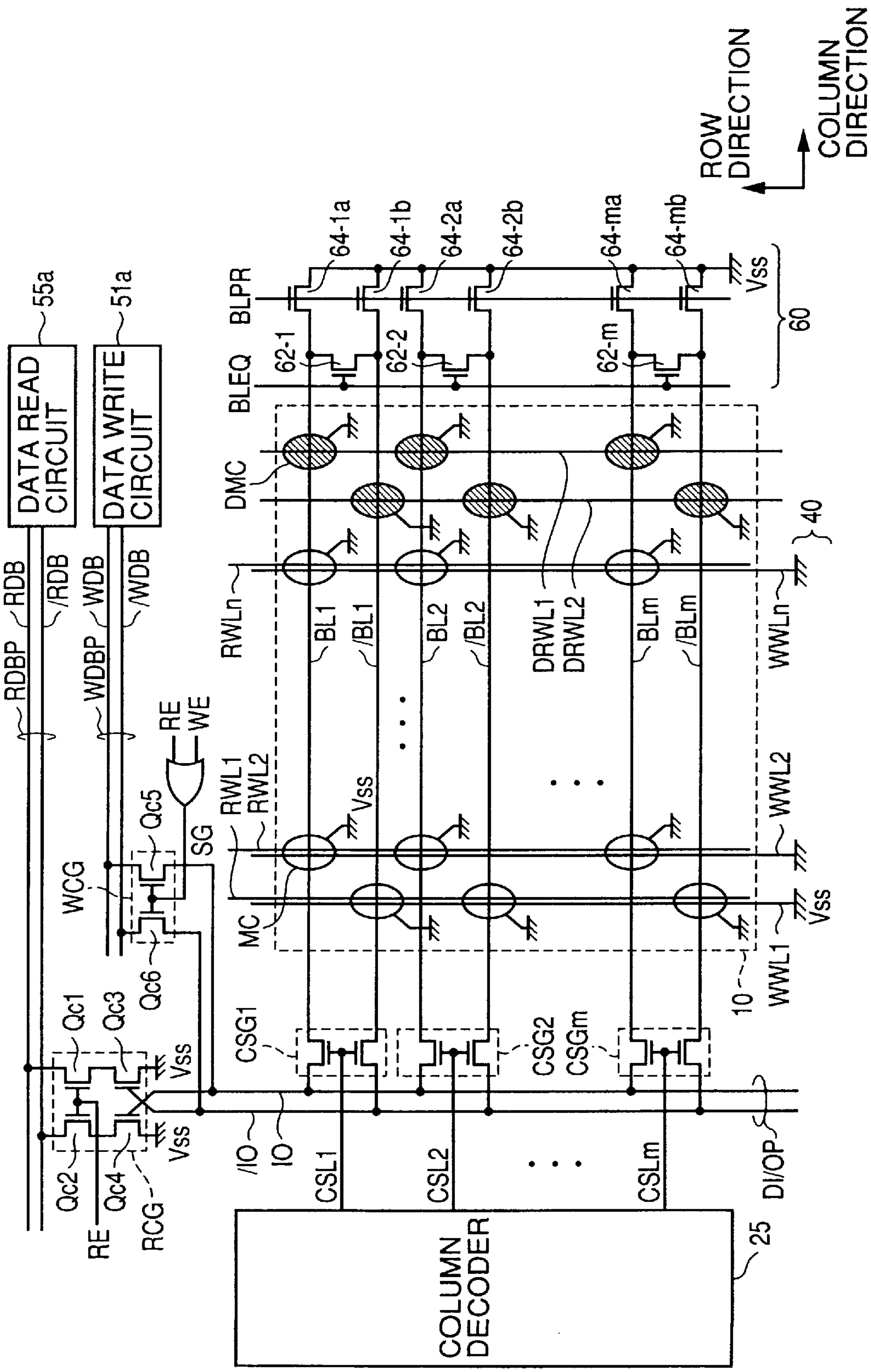
FIG. 11 is a diagram illustrating the structure of a memory array 10 and its peripheral circuitry according to a third modification of the first embodiment.

Referring to FIG. 11, the structure according to the third modification of the first embodiment includes a data input/output (I/O) line pair DI/OP formed from data I/O lines IO and /IO.

Column selection gates CSG1 to CSGm are provided between the data I/O line pair DI/OP and the bit line pairs BLP1 to BLPm, respectively. According to the column selection result, the column selection gate CSG1 to CSGm is turned ON/OFF according to the voltage on a corresponding column selection line CSL1 to CSLm that is selectively activated to H level by the column decoder 25. More specifically, both in the data read and write operations, the column selection gate CSG1 to CSGm is turned ON/OFF according to the column selection result.

Note that the column selection gates CSG1 to CSGm are also generally denoted with CSG.

A read gate for increasing the data read speed is provided as a common read gate RCG coupled between the read data bus pair RDBP and the data I/O line pair DI/OP. A write selection gate WCG is further provided between the data I/O line pair DI/OP and the write data bus pair WDBP.

Since the respective structures of the memory array 10 and the read/write control circuit 60 are the same as those of FIG. 2, detailed description thereof will not be repeated. Moreover, the respective structures and operations of the data write circuit 51*a* and the data read circuit 55*a* are also the same as those described above. Therefore, detailed description thereof will not be repeated.

The read gate RCG includes N-type MOS transistors Qc1 and Qc3 coupled in series between the read data bus RDB and the ground voltage Vss, and N-type MOS transistors Qc2 and Qc4 coupled in series between the read data bus /RDB and the ground voltage Vss. The transistors Qc1 and Qc2 receive the control signal RE at their gates. The transistors Qc3 and Qc4 are connected at their gates to the data I/O lines /IO and IO, respectively.

Thus, in the data read operation in which the control signal RE is activated to H level, the read data buses RDB, /RDB can be driven by the bit lines BL, /BL corresponding to the selected memory cell column through the column selection gate CSG and the data I/O line pair DI/OP.

Accordingly, the memory cell columns in the memory array 10 sharing the data I/O line pair DI/OP share the common read gate RCG, achieving reduction in circuit area. With the common read gate RCG as well, the data read operation can be conducted at a high speed without supplying the sense current Is to the read data buses RDB, /RDB.

The write selection gate WCG includes an N-type MOS transistor Qc5 electrically coupled between the write data bus WDB and the data I/O line IO, and an N-type MOS transistor Qc6 electrically coupled between the write data bus /WDB and the data I/O line /IO. The transistors Qc5 and Qc6 receive a control signal SG at their gates. The control signal SG is activated in the data write operation according to the control signal WE. In the data read operation as well, the control signal SG may be activated according to the control signal RE. Thus, the transistors Qc5 and Qc6 are turned ON, and the pull-up circuit 53 within the data write circuit 51*a* pulls up the bit lines BL and /BL corresponding to the selected memory cell column, whereby the sense current Is can be supplied.

In the data write operation, the transistors Qc1 and Qc2 in the common read gate RCG are turned OFF. Therefore, the voltages on the read data buses RDB and /RDB do not relate to the data I/O lines IO and /IO.

On the other hand, in response to activation (H level) of the control signal SG, the transistors Qc5 and Qc6 in the write selection gate WCG electrically couple the write data buses WDB and /WDB to the data I/O lines IO and /IO, respectively. Thus, the data write current ±Iw can be supplied to the bit lines BL and /BL corresponding to the selected memory cell column.

As in the case of FIG. 6, the data write circuit 51*a* and the data read circuit 55*a* may be replaced with the data write circuit 51*b* and the data read circuit 55*b*, and the power supply voltage Vcc may be used as the precharge voltage of the bit lines BL1, /BL1 to BLm, /BLm. Thus, the data read operation according to the voltage reduction rate on the bit line can be conducted as in the first modification of the first embodiment.

In this case, the control signal SG must be inactivated to L level in the data read operation in order to turn OFF the write selection gate WCG. For example, instead of the control signal SG, the control signal WE can be directly input to the gates of the transistors Qc5 and Qc6.

Second Embodiment

In the second embodiment is described the structure for adjusting a data write current in order to ensure a data write margin corresponding to variation in magnetic characteristics of the memory cells due to manufacturing variation.

Figure 12:
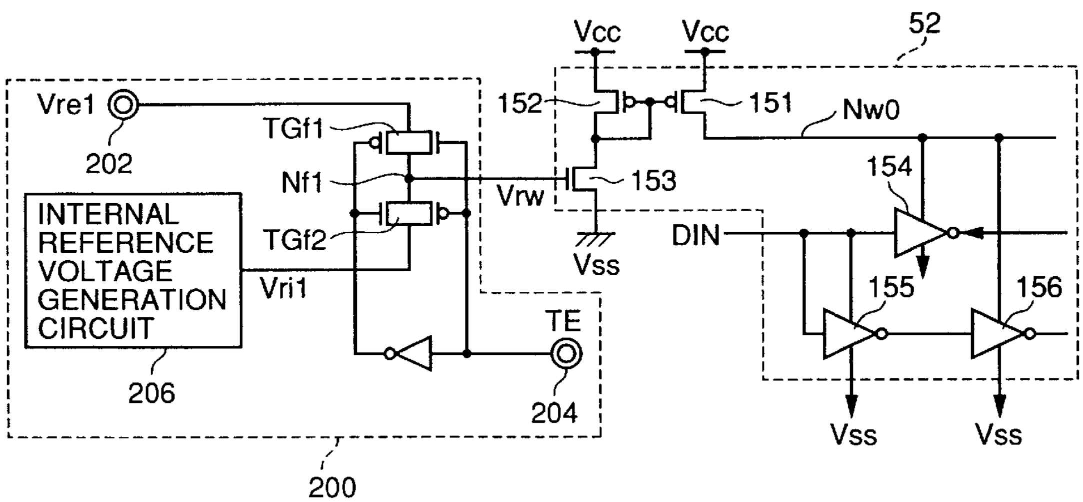
FIG. 12 is a circuit diagram showing the structure of a data write circuit according to a second embodiment of the present invention.

Referring to FIG. 12, a data write circuit according to the second embodiment is different from the data write circuit 51*a* shown in FIG. 3 in that the data write current of the second embodiment further includes a data write current adjustment circuit 200.

The data write current adjustment circuit 200 outputs a reference voltage Vrw for controlling the current amount of the current source 153 in the data write current supply circuit 52. The data write current supply circuit 52 includes an N-channel MOS transistor receiving the reference voltage Vrw at its gate. This N-channel MOS transistor corresponds to the current source 153. Accordingly, the current amount supplied to the node Nw0 through the transistor 151 forming a current mirror with the transistor 152 in the data write current supply circuit 52, i.e., the amount of the data write current ±Iw, can be adjusted according to the reference voltage Vrw.

The data write current adjustment circuit 200 includes a reference voltage external input terminal 202 for receiving an external reference voltage Vre1, a test input terminal 204 for receiving a test mode entry signal TE for switching generation of the reference voltage Vrw between the test mode and the normal mode, and an internal reference voltage generation circuit 206 for generating an internal reference voltage Vri1.

The data write current adjustment circuit 200 further includes a transfer gate TGf1 coupled between the reference voltage external input terminal 202 and a node Nf1, and a transfer gate TGf2 provided between the internal reference voltage generation circuit 206 and the node Nf1. The transfer gates TGf1 and TGf2 are turned ON in a complementary manner in response to the test mode entry signal TE. The node Nf1 is coupled to the gate of the N-channel MOS transistor corresponding to the current source 153.

With such a structure, in the normal operation in which the test mode entry signal TE is inactivated to L level, the transfer gates TGf2 and TGf1 are turned ON and OFF, respectively. Accordingly, the reference voltage Vri1 produced by the internal reference voltage generation circuit 206 is input as the reference voltage Vrw to the gate of the transistor corresponding to the current source 153.

On the other hand, in the test operation in which the test mode entry signal TE is activated to H level, the transfer gates TGf1 and TGf2 are turned ON and OFF, respectively. Accordingly, the external reference voltage Vre1 applied to the reference voltage external input terminal 202 is input to the gate of the transistor corresponding to the current source 153.

Accordingly, in the test mode, the external reference voltage Vre1 at an arbitrary level is input in response to activation of the test mode entry signal TE, so that the data write margin can be tested. Thus, the manufacturing variation in magnetic characteristics of the MTJ memory cells can be compensated for, whereby the adjustment testing of the data write current amount for appropriately ensuring a data write margin can be conducted. For example, this adjustment testing can be conducted such that the data write current ±Iw is gradually reduced from the standard value, whereby whether or not a desired data write margin is ensured for every MTJ memory cell is confirmed.

The level of the voltage Vri1 produced by the internal reference voltage generation circuit 206 need only be set to a proper value of the reference voltage Vrw that is found from such adjustment testing.

Thus, variation in magnetic characteristics of the MTJ memory cells due to the manufacturing variation can be compensated for, allowing the data write operation in the normal operation to be conducted based on a proper data write current amount.

Figure 13:
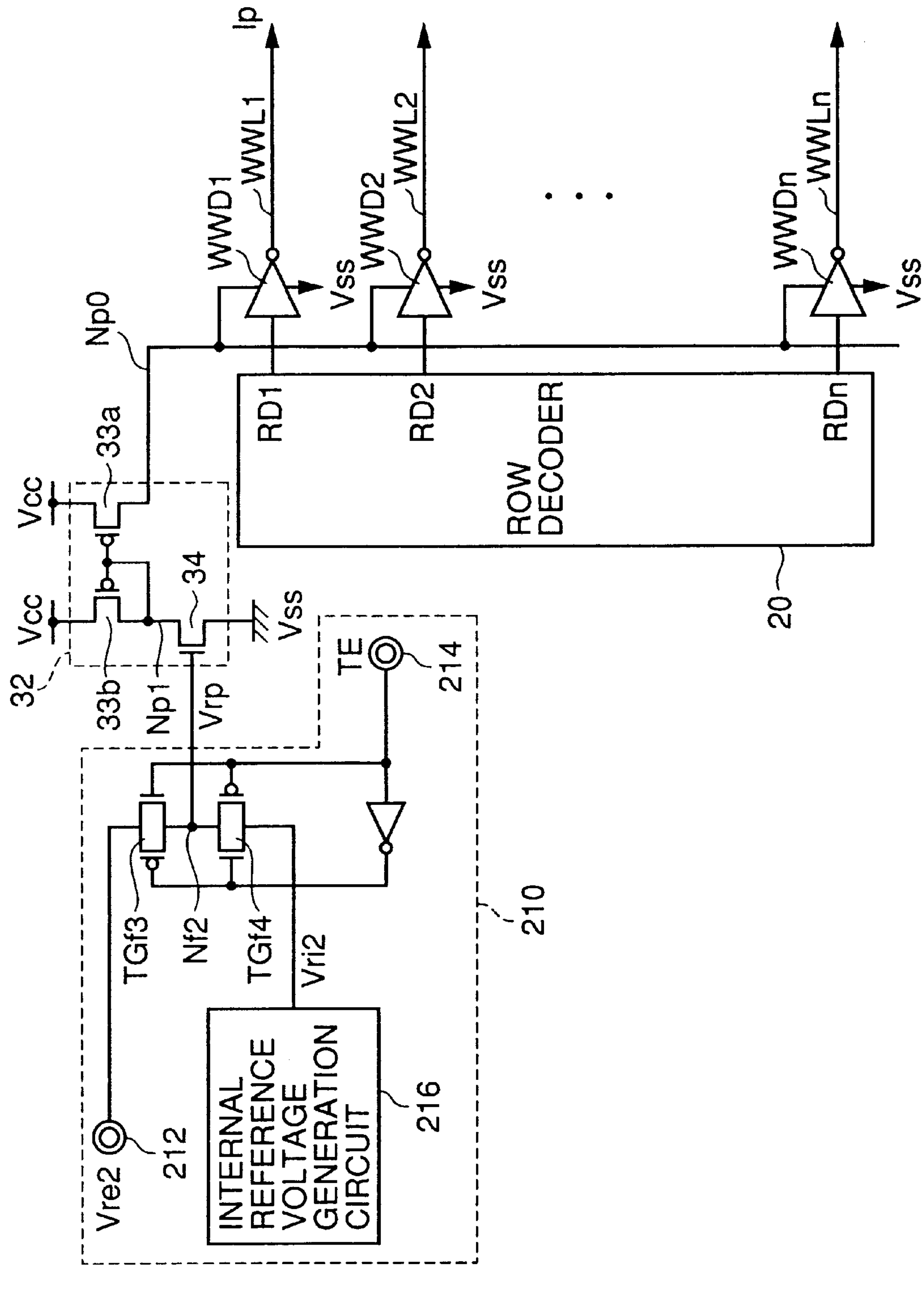
FIG. 13 is a circuit diagram showing an example of the structure of a word line driver according to the second embodiment.

Referring to FIG. 13, a word line driver according to the second embodiment includes write word drivers WWD1 to WWDn provided corresponding to the write word lines WWL1 to WWLn, respectively. Each of the write word drivers WWD1 to WWDn is formed from, e.g., an inverter. Note that, hereinafter, the write word drivers WWD1 to WWDn are also generally denoted with WWD.

The row decoder 20 activates one of row decode signals RD1 to RDn, i.e., the row decode signal corresponding to the selected row, to L level according to the row address RA. The row decode signals RD1 to RDn are transmitted to the word line driver 30. The write word drivers WWD1 to WWDn of the word line driver 30 receive the row decode signals RD1 to RDn, respectively. When a row decode signal is inactivated to L level, the corresponding write word driver WWD activate the corresponding write word line WWL to the selected state (H level).

In the data write operation, the write word driver WWD1 to WWDn supplies the data write current Ip to the write word line WWL corresponding to the selected row.

The word line driver 30 further includes a data write current supply circuit 32 for supplying the data write current Ip to the word drivers WWD1 to WWDn, and a data write current adjustment circuit 210 for adjusting the amount of the data write current Ip.

The data write current supply circuit 32 includes P-channel MOS transistors 33*a* and 33*b* electrically coupled between the power supply voltage Vcc and nodes Np0 and Np1, and an N-channel MOS transistor 34 electrically coupled between the node Np1 and the ground voltage Vss. The data write current Ip to be supplied to each write word driver WWD is transmitted to the node Np0.

The node Np1 is electrically coupled to the gates of the transistors 33*a* and 33*b*. The transistor 34 receives at its gate a reference voltage Vrp output from the data write current adjustment circuit 210. Thus, the transistor 34 operates as a current source for supplying the current amount according to the reference voltage Vrp. Since the transistors 33*a*, 33*b* and 34 form a current mirror circuit, the current amount supplied through the data write current supply circuit 32 to the node Np0, i.e., the amount of the data write current Ip, can be adjusted according to the reference voltage Vrp output from the data write current adjustment circuit 210.

The data write current adjustment circuit 210 has the same structure as that of the data write current adjustment circuit 200 described in connection with FIG. 11.

More specifically, the data write current adjustment circuit 210 includes a reference voltage external input terminal 212 for receiving an external reference voltage Vre2, a test input terminal 214 for receiving a test mode entry signal TE, and an internal reference voltage generation circuit 216 for generating an internal reference voltage Vri2.

The data write current adjustment circuit 210 further includes a transfer gate TGf3 coupled between the reference voltage external input terminal 212 and a node Nf2, and a transfer gate TGf4 provided between the internal reference voltage generation circuit 216 and the node Nf2. The transfer gates TGf3 and TGf4 are turned ON in a complementary manner in response to the test mode entry signal TE. The node Nf2 is coupled to the gate of the transistor 34 operating as a current source.

Accordingly, in each of the normal operation and the test mode operation, the reference voltage Vri2 produced by the internal reference voltage generation circuit 216 and the external reference voltage Vre2 applied to the reference voltage external input terminal 212 are input to the gate of the transistor 34 according to the test mode entry signal TE.

As a result, in the test mode, the external reference voltage Vre2 at an arbitrary level is input, so that the data write margin can be tested. Thus, the manufacturing variation in magnetic characteristics of the MTJ memory cells can be compensated for, whereby the adjustment testing of the data write current amount for appropriately ensuring a data write margin can be facilitated. For example, this adjustment testing can be conducted such that the data write current Ip is gradually reduced from the standard value, whereby whether or not a desired data write margin is ensured for every MTJ memory cell is confirmed.

The level of the voltage Vri2 produced by the internal reference voltage generation circuit 216 need only be set to a proper value of the reference voltage Vrw that is found from such adjustment testing.

Thus, variation in magnetic characteristics of the MTJ memory cells due to the manufacturing variation can be compensated for, allowing the data write operation in the normal operation to be conducted based on a proper data write current amount.

Modification of Second Embodiment

Figure 14:
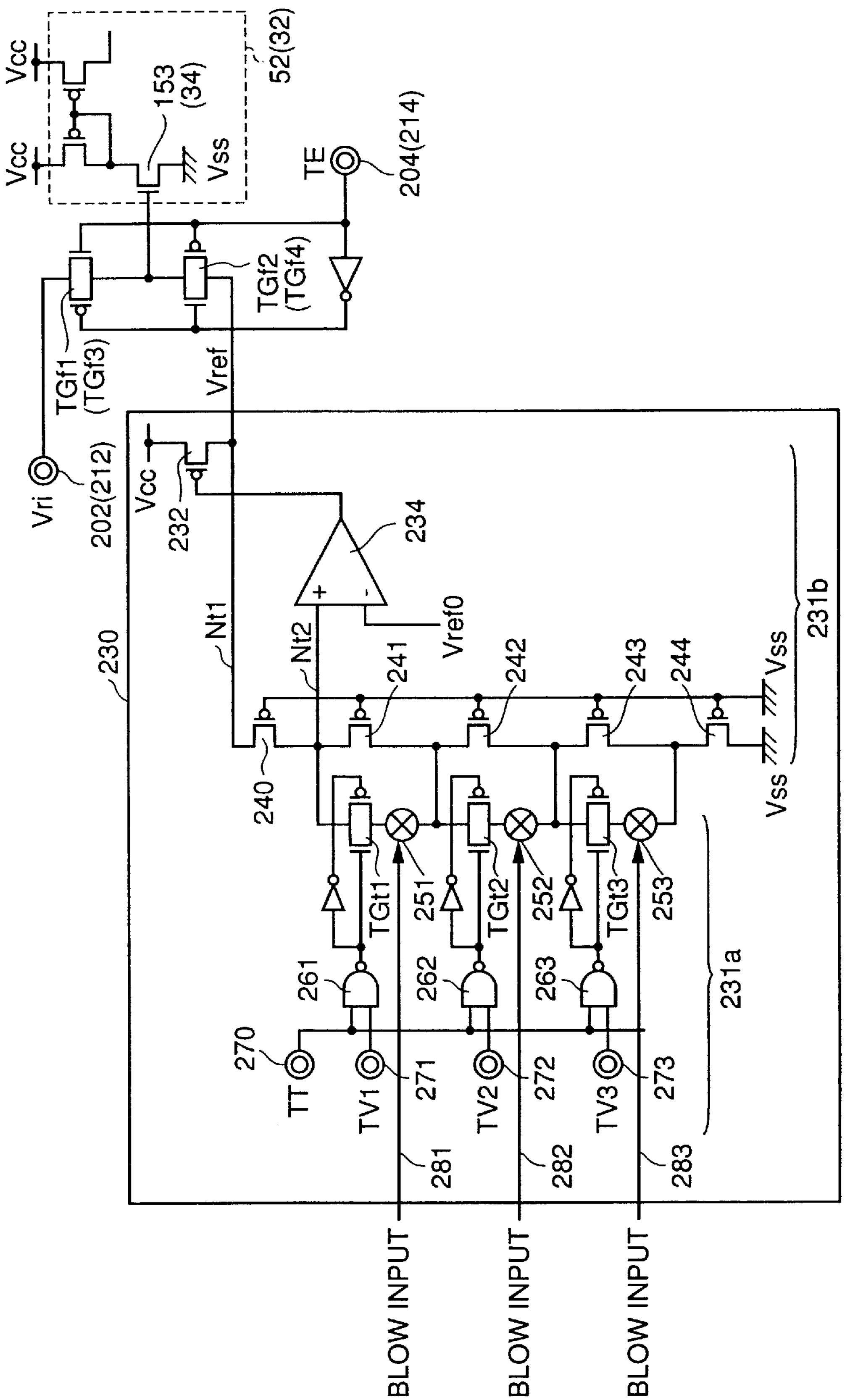
FIG. 14 is a circuit diagram showing the structure of a data write current adjustment circuit 230 according to a modification of the second embodiment.

Referring to FIG. 14, a data write current adjustment circuit 230 according to the modification of the second embodiment outputs a reference voltage Vref for adjusting the amount of the data write current. Note that the data write current adjustment circuit 230 shown in FIG. 13 may be replaced either with the data write current adjustment circuit 200 for adjusting the data write current ±Iw to be supplied to the bit line or with the data write current adjustment circuit 21 for adjusting the data write current Ip to be supplied to the write word line.

Referring to FIG. 14, the data write current adjustment circuit 230 includes a tuning input portion 231*a* and a voltage adjustment portion 231*b* for adjusting the reference voltage Vref according to the setting of the tuning input portion 231*a*.

The voltage adjustment portion 231_b_ includes a P-channel MOS transistor 232 electrically coupled between a node Nt1 producing the reference voltage Vref and the power supply voltage Vcc, and an operational amplifier 234 for amplifying the voltage difference between the voltage on a node Nt2 and a prescribed voltage Vref0 for output to the gate of the transistor 232.

The voltage adjustment portion 231_b_ further includes a P-channel MOS transistor 240 electrically coupled between the nodes Nt1 and Nt2, and P-channel MOS transistors 241, 242, 243 and 244 coupled in series between the node Nt2 and the ground voltage Vss. The transistors 240 to 244 have their gates coupled to the ground voltage Vss. Thus, the transistors 240 to 244 serve as resistive elements.

With the gate voltage of the transistor 232 being controlled by the operational amplifier 234, the level of the reference voltage Vref is controlled so that the voltage on the node Nt2 becomes equal to the prescribed voltage Vref0. The prescribed voltage Vref0 is set in view of the reference voltage Vref.

Herein, the voltage Vα on the node Nt2 is obtained from the reference voltage Vref divided by the transistors 240 to 244 serving as resistive elements. Provided that this voltage division ratio is defined as α (α=Vref/Vα), the reference voltage Vref is given by the following expression using the prescribed voltage Vref0 input to the operational amplifier 234: Vref=α·Vref0.

The voltage division ratio α is determined from the ratio of the resistance value between the node Nt1 and the ground voltage Vss to the resistance value between the node Nt2 and the ground voltage Vss, which are set according to the input to the tuning input portion 231_a_.

Thus, the reference voltage Vref is not directly programmed, but the voltage division ratio α for the input voltage to the operational amplifier 234 is programmed, whereby the response property and noise resistance of the reference voltage Vref can be improved.

The tuning input portion 231_a_ includes sets of a fuse element serving as a program element and a transfer gate. These sets are provided in parallel with the transistors 241 to 243, respectively. For example, a transfer gate TGt1 and a fuse element 251, which are connected in series with each other, are provided in parallel with the transistor 241. A transfer gate TGt2 and a fuse element 252, which are connected in series with each other, are provided in parallel with the transistor 242. Similarly, a transfer gate TGt3 and a fuse element 253, which are connected in series with each other, are provided in parallel with the transistor 243.

The fuses can be blown by radiating the laser light from the outside directly to the fuse elements 251 to 253, or by applying a high voltage signal from the outside through respective blow input nodes 281 to 283.

The tuning input portion 231a further includes an input terminal 270 for receiving a control signal TT that is activated upon conducting the tuning testing of the data write current, input terminals 271 to 273 for receiving tuning test signals TV1 to TV3, respectively, a logic gate 261 for controlling turning ON/OFF of the transfer gate TGt1 according to the respective levels of the control signal TT and tuning test signal TV1, a logic gate 262 for controlling turning ON/OFF of the transfer gate TGt2 according to the respective levels of the control signal TT and tuning test signal TV2, and a logic gate 263 for controlling turning ON/OFF of the transfer gate TGt3 according to the respective levels of the control signal TT and tuning test signal TV3.

In the normal operation, the control signal TT is inactivated to L level. Therefore, the respective output signals of the logic gates 261 to 263 are set to H level. In response to this, the transfer gates TGt1 to TGt3 are all turned ON. Thus, the voltage division ratio α is determined whether the fuse elements 251 to 253 have been blown or not.

In the tuning input portion 231_a_, the fuse-blown state can be simulated by setting the output signal of the logic gate 261 to 263 to L level by the input signal to the input terminal 270 to 273 so as to turn OFF the corresponding transfer gate TGt1, TGt2, TGt3.

For example, in the case where the tuning test is conducted with the control signal TT activated (to H level), the transfer gate TGt1 can be turned OFF by activating the tuning test signal TV1 to H level. Thus, the state equivalent to that in which the fuse element 251 has been blown can be obtained.

Similarly, the fuse-blown state can also be simulated for the fuse elements 252 and 253.

Accordingly, the voltage division ratio α is changed with the control signal TT and the tuning test signals TV1 to TV3 that are input to the respective input terminals 270 to 273, so that the reference voltage Vref for adjusting the data write current can be set in a variable manner.

Therefore, in the tuning test, the voltage division ratio α is adjusted reversibly without actually blowing any fuse, whereby the adjustment test of the data write current amount for appropriately ensuring the data write margin can be facilitated.

After the tuning test is completed, the fuse element is actually blown according to the test result. Thus, the reference voltage Vref for obtaining an appropriate data write current can be programmed to the tuning input portion 231_a_ in a non-volatile manner. As a result, the data write current adjustment circuit 230 produces a programmed, appropriate reference voltage Vref in the normal operation. Therefore, the manufacturing variation in magnetic characteristics of the MTJ memory cells is compensated for, and the data write operation in the normal operation can be conducted.

Note that FIG. 14 shows the structure including the reference voltage external input terminals 202 (212) and 204 (214) for receiving the external reference voltage, as well as the transfer gates TGf1 (TGf3) and TGf2 (TGf4). However, these elements may be omitted so that the reference voltage Vref is directly applied to the gate of the transistor 153 (34). In this case as well, the tuning test of the data write current can be conducted.

Such a structure enables the tuning test to be conducted merely by inputting a digital signal. That is, the tuning testing can be conducted more efficiently as compared to the respective structures of the data write current adjustment circuits 200 and 210 shown in FIGS. 12 and 13. Moreover, this structure eliminates the need to conduct the adjustment corresponding to the output voltage adjustment of the internal reference voltage generation circuits 206 and 216 included in the data write current adjustment circuits 200 and 210, thereby reducing the load for adjustment.

Note that the number of transistors for setting the voltage division ratio α is not limited to that in the example shown in FIG. 13, but any plurality of transistors can be provided. In this case, the level of the reference voltage Vref can be set more finely by providing similarly controlled sets of transfer gates and fuse elements as well as control signal input terminals in parallel with the plurality of transistors serving as resistive elements.

FIG. 14 exemplarily shows the structure using as program elements the fuse elements that are disconnected after blow input. However, so-called anti-fuse elements that are rendered conductive after blow input may alternatively be used.

In this case, the same effects can be obtained by providing the transfer gates (TGt1 to TGt3 in FIG. 14) for conducting the tuning test in parallel with the respective anti-fuse elements.

Note that the adjustment of the data write current as described in the second embodiment and the modification thereof can be applied not only to the MRAM device for conducting the data read operation through the read gate as described in the first embodiment and the modifications thereof, but also to an MRAM device having a general structure.

Figure 15:
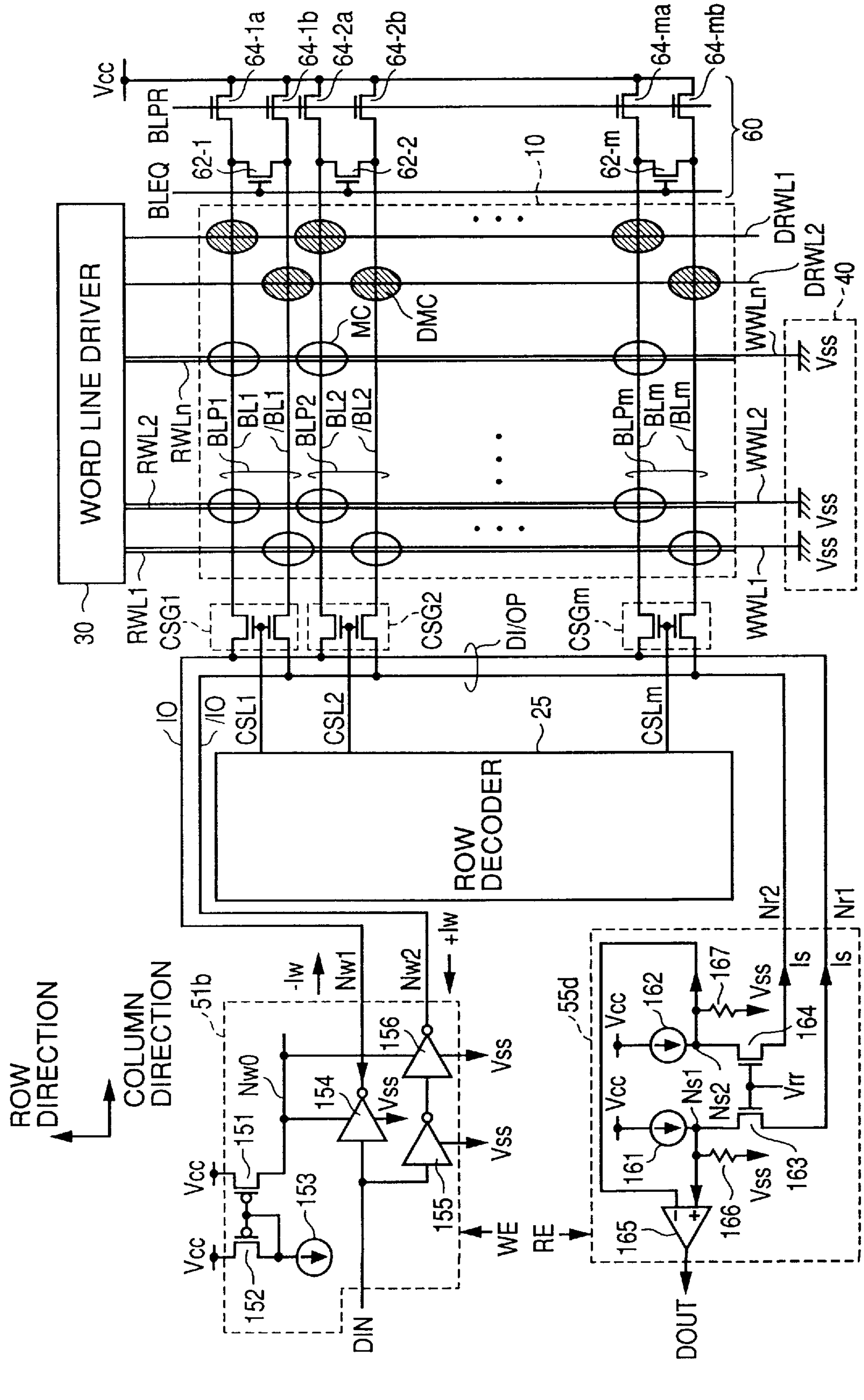
FIG. 15 is a diagram illustrating the structure of a memory array 10 and its peripheral circuitry in an MRAM device for conducting a data read operation without using any read gate.

FIG. 15 shows an example of the structure of the MRAM device for conducting the data read operation without using the read gate.

The structure of FIG. 15 is different from that of FIG. 2 in that column selection gates CSG1 to CSGm are provided corresponding to the respective memory cell columns. Each column selection gate couples a corresponding bit line pair BLP to the data I/O line pair DI/OP according to the column selection result. For example, the column selection gate CSG1 couples the data I/O lines IO and /IO of the data I/O line pair DI/OP to the bit lines BL1 and /BL1 of the corresponding bit line pair BLP1, respectively, according to the voltage on the column selection line CSL1.

The data write current ±Iw can be supplied to the data I/O line pair DI/OP by the data write circuit 51*b* described in connection with FIG. 10. The data write current adjustment circuit 200 or 230 shown in FIGS. 12 and 14 is provided in order to adjust the current amount of the current source 153 in the data write current supply circuit 52 included in the data write circuit 51*b*. Thus, the adjustment of the data write current can be conducted in the same manner.

The data write current Ip is supplied to the write word line WWL by the word line driver 30. By applying the structure described in connection with FIG. 13 to the word line driver 30, the adjustment of the data write current can be conducted in the same manner as that of the second embodiment.

In the MRAM device having the structure of FIG. 15, a data read circuit 55*d* must supply the sense current Is in the data read operation.

The data read circuit 55*d* includes current sources 161 and 162 for receiving the power supply voltage Vcc to supply a constant current to respective internal nodes Ns1 and Ns2, an N-type MOS transistor 163 electrically coupled between the internal node Ns1 and a node Nr1, an N-type MOS transistor 164 electrically coupled between the internal node Ns2 and a node Nr2, and an amplifier 165 for amplifying the voltage level difference between the internal nodes Ns1 and Ns2 so as to output read data DOUT.

The transistors 163 and 164 receive a reference voltage Vrr at their gates. The respective current amounts supplied from the current sources 161 and 162 as well as the reference voltage Vrr are set according to the amount of the sense current Is. Resistances 166 and 167 are provided in order to pull down the internal nodes Ns1 and Ns2 to the ground voltage Vss, respectively. The nodes Nr1 and Nr2 are coupled to the data I/O lines IO and /IO, respectively.

With such a structure, the data read circuit 55*d* supplies the sense current Is to each of the data I/O lines IO and /IO in the data read operation. The read data DOUT is output according to the respective voltage changes produced on the data I/O lines IO and /IO corresponding to the storage data level in the MTJ memory cell connected thereto through the column selection gate and the bit line pair.

Third Embodiment

In the third embodiment is described the structure in which the bit lines BL and write word lines WWL receiving the data write current are formed in a plurality of wiring layers.

Figure 16:
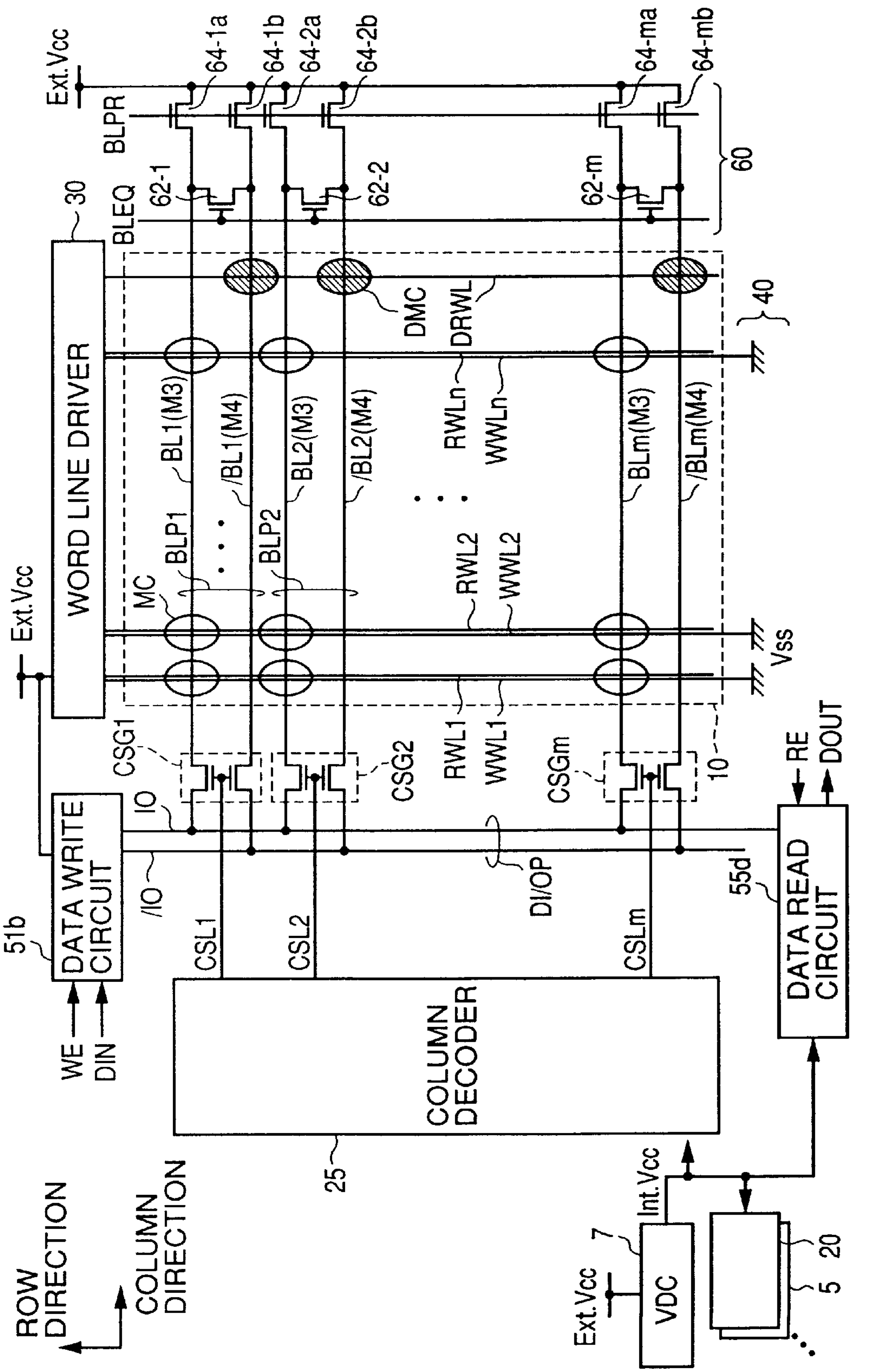
FIG. 16 is a block diagram illustrating the bit line arrangement according to a third embodiment of the present invention.

FIG. 16 shows the bit line arrangement according to the third embodiment of the present invention.

Referring to FIG. 16, the data write and read operations to and from the memory array 10 are conducted through the data I/O line pair DI/OP by the data write circuit 51*b* and the data read circuit 55*d*, respectively, based on the same structure as that of FIG. 15.

The bit lines BL1 to BLm, /BL1 to /BLm forming the bit line pairs BLP1 to BLPm, column selection gates CSG1 to CSGm, and column selection lines CSL1 to CSLm are provided corresponding to the respective memory cell columns.

The bit lines BL1 to BLm are formed in a wiring layer different from that of the bit lines /BL1 to /BLm. For example, the bit lines BL1 to BLm are each formed in a metal wiring layer M3, whereas the bit lines /BL1 to /BLm are each formed in a metal wiring layer M4.

Each memory cell MC is coupled to one bit line BL of the corresponding bit line pair. Each dummy memory cell DMC is coupled to the other bit line /BL of the corresponding bit line pair.

The read/write control circuit 60 includes equalizing transistors 62-1 to 62-*m* provided corresponding to the respective memory cell columns. The equalizing transistor 62 short-circuits the bit lines BL and /BL formed in different metal wiring layers, in response to a bit line equalizing signal BLEQ. The bit line equalizing signal BLEQ is activated/inactivated in the same manner as that described in the first embodiment.

Accordingly, in the data write operation, the data write current ±Iw for the bit line pair BLP is supplied to the bit lines BL and /BL in the selected memory cell column so as to flow in the different directions as a reciprocating current. Thus, the structure of the data write circuit 51*b* including the data write current supply circuit 52 can be applied as in the case of the first embodiment.

As a result, like the first embodiment, a return path of the data write current ±Iw can be provided by the equalizing transistor 62. Therefore, the structure for sinking the data write current need not be provided in the read/write control circuit 60, achieving reduction in layout area of the peripheral circuitry.

Figure 17:
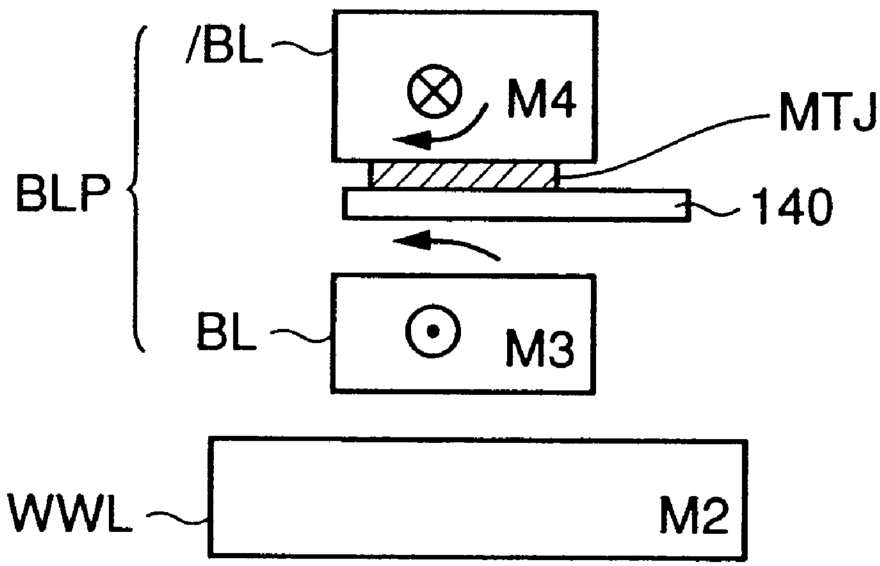
FIG. 17 is a structural diagram showing a first example of the bit line arrangement according to the third embodiment.

FIG. 17 shows a first example of the bit line arrangement according to the third embodiment.

Referring to FIG. 17, the write word line WWL is formed in a metal wiring layer M2. The bit line pair BLP has the bit line BL formed in the metal wiring layer M3 and the bit line /BL formed in the metal wiring layer M4. The bit lines BL and /BL are thus formed in the different metal wiring layers so as to interpose the magnetic tunnel junction MTJ therebetween in the vertical direction. As described before, the bit lines BL and /BL are electrically coupled to each other through the equalizing transistor 62 at the end of the memory array 10, so that the data write current flows therethrough.

Accordingly, the data write current ±Iw in the data write operation flows through the bit lines BL and /BL in the different directions. Thus, in the magnetic tunnel junction MTJ, the data write magnetic fields produced by the data write current ±Iw act in such a direction that the respective magnetic fields produced by the bit lines BL and /BL enhance each other. Accordingly, the data write current ±Iw in the data write operation can be reduced. As a result, reduced current consumption of the MRAM device, improved reliability resulting from a reduced bit line current density, and reduced magnetic field noise in the data write operation can be achieved.

On the contrary, in the peripheral portion including other memory cells, the respective magnetic fields produced by the bit lines BL and /BL act in such a direction that cancels each other. As a result, the magnetic field noise in the data write operation can further be suppressed.

Figure 18:
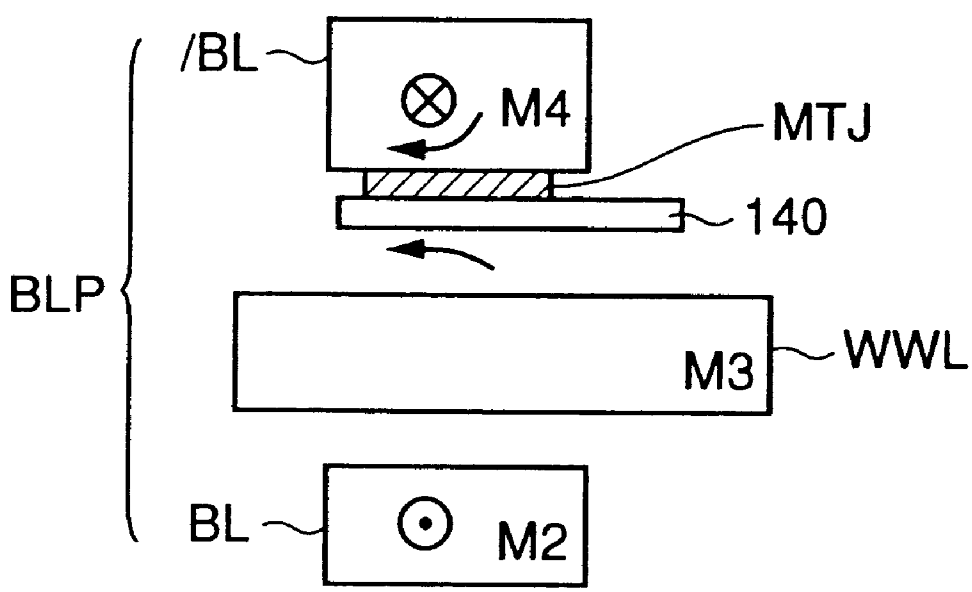
FIG. 18 is a structural diagram showing a second example of the bit line arrangement according to the third modification.

FIG. 18 shows a second example of the bit line arrangement according to the third embodiment.

Referring to FIG. 18, the write word line WWL is provided in the metal wiring layer M3. The bit lines BL and /BL are provided in the different metal wiring layers M2 and M4 so as to interpose the magnetic tunnel junction MTJ therebetween in the vertical direction. In this structure as well, the magnetic fields produced by the data write current ±Iw act in the same direction as that of FIG. 17. Thus, the same effects as those obtained with the structure of FIG. 17 can be obtained.

Referring back to FIG. 16, in the third embodiment, an external power supply voltage Ext. Vcc to the MRAM device 1 is supplied directly to the data write circuit 51*b* and the word line driver 30 for activating the write word line WWL, i.e., the components for supplying the data write current in the data write operation.

The MRAM device 1 further includes a voltage down converter (VDC) 7 for down-converting the external power supply voltage Ext. Vcc to produce an internal power supply voltage Int. Vcc.

The internal power supply voltage Int. Vcc produced by the voltage down converter 7 is supplied to the internal circuitry for conducting the data read operation and address processing, such as the data read circuit 55*d*, column decoder 25, control circuit 5 and row decoder 20.

With such a structure, the data write circuit for supplying a relatively large data write current ±Iw as well as the word line driver for supplying the data write current Ip to the write word line WWL is driven with the external power supply voltage Ext. Vcc in the data write operation. As a result, these data write currents can be supplied quickly.

On the other hand, the internal circuitry other than the circuitry for supplying the data write current is driven with the down-converted internal power supply voltage Int. Vcc. As a result, power consumption in the internal circuitry can be reduced, as well as the reliability corresponding to the shrinking of the device for improved integration can be ensured.

First Modification of Third Embodiment

Figure 19:
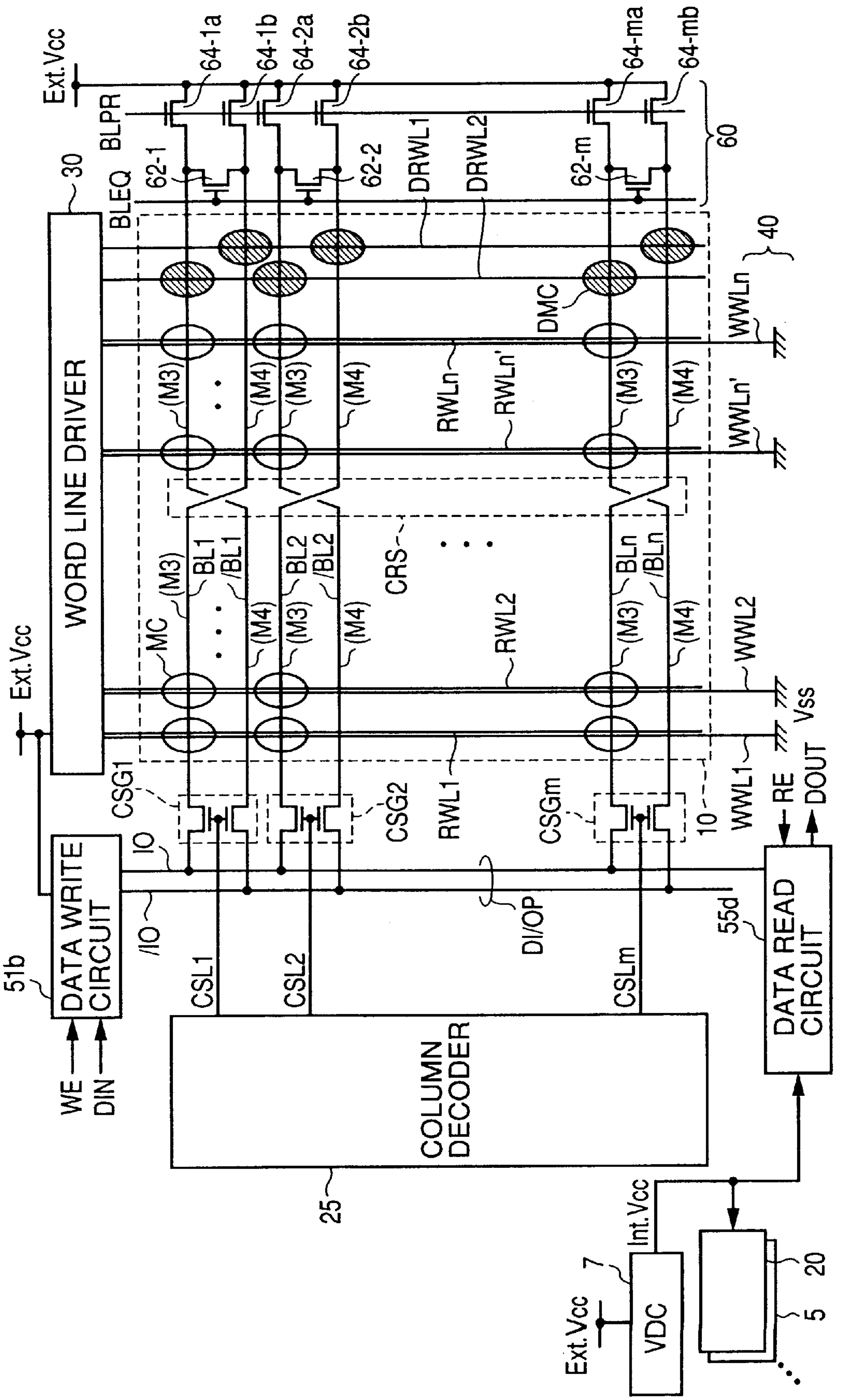
FIG. 19 is a conceptual diagram illustrating the bit line arrangement according to a first modification of the third embodiment.

Referring to FIG. 19, in the bit line arrangement according to the first modification of the third embodiment, the bit lines BL and /BL of each bit line pair BLP are provided in the metal wiring layers M3 and M4 so as to cross each other in a region CRS in the memory array 10.

More specifically, in the region located on the left side of the region CRS, the bit lines BL and /BL are respectively formed from the wirings provided in the metal wiring layers M3 and M4. In the region located on the right side of the region CRS, however, the bit lines BL and /BL are respectively formed from the wirings provided in the metal wiring layers M4 and M3.

The wirings corresponding to the bit line BL, which are formed in the metal wiring layers M3 and M4, are coupled to each other in the region CRS. Similarly, the wirings corresponding to the bit line /BL, which are formed in the metal wiring layers M3 and M4, are coupled to each other in the region CRS.

The bit lines BL and /BL are coupled to the memory cells MC in one of the metal wiring layers. In FIG. 18, the bit lines BL and /BL are coupled to the memory cells MC in the lower metal wiring layer M3 structurally having a smaller distance to the magnetic tunnel junction MTJ.

Thus, each of the memory cells MC in the same memory cell column is coupled to either the bit line BL or /BL. Accordingly, a dummy memory cells DMC coupled to the bit line BL and a dummy memory cell DMC coupled to the bit line /BL are provided in each memory cell column. A dummy read word line DRWL1 is provided in common to the dummy memory cells DMC coupled to the respective bit lines BL. Similarly, a dummy read word line DRWL2 is provided in common to the dummy memory cells DMC coupled to the respective bit lines /BL.

The equalizing transistors 62-1 to 62-*m* are provided corresponding to the respective memory cell columns, for coupling the bit lines BL and /BL of the corresponding bit line pair to each other in response to the bit line equalizing signal BLEQ.

With such a structure, a reciprocating current turning around at the equalizing transistor 62 flows through the bit lines BL and /BL in the selected memory cell column, whereby the data write operation based on the folded bit line structure can be conducted.

Thus, in the bit line arrangement of FIG. 19, the same number of memory cells can be coupled to each of the bit lines BL and /BL of each bit line pair. Therefore, the imbalance of the RC load between the bit lines BL and /BL of the same bit line pair BLP can be corrected. Moreover, since the data read operation based on the folded bit line structure can be conducted using the dummy memory cells, the data read operation margin can further be improved.

Since the structure and the basic operation in reading and writing the data are otherwise the same as those of FIG. 15, detailed description thereof will not be repeated.

Second Modification of Third Embodiment

Hereinafter, the structure in which the write word lines WWL are formed in a plurality of metal wiring layers will be described.

Figure 20:
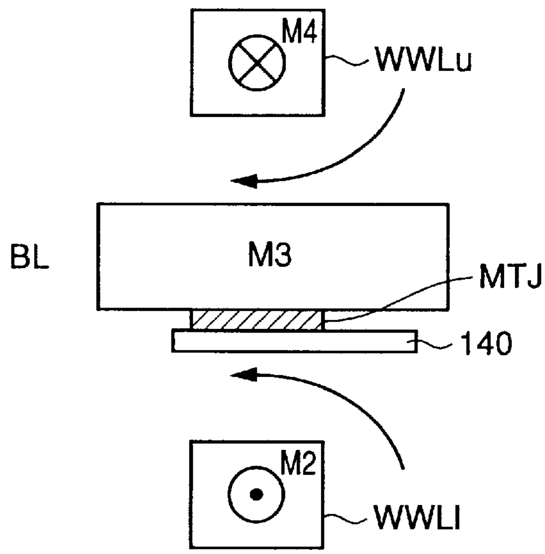
FIG. 20 is a structural diagram illustrating the arrangement of a write word line WWL according to a second modification of the third embodiment.

FIG. 20 is a structural diagram illustrating the arrangement of the write word lines WWL according to the second modification of the third embodiment.

Referring to FIG. 20, the write word line WWL include a sub write word line WWL1 formed in the metal wiring layer M2 and a sub write word line WWLu formed in the metal wiring layer M4. The sub write word lines WWL1 and WWLu are provided so as to interpose the magnetic tunnel junction MTJ therebetween in the vertical direction.

Figure 21A:
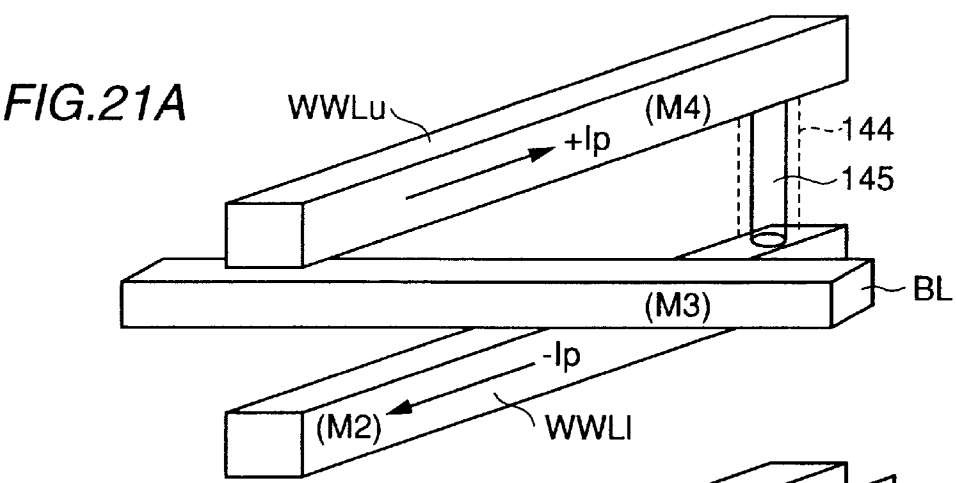
FIGS. 21A and 21B are conceptual diagrams illustrating the coupling between sub-word lines forming the same write word line.
Figure 21B:
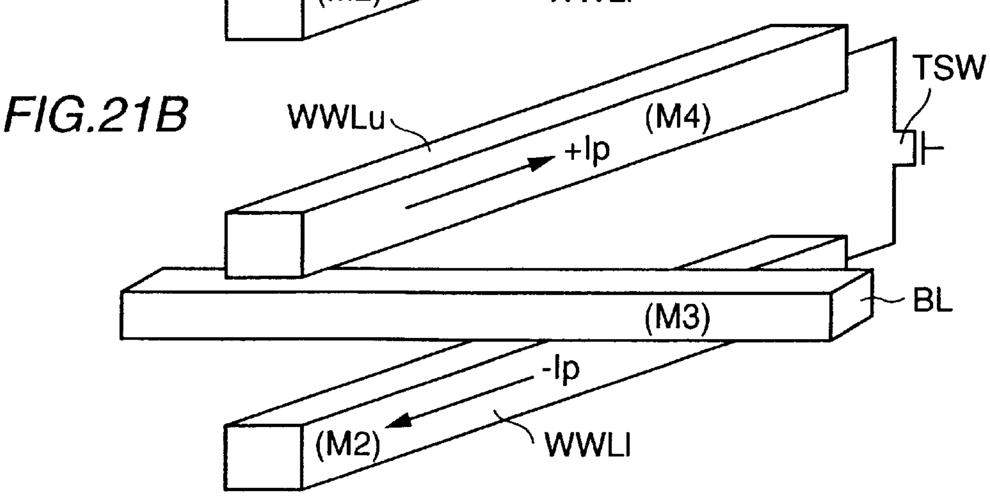

FIGS. 21A and 21B are conceptual diagrams illustrating coupling between the sub write word lines forming the same write word line WWL.

Referring to FIGS. 21A and 21B, the sub write word lines WWLu and WWL1 forming the same write word line WWL are electrically coupled to each other at the end of the memory array 10. This enables the data write current Ip to be supplied as a reciprocating current using the sub write word lines WWLu and WWL1.

In FIG. 21A, the sub write word lines WWLu and WWL1 are electrically coupled to each other through a metal wiring 145 provided in a through hole 144.

As shown in FIG. 21B, a write word line current control switch TSW formed from a MOS transistor electrically coupled between the sub write word lines WWLu and WWL1 may be provided in order to short-circuit the sub write word lines WWLu and WWL1.

Such a structure enables the data write current Ip to be supplied to the sub write word lines WWLu and WWL1 of the same write word line WWL in the opposite directions as a reciprocating current.

Referring back to FIG. 20, by applying the data write current Ip to the sub write word lines WWL1 and WWLu in the opposite directions, the respective data write magnetic fields produced at the magnetic tunnel junction MTJ by the sub write word lines WWLu and WWL1 act in the same direction, as in the case of FIGS. 16 and 17.

In the peripheral portion including other memory cells, the respective magnetic fields produced by the sub write word lines WWLu and WWL1 act in such a direction that cancels each other. Thus, with the same current value, a larger data write magnetic field can be applied to the magnetic tunnel junction MTJ. As a result, the amount of data write current required to produce a desired data write magnetic field is reduced.

Thus, reduced current consumption of the MRAM device, improved operation reliability resulting from a reduced current density of the write word line WWL, and reduced magnetic field noise in the data write operation can be realized simultaneously.

Third Modification of Third Embodiment

Figure 22:
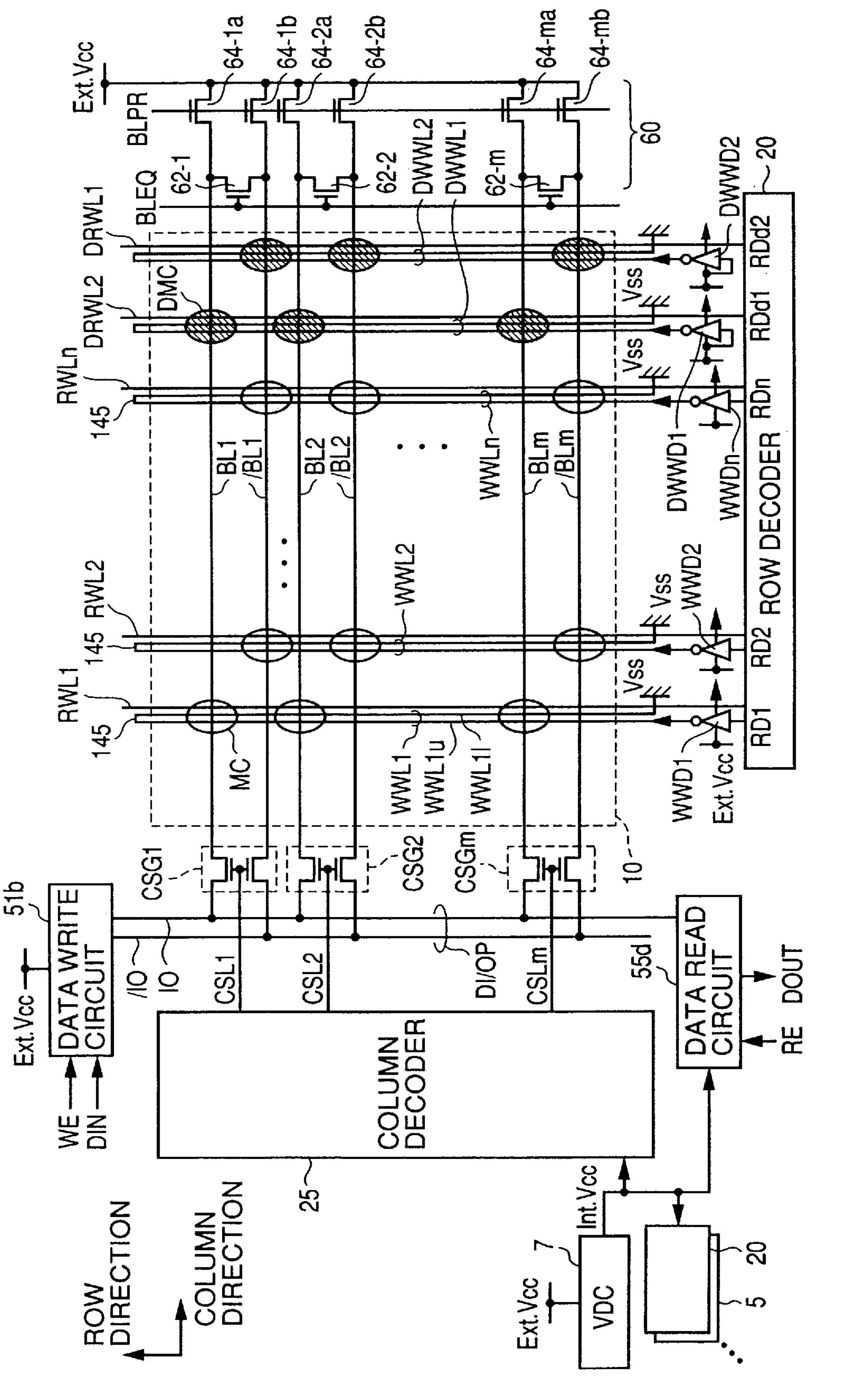
FIG. 22 is a diagram illustrating the write word line arrangement according to a third modification of the third embodiment.

Referring to FIG. 22, in the structure according to the third modification of the third embodiment, the row decoder 20 and write word drivers WWD1 to WWDn included in the word line driver 30 are provided at one end of the memory array 10 along the row direction. The write word drivers WWD1 to WWDn are provided corresponding to the respective write word lines WWL1 to WWLn, for activating the corresponding write word line WWL according to the decode result of the row decoder 20 so as to supply the data write current Ip thereto.

The write word lines WWL are arranged according to the structure shown in FIGS. 20 and 21A. More specifically, the sub write word lines WWLu and WWL1 forming the same write word line WWL are electrically coupled to each other at the other end of the memory array 10 through the metal wiring 145 in the through hole.

The write word drivers WWD1 to WWDn supply the data write current Ip to one sub write word line WWLu of the corresponding write word line WWL. The other sub write word line WWL1 forming the same write word line WWL is coupled to the ground voltage Vss at one end (on the side of the write word driver WWD) of the memory array 10.

Such a structure enables the data write current Ip for the data write operation to be supplied to the write word line WWL corresponding to the selected memory cell column as a reciprocating current using the sub write word lines WWLu and WWL1. Note that the connection between the sub write word line WWLu, WWL1 and the write word driver WWD and ground voltage Vss may be switched so that the sub write word line WWL1 is coupled to the write word driver WWD and the sub write word line WWLu is coupled to the ground voltage Vss.

Fourth Modification of Third Embodiment

Figure 23:
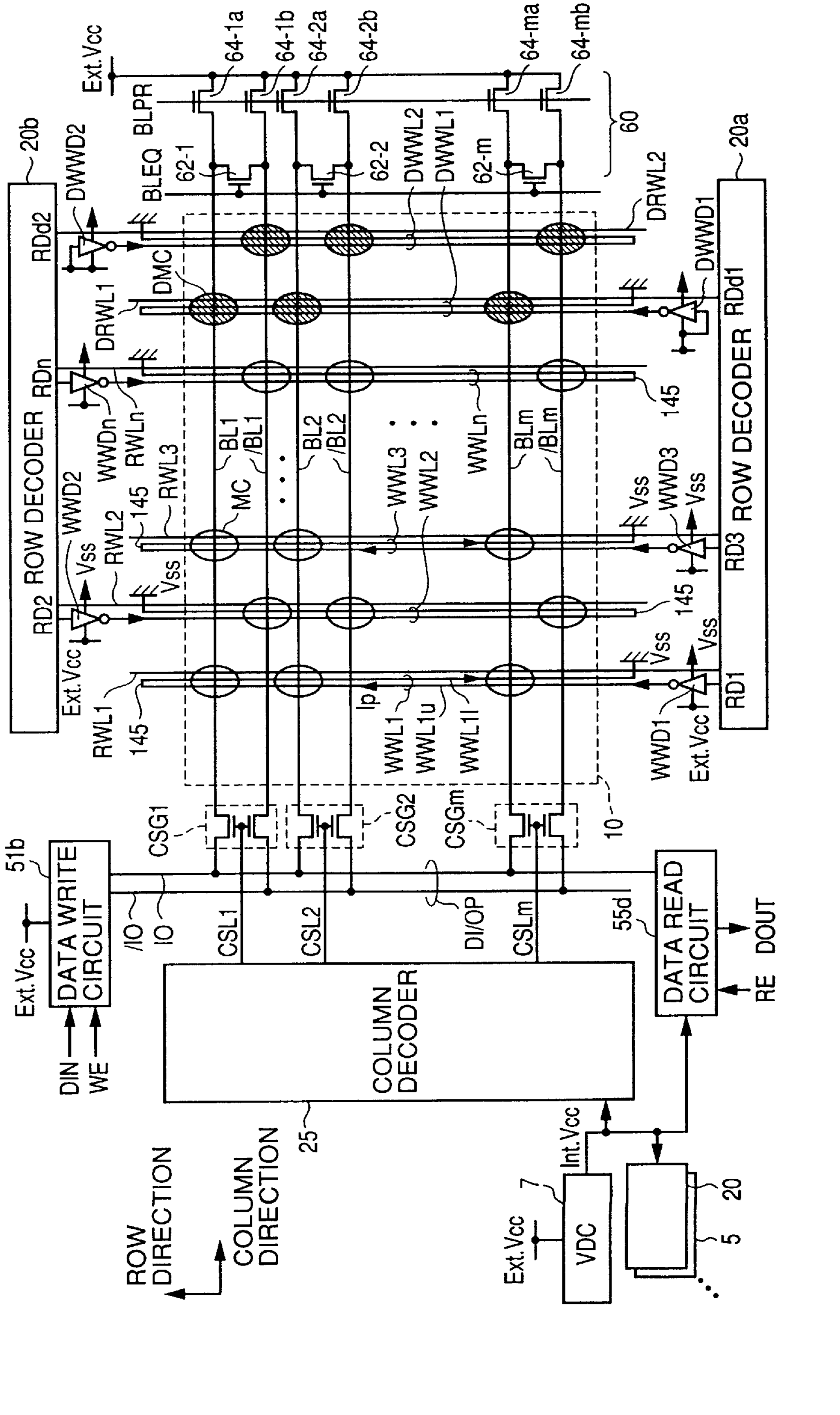
FIG. 23 is a diagram illustrating the write word line arrangement according to a fourth modification of the third embodiment.

Referring to FIG. 23, in the structure according to the fourth modification of the third embodiment, the write word drivers WWD corresponding to the respective write word lines WWL are provided separately at both ends of the memory array 10. Accordingly, the row decoder is also provided separately as a row decoder 20*a* for activating the write word drivers corresponding to the odd rows and a row decoder 20*b* for controlling the write word drivers corresponding to the even rows.

As described before, the write word driver WWD includes a transistor for supplying the data write current Ip, requiring a relatively large size. Accordingly, providing the write word drivers WWD separately on both sides of the memory array allows the layout pitch corresponding to two rows to be utilized for each write word driver WWD. This improves the integration of the write word lines WWL in the row direction, allowing for efficient reduction in area of the memory array 10.

Since the structure and operation are otherwise the same as those of FIG. 22, detailed description thereof will not be repeated.

Fifth Modification of Third Embodiment

Figure 24:
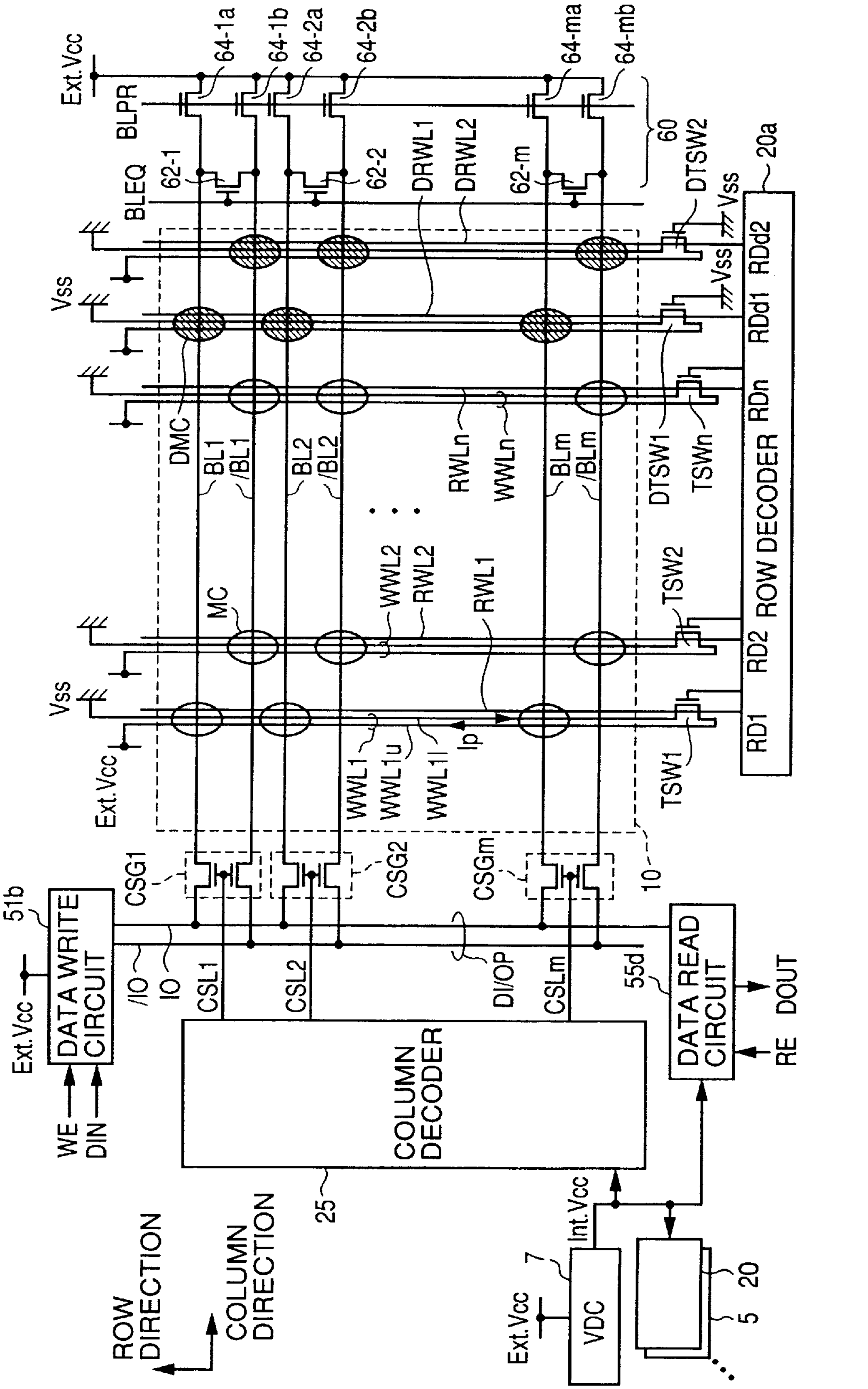
FIG. 24 is a diagram illustrating the write word line arrangement according to a fifth modification of the third embodiment.

Referring to FIG. 24, in the structure according to the fifth modification of the third embodiment, the sub write word lines WWLu to WWL1 forming the same write word line WWL are electrically coupled to each other by a corresponding write word line current control switch TSW at one end (on the side of the row decoder 20) of the memory array 10. The write word line current control switches TSW are provided corresponding to the respective memory cell rows.

FIG. 24 exemplarily shows the write word line current control switches TSW1 and TSW2 corresponding to the write word lines WWL1 and WWL2, respectively. The write word line current control switch TSW is turned ON under the control of the row decoder 20 in response to selection of the corresponding memory cell row.

The sub write word lines WWLu and WWL1 forming the same write word line WWL are respectively coupled to the power supply voltage Vcc and the ground voltage Vss at the other end of the memory array 10. Accordingly, the write word line current control switch TSW is turned ON based on the row selection result, whereby the reciprocating data write current Ip can be supplied to the sub write word lines WWLu and WWL1 of the corresponding write word line WWL. Thus, the same effects as those of the third and fourth modifications of the third embodiment can be obtained.

During the OFF period of the corresponding write word line current control switch TSW, the sub write word lines WWLu and WWL1 are respectively set to the power supply voltage Vcc and the ground voltage Vss. Accordingly, the voltage on the write word line WWL can be restored rapidly to the stand-by state or non-selected state after the operation of selecting the write word line WWL is completed.

FIG. 24 exemplarily shows the structure in which the sub write word lines WWLu and WWL1 are respectively coupled to the power supply voltage Vcc and the ground voltage Vss at the other end of the memory array 10. However, this connection may be switched such that the sub write word lines WWLu and WWL1 are respectively coupled to the ground voltage Vss and the power supply voltage Vcc.

More specifically, since the reciprocating data write current Ip is supplied in the data write operation, the write word line WWL is increased in length. However, the write word line WWL is divided into the sub write word lines WWLu and WWL1, which are restored to the respective prescribed voltage levels. Such a structure enables the write word line WWL to be restored rapidly to the stand-by state or the non-selected state while obtaining the effects resulting from supplying the data write current as a reciprocating current.

Note that, in the third to fifth modifications of the third embodiment, at least one of the dummy write word lines DWWL1, DWWL2 and write word drivers DWWD1, DWWD2 and the write word line current control switches DTSW1, DTSW2 is provided also for the dummy memory cells MC that originally do not relate to the data write operation. The dummy write word lines DWWL1, DWWL2, the write word drivers DWWD1, DWWD2, and the write word line current control switches DTSW1, DTSW2 each has the same structure as that provided for the memory cell MC.

However, since the data write current need not be supplied to the dummy memory cells DMC, the input of the write word drivers DWWD1 and DWWD2 corresponding to the dummy memory cells is fixed to the power supply voltage Vcc. Accordingly, the dummy write word line DWWL1, DWWL2 is always retained in the inactive state (ground voltage Vss), and a current is not applied thereto. Moreover, the gate of the N-type MOS transistor forming the corresponding write word line current control switch DTSW is fixed to the ground voltage Vss, so that the N-type MOS transistor is retained in the OFF state.

Providing the write word lines WWL in the memory array 10 except for the region corresponding to the dummy memory cells DMC causes lack in continuity in terms of the shape. This may possibly result in defective shape during production of the MRAM device. In order to avoid such a problem, the write word lines, write word drivers, and peripheral circuitry thereof (write word line current control switches TSW in FIG. 24) each having the same structure as that provided for the regular memory cells MC can be provided also for the dummy memory cells DMC for which the data write operation is not required.

Note that it is also possible to combine the arrangement of the bit lines and write word lines according to the third embodiment and the modifications thereof with each or both of the first and second embodiments. In this case, the data write circuit and the data read circuit need only be structured as described in the first and second embodiments and the modifications thereof.

Fourth Embodiment

Figure 25:
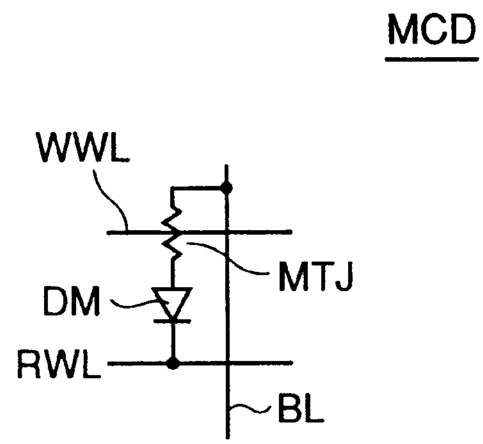
FIG. 25 is a diagram showing the structure of an MTJ memory cell according to a fourth embodiment of the present invention.
Figure 90:
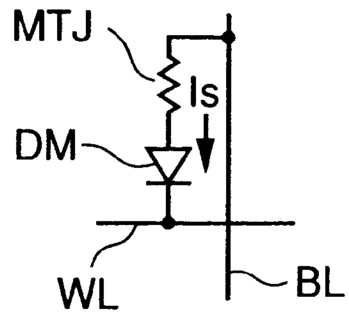
FIG. 90 is a schematic diagram showing the structure of an MTJ memory cell using a diode.

Referring to FIG. 25, an MTJ memory cell MCD according to the fourth embodiment includes a magnetic tunnel junction MTJ and an access diode DM, as in the structure of FIG. 90. The MTJ memory cell MCD is different from that of FIG. 90 in that the read word line RWL and the write word line WWL are separately provided. The bit line BL extends in such a direction that crosses the write word lines WWL and the read word line RWL, and is electrically coupled to the magnetic tunnel junction MTJ.

The access diode DM is coupled between the magnetic tunnel junction MTJ and the read word line RWL. Herein, the direction from the magnetic tunnel junction MTJ toward the read word line RWL is a forward direction. The write word line WWL is provided near the magnetic tunnel junction MTJ without being connected to the bit line BL, read word line RWL and access diode DM.

Figure 26:
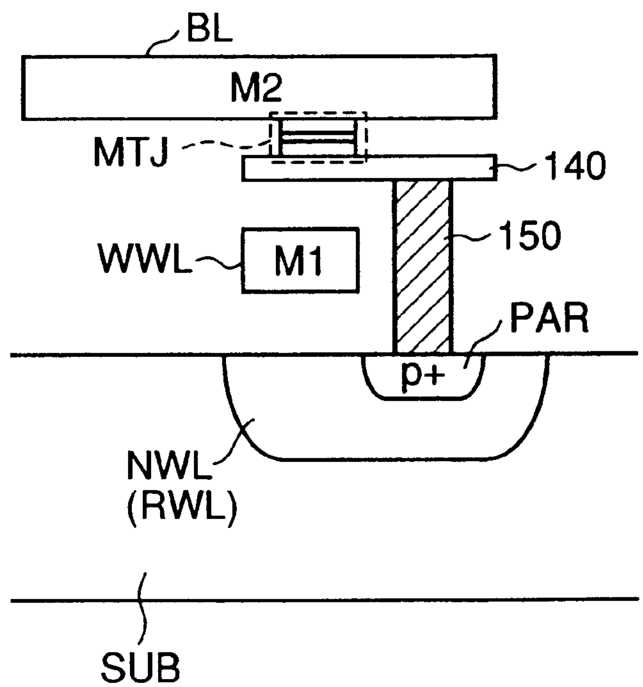
FIG. 26 is a structural diagram of the MTJ memory cell of FIG. 25 provided on a semiconductor substrate.

Referring to FIG. 26, an N-type region (N-well, $n^+$ diffusion region, or the like) NWL formed at the semiconductor main substrate SUB corresponds to the cathode of the access diode DM. In the case where the MTJ memory cells are arranged in rows and columns on the semiconductor substrate, the N-type regions NWL for the MTJ memory cells in the same row may be electrically coupled to each other. Thus, the coupling between the access diode DM and the read word line RWL as shown in FIG. 25 can be implemented without providing the read word line RWL.

A P-type region PAR formed at the N-type region NWL corresponds to the anode of the access diode DM. The P-type region PAR is electrically coupled to the magnetic tunnel junction MTJ through a barrier metal 140 and a metal film 150.

The write word line WWL and the bit line BL are respectively provided in the metal wiring layers M1 and M2. The bit line BL is coupled to the magnetic tunnel junction MTJ.

Figure 27:
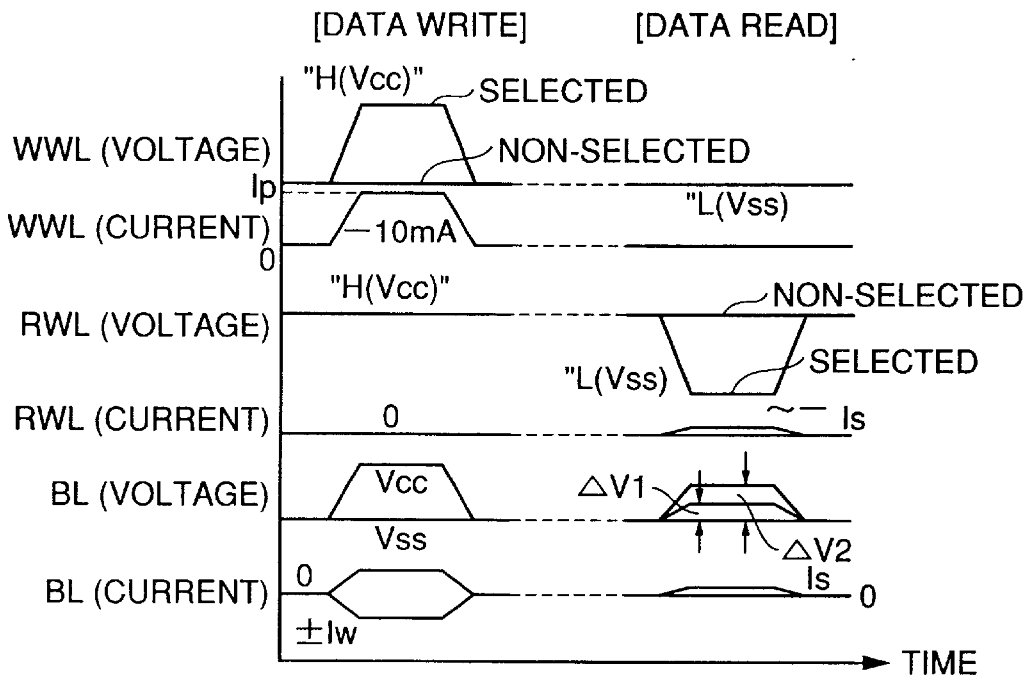
FIG. 27 is a timing chart illustrating the read and write operations from and to the MTJ memory cell of FIG. 25.

FIG. 27 is a timing chart illustrating the read and write operations from and to the MTJ memory cell MCD.

Referring to FIG. 27, in the data write operation, the voltage on the read word line RWL, i.e., the N-type region NWL, is set to H level (power supply voltage Vcc). In the data read operation, no current flow through the read word line RWL.

The power supply voltage Vcc is applied to the write word line WWL corresponding to the selected memory cell, so that the data write current Ip flows therethrough. According to the write data level, the bit line BL is set to the power supply voltage Vcc at its one end and to the ground voltage Vss at the other end. Thus, the data write current ±Iw corresponding to the write data level can be supplied to the bit line BL.

With the data write currents Ip and ±Iw thus supplied, the data is written to the MTJ memory cell. In this case, the read word line RWL is set to the power supply voltage Vcc, so that the access diode DM is reliably turned OFF in the data write operation. As a result, the data write operation can be conducted more stably as compared to the case of the MTJ memory cell shown in FIG. 90.

Hereinafter, the data read operation will be described.

Before the data read operation, the bit lines BL are precharged to the ground voltage Vss.

The read word line RWL corresponding to the memory cell MCD to be read is driven to the active state (L level: ground voltage Vss) in the data read operation. In response to this, the access diode DM is biased in the forward direction. Thus, the sense current Is is supplied to a path formed from the bit line BL, magnetic tunnel junction MTJ, access diode DM and read word line RWL (ground voltage Vss), enabling the data read operation.

More specifically, a voltage change produced on the bit line BL is amplified with the sense amplifier Is, so that the storage data in the magnetic tunnel junction MTJ can be read.

Note that, as shown in FIG. 26, the distance between the bit line BL and the magnetic tunnel junction MTJ is smaller than that between the write word line WWL and the magnetic tunnel junction MTJ. Therefore, with the current amount being the same, the magnetic field produced by the data write current flowing through the bit line BL is larger than that produced by the data write current flowing though the write word line WWL.

In order to apply the data write magnetic fields of approximately the same strength to the magnetic tunnel junction MTJ, a larger data write current must be supplied to the write word line WWL than to the bit line BL. The bit line BL and the write word line WWL are formed in the metal wiring layers in order to reduce the electrical resistance value. However, an excessive current density in the wirings may possibly cause disconnection or short-circuit of the wirings due to the electromigration phenomenon, thereby possibly degrading the operation reliability. It is therefore desirable to suppress the current density of the wirings receiving the data write current.

Accordingly, in the case where the MTJ memory cell MCD shown in FIG. 25 is provided on the semiconductor substrate, the cross sectional area of the write word line WWL is made larger than that of the bit line BL located closer to the magnetic tunnel junction MTJ, in order to suppress the current density of the write word line WWL to which a larger data write current must be supplied. Thus, improved reliability of the MRAM device can be achieved.

For the improved reliability, it is also effective to form a metal wiring located farther from the magnetic tunnel junction MTJ and thus requiring a larger data write current to be supplied thereto (i.e., the write word line WWL in FIG. 26), from a highly electromigration-resistant material. For example, in the case where the other metal wirings are formed from an aluminum alloy (Al alloy), the metal wirings that may be subjected to electromigration may be formed from copper (Cu).

Figure 28:
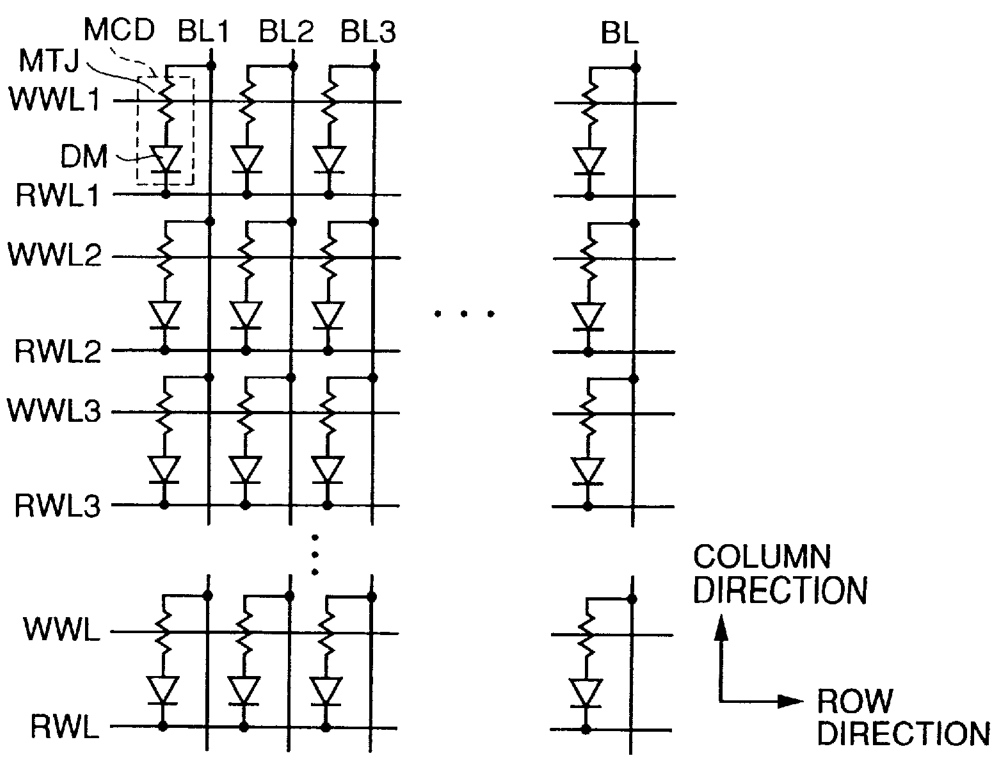
FIG. 28 is a conceptual diagram showing the structure of a memory array having the MTJ memory cells of FIG. 25 arranged in rows and columns.

FIG. 28 is a conceptual diagram showing the memory array structure having the MTJ memory cells MCD arranged in rows and columns.

Referring to FIG. 28, with the MTJ memory cells arranged in rows and columns on the semiconductor substrate, a highly integrated MRAM device can be realized. FIG. 28 shows the case where the MTJ memory cells MCD are arranged in n rows by m columns.

As described before, the bit line BL, write word line WWL and read word line RWL must be provided for each MTJ memory cell MCD. Accordingly, n write word lines WWL1 to WWLn, n read word lines RWL1 to RWLn, and m bit lines BL1 to BLm are provided for the MTJ memory cells arranged in n rows by m columns.

Figure 29:
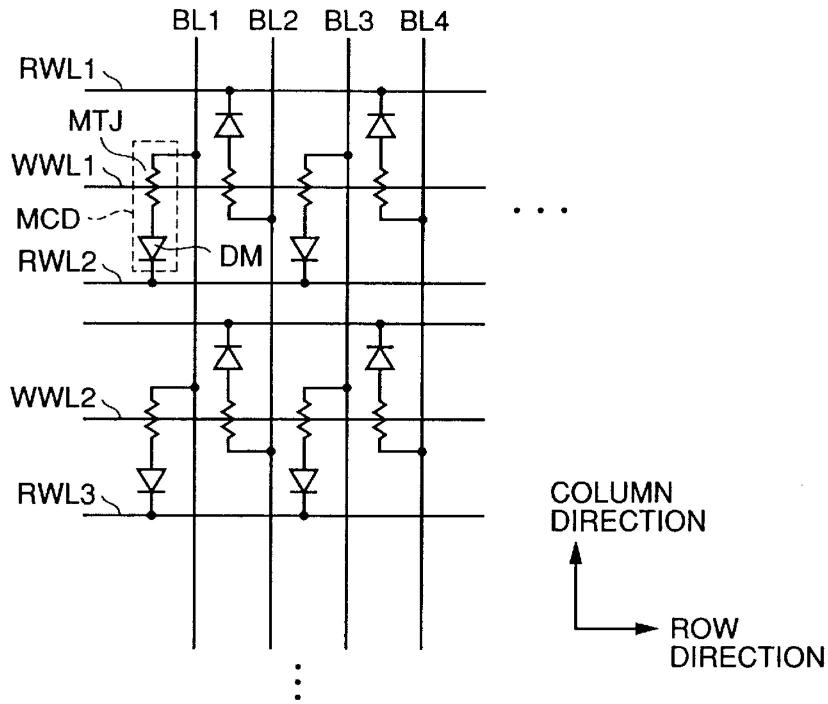
FIG. 29 is a conceptual diagram showing the structure of a memory array in which the MTJ memory cells arranged in rows and columns share write word lines WWL.

FIG. 29 shows the memory array structure in which the MTJ memory cells MCD arranged in rows and columns share the write word lines WWL.

Referring to FIG. 29, the read word lines RWL and write word lines WWL provided for the MTJ memory cells MCD having the structure of FIG. 25 extend in the row direction. Each write word line WWL is shared between adjacent memory cells.

For example, the MTJ memory cell coupled to the read word line RWL1 and the MTJ memory cell coupled to the read word line RWL2 share the same write word line WWL1.

Such sharing of the write word lines WWL can reduce the number of write word lines WWL in the whole memory array. Thus, improved integration of the MTJ memory cells in the memory array as well as reduced chip area can be achieved.

Such a reduced number of write word lines WWL also ensures the wiring pitch of the write word lines WWL in the metal wiring layer M1 shown in FIG. 26. Accordingly, an increased wiring width of the write word line WWL can be readily obtained. This makes it easy to make the cross sectional area of the write word line WWL larger that of the bit line BL located closer to the magnetic tunnel junction MTJ. As a result, the electromigration can be suppressed, whereby improved reliability of the MRAM device can be readily achieved.

Moreover, the MTJ memory cells MCD according to the fourth embodiment may be used in the first to third embodiments as memory cells MC arranged in the memory array 10.

Modification of Fourth Embodiment

Such sharing of the wirings can be applied to the conventional MTJ memory cell having the structure shown in FIG. 90.

Figure 30:
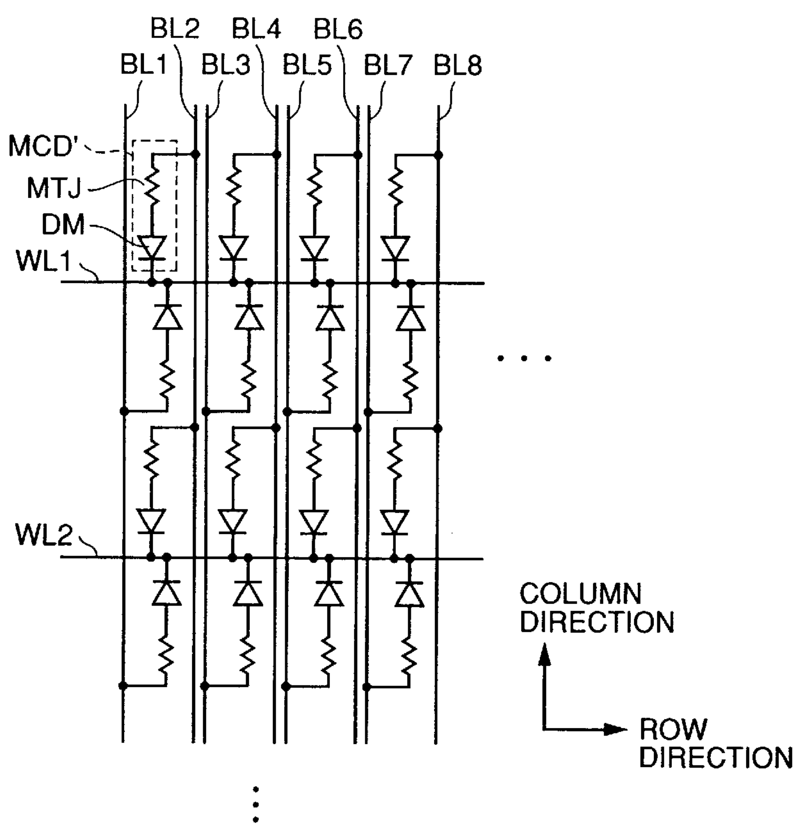
FIG. 30 is a conceptual diagram showing the MTJ memory cell arrangement according to a modification of the fourth embodiment.

FIG. 30 shows the arrangement of the MTJ memory cells according to the modification of the fourth embodiment.

FIG. 30 shows a memory array integrating MTJ memory cells MCD' having the structure shown in FIG. 90.

Referring to FIG. 30, in the memory array having the MTJ memory cells MCD' arranged in rows and columns according to the modification of the fourth embodiment, adjacent memory cell MCD' in the column direction share the same word line WL. For example, the memory cell MCD' of the first memory cell row and the memory cell MCD' of the second memory cell row share the same word line WL1.

Such a structure reduces the number of word lines WL in the entire memory array, whereby improved integration of the MTJ memory cells as well as reduced chip area can be achieved.

Figure 91:
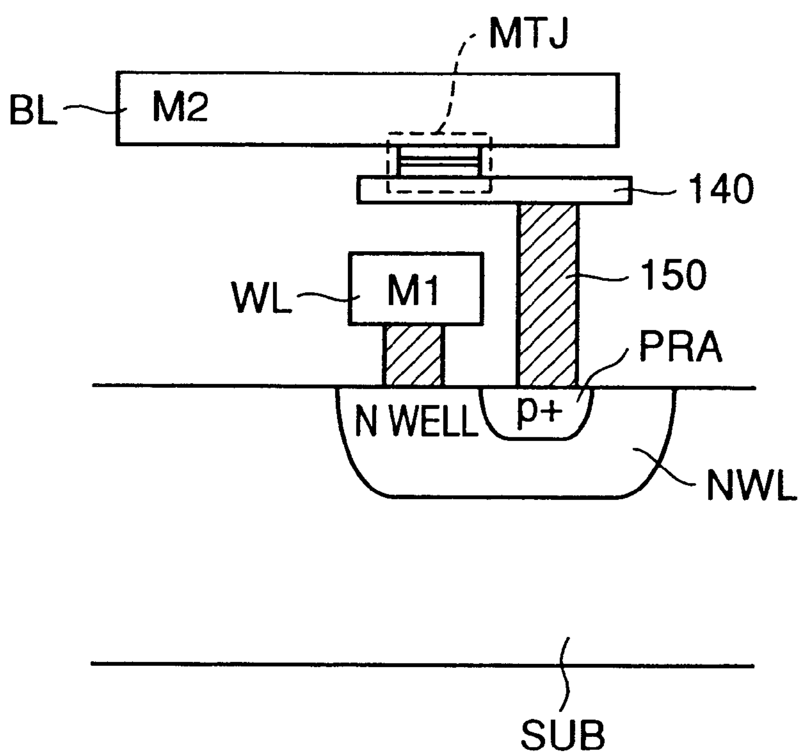
FIG. 91 is a structural diagram of the MTJ memory cell of FIG. 90 provided on a semiconductor substrate.

Referring back to FIG. 91, in the MTJ memory cell of FIG. 90 as well, the distance between the word line WL and the magnetic tunnel junction MTJ is larger than that between the bit line BL and the magnetic tunnel junction MTJ. Accordingly, a larger data write current must be supplied to the word line WL. In order to ensure the operation reliability, it is important to reduce the current density on the word line WL in such an MTJ memory cell.

In the modification of the fourth embodiment, the wiring pitch of the word lines WL requiring a larger data write current can be readily ensured. Accordingly, the current density on the word line WL is suppressed, whereby the improved reliability of the MRAM device can be achieved. As described in the fourth embodiment, the operation reliability of the MRAM device can further be improved by using a higher electromigration-resistant material to form the wiring to which a larger data rite current must be supplied.

Fifth Embodiment

In the fifth and the following embodiments, improved integration of the memory array is described for the case where the read word line RWL and the write word line WWL extend in different directions.

Figure 31:
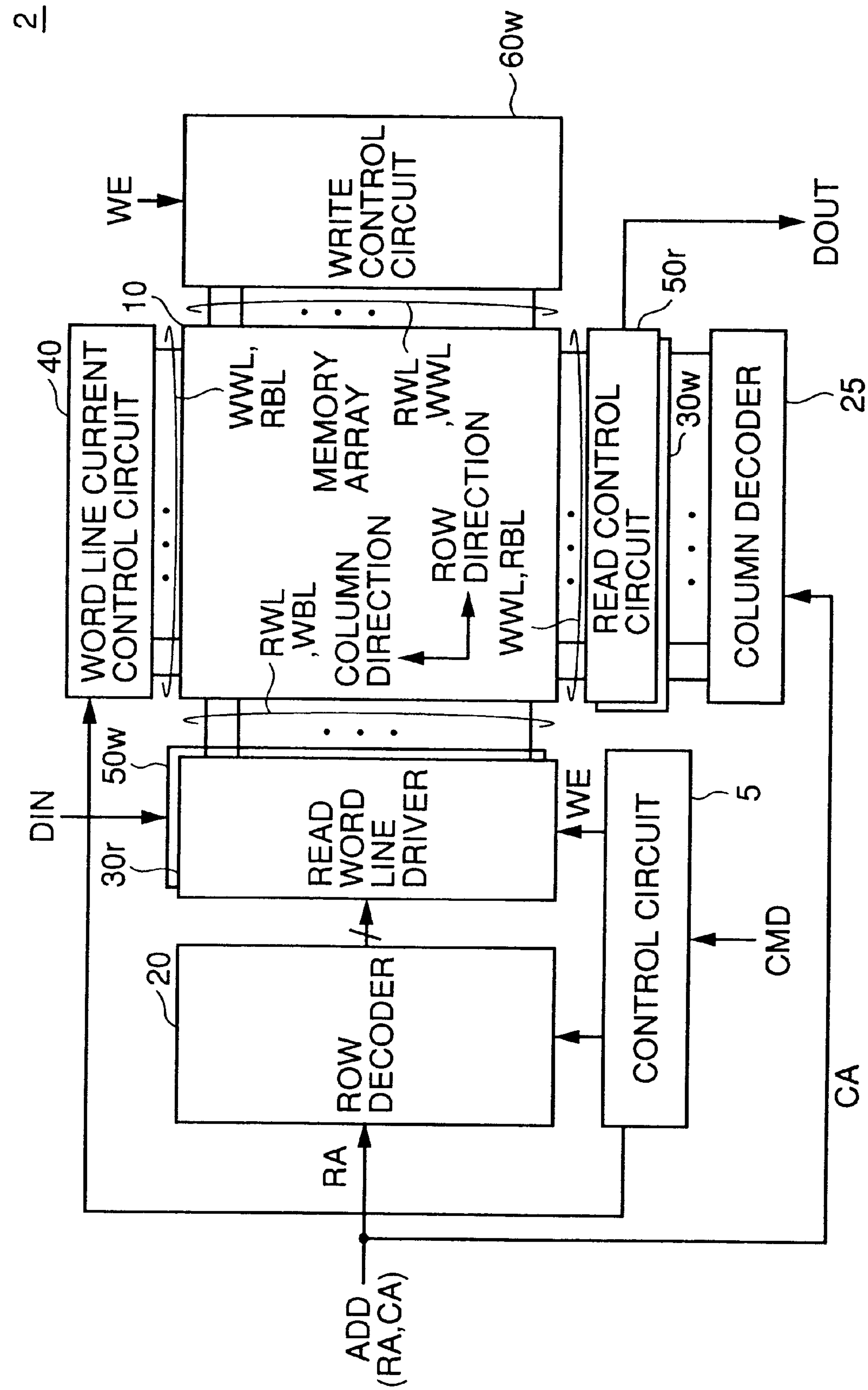
FIG. 31 is a schematic block diagram showing the overall structure of an MRAM device 2 according to a fifth embodiment of the present invention.

Referring to FIG. 31, in an MRAM device 2 according to the fifth embodiment of the present invention, the read word lines RWL and the write word lines WWL respectively extend in the row and column directions on the memory array 10.

The bit lines are correspondingly divided into read bit lines RBL and write bit lines WBL, so that the read bit lines RBL and the write bit lines WBL respectively extend in the column and row directions on the memory array 10.

Accordingly, the MRAM device 2 is different from the MRAM device 1 of FIG. 1 in that the word line driver 30 is divided into a read word line driver **30*r* and a write word line driver 30*w***.

The read/write control circuits 50, 60 are also divided into write control circuits **50*w*, 60*w* provided adjacent to the memory array 10 in the row direction, and a read control circuit 50*r***.

Since the structure and operation are otherwise the same as those of the MRAM device 1, detailed description thereof will not be repeated.

Figure 32:
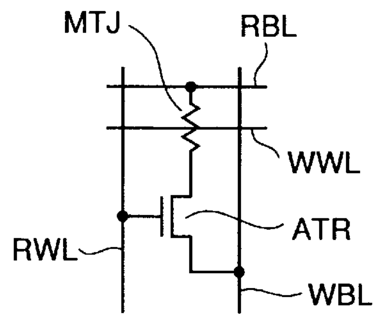
FIG. 32 is a circuit diagram showing the connection of an MTJ memory cell according to the fifth embodiment.

Referring to FIG. 32, in the fifth embodiment, the read word line RWL, write word line WWL, write bit line WBL and read bit line RBL are provided for the MTJ memory cell having the magnetic tunnel junction MTJ and access transistor ATR. A MOS transistor, which is a field effect transistor formed on the semiconductor substrate SUB, is typically used for the access transistor ATR.

The access transistor ATR has its gate coupled to the read word line RWL. The access transistor ATR is turned ON (actuated) in response to activation of the read word line RWL to the selected state (H level: power supply voltage Vcc), forming a current path including the magnetic tunnel junction MTJ. On the other hand, when the read word line RWL is inactivated to the non-selected state (L level: ground voltage Vss), the access transistor ATR is turned OFF.

Therefore, the current path including the magnetic tunnel junction MTJ is not formed.

Thus, by providing the read word line RWL and the write word line WWL extending perpendicularly to each other, the read word line driver 30$r$ and the write word line driver 30$w$ can be provided separately.

The write word line WWL and the write bit line WBL extend perpendicular to each other near the magnetic tunnel junction MTJ.

The write word line WWL can be provided independently without being coupled to other portions of the MTJ memory cell. Accordingly, the write word line WWL can be arranged for improved magnetic coupling with the magnetic tunnel junction MTJ. Thus, the data write current Ip flowing through the write word line WWL can be suppressed.

Since the respective activation of the read word line RWL and the write word line WWL is controlled independently in the data read and write operations, their respective drivers can be originally designed as independent drivers. Accordingly, the write word line driver 30$w$ and the read word line driver 30$r$ each having a reduced size can be separately provided in different regions adjacent to the memory array 10. As a result, the freedom of layout is improved, whereby the layout area, i.e., the chip area of the MRAM device, can be reduced.

The magnetic tunnel junction MTJ is electrically coupled between the read bit line RBL and the access transistor ATR. Accordingly, in the data read operation, the voltage level on the write bit line WBL that requires no current supply is set to the ground voltage Vss. As a result, a current path is formed by the read bit line RBL, magnetic tunnel junction MTJ, access transistor ATR and write bit line WBL (ground voltage Vss) in response to turning-ON of the access transistor ATR. In response to the sense current Is supplied to this current path, a voltage change corresponding to the storage data level in the magnetic tunnel junction MTJ is produced on the read bit line RBL, whereby the storage data can be read.

Figure 86:
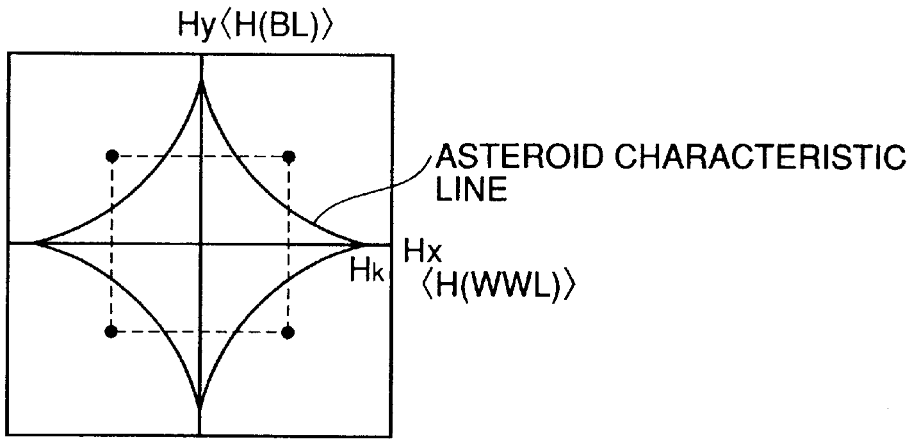
FIG. 86 is a conceptual diagram illustrating the relation between the direction of a data write current and the direction of a magnetic field in the data write operation.
Figure 87:
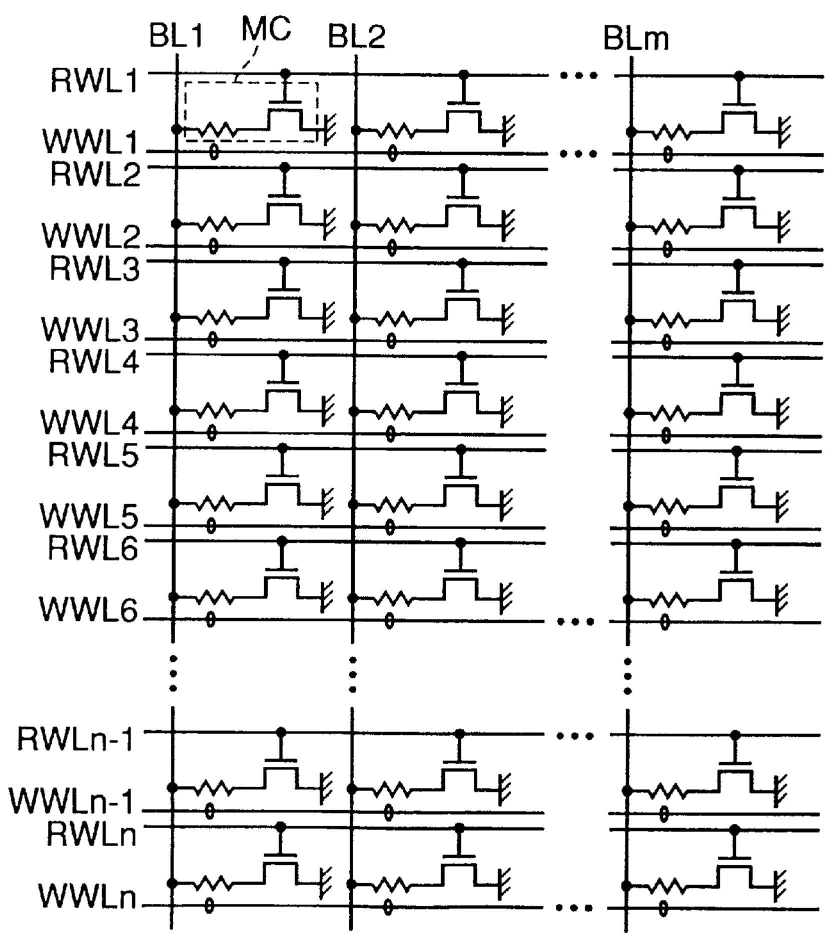
FIG. 87 is a conceptual diagram showing the MTJ memory cells arranged in rows and columns in an integrated manner.
Figure 88:
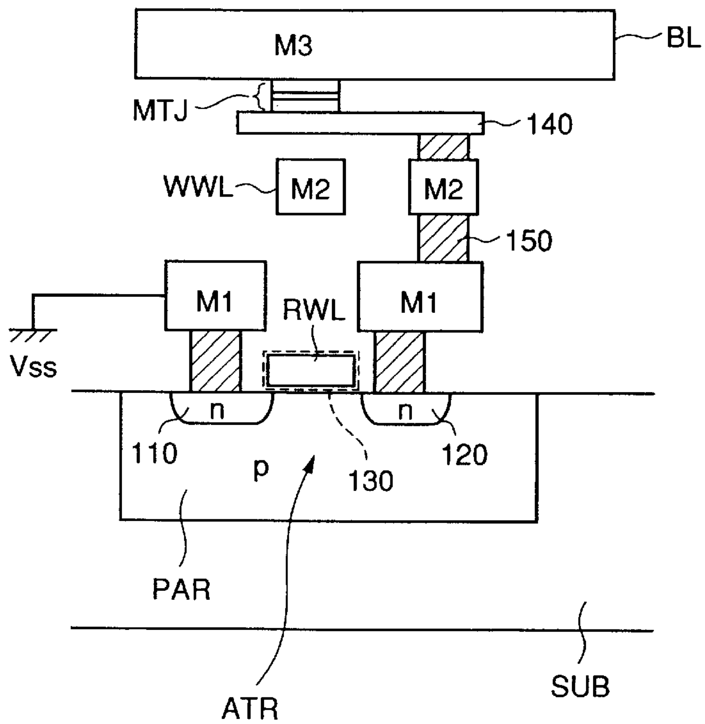
FIG. 88 is a structural diagram of the MTJ memory cell provided on a semiconductor substrate.
Figure 89:
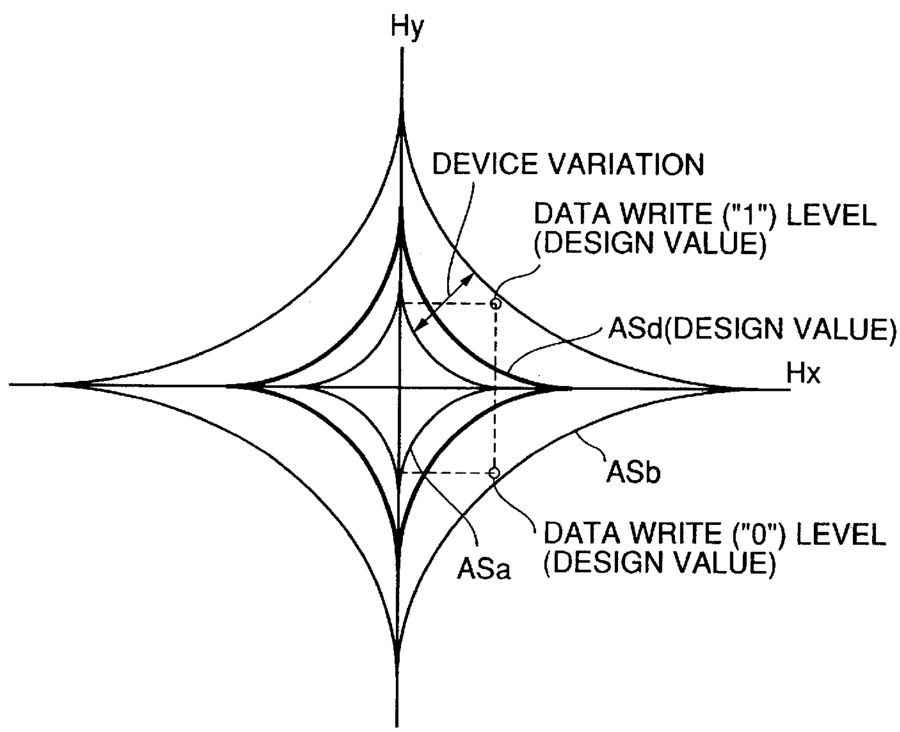
FIG. 89 is a conceptual diagram illustrating the effects of the manufacturing variation on the data write margin.

In the data write operation, the data write current is supplied to each of the write word line WWL and the write bit line WBL. When the sum of the magnetic fields produced by these data write currents reaches a fixed magnetic field, i.e., the region beyond the asteroid characteristic line shown in FIG. 86, the storage data is written to the magnetic tunnel junction MTJ.

Hereinafter, the data write and read operations to and from the MTJ memory cell according to the fifth embodiment will be described with reference to FIG. 33.

First, the data write operation will be described.

According to the column selection result of the column decoder 25, the write word line driver 30$w$ drives the voltage on the write word line WWL corresponding to the selected column to the selected state (H level). In the non-selected columns, the voltage levels on the write word lines WWL are retained in the non-selected state (L level). Since each write word line WWL is coupled to the ground voltage Vss by the word line current control circuit 40, the data write current Ip flows through the write word line WWL of the selected column.

In the data write operation, the read word lines RWL are retained in the non-selected state (L level). In the data write operation, the read control circuit 50$r$ does not supply the sense current Is, but precharges the read bit lines RBL to the high voltage state (Vcc). Since the access transistors ATR are retained in the OFF state, no current flows through the read bit lines RBL in the data write operation.

The write control circuits 50$w$ and 60$w$ control the voltage on the write bit line WBL at both ends of the memory array 10, thereby producing a data write current in the direction corresponding to the level of the write data DIN.

For example, in order to write the storage data "1", the bit line voltage on the side of the write control circuit 60$w$ is set to the high voltage state (power supply voltage Vcc), and the bit line voltage on the opposite side, i.e., on the side of the write control circuit 50$w$, is set to the low voltage state (ground voltage Vss). As a result, the data write current ±Iw flows through the write bit line WBL from the write control circuit 60$w$ toward 50$w$.

In order to write the storage data "0", the bit line voltages on the side of the write control circuits 50$w$ and 60$w$ are respectively set to the high and low voltage states, whereby the data write current −Iw flows through the write bit line WBL from the write control circuit 50$w$ toward 60$w$. At this time, the data write current ±Iw is selectively applied to the write bit line WBL corresponding to the selected row, according to the row selection result of the row decoder 20.

By setting the directions of the data write currents Ip and ±Iw in this way, one of the data write currents +Iw and −Iw of the opposite directions is selected according to the storage data level "1" or "0" to be written, and the data write current Ip on the write word line WWL can be made to flow in the fixed direction regardless of the data level. Thus, the data write current Ip flowing through the write word line WWL can be always kept in the fixed direction. As a result, the structure of the word line current control circuit 40 can be simplified, as described before.

Next, the data read operation will be described.

In the data read operation, the write word lines WWL are retained in the non-selected state (L level), and the voltage level thereof is fixed to the ground voltage Vss by the word line current control circuit 40. In the data read operation, the write control circuits 50$w$ and 60$w$ discontinue supply of the data write current to the write bit line WBL, and set the write bit lines WBL to the ground voltage Vss.

The read word line driver 30$r$ drives the read word line RWL corresponding to the selected row to the selected state (H level), according to the row selection result of the row decoder 20. In the non-selected rows, the voltage levels on the read word lines RWL are retained in the non-selected state (L level). In the data read operation, the read control circuit 50$r$ supplies the read bit line RBL of the selected column with a fixed amount of sense current Is for conducting the data read operation. The read bit lines RBL are precharged to the high voltage state (Vcc) before the data read operation. Therefore, when the access transistor ATR is turned ON in response to activation of the read word line RWL, a current path of the sense current Is is formed within the MTJ memory cell, whereby a voltage change (drop) corresponding to the storage data is produced on the read bit line RBL.

Figure 33:
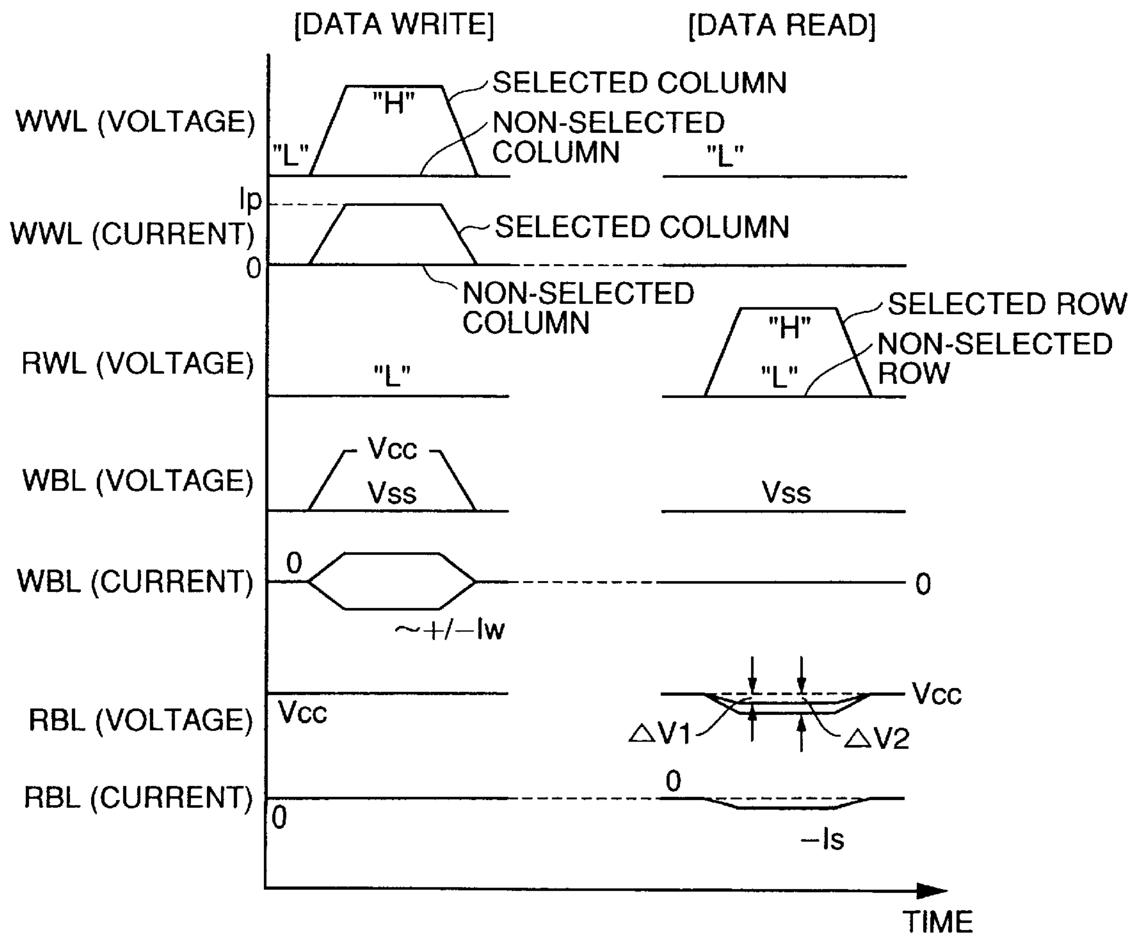
FIG. 33 is a timing chart illustrating the data read and write operations from and to the MTJ memory cell according to the fifth embodiment.

It is now assumed in FIG. 33 that the fixed magnetic layer FL and the free magnetic layer VL have the same magnetic field direction when the storage data level is "1". In this case, the read bit line RBL has a small voltage change ΔV1 when the storage data is "1", and has a voltage change ΔV2 larger than ΔV1 when the storage data is "0". The storage data of the MTJ memory cell can be read by sensing the difference between the voltage drops ΔV1 and ΔV2.

In the data write operation, the read bit lines RBL are set to the same voltage as the precharge voltage for the data read operation, i.e., the power supply voltage Vcc. This enables the precharging operation for the read data operation to be conducted efficiently, increasing the data read operation speed. Note that, when the precharge voltage of the read bit lines RBL is set to the ground voltage Vss, the read bit lines RBL need only be set to the ground voltage Vss in the data write operation.

Similarly, the write bit lines WBL, which must be set to the ground voltage Vss in the data read operation, can be set to the ground voltage Vss after the data write operation, in order to increase the data read speed.

Figure 34:
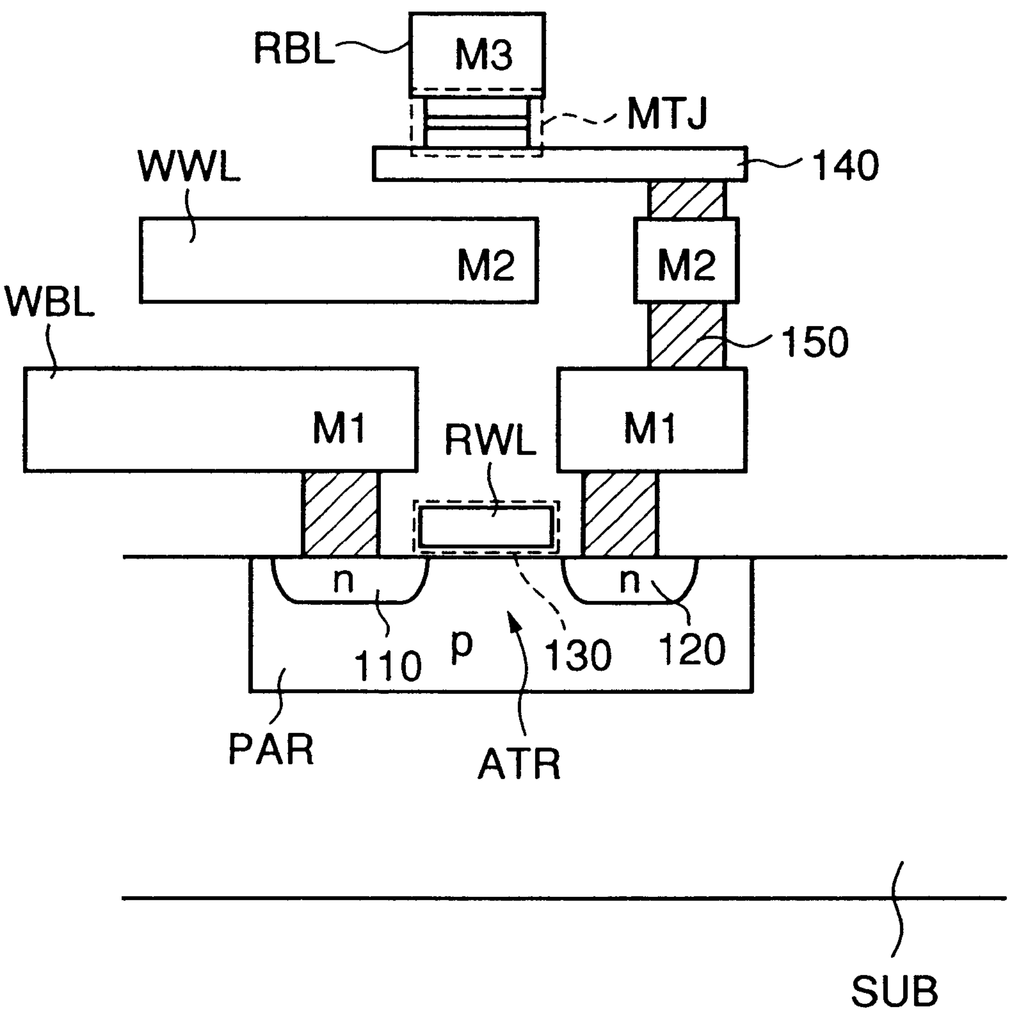
FIG. 34 is a structural diagram illustrating the MTJ memory cell arrangement according to the fifth embodiment.

Referring to FIG. 34, in the MTJ memory cell according to the fifth embodiment, the access transistor ATR is formed in a p-type region PAR of the semiconductor substrate SUB. The write bit line WBL is formed in a first metal wiring layer M1 so as to be electrically coupled to one of the source/drain regions, i.e., 110, of the access transistor ATR. The other source/drain region 120 is electrically coupled to the magnetic tunnel junction MTJ through a metal wiring provided in the first metal wiring layer M1, a barrier metal 140 and a metal film 150 formed in a contact hole.

The read bit line RBL is provided in a third metal wiring layer M3 so as to be electrically coupled to the magnetic tunnel junction MTJ. The write word line WWL is provided in a second metal wiring layer M2. The write word line WWL can be independently provided without being coupled to other portions of the MTJ memory cell. Therefore, the write word line WWL can be arbitrarily arranged so as to enhance the magnetic coupling with the magnetic tunnel junction MTJ.

With such a structure, the read word line RWL and the write word line WWL are provided for the MTJ memory cell so as to extend perpendicularly to each other, and the read word line driver 30*r* and write word line driver 30*w* respectively corresponding to the read word line RWL and write word line WWL are independently provided. Thus, the freedom of layout can be improved. Moreover, a word line drive current is prevented from being excessively increased in the data read operation, whereby generation of undesirable magnetic noise can be prevented.

Figure 35:
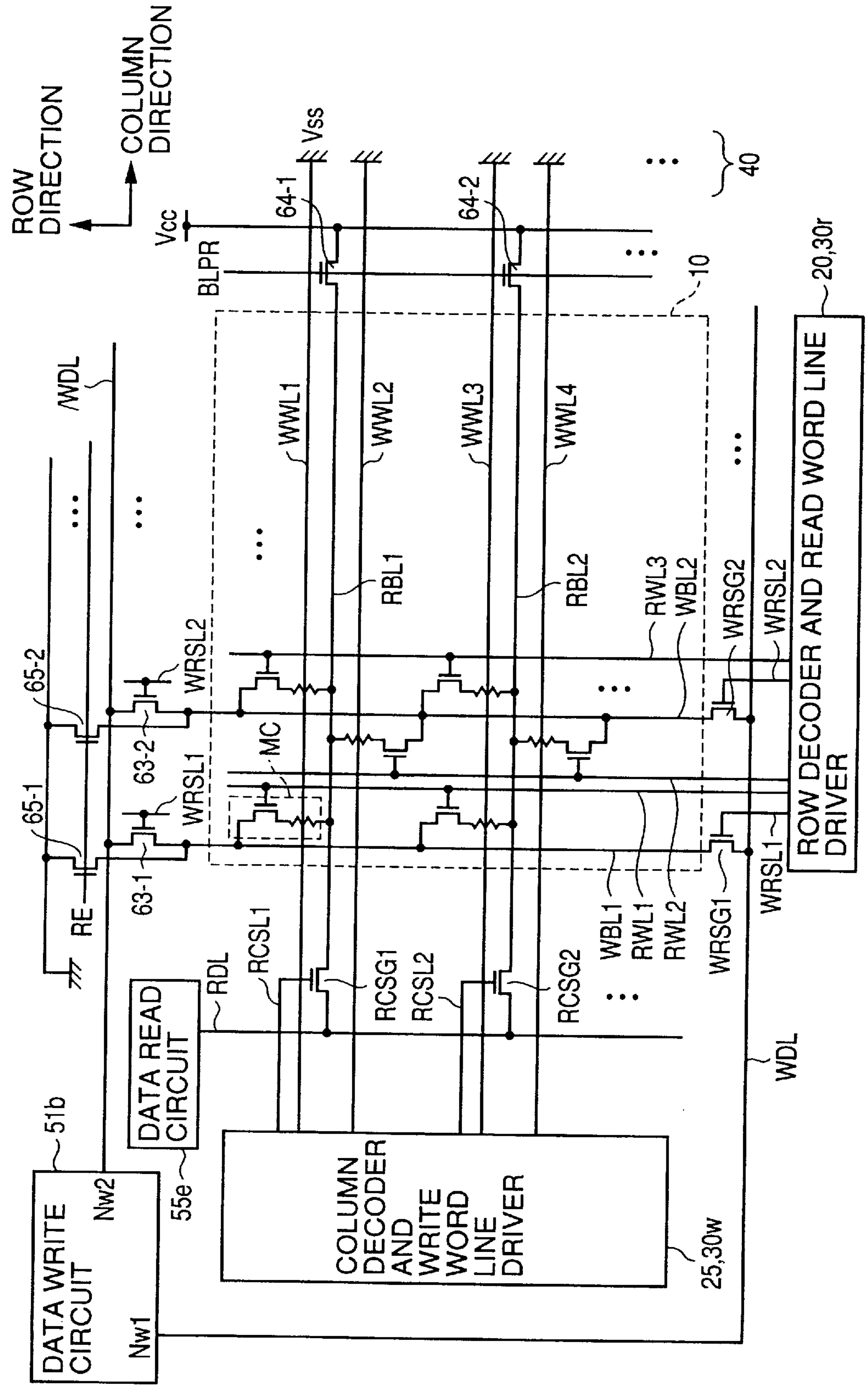
FIG. 35 is a diagram illustrating the structure of a memory array 10 and its peripheral circuitry according to the fifth embodiment.

Referring to FIG. 35, in the memory array 10 according to the fifth embodiment, the memory cells MC having the structure of FIG. 32 are arranged in rows and columns. The read word lines RWL and the write word lines WWL respectively extend in the row and column directions. The read bit lines RBL and the write bit lines WBL respectively extend in the column and row directions. The read bit lines and the write bit lines are also generally denoted with RBL and WBL, respectively, and a specific read bit line and write bit line are denoted with, e.g., RBL1 and WBL1.

The word line current control circuit 40 couples each write word line WWL to the ground voltage Vss. Thus, in the data read and write operations, the voltage and current on the write word line WWL can be controlled as shown in FIG. 33.

Adjacent memory cells in the row direction share the read bit line RBL, and adjacent memory cells in the column direction share the write bit line WBL.

For example, the memory cell group of the first and second memory cell columns shares the same read bit line RBL1, and the memory cell group of the third and fourth memory cell columns shares the same read bit line RBL2. Moreover, the memory cell group of the second and third memory cell rows shares the write bit line WBL2. In the following memory cell rows and columns as well, the read bit lines RBL and the write bit lines WBL are arranged similarly.

If the data is to be read from or written to a plurality of memory cells MC of the same read bit line RBL or write bit line WBL, data collision occurs. Accordingly, the memory cells MC are arranged alternately.

With such a structure, the pitches of the read bit lines RBL and the write bit lines WBL in the memory array 10 can be widened. As a result, the memory cells MC can be efficiently arranged, whereby improved integration of the memory array 10 as well as reduced chip area of the MRAM device can be achieved.

Hereinafter, the peripheral circuitry for supplying the sense current Is and the data write current ±Iw will be described.

Column selection for the data read operation is conducted using the read column selection lines RCSL and the read column selection gates RCSG, both provided corresponding to the respective read bit lines RBL. FIG. 35 exemplarily shows the read column selection lines RCSL1, RCSL2 and the read column selection gates RCSG1, RCSG2, which are provided corresponding to the respective read bit lines RBL1 and RBL2.

In the data read operation, the column decoder 25 activates one of the plurality of read column selection lines RCSL to the selected state (H level) according to the column selection result.

The read column selection gate RCSG connects a read data line RDL to the corresponding read bit line RBL according to the voltage on the corresponding read column selection line RCSL. A data read circuit 55*e* supplies the sense current Is to the read data line RDL.

Figure 36:
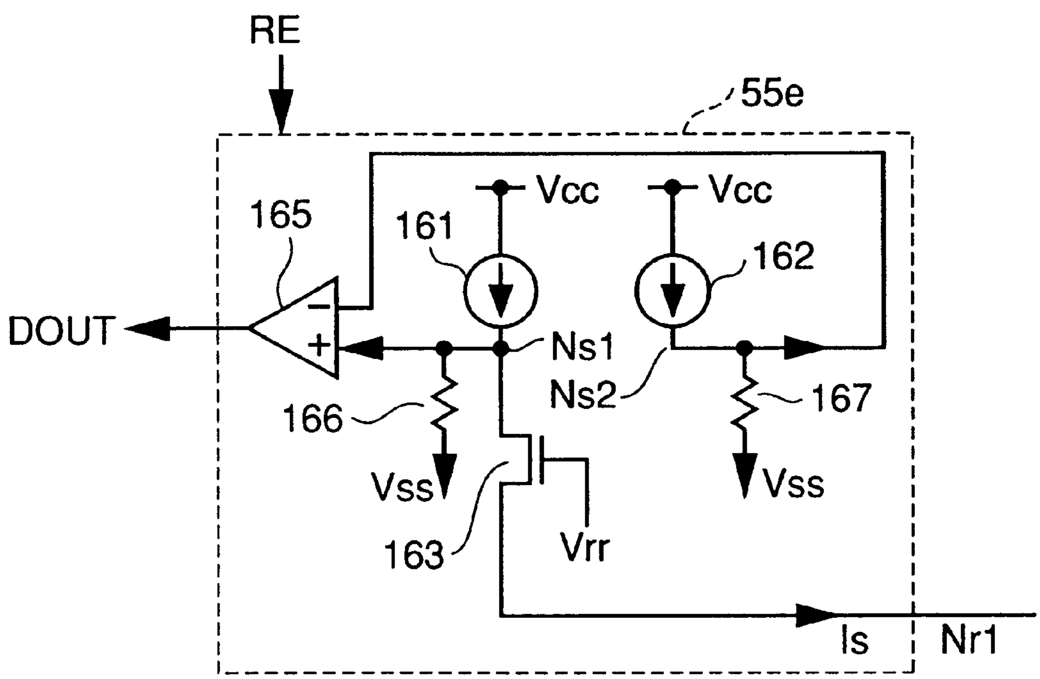
FIG. 36 is a circuit diagram showing the structure of a data read circuit 55*e*.

Referring to FIG. 36, the data read circuit 55*e* is different from the data read circuit 55*d* of FIG. 15 in that the data read circuit 55*e* supplies the sense current Is only to the node Nr1. Accordingly, the transistor 164 shown in FIG. 15 is eliminated, and the reference voltage Vref is applied only to the gate of the transistor 163.

The data read circuit 55*e* senses the level of the read data DOUT based on the comparison between a voltage drop caused by the sense current Is and a reference voltage drop $\Delta Vr$. Provided that the data line has a voltage drop $\Delta Vh$ when the H-level data is read, and has a voltage drop $\Delta Vl$ when the L-level data is read, $\Delta Vr$ is set to an intermediate value of $\Delta Vh$ and $\Delta Vl$.

Accordingly, in the data read circuit 55*e*, the resistance value of the resistance 167 is set so that the node Ns2 has a voltage level ($Vcc-\Delta Vr$).

Referring back to FIG. 35, the sense current Is is selectively supplied to the read bit line RBL corresponding to the column selection result through the read column selection gate RCSG.

According to the row selection result, the read word line driver 30*r* selectively activates the read word line RWL. Thus, the sense current Is can be supplied to the MTJ memory cell corresponding to the selected memory cell row.

On the other hand, column selection for the data write operation is conducted in response to selective activation of the write word line WWL by the write word line driver 30*w* according to the column selection result. Each write word line WWL is coupled to the ground voltage Vss in the word line current control circuit 40.

The write bit lines WBL are provided corresponding to the respective memory cell rows so as to extend perpendicularly to the write word lines WWL. Accordingly, row selection for the data write operation is conducted using write row selection lines and write row selection gates, which are provided corresponding to the respective write bit lines WBL.

FIG. 35 exemplarily shows the write row selection lines WRSL1, WRSL2 and the write row selection gates WRSG1, WRSG2, which are provided corresponding to the write bit lines WBL1, WBL2. Hereinafter, the write row selection lines and the write row selection gates are also generally denoted with WRSL and WRSG, respectively.

The write row selection gate WRSG is electrically coupled between the corresponding write bit line WBL and a write data line WDL, and is turned ON/OFF according to the voltage on the corresponding write row selection line WRSL.

The read/write control circuit 60 includes bit line current control transistors provided corresponding to the respective write bit lines WBL. FIG. 35 exemplarily shows the bit line current control transistors 63-1, 63-2 provided corresponding to the write bit lines WBL1, WBL2, respectively. Hereinafter, the bit line current control transistors are also generally denoted with 63.

The bit line current control transistor 63 is electrically coupled between the corresponding write bit line WBL and a write data line /WDL, and is turned ON/OFF according to the voltage on the corresponding write row selection line WRSL.

The data write circuit 51*b* shown in FIG. 7 supplies the data write current ±Iw to the write data lines WDL and /WDL. Thus, the data write current ±Iw can be supplied to the write bit line WBL corresponding to the selected memory cell row, according to the row selection result of the row decoder 20.

The read/write control circuit 60 further includes precharging transistors provided corresponding to the respective read bit lines RBL, and write bit line voltage control transistors provided corresponding to the respective write bit lines WBL.

FIG. 35 exemplarily shows the precharging transistors 64-1, 64-2 provided corresponding to the read bit lines RBL1, RBL2, and the write bit line voltage control transistors 65-1, 65-2 provided corresponding to the write bit lines WBL, WBL2, respectively. Hereinafter, the plurality of write bit line voltage control transistors are also generally denoted with 65.

Each write bit line voltage control transistor 65 is turned ON in the data read operation to couple the corresponding write bit line WBL to the ground voltage Vss in order to ensure the current path of the sense current Is. In the operation other than the data read operation, each write bit line voltage control transistor 65 is turned OFF, so that each write bit line WBL is disconnected from the ground voltage Vss. Since the operation of the precharging transistor 64 is the same as that described in connection with FIG. 2, description thereof will not be repeated.

With such a structure, in the data write operation, the data write current ±Iw can be supplied to the write bit line WBL corresponding to the selected memory cell row through the path formed from the write data line WDL, write row selection gate WRSG, write bit line WBL, bit line current control transistor 63 and write data line /WDL. Note that it is possible to control the direction of the data write current ±Iw by setting the voltage on the write data line WDL, /WDL in the same manner as that of the write data bus WDB, /WDB of the first embodiment. Accordingly, like the first embodiment, the structure of the peripheral circuitry associated with the data write operation, i.e., the write control circuit 50*w* and 60*w* can be simplified.

Thus, the data write and read operations as shown in FIG. 33 can be conducted even in the structure in which the read word lines RWL and the write word lines WWL extend perpendicularly to each other and the write bit line WBL and the read bit line RBL are shared between adjacent memory cells.

With such a structure, the pitches of the write bit lines WBL and the read bit lines RBL in the memory array 10 can be widened. As a result, the memory cells MC can be efficiently arranged, whereby improved integration of the memory array 10 as well as reduced chip area of the MRAM device can be achieved.

Such the widened pitch of the write bit lines WBL ensure an increased line width of the write bit lines WBL. Accordingly, the following effects can further be obtained.

As described before, in the data write operation, the data write current must be supplied to both the write bit line WBL and the write word line WWL.

As shown in FIG. 34, in the MTJ memory cell structure according to the fifth embodiment, the distance between the write bit line WBL and the magnetic tunnel junction MTJ in the vertical direction is larger than that between the write word line WWL and the magnetic tunnel junction MTJ. Accordingly, in the data write operation, a larger current must be supplied to the write bit line WBL that is located farther from the magnetic tunnel junction MTJ.

However, the write bit line WBL is shared between adjacent memory cell columns. Therefore, the write bit line WBL can be arranged using the space for two memory cell rows, whereby the line width of each write bit line WBL can be increased. Thus, a line width at least larger than that of the write word line WWL, i.e., a larger cross-sectional area, of the write bit line WBL can be ensured. As a result, the current density of the write word line WWL is suppressed.

The reliability of the MRAM device can thus be improved by sharing one of the wirings requiring the data write current supply, i.e., the wiring that is structurally located farther from the magnetic tunnel junction MTJ, between adjacent memory cells.

For improved reliability, it is also effective to form a metal wiring having a large distance to the magnetic tunnel junction MTJ (the write bit line WBL in FIG. 34) from a highly electromigration-resistant material. For example, in the case where the other metal wirings are formed from an aluminum alloy (Al alloy), the metal wirings that may possibly be subjected to electromigration may be formed from copper (Cu).

First Modification of Fifth Embodiment

Figure 37:
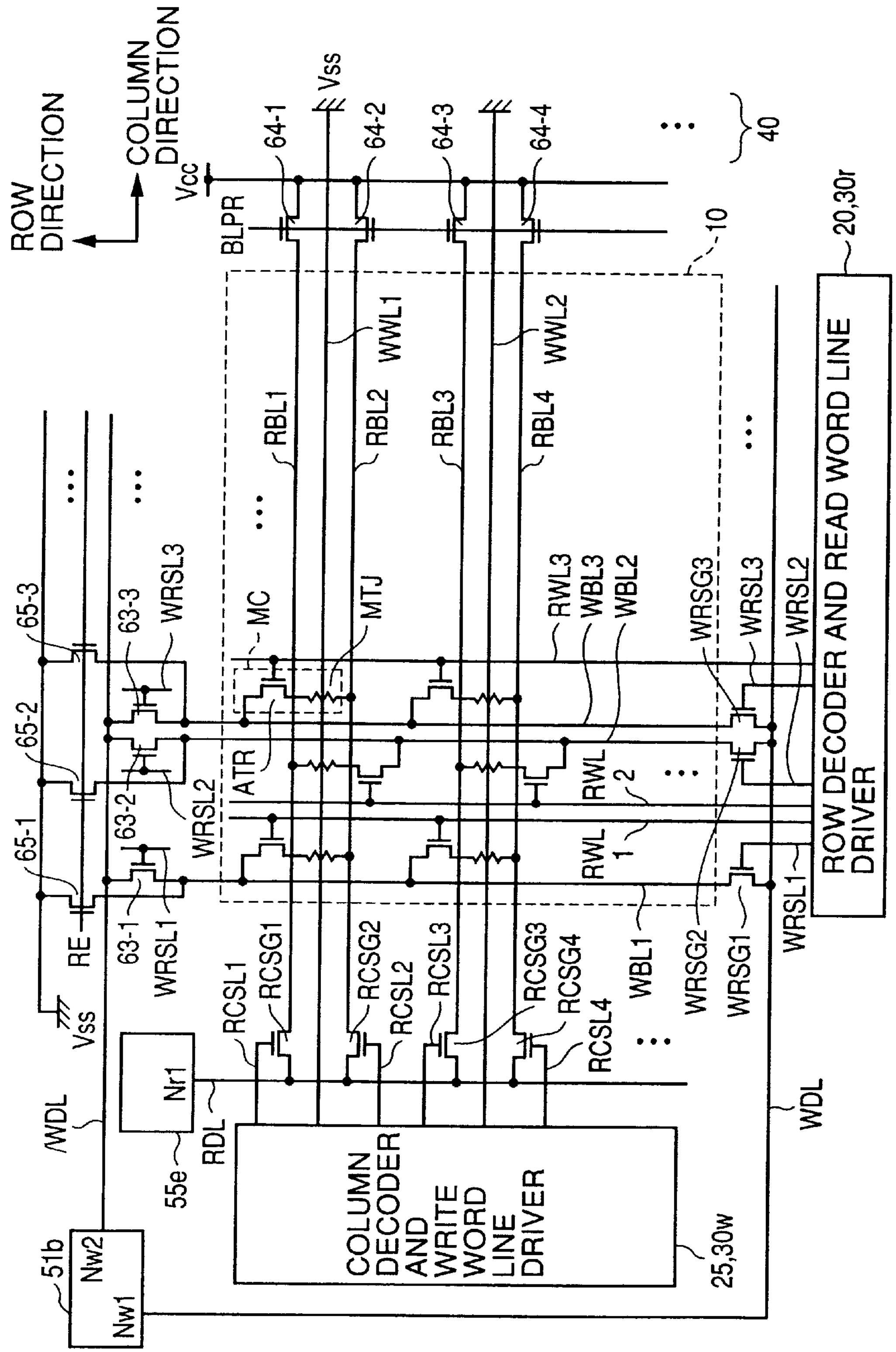
FIG. 37 is a diagram illustrating the structure of a memory array 10 and its peripheral circuitry according to a first modification of the fifth embodiment.

Referring to FIG. 37, in the memory array according to the first modification of the fifth embodiment, adjacent memory cells share the same write word line WWL. For example, the memory cell group of the first and second memory cell columns shares a single write word line WWL1. In the following memory cell columns as well, the write word lines WWL are arranged similarly.

In order to conduct the data write operation normally, a plurality of memory cells MC must not be present at the intersection of the same write word line WWL and the same write bit line WBL. Accordingly, the memory cells MC are arranged alternately.

Since the structure of the peripheral circuitry associated with the data read and write operations through the read bit line RBL and write bit line WBL, as well as the memory cell operation in reading and writing the data are the same as those of the fifth embodiment, detailed description thereof will not be repeated.

With such a structure, the pitch of the write word lines WWL in the memory array 10 can be widened. As a result, the memory cells MC can be efficiently arranged, whereby improved integration of the memory array 10 as well as reduced chip area of the MRAM device can be achieved.

Second Modification of Fifth Embodiment

Figure 38:
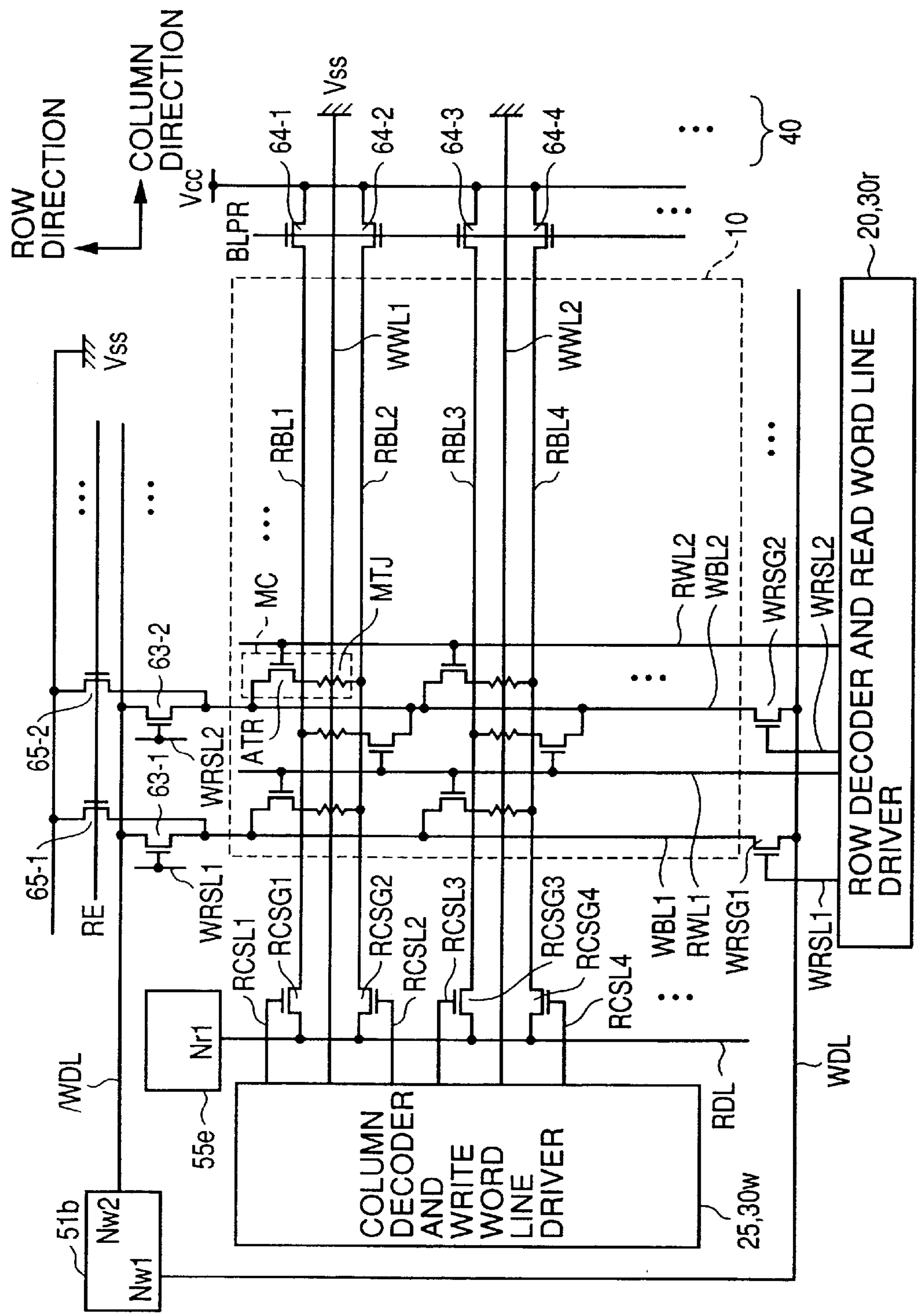
FIG. 38 is a diagram illustrating the structure of a memory array 10 and its peripheral circuitry according to a second modification of the fifth embodiment.

Referring to FIG. 38, the memory array according to the second modification of the fifth embodiment is different from that of the first modification of the fifth embodiment in that adjacent memory cells in the column direction also share the same read word line RWL. For example, the memory cell group of the first and second memory cell rows shares the same read word line RWL1. In the following memory cell rows as well, the read word lines RWL are arranged similarly.

In order to conduct the data read and write operations normally, a plurality of memory cells MC selected by a single read word line RWL or write word line WWL must not be simultaneously coupled to the same read bit line RBL or write bit line WBL. Accordingly, the read bit line RBL and the write bit line WBL are provided in every memory cell column and every memory cell row, respectively, and the memory cells MC are arranged alternately.

Since the structure of the other portions and the memory cell operation in reading and writing the data are the same as those of the fifth embodiment, detailed description thereof will not be repeated.

With such a structure, the pitches of the read word lines RWL and write word lines WWL in the memory array 10 can be widened. As a result, the memory cells MC can be more efficiently arranged, whereby improved integration of the memory array 10 as well as reduced chip area of the MRAM device can be achieved.

Third Modification of Fifth Embodiment

Figure 39:
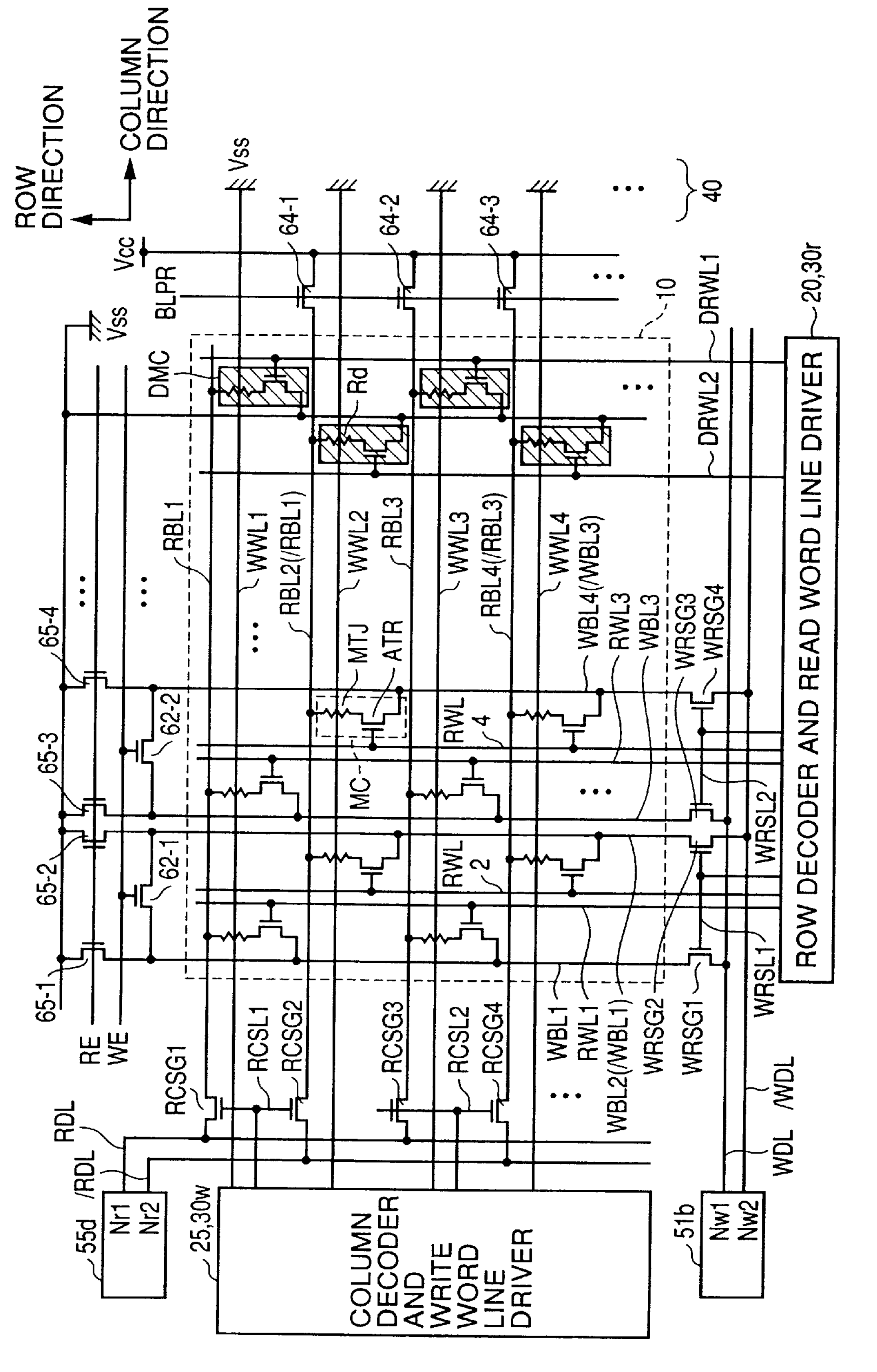
FIG. 39 is a diagram illustrating the structure of a memory array 10 and its peripheral circuitry according to a third modification of the fifth embodiment.

Referring to FIG. 39, for the memory cells having the structure of the fifth embodiment and arranged in rows and columns, the folded bit line structure is realized in every set of adjacent two memory cell columns, using corresponding two read bit lines RBL. For example, a read bit line pair can be formed from the read bit lines RBL1 and RBL2 respectively corresponding to the first and second memory cell columns. In this case, the read bit line RBL2 is also referred to as read bit line /RBL1 because it is complementary to the read bit line RBL1.

Hereinafter, one read bit line of each read bit line pair that corresponds to an odd memory cell column is also generally referred to as read bit line RBL, and the other read bit line that corresponds to an even memory cell column is also generally referred to as read bit line /RBL.

A read column selection line is provided for every read bit line pair, i.e., every set of memory cell columns. Accordingly, two read column selection gates RCSG corresponding to the same set are turned ON/OFF in response to the common read column selection line RCSL.

For example, the read column selection gates RCSG1 and RCSG2 corresponding to the first and second memory cell columns operate in response to the common read column selection line RCSL1. The read column selection gates RCSG1, RCSG3, . . . corresponding to the read bit lines RBL of the odd columns are each electrically coupled between the corresponding read bit line RBL and the read data line RDL. The read column selection gates RCSG2, RCSG4, . . . corresponding to the read bit lines /RBL of the even columns are each electrically coupled between the corresponding read bit line /RBL and a read data line /RDL.

In response to the read column selection line RCSL activated according to the column selection result, corresponding two read column selection gates RCSG are turned ON. As a result, the read bit lines RBL and /RBL of the read bit line pair corresponding to the selected memory cell column are electrically coupled to the read data lines RDL and /RDL of the read data line pair, respectively.

Moreover, the same precharging transistors 64 as those described in connection with FIG. 35 are provided corresponding to the respective read bit lines RBL and /RBL. As described before, the precharging transistors 64 are turned OFF in the data read operation.

As a result, the sense current Is is supplied from the data read circuit 55*d* to each of the read bit lines RBL and /RBL corresponding to the selected memory cell column through the read data lines RDL and /RDL. Since the structure of the data read circuit 55*d* has been described in connection with FIG. 15, detailed description thereof will not be repeated.

Accordingly, the data read operation is conducted using the same dummy memory cells DMC as those of the first embodiment each capable of being selectively coupled to either the read bit line RBL or /RBL. Thus, the data read margin can be ensured based on the so-called folded bit line structure.

Similarly, the folded bit line structure is realized in every set of adjacent two memory cell rows, using corresponding two write bit lines WBL. For example, a write bit line pair can be formed from the write bit lines WBL1 and WBL2 respectively corresponding to the first and second memory cell rows. In this case, the write bit line WBL2 is also referred to as write bit line /WBL1 because it is complementary to the write bit line WBL1.

In the following memory cell columns as well, the read bit lines RBL and the write bit lines WBL are similarly arranged so as to form a read bit line pair and a write bit line pair in every set of memory cell columns and rows, respectively.

One write bit line of each write bit line pair that corresponds to an odd memory cell row is also generally referred to as write bit line WBL, and the other write bit line that corresponds to an even memory cell row is also generally referred to as write bit line /WBL. Thus, the data write operation can be conducted based on the so-called folded bit line structure.

The write row selection line WRSL is provided for every write bit line pair, i.e., every set of memory cell rows. Accordingly, two write row selection gates WRSG corresponding to the same set are turned ON/OFF in response to the common write row selection line WRSL.

For example, the write row selection gates WRSG1 and WRSG2 corresponding to the first and second memory cell rows operate in response to the common write row selection line WRSL1.

The write row selection gates WRSG1, WRSG3, . . . corresponding to the write bit lines WBL of the odd rows are each electrically coupled between the corresponding write bit line WBL and the write data line WDL. The write row selection gates WRSG2, WRSG4, . . . corresponding to the write bit lines /WBL of the even rows are each electrically coupled between the corresponding write bit line /WBL and the write data line /WDL.

In response to the write row selection line WRSL activated according to the row selection result, corresponding two write row selection gates WRSG are turned ON. As a result, the write bit lines WBL and /WBL of the write bit line pair corresponding to the selected memory cell row are electrically coupled to the write data lines WDL and /WDL of the write data line pair, respectively.

Moreover, the equalizing transistors 62 for connecting the write bit lines WBL and /WBL of the respective write bit line pair to each other are provided instead of the bit line current control transistors 63 shown in FIG. 35. The equalizing transistor 62 operates in response to, e.g., the control signal WE so as to short-circuit two write bit lines forming the same write bit line pair in the data write operation. The same write bit line voltage control transistors 65 as those described in connection with FIG. 35 are provided corresponding to the respective write bit lines WBL and /WBL.

The data write current ±Iw is supplied from the data write circuit 51*b* to the write data lines WDL and /WDL of the write data line pair in the same manner as that of the write data buses WDB and /WDB of the first embodiment. Since the structure and operation of the data write circuit 51*b* have been described in connection with FIG. 7, detailed description thereof will not be repeated.

As a result, the data write operation can be conducted in the write bit line pair corresponding to the row selection result, by using a reciprocating current returned at the equalizing transistor 62.

With such a structure, in the data read operation, a selected read bit line pair is supplied with the sense current in the same manner as that of the bit line pair of the first embodiment. Similarly, in the data write operation, a selected write bit line pair is supplied with the data write current thorough the corresponding equalizing transistor 62 in the same manner as that of the bit line pair of the first embodiment.

Therefore, in the case where the memory cells according to the fifth embodiment capable of reducing the chip area are arranged in rows and columns, the read and write operation margins can be ensured using the folded bit line structure.

Fourth Modification of Fifth Embodiment

In the fourth modification of the fifth embodiment, the write bit line WBL is shared between adjacent memory cells, in addition to the folded bit line structure shown in the third modification of the fifth embodiment.

Figure 40:
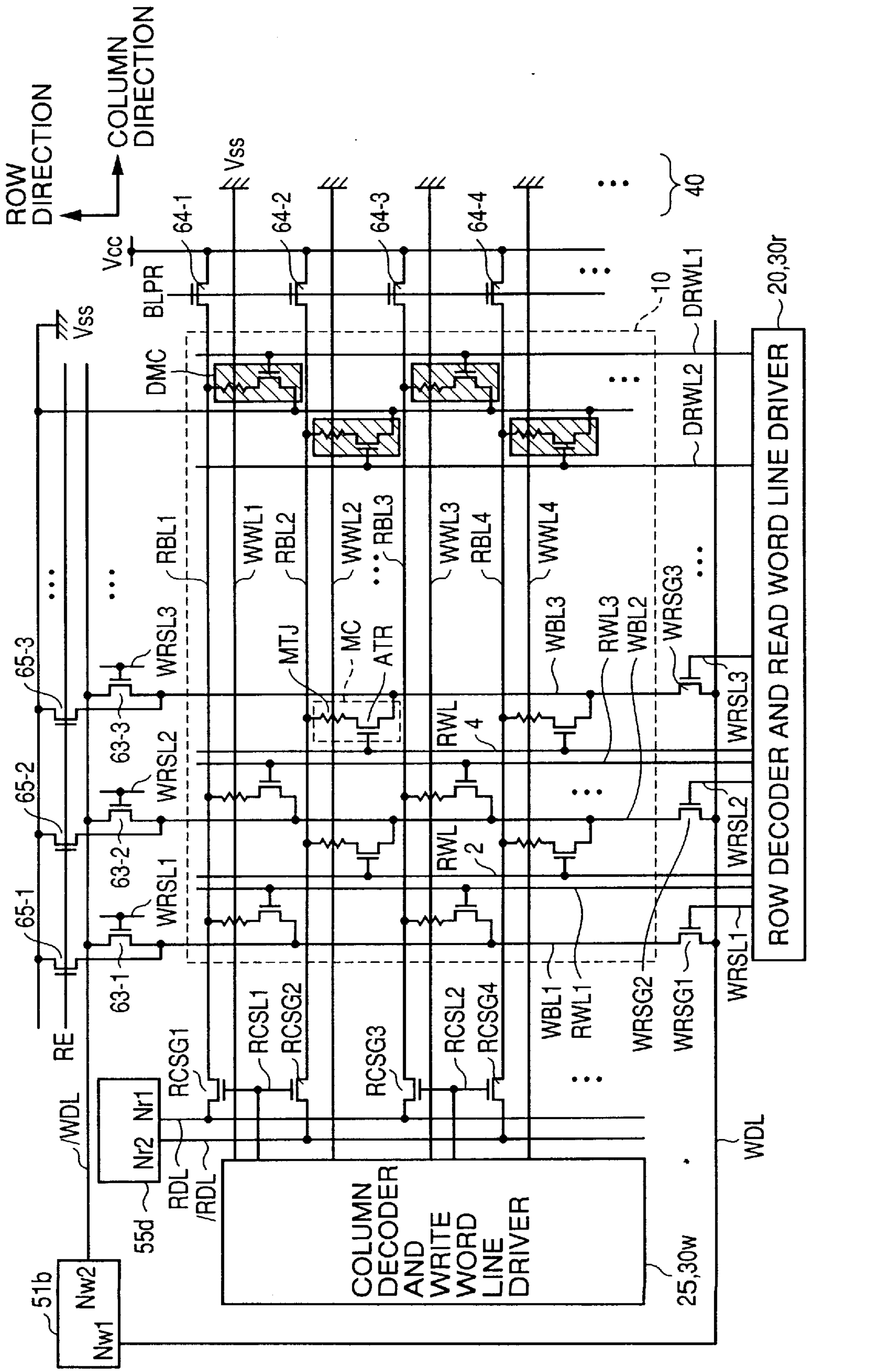
FIG. 40 is a diagram illustrating the structure of a memory array 10 and its peripheral circuitry according to a fourth modification of the fifth embodiment.

Referring to FIG. 40, in the memory array according to the fourth modification of the fifth embodiment, adjacent memory cells in the column direction share the same write bit line WBL.

In the read operation, the read word line RWL is activated. In each read bit line RBL, the memory cells are provided every other read word line RWL. Moreover, the memory cells are arranged alternately between every adjacent read bit lines RBL. Therefore, every set of adjacent two memory cell columns form a read bit line pair, so that the data read operation can be conducted based on the folded bit line structure in the same manner as that of the third modification of the fifth embodiment.

On the other hand, the data write operation cannot be conducted based on the folded bit line structure because the write bit line WBL is shared. Accordingly, in the fourth modification of the fifth embodiment, the peripheral circuitry associated with selection of the write bit line WBL is arranged in the same manner as that shown in FIG. 35. Thus, as in the case of the fifth embodiment, the data write operation can be conducted using the data write circuit 51*b* having a simple structure.

Although the data write operation cannot be conducted based on the folded bit line structure, the pitch of the write bit lines WBL in the memory array 10 can be widened. As a result, further improved integration of the memory array 10 and thus further reduced chip area of the MRAM device can be achieved. Improved reliability of the MRAM device can also be achieved by increasing the electromigration resistance of the write bit lines WWL.

Note that, although FIG. 40 shows the structure in which the write bit line WBL out of the signal wirings associated with the data write operation is shared between adjacent memory cells, it is also possible to share the write word line WWL instead of the write bit line WBL. In this case, however, the write bit line WBL cannot be shared, and must be provided in every memory cell row. Which of the wirings should be shared to widen the wiring pitch can be determined in view of the structural conditions, design and the like, such as the distance from the magnetic tunnel junction MTJ.

Fifth Modification of Fifth Embodiment

In the fifth modification of the fifth embodiment, the read word line RWL is shared between adjacent memory cells, in addition to the folded bit line structure of the third modification of the fifth embodiment.

Figure 41:
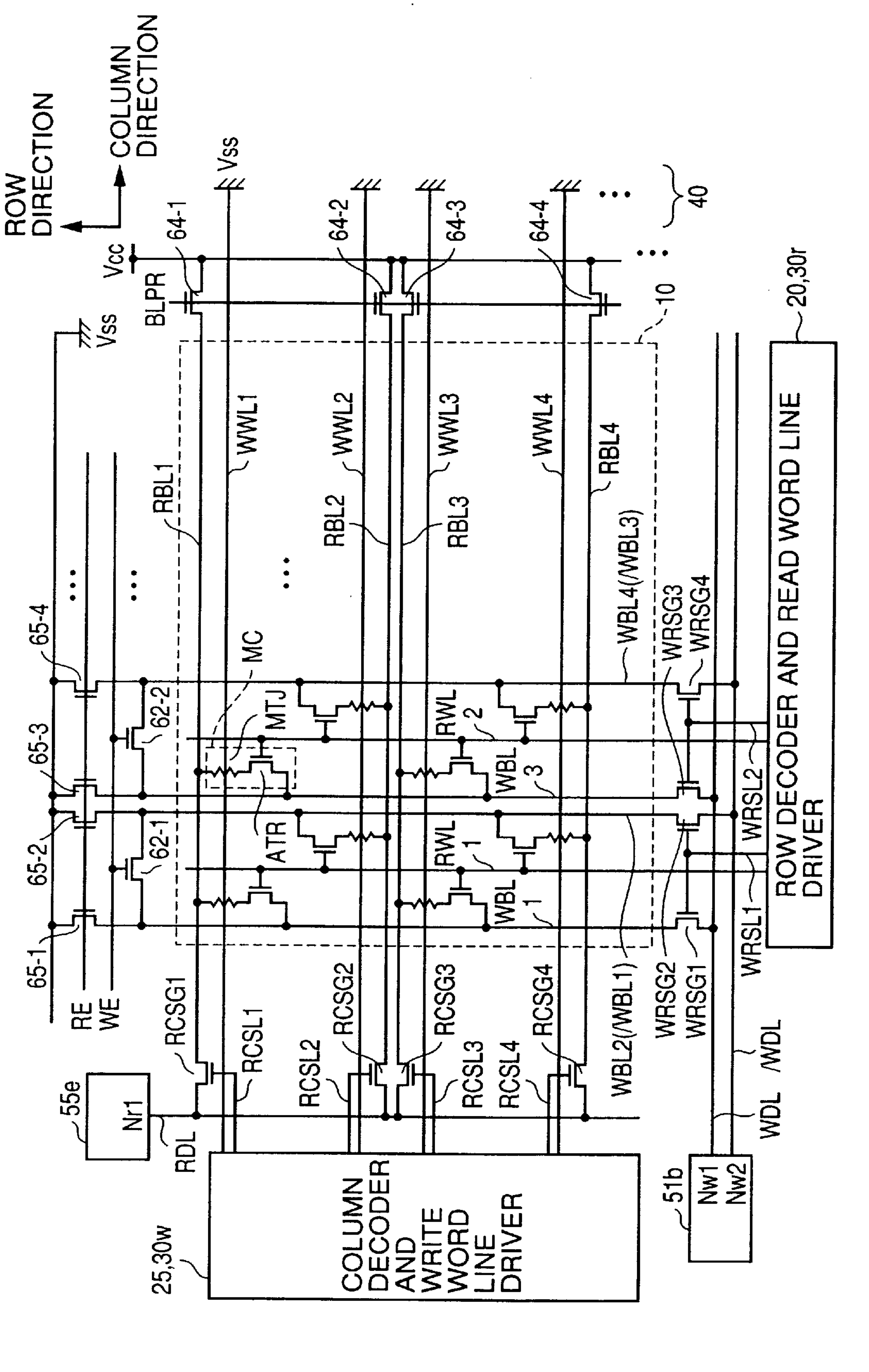
FIG. 41 is a diagram illustrating the structure of a memory array 10 and its peripheral circuitry according to a fifth modification of the fifth embodiment.

Referring to FIG. 41, in the memory array according to the fifth modification of the fifth embodiment, adjacent memory cells in the column direction share the same read word line RWL.

The read/write control circuit 60 includes the equalizing transistors 62, precharging transistors 64 and write bit line voltage control transistors 65, which are arranged in the same manner as that of the third modification of the fifth embodiment.

In the data write operation, the write word line WWL is activated. In each write bit line WBL, the memory cells are provided every other write word line WWL. Moreover, the memory cell are arranged alternately between every adjacent write bit lines WBL. Therefore, every set of adjacent two memory cell rows can form a write bit line pair. As a result, the data write operation can be conducted based on the folded bit line structure in the same manner as that of the third modification of the fifth embodiment, so that the same effects can be obtained.

On the other hand, in the data read operation, the read word line RWL shared by a plurality of memory cell rows is activated. Therefore, the data read operation cannot be conducted based on the folded bit line structure. Accordingly, in the fifth modification of the fifth embodiment, the peripheral circuitry associated with selection of the read bit line RBL is arranged in the same manner as that shown in FIG. 35.

With such a structure, the read operation margin based on the folded bit line structure cannot be ensured, but the pitch of the read word lines RWL in the memory array 10 can be widened, and the data read operation can be conducted normally. As a result, improved integration of the memory array 10 and thus reduced chip area of the MRAM device can be achieved.

Accordingly, by conducting the data write operation based on the folded bit line structure using the memory cells of the fifth embodiment, the write operation margin can be ensured as well as a simplified structure of the peripheral circuitry and reduced data write noise can be achieved. Moreover, by sharing the read word line RWL, improved integration of the memory array 10 can also be achieved simultaneously.

Note that, although FIG. 41 shows the structure in which the read word line RWL out of the signal wirings associated with the data read operation is shared between adjacent memory cells, it is also possible to share the read bit line RBL instead of the read word line RWL. In this case, however, the read word line RWL cannot be shared, and must be provided in every memory cell row. Which of the wirings should be shared to widen the wiring pitch can be determined as appropriate in view of the structural conditions, design and the like.

Sixth Embodiment

Figure 42:
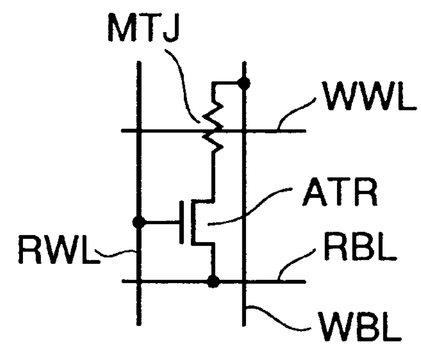
FIG. 42 is a circuit diagram showing the connection of an MTJ memory cell according to a sixth embodiment of the present invention.

Referring to FIG. 42, the MTJ memory cell according to the sixth embodiment is different from that shown in FIG. 32 in connection between the read bit line RBL and the write bit line WBL. More specifically, the read bit line RBL is not directly coupled to the magnetic tunnel junction MTJ, but coupled thereto in response to turning-ON of the access transistor ATR. Moreover, the write bit line WBL is coupled to the magnetic tunnel junction MTJ so as to be included in the sense current path in the data read operation.

Including the extending direction of each signal wiring, the structure is otherwise the same as that of FIG. 32. Therefore, detailed description thereof will not be repeated. Moreover, the voltage and current waveforms of each wiring in the data read and write operations are also the same as those of FIG. 33. Therefore, detailed description thereof will not be repeated.

Accordingly, the write word line WWL is provided near the magnetic tunnel junction MTJ so as to extend perpendicularly to the write bit line WBL. As a result, the read word line driver 30*r* and the write word line driver 30*w* can be independently provided, whereby the same effects as those of the fifth embodiment can be obtained.

Moreover, the write word line WWL can be independently provided without being coupled to other portions of the MTJ memory cell. Therefore, the write word line WWL can be arbitrarily arranged so as to improve the magnetic coupling with the magnetic tunnel junction MTJ.

Moreover, the read bit line RBL is coupled to the magnetic tunnel junction MTJ through the access transistor ATR. Therefore, the number of magnetic tunnel junctions MTJ coupled to the read bit lines RBL is reduced, and the capacitance of the read bit line RBL is reduced. As a result, the data read speed can be increased.

Figure 43:
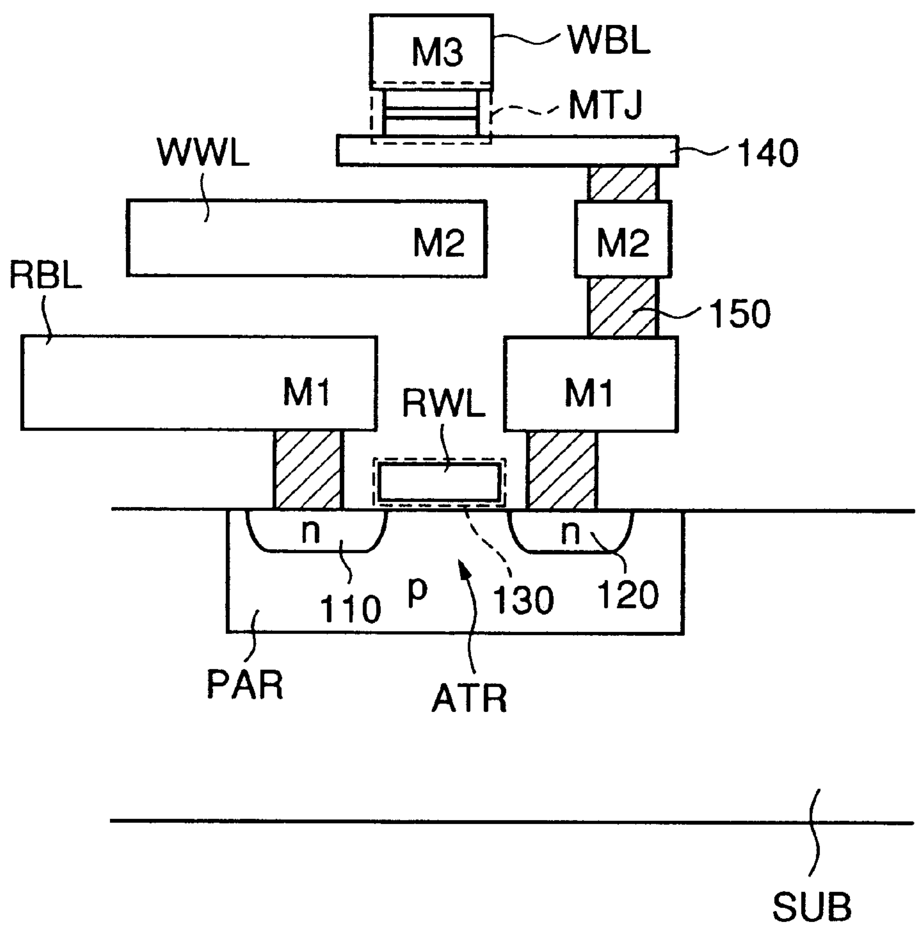
FIG. 43 is a structural diagram illustrating the MTJ memory cell arrangement according to the sixth embodiment.

Referring to FIG. 43, in the MTJ memory cell according to the sixth embodiment, the read bit line RBL is provided in the first metal wiring layer M1 so as to be electrically coupled to the source/drain region 110 of the access transistor ATR. The read word line RWL is provided in the same layer as that of the gate 130 of the access transistor ATR. The source/drain region 120 of the access transistor ATR is coupled to the magnetic tunnel junction MTJ through the metal wirings provided in the first and second metal wiring layers M1 and M2, the barrier metal 140, and the metal film 150 provided in the contact hole.

The magnetic tunnel junction MTJ is provided between the second and third metal wiring layers M2 and M3. The write bit line WBL is provided in the third metal wiring layer M3 so as to be electrically coupled to the magnetic tunnel junction MTJ. The write word line WWL is provided in the second metal wiring layer M2. At this time, the write word line WWL is provided so as to enable improved magnetic coupling with the magnetic tunnel junction MTJ.

In the MTJ memory cell according to the sixth embodiment, the distance between the write bit line WBL and the magnetic tunnel junction MTJ can be reduced as compared to that in the MTJ memory cell of the fifth embodiment shown in FIG. 34. Accordingly, the amount of data write current flowing through the write bit line WBL can be reduced.

The write word line WWL is located farther from the magnetic tunnel junction MTJ than is the write bit line WBL. Therefore, in the MTJ memory cell of the sixth embodiment, a relatively large data write current must be applied to the write word line WWL.

Figure 44:
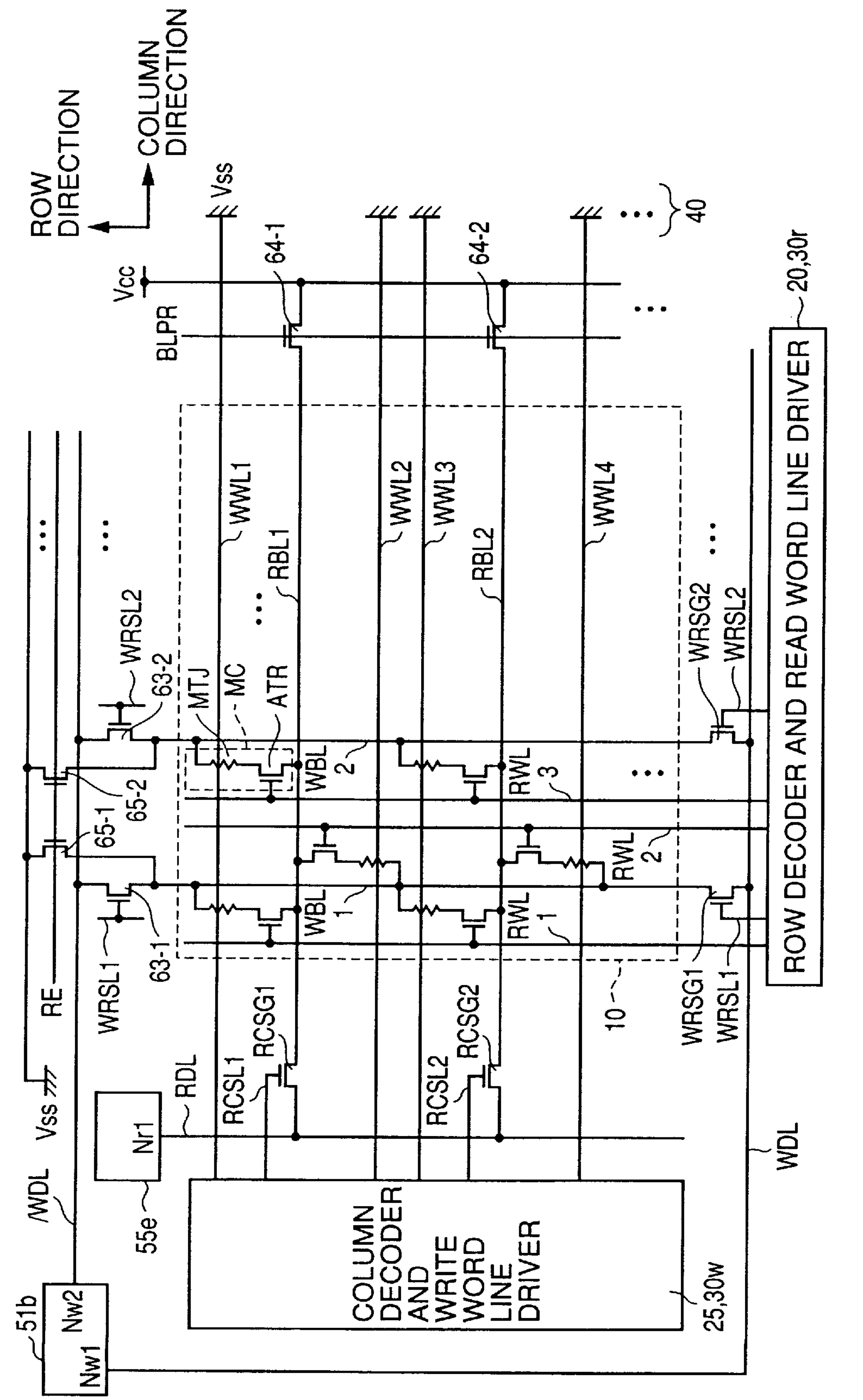
FIG. 44 is a diagram illustrating the structure of a memory array 10 and its peripheral circuitry according to the sixth embodiment.

Referring to FIG. 44, in the memory array according to the sixth embodiment, the memory cells MC having the structure of FIG. 42 are arranged in rows and columns. The read word lines RWL and the write word lines WWL extend in the row and column directions, respectively. The read bit lines RBL and the write bit lines WBL extend in the column and row directions, respectively.

Adjacent memory cells in the row direction share the read bit line RBL, and adjacent memory cells in the column direction share the write bit line WBL.

For example, the memory cell group of the first and second memory cell columns shares the same read bit line RBL1, and the memory cell group of the third and fourth memory cell columns shares the same read bit line RBL2. Moreover, the memory cell group of the second and third memory cell rows shares the write bit line WBL2. In the following memory cell rows and columns as well, the read bit lines RBL and the write bit lines WBL are arranged similarly.

If the data is to be read from or written to a plurality of memory cells MC of the same read bit line RBL or write bit line WBL, data collision occurs. Accordingly, the memory cells MC are arranged alternately.

With such a structure, the pitches of the read bit lines RBL and the write bit lines WBL in the memory array 10 can be widened as in the case of the fifth embodiment. As a result, the memory cells MC can be efficiently arranged, whereby improved integration of the memory array 10 as well as reduced chip area of the MRAM device can be achieved.

Since the structure of the peripheral circuitry for selectively supplying the data write current and the sense current to the read bit line RBL and the write bit line WBL is the same as that of FIG. 35, detailed description thereof will not be repeated.

First Modification of Sixth Embodiment

Figure 45:
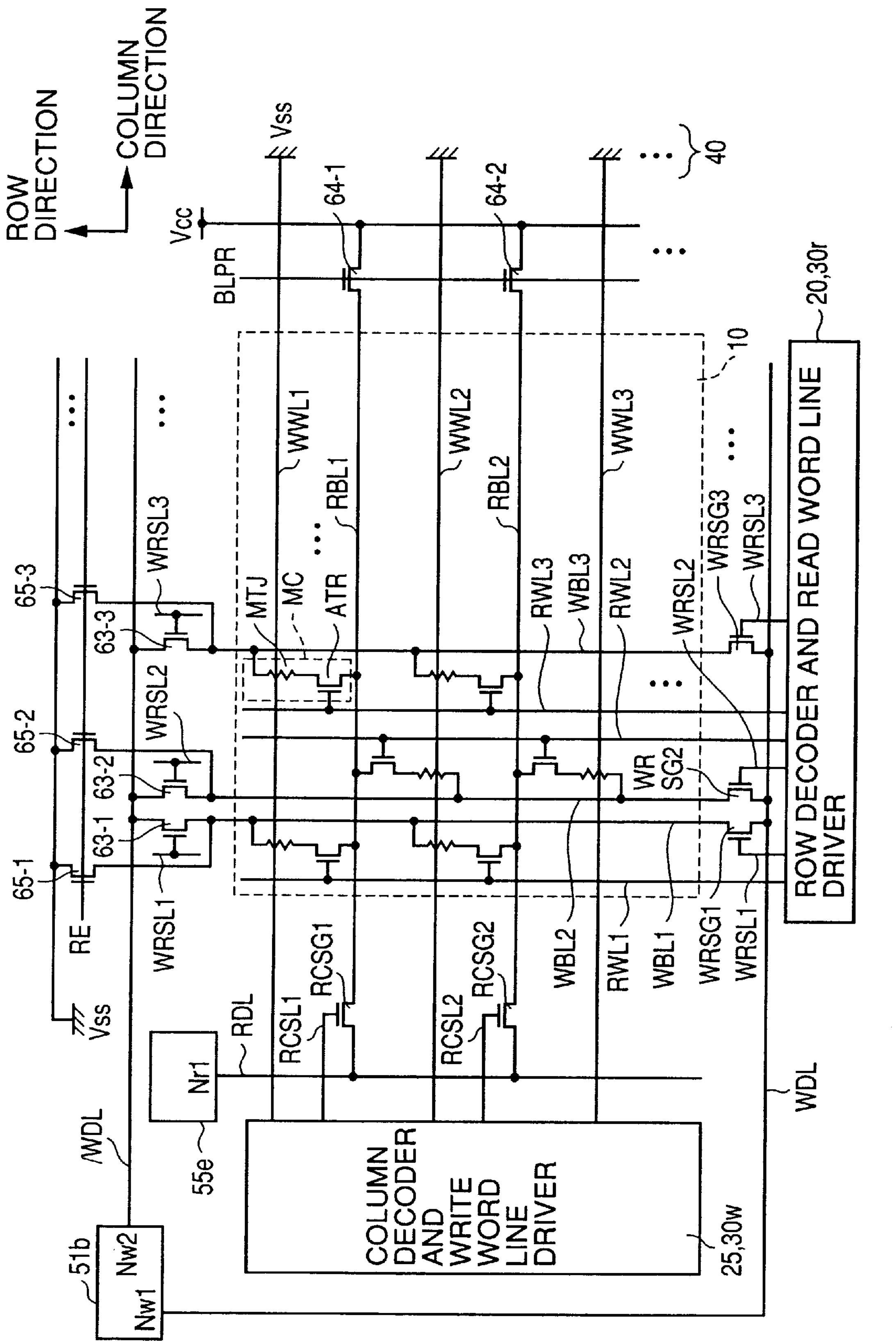
FIG. 45 is a diagram illustrating the structure of a memory array 10 and its peripheral circuitry according to a first modification of the sixth embodiment.

Referring to FIG. 45, in the memory array according to the first modification of the sixth embodiment, adjacent memory cells share the same write word line WWL. For example, the memory cell group of the second and third memory cell columns shares a single write word line WWL2. In the following memory cell columns as well, the write word lines WWL are arranged similarly.

In order to conduct the data write operation normally, a plurality of memory cells MC must not be present at the intersection of the same write word line WWL and the same write bit line WBL. Accordingly, the memory cells MC are arranged alternately.

Moreover, like the sixth embodiment, adjacent memory cells in the row direction share the read bit line RBL.

Since the structure of the peripheral circuitry associated with the data read and write operations through the read bit line RBL and write bit line WBL, as well as the memory cell operation in reading and writing the data are the same as those of the sixth embodiment, detailed description thereof will not be repeated.

As described before, in the MTJ memory cell of the sixth embodiment, a relatively large data write current must be applied to the write word line WWL. Accordingly, the write word line WWL is shared between adjacent memory cells so as to ensure the line pitch thereof. As a result, the line width, i.e., the cross-sectional area, of the write word line WWL is assured, so that the current density thereof can be suppressed. As a result, improved reliability of the MRAM device can be achieved. As described before, for the improved operation reliability, it is also effective to select a material of these wirings in view of electromigration resistance.

Second Modification of Sixth Embodiment

Figure 46:
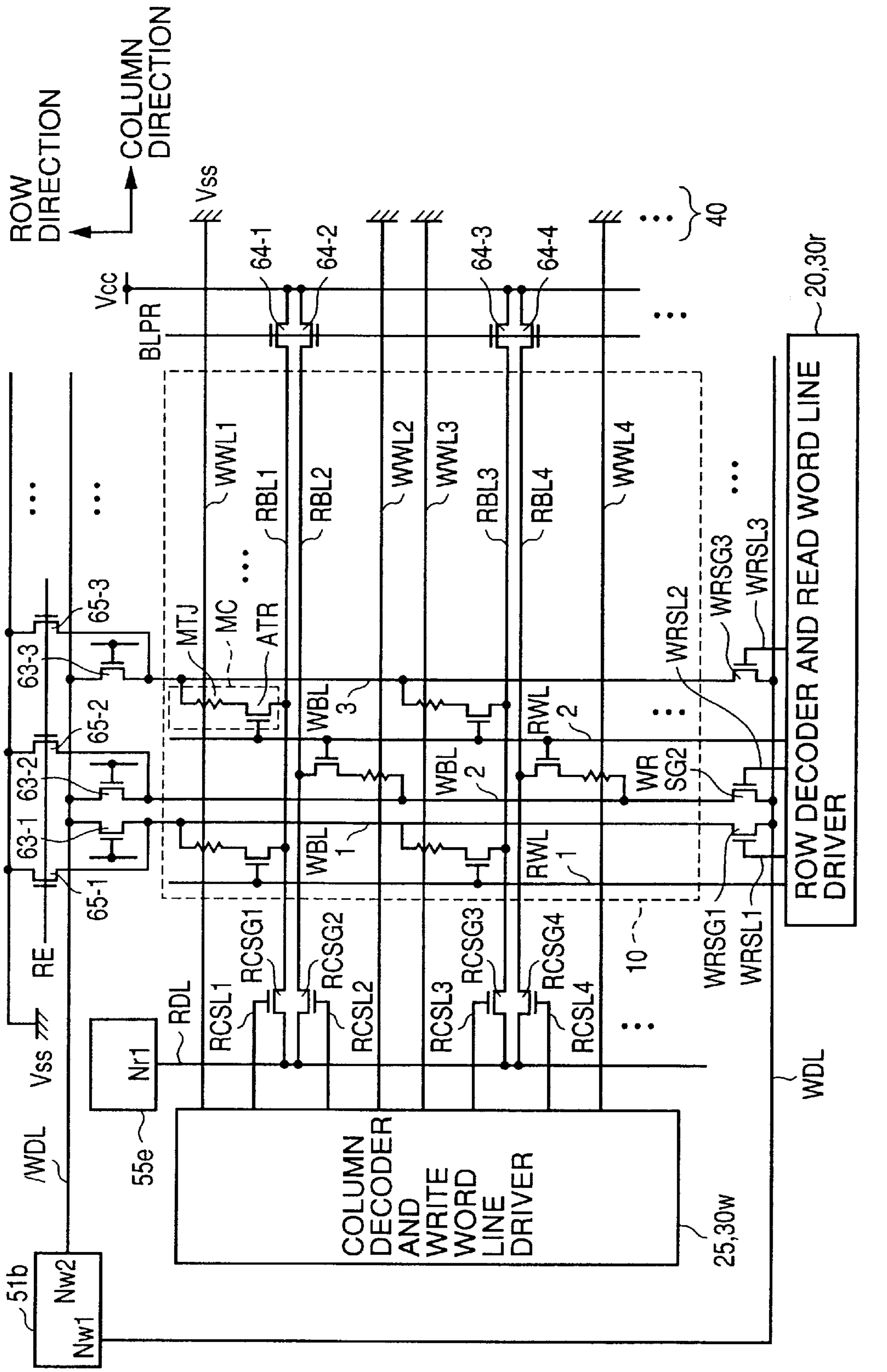
FIG. 46 is a diagram illustrating the structure of a memory array 10 and its peripheral circuitry according to a second modification of the sixth embodiment.

Referring to FIG. 46, in the memory array according to the second modification of the sixth embodiment, adjacent memory cells in the column direction also share the same read word line RWL. For example, the memory cell group of the second and third memory cell rows shares the same read word line RWL2. In the following memory cell rows as well, the read word lines RWL are arranged similarly.

In order to conduct the data read operation normally, a plurality of memory cells MC selected by the same read word line RWL must not be simultaneously coupled to the same read bit line RBL. Accordingly, the read bit line RBL is provided in every memory cell column, and the memory cells MC are arranged alternately.

With such a structure, the pitch of the write word lines WWL in the memory array 10 can be widened. As a result, the memory cells MC can be efficiently arranged, whereby improved integration of the memory array 10 as well as reduced chip area of the MRAM device can be achieved.

Third Modification of Sixth Embodiment

Figure 47:
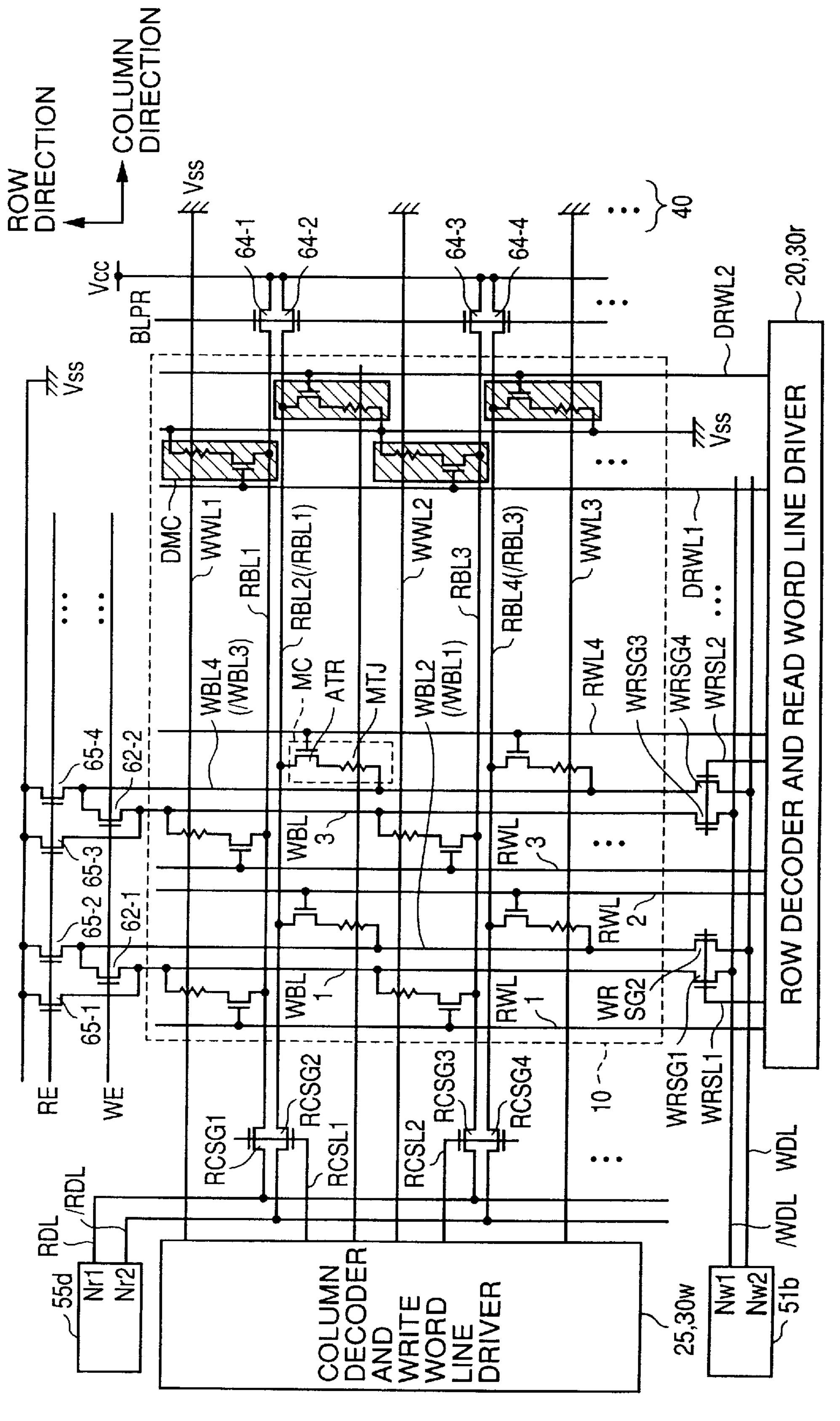
FIG. 47 is a diagram illustrating the structure of a memory array 10 and its peripheral circuitry according to a third modification of the sixth embodiment.

Referring to FIG. 47, for the memory cells having the structure of the sixth embodiment and arranged in rows and columns, the folded bit line structure is realized in every set of adjacent two memory cell columns, using corresponding two read bit lines RBL. For example, a read bit line pair can be formed from the read bit lines RBL1 and RBL2 (/RBL1) respectively corresponding to the first and second memory cell columns.

Similarly, the folded bit line structure is realized in every set of adjacent two memory cell rows, using corresponding two write bit lines WBL. For example, a write bit line pair can be formed from the write bit lines WBL1 and WBL2 (/WBL1) respectively corresponding to the first and second memory cell rows.

The structure of the peripheral circuitry for conducting row selection from the write bit lines WBL and /WBL of the write bit line pairs and supplying the data write current ±Iw thereto, and for conducting column selection from the read bit lines RBL and /RBL of the read bit line pairs and supplying the sense current Is thereto is the same as that shown in FIG. 39. Therefore, detailed description thereof will not be repeated.

Accordingly, even when the memory cells according to the sixth embodiment are arranged in rows and columns, the read and write operation margins can be ensured using the folded bit line structure.

Fourth Modification of Sixth Embodiment

In the fourth modification of the sixth embodiment, the write bit line WBL is shared between adjacent memory cells, in addition to the folded bit line structure shown in the third modification of the sixth embodiment.

Figure 48:
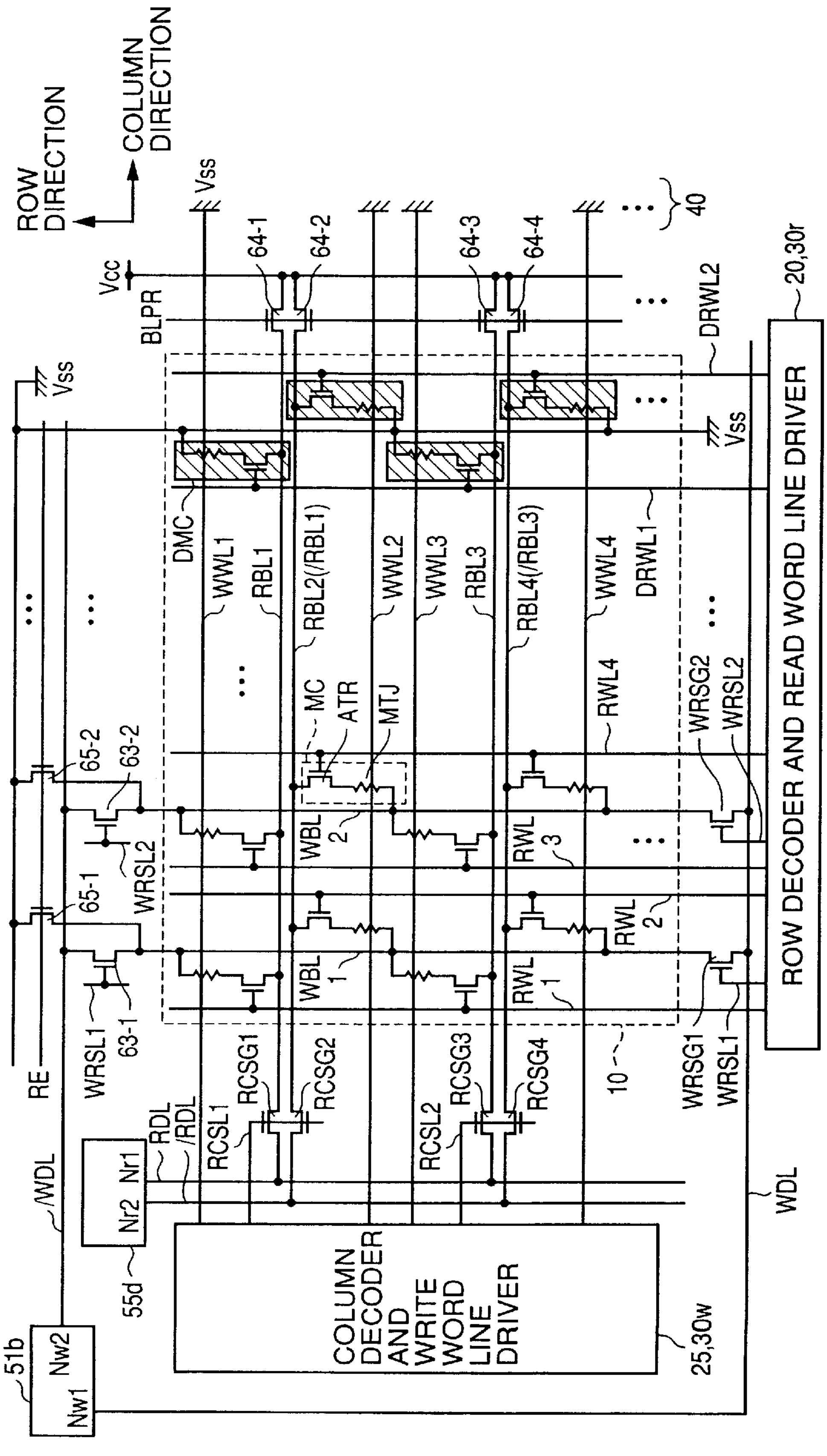
FIG. 48 is a diagram illustrating the structure of a memory array 10 and its peripheral circuitry according to a fourth modification of the sixth embodiment.

Referring to FIG. 48, in the memory array according to the fourth modification of the sixth embodiment, adjacent memory cells in the column direction share the same write bit line WBL.

In the read operation, the read word line RWL is activated. In each read bit line RBL, the memory cells are provided every other read word line RWL. Moreover, the memory cells are arranged alternately between every adjacent read bit lines RBL. Therefore, every set of adjacent two memory cell columns form a read bit line pair, so that the data read operation can be conducted based on the folded bit line structure in the same manner as that of the third modification of the sixth embodiment.

On the other hand, the data write operation cannot be conducted based on the folded bit line structure because the write bit line WBL is shared. Accordingly, in the fourth modification of the sixth embodiment, the peripheral circuitry associated with selection of the write bit line WBL is arranged in the same manner as that shown in FIG. 44. Thus, as in the case of the sixth embodiment, the data write operation can be conducted using the data write circuit 51*b* having a simple structure.

Although the data write operation cannot be conducted based on the folded bit line structure, the pitch of the write bit lines WBL in the memory array 10 can be widened. As a result, further improved integration of the memory array 10 and thus further reduced chip area of the MRAM device can be achieved.

Note that, although FIG. 48 shows the structure in which the write bit line WBL out of the signal wirings associated with the data write operation is shared between adjacent memory cells, it is also possible to share the write word line WWL instead of the write bit line WBL. In this case, however, the write bit line WBL cannot be shared, and must be provided in every memory cell row. Which of the wirings should be shared to widen the wiring pitch can be determined in view of the distance from the magnetic tunnel junction MTJ, and the like.

Fifth Modification of Sixth Embodiment

In the fifth modification of the sixth embodiment, the read word line RWL is shared between adjacent memory cells, in addition to the folded bit line structure of the third modification of the sixth embodiment.

Figure 49:
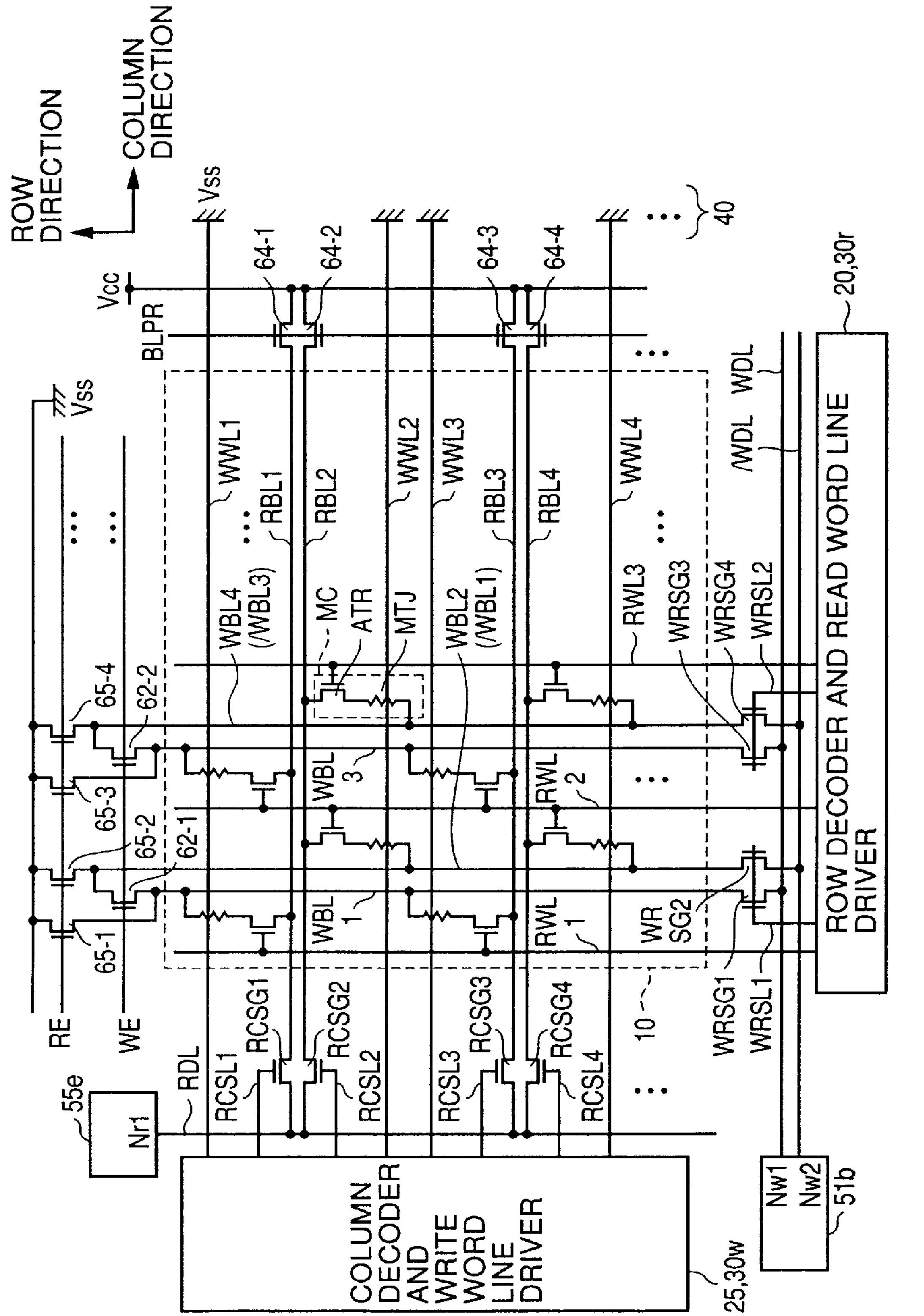
FIG. 49 is a diagram illustrating the structure of a memory array 10 and its peripheral circuitry according to a fifth modification of the sixth embodiment.

Referring to FIG. 49, in the memory array according to the fifth modification of the sixth embodiment, adjacent memory cells in the column direction share the same read word line RWL.

The read/write control circuit 60 includes the equalizing transistors 62, precharging transistors 64 and write bit line voltage control transistors 65, which are arranged in the same manner as that of the third modification of the sixth embodiment.

In the data write operation, the write word line WWL is activated. In each write bit line WBL, the memory cells are provided every other write word line WWL. Moreover, the memory cells are arranged alternately between every adjacent write bit lines WBL. Therefore, every set of adjacent two memory cell rows can form a write bit line pair. As a result, the data write operation can be conducted based on the folded bit line structure in the same manner as that of the third modification of the fifth embodiment, so that the same effects can be obtained.

On the other hand, in the data read operation, the read word line RWL shared by a plurality of memory cell rows is activated. Therefore, the data read operation cannot be conducted based on the folded bit line structure. Accordingly, in the fifth modification of the sixth embodiment, the peripheral circuitry associated with selection of the read bit line RBL is arranged in the same manner as that shown in FIG. 44.

With such a structure, the read operation margin based on the folded bit line structure cannot be ensured, but the pitch of the read word lines RWL in the memory array 10 can be widened, and the data read operation can be conducted normally. As a result, improved integration of the memory array 10 and thus reduced chip area of the MRAM device can be achieved.

Accordingly, by conducting the data write operation based on the folded bit line structure using the memory cells of the sixth embodiment, the write operation margin can be ensured as well as a simplified structure of the peripheral circuitry and reduced data write noise can be achieved. Moreover, by sharing the read word line RWL, improved integration of the memory array 10 can also be achieved simultaneously.

Note that, although FIG. 49 shows the structure in which the read word line RWL out of the signal wirings associated with the data read operation is shared between adjacent memory cells, it is also possible to share the read bit line RBL instead of the read word line RWL. In this case, however, the read word line RWL cannot be shared, and must be provided in every memory cell row. Which of the wirings should be shared to widen the wiring pitch can be determined as appropriate in view of the structural conditions, design and the like.

Seventh Embodiment

Figure 50:
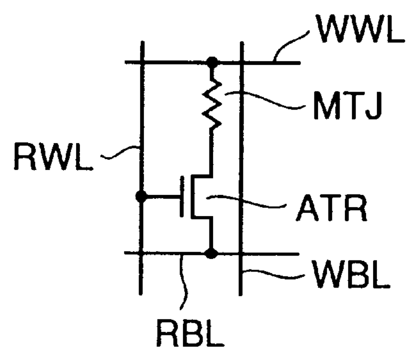
FIG. 50 is a circuit diagram showing the connection of an MTJ memory cell according to a seventh embodiment of the present invention.

Referring to FIG. 50, in the MTJ memory cell according to the seventh embodiment, the read bit line RBL is coupled to the magnetic tunnel junction MTJ through the access transistor ATR. The magnetic tunnel junction MTJ is coupled between the write word line WWL and the access transistor ATR. The read word line RWL is coupled to the gate of the access transistor ATR. In the structure of FIG. 50 as well, the read word line RWL and the write word line WWL extend perpendicularly to each other.

Figure 51:
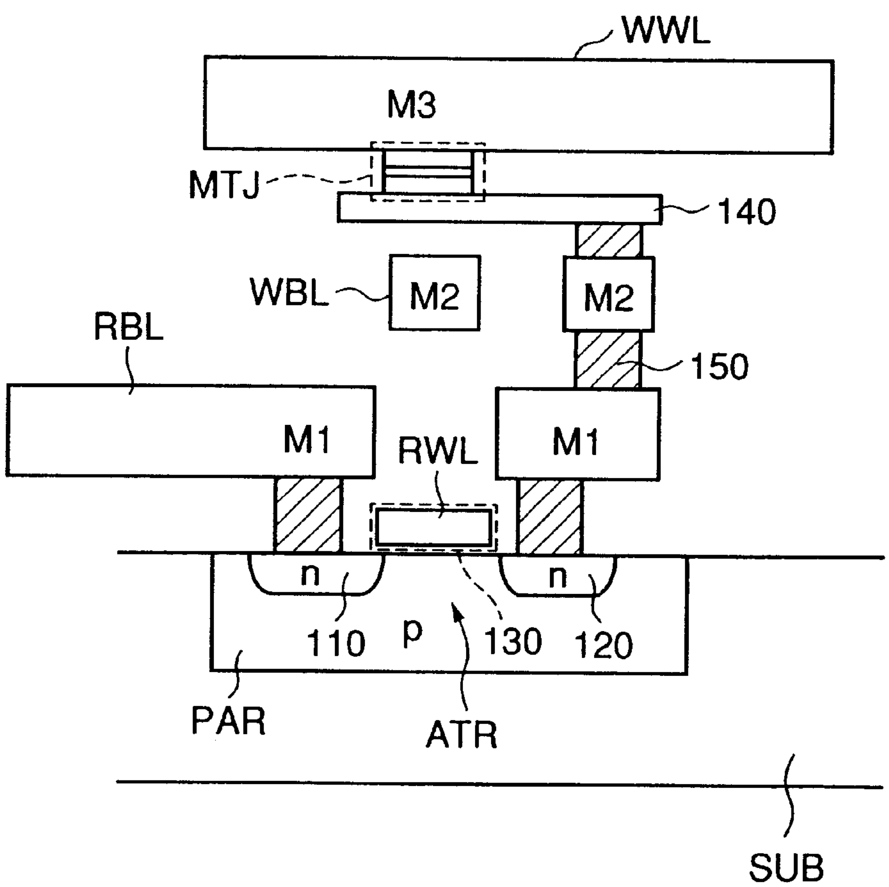
FIG. 51 is a structural diagram showing the MTJ memory cell arrangement according to the seventh embodiment.

Referring to FIG. 51, the read bit line RBL is provided in the metal wiring layer M1. The read word line RWL is formed in the same layer as that of the gate 130 of the access transistor ATR. The read bit line RBL is coupled to the source/drain region 110 of the access transistor ATR. The source/drain region 120 is coupled to the magnetic tunnel junction MTJ through the metal wirings provided in the first and second metal wiring layers M1 and M2, the barrier metal 140, and the metal film 150 provided in the contact hole.

The write bit line WBL is provided in the second metal wiring layer M2 near the magnetic tunnel junction MTJ. The write word line WWL is provided in the third metal wiring layer M3 so as to be electrically coupled to the magnetic tunnel junction MTJ.

With such a structure, the read bit line RBL is coupled to the magnetic tunnel junction MTJ through the access transistor ATR. Accordingly, the read bit line RBL is electrically coupled only to the MTJ memory cell MC to be read, i.e., the MTJ memory cell MC of the memory cell row corresponding to the read word line RWL activated to the selected state (H level). Accordingly, the capacitance of the read bit line RBL can be suppressed, whereby a high-speed data read operation can be achieved.

Note that, in the MTJ memory cell of the seventh embodiment, the voltage and current waveforms of each wiring in the data read and write operations are the same as those of FIG. 33. Therefore, detailed description thereof will not be repeated.

In the MTJ memory cell according to the seventh embodiment as well, the distance between the write bit line WBL and the magnetic tunnel junction MTJ can be reduced as compared to that in the MTJ memory cell of the fifth embodiment shown in FIG. 34. Accordingly, the amount of data write current flowing through the write bit line WBL can be reduced.

The write bit line WBL is located farther from the magnetic tunnel junction MTJ than is the write word line WWL. Therefore, in the MTJ memory cell of the seventh embodiment, a relatively large data write current must be applied to the write bit line WBL.

Figure 52:
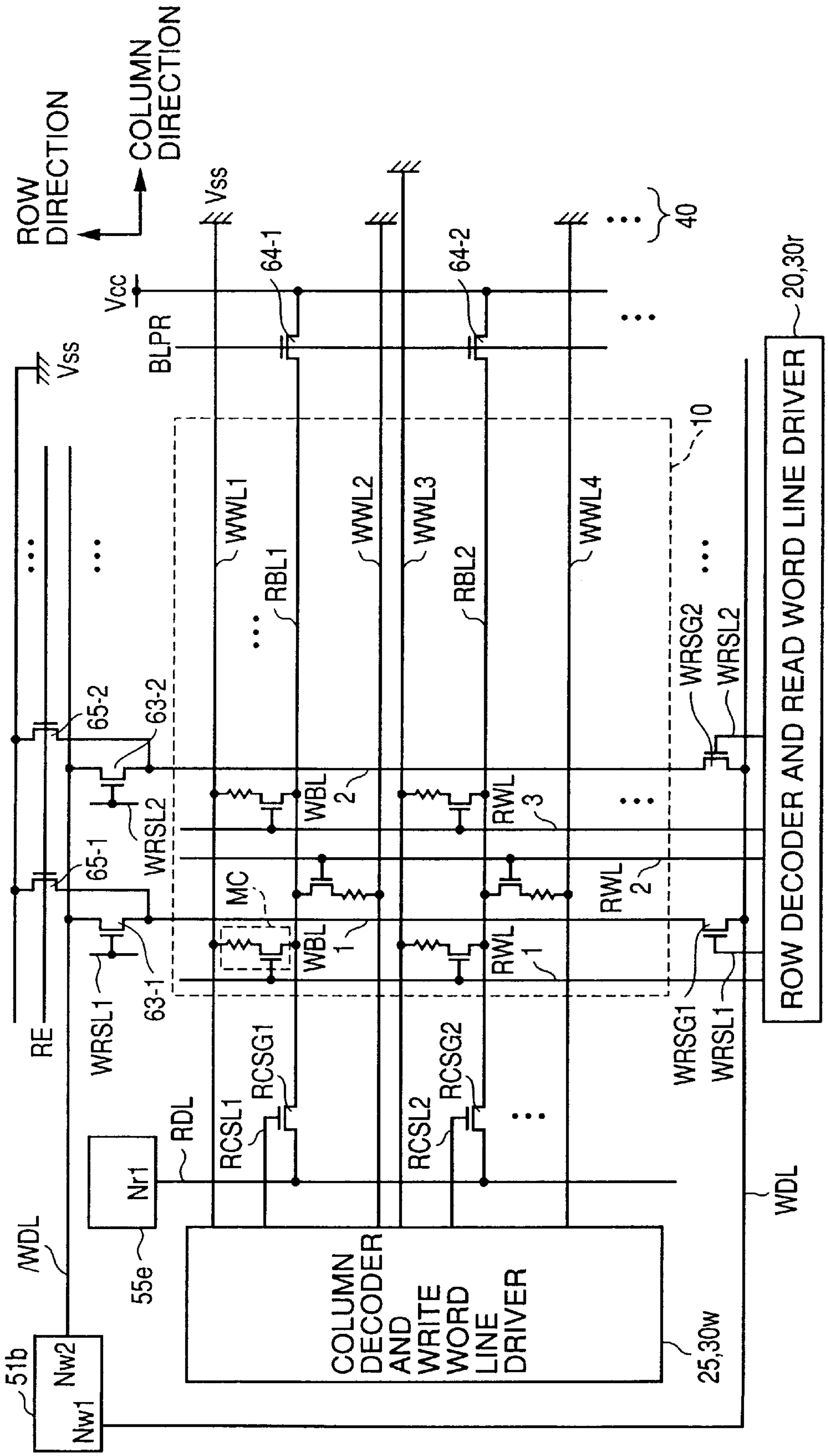
FIG. 52 is a diagram illustrating the structure of a memory array 10 and its peripheral circuitry according to the seventh embodiment.

Referring to FIG. 52, in the memory array according to the seventh embodiment, the memory cells MC shown in FIG. 50 are arranged in rows and columns. The read word lines RWL and the write word lines WWL extend in the row and column directions, respectively. The read bit lines RBL and the write bit lines WBL extend in the column and row directions, respectively.

Adjacent memory cells in the row direction share the read bit line RBL, and adjacent memory cells in the column direction share the write bit line WBL.

For example, the memory cell group of the first and second memory cell columns shares the same read bit line RBL1, and the memory cell group of the third and fourth memory cell columns shares the same read bit line RBL2. Moreover, the memory cell group of the second and third memory cell rows shares the write bit line WBL2. In the following memory cell rows and columns as well, the read bit lines RBL and the write bit lines WBL are arranged similarly.

If the data is to be read from or written to a plurality of memory cells MC of the same read bit line RBL or write bit line WBL, data collision occurs. Accordingly, the memory cells MC are arranged alternately.

With such a structure, the pitches of the read bit lines RBL and the write bit lines WBL in the memory array 10 can be widened. As a result, the memory cells MC can be efficiently arranged, whereby improved integration of the memory array 10 as well as reduced chip area of the MRAM device can be achieved.

Since the structure of the peripheral circuitry for selectively supplying the data write current and the sense current to the read bit line RBL and the write bit line WBL is the same as that of FIG. 35, detailed description thereof will not be repeated.

As described before, in the MTJ memory cell of the seventh embodiment, a relatively large data write current must be applied to the write bit line WBL. Accordingly, the write bit line WBL is shared between adjacent memory cells so as to ensure the line pitch thereof. As a result, the line width, i.e., the cross-sectional area, of the write bit line WBL is assured, so that the current density thereof can be suppressed. As a result, improved reliability of the MRAM device can be achieved. As described before, for the improved operation reliability, it is also effective to select a material of these wirings in view of electromigration resistance.

First Modification of Seventh Embodiment

Figure 53:
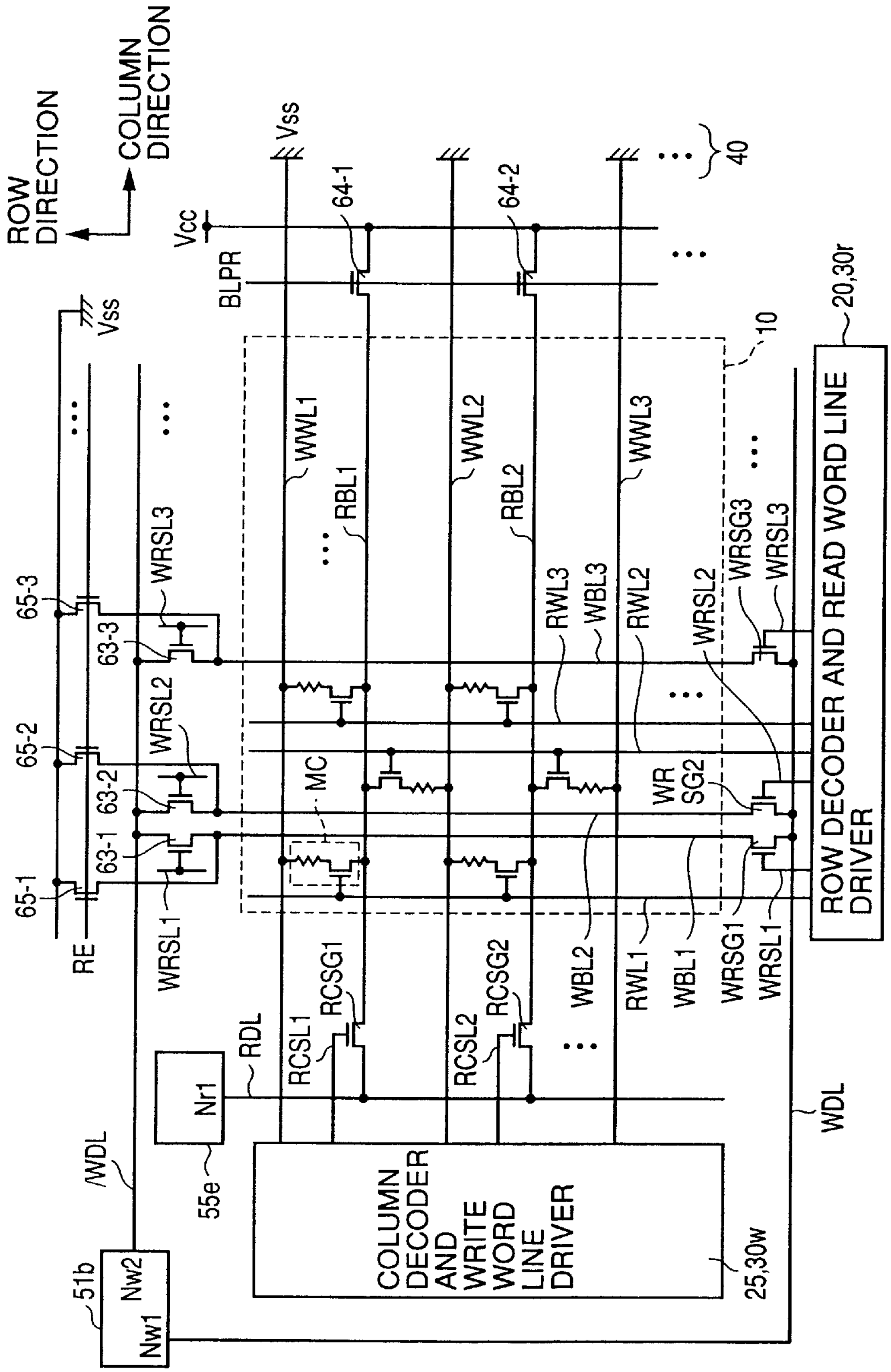
FIG. 53 is a diagram illustrating the structure of a memory array 10 and its peripheral circuitry according to a first modification of the seventh embodiment.

Referring to FIG. 53, in the memory array according to the first modification of the seventh embodiment, adjacent memory cells share the same write word line WWL. For example, the memory cell group of the second and third memory cell columns shares a single write word line WWL2. In the following memory cell columns as well, the write word lines WWL are arranged similarly.

In order to conduct the data write operation normally, a plurality of memory cells MC must not be present at the intersection of the same write word line WWL and the same write bit line WBL. Accordingly, the memory cells MC are arranged alternately.

Moreover, like the seventh embodiment, adjacent memory cells in the row direction share the read bit line RBL.

Since the structure of the peripheral circuitry associated with the data read and write operations through the read bit line RBL and write bit line WBL, as well as the memory cell operation in reading and writing the data are the same as those of the seventh embodiment, detailed description thereof will not be repeated.

With such a structure, the pitches of the read bit lines RBL and the write word lines WWL in the memory array 10 can be widened. As a result, the memory cells MC can be efficiently arranged, whereby improved integration of the memory array 10 as well as reduced chip area of the MRAM device can be achieved.

Second Modification of Seventh Embodiment

Figure 54:
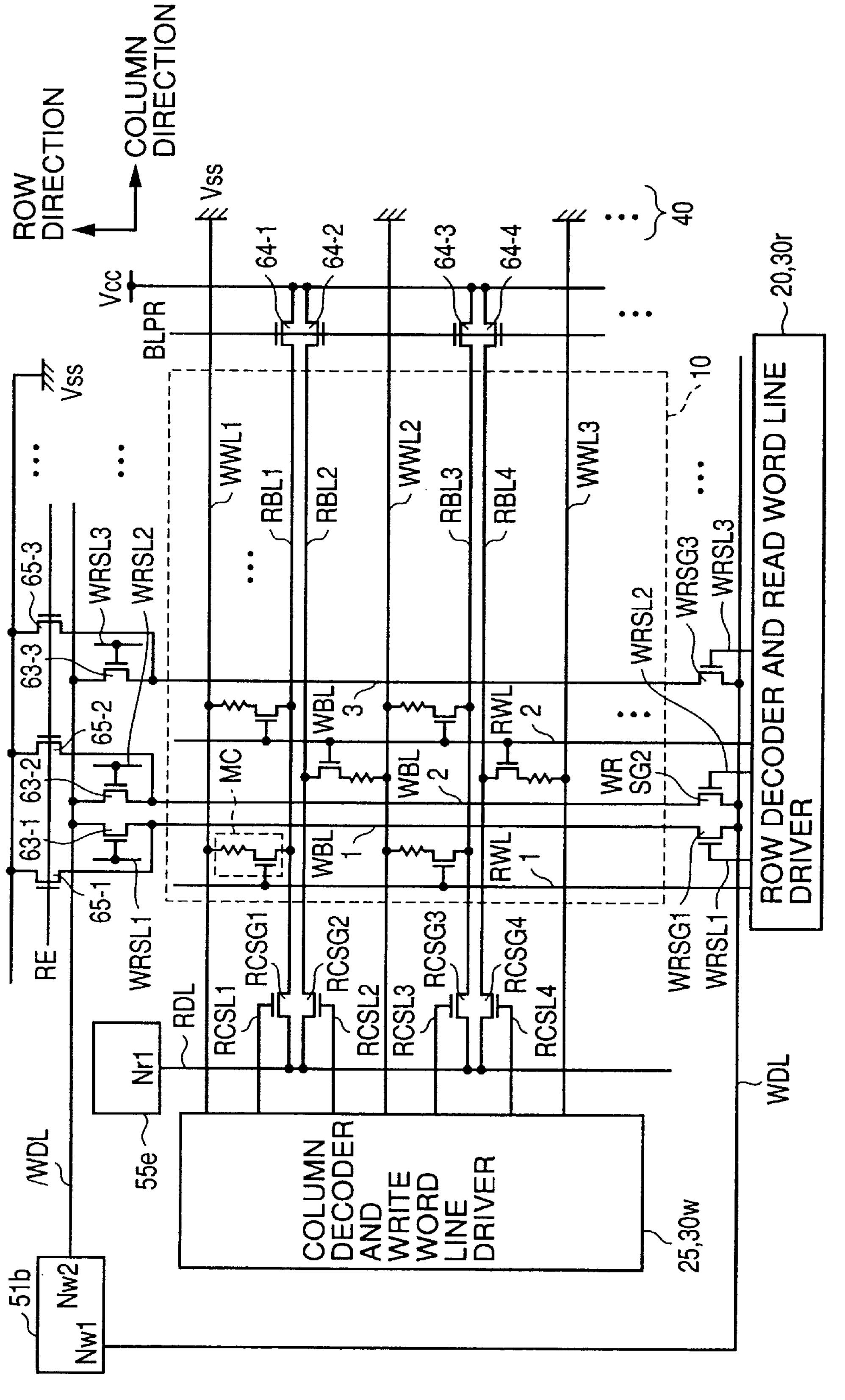
FIG. 54 is a diagram illustrating the structure of a memory array 10 and its peripheral circuitry according to a second modification of the seventh embodiment.

Referring to FIG. 54, in the memory array according to the second modification of the seventh embodiment, adjacent memory cells in the column direction share the same read word line RWL. For example, the memory cell group of the second and third memory cell rows shares the same read word line RWL2. In the following memory cell rows as well, the read word lines RWL are arranged similarly.

Moreover, adjacent memory cells in the row direction share the same write word line WWL. For example, the memory cell group of the second and third memory cell columns shares the same write word line WWL2. In the following memory cell columns as well, the write word lines WWL are arranged similarly.

In order to conduct the data read and write operations normally, a plurality of memory cells MC selected by the same read word line RWL or write word line WWL must not be simultaneously coupled to the same read bit line RBL or write bit line WBL. Accordingly, the read bit line RBL and the write bit line WBL are provided in every memory cell column and every memory cell row, respectively, and the memory cells MC are arranged alternately.

Since the structure is otherwise the same as that of the seventh embodiment, detailed description thereof will not be repeated.

With such a structure, the pitches of the write word lines WWL and read word lines RWL in the memory array 10 can be widened. As a result, the memory cells MC can be more efficiently arranged, whereby improved integration of the memory array 10 as well as reduced chip area of the MRAM device can be achieved.

Third Modification of Seventh Embodiment

Figure 55:
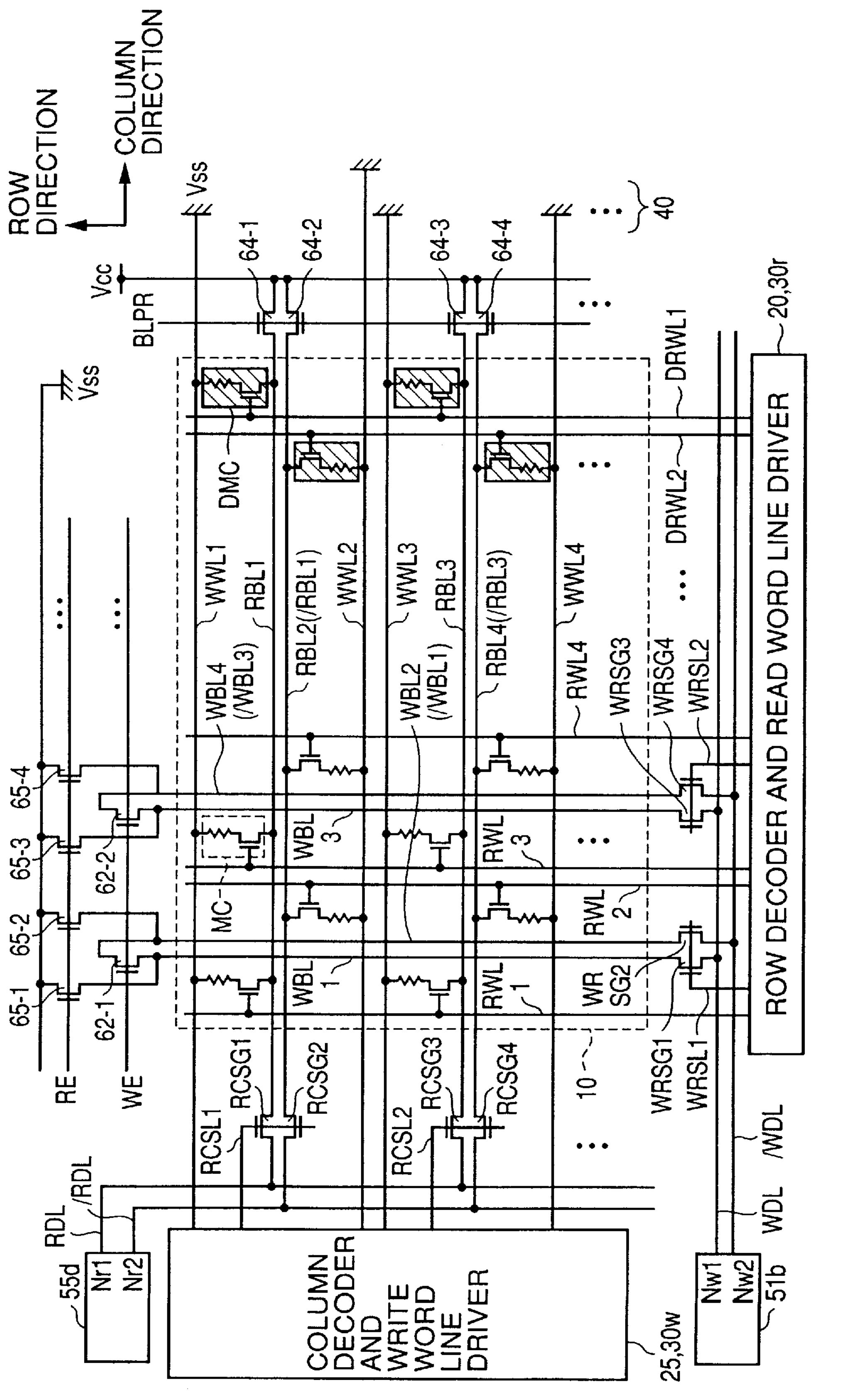
FIG. 55 is a diagram illustrating the structure of a memory array 10 and its peripheral circuitry according to a third modification of the seventh embodiment.

Referring to FIG. 55, for the memory cells having the structure of the seventh embodiment and arranged in rows and columns, the folded bit line structure is realized in every set of adjacent two memory cell columns, using corresponding two read bit lines RBL. For example, a read bit line pair can be formed from the read bit lines RBL1 and RBL2 (/RBL1) respectively corresponding to the first and second memory cell columns.

Similarly, the folded bit line structure is realized in every set of adjacent two memory cell rows, using corresponding two write bit lines WBL. For example, a write bit line pair can be formed from the write bit lines WBL1 and WBL2 (/WBL1) respectively corresponding to the first and second memory cell rows.

The structure of the peripheral circuitry for conducting row selection from the write bit lines WBL and /WBL of the write bit line pairs and supplying the data write current ±Iw thereto, and for conducting column selection from the read bit lines RBL and /RBL of the read bit line pairs and supplying the sense current Is thereto is the same as that shown in FIG. 39. Therefore, detailed description thereof will not be repeated.

Accordingly, even when the memory cells according to the seventh embodiment are arranged in rows and columns, the read and write operation margins can be ensured using the folded bit line structure.

Fourth Modification of Seventh Embodiment

In the fourth modification of the seventh embodiment, the write word line WWL is shared between adjacent memory cells, in addition to the folded bit line structure shown in the third modification of the seventh embodiment.

Figure 56:
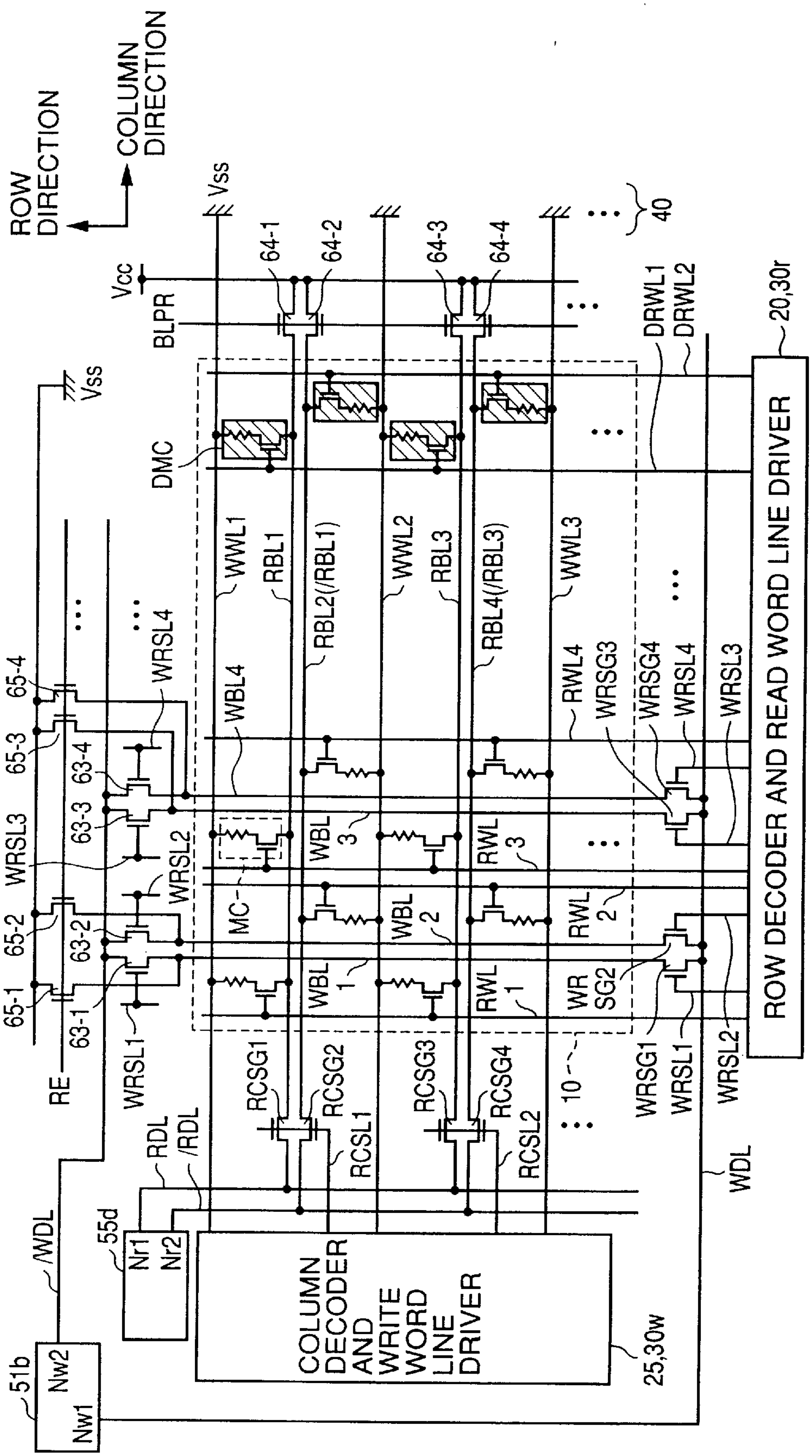
FIG. 56 is a diagram illustrating the structure of a memory array 10 and its peripheral circuitry according to a fourth modification of the seventh embodiment.

Referring to FIG. 56, in the memory array according to the fourth modification of the seventh embodiment, adjacent memory cells in the row direction share the same write word line WWL.

In the read operation, the read word line RWL is activated. In each read bit line RBL, the memory cells are provided every other read word line RWL. Moreover, the memory cells are arranged alternately between every adjacent read bit lines RBL. Therefore, every set of adjacent two memory cell columns form a read bit line pair, so that the data read operation can be conducted based on the folded bit line structure in the same manner as that of the third modification of the seventh embodiment.

On the other hand, the data write operation cannot be conducted based on the folded bit line structure because the write word line WWL is shared. Accordingly, in the fourth modification of the seventh embodiment, the peripheral circuitry associated with selection of the write bit line WBL is arranged in the same manner as that shown in FIG. 52. Thus, as in the case of the seventh embodiment, the data write operation can be conducted using the data write circuit 51*b* having a simple structure.

Although the data write operation cannot be conducted based on the folded bit line structure, the pitch of the write word lines WWL in the memory array 10 can be widened. As a result, further improved integration of the memory array 10 and thus further reduced chip area of the MRAM device can be achieved.

Note that, although FIG. 56 shows the structure in which the write word line WWL out of the signal wirings associated with the data write operation is shared between adjacent memory cells, it is also possible to share the write bit line WBL instead of the write word line WWL. In this case, however, the write word line WWL cannot be shared, and must be provided in every memory cell column. Which of the wirings should be shared to widen the wiring pitch can be determined in view of the distance from the magnetic tunnel junction MTJ, and the like.

Fifth Modification of Seventh Embodiment

In the fifth modification of the seventh embodiment, the read word line RWL is shared between adjacent memory cells, in addition to the folded bit line structure of the third modification of the seventh embodiment.

Figure 57:
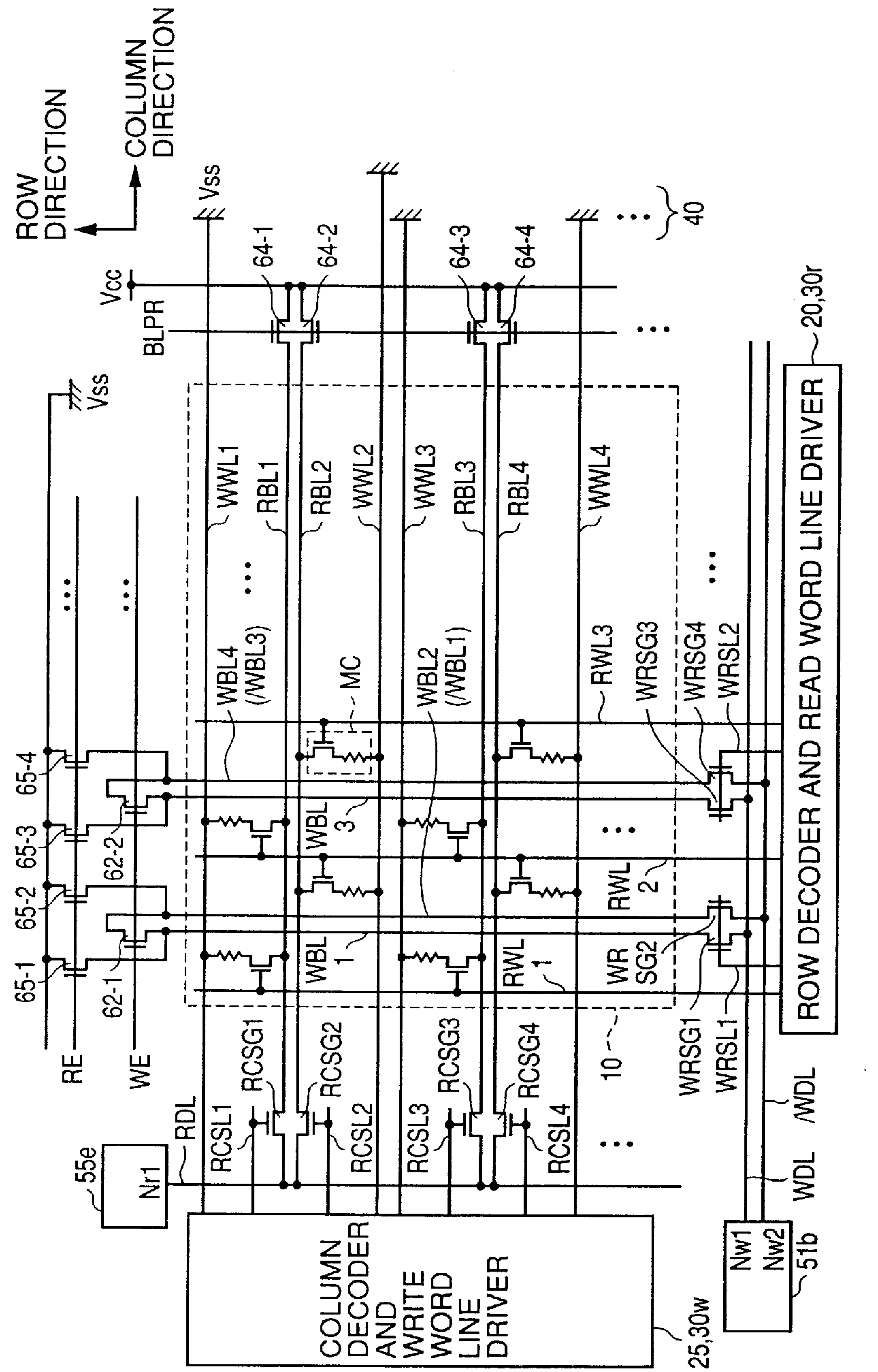
FIG. 57 is a diagram illustrating the structure of a memory array 10 and its peripheral circuitry according to a fifth modification of the seventh embodiment.

Referring to FIG. 57, in the memory array according to the fifth modification of the seventh embodiment, adjacent memory cells in the column direction share the same read word line RWL.

The read/write control circuit 60 includes the equalizing transistors 62, precharging transistors 64 and write bit line voltage control transistors 65, which are arranged in the same manner as that of the third modification of the seventh embodiment.

In the data write operation, the write word line WWL is activated. In each write bit line WBL, the memory cells are provided every other write word line WWL. Moreover, the memory cells are arranged alternately between every adjacent write bit lines WBL. Therefore, every set of adjacent two memory cell rows can form a write bit line pair. As a result, the data write operation can be conducted based on the folded bit line structure in the same manner as that of the third modification of the fifth embodiment, so that the same effects can be obtained.

On the other hand, in the data read operation, the read word line RWL shared by a plurality of memory cell rows is activated. Therefore, the data read operation cannot be conducted based on the folded bit line structure. Accordingly, in the fifth modification of the seventh embodiment, the peripheral circuitry associated with selection of the read bit line RBL is arranged in the same manner as that shown in FIG. 52.

With such a structure, the read operation margin based on the folded bit line structure cannot be ensured, but the pitch of the read word lines RWL in the memory array 10 can be widened, and the data read operation can be conducted normally. As a result, improved integration of the memory array 10 and thus reduced chip area of the MRAM device can be achieved.

Accordingly, by conducting the data write operation based on the folded bit line structure using the memory cells of the seventh embodiment, the write operation margin can be ensured as well as a simplified structure of the peripheral circuitry and reduced data write noise can be achieved. Moreover, by sharing the read word line RWL, improved integration of the memory array 10 can also be achieved simultaneously.

Note that, although FIG. 57 shows the structure in which the read word line RWL out of the signal wirings associated with the data read operation is shared between adjacent memory cells, it is also possible to share the read bit line RBL instead of the read word line RWL. In this case, however, the read word line RWL cannot be shared, and must be provided in every memory cell row. Which of the wirings should be shared to widen the wiring pitch can be determined as appropriate in view of the structural conditions, design and the like.

Eighth Embodiment

Figure 58:
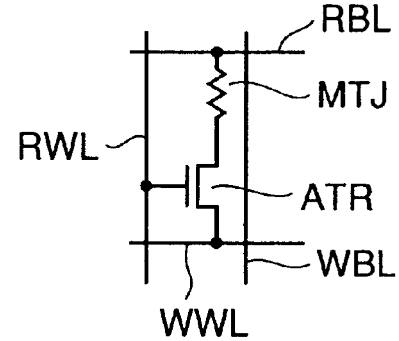
FIG. 58 is a circuit diagram showing the connection of an MTJ memory cell according to an eighth embodiment of the present invention.

Referring to FIG. 58, the MTJ memory cell according to the eighth modification is different from that of the seventh embodiment shown in FIG. 50 in that the read bit line RBL and the write word line WWL are switched in position. Since the arrangement of the lines is otherwise the same as that of FIG. 50, description thereof will not be repeated. Such a structure also allows the read word line RWL and the write word line WWL to extend perpendicularly to each other.

Figure 59:
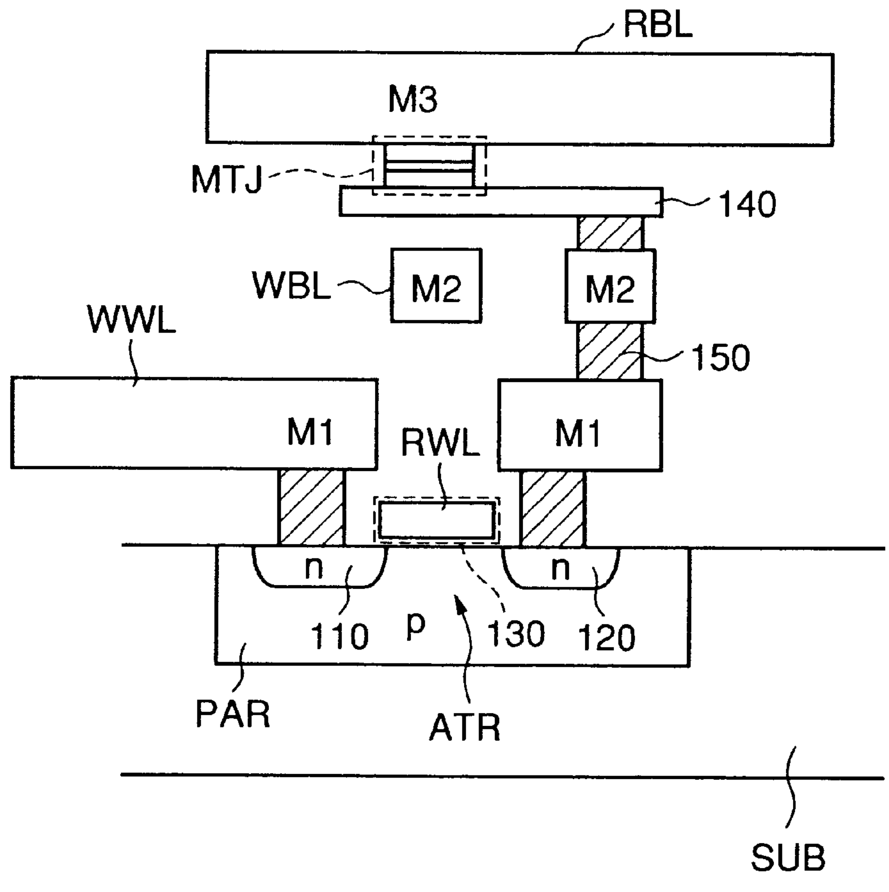
FIG. 59 is a structural diagram showing the MTJ memory cell arrangement according to the eighth embodiment.

Referring to FIG. 59, the structure of the MTJ memory cell according to the eighth embodiment is different from that of the seventh embodiment shown in FIG. 51 in that the write word line WWL and the read bit line RBL are switched in position. More specifically, the write word line WWL is provided in the first metal wiring layer M1 so as to be coupled to the source/drain region 110 of the access transistor ATR. The read bit line RBL is provided in the third metal wiring layer M3 so as to be electrically coupled to the magnetic tunnel junction MTJ.

In the eighth embodiment, the read bit line RBL is directly coupled to the magnetic tunnel junction MTJ. Therefore, such an increased read operation speed as in the seventh embodiment cannot be achieved. However, in the structure of the eighth embodiment as well, the read word line driver 30*r* and the write word line driver 30*w* can be independently provided, whereby the same effects as those of the seventh embodiment can be obtained.

Note that, in the MTJ memory cell of the eighth embodiment, the voltage and current waveforms of each wiring in the data read and write operations are the same as those of FIG. 33. Therefore, detailed description thereof will not be repeated.

In the MTJ memory cell according to the eighth embodiment, the write word line WWL is located farther from the magnetic tunnel junction MTJ than is the write bit line WBL. Therefore, a relatively large data write current must be applied to the write word line WWL.

Figure 60:
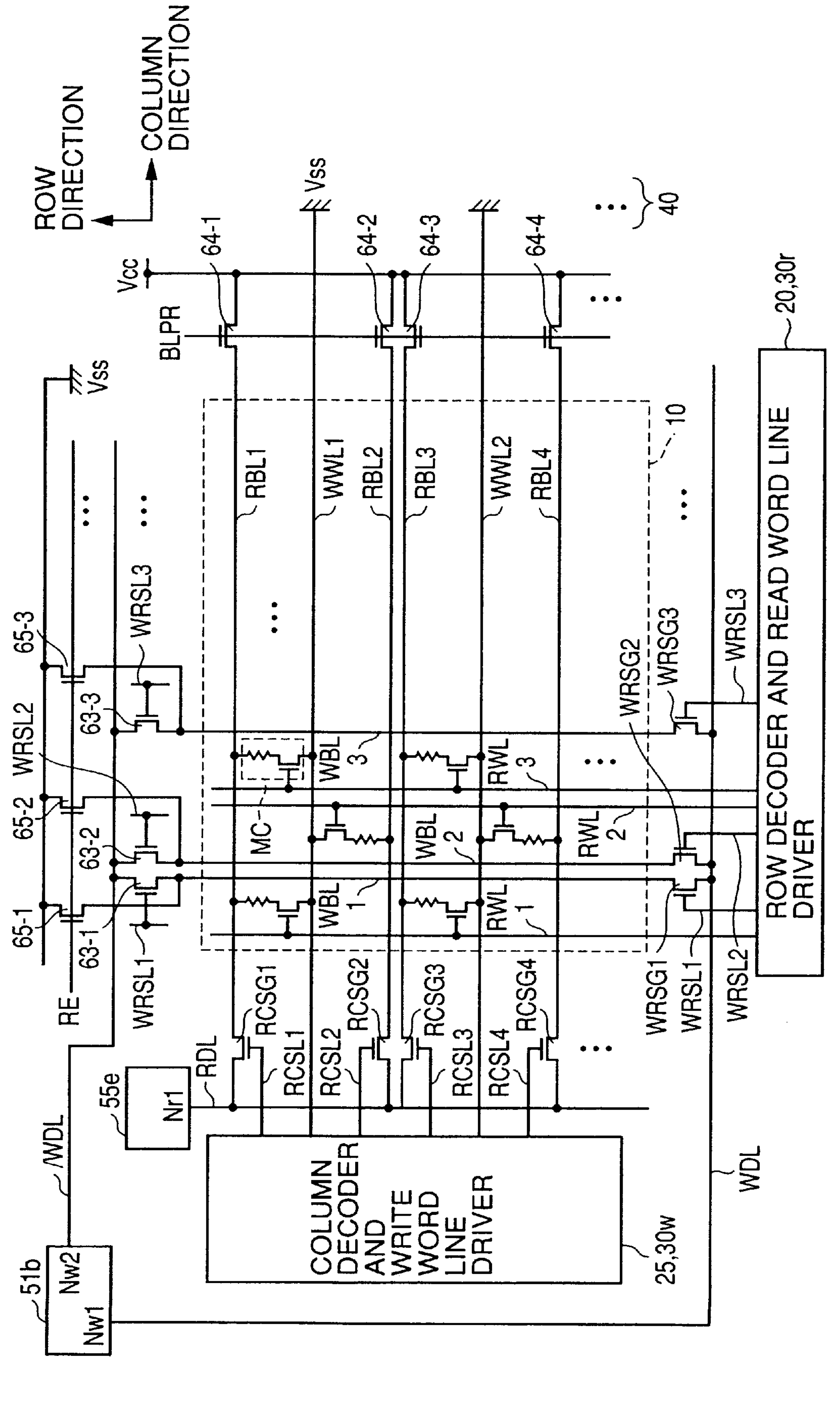
FIG. 60 is a diagram illustrating the structure of a memory array 10 and its peripheral circuitry according to the eighth embodiment.

Referring to FIG. 60, in the memory array according to the eighth embodiment, the memory cells MC having the structure shown in FIG. 58 are arranged in rows and columns. The read word lines RWL and the write word lines WWL extend in the row and column directions, respectively. The read bit lines RBL and the write bit lines WBL extend in the column and row directions, respectively.

Adjacent memory cells in the row direction share the same write word line WWL.

For example, the memory cell group of the first and second memory cell columns shares the same write word line WWL1, and the memory cell group of the third and fourth memory cell columns shares the same write word line WWL2. In the following memory cell columns as well, the write word lines WWL are arranged similarly.

If the data is to be written to a plurality of memory cells MC of the same write bit line WBL, data collision occurs. Accordingly, the memory cells MC are arranged alternately.

With such a structure, the pitch of the write word lines WWL in the memory array 10 can be widened. As a result, the memory cells MC can be efficiently arranged, whereby improved integration of the memory array 10 as well as reduced chip area of the MRAM device can be achieved.

Since the structure of the peripheral circuitry for selectively supplying the data write current and the sense current to the read bit line RBL and the write bit line WBL is the same as that of FIG. 35, detailed description thereof will not be repeated.

As described before, in the MTJ memory cell of the eighth embodiment, a relatively large data write current must be applied to the write word line WWL. Accordingly, the write word line WWL is shared between adjacent memory cells so as to ensure the line pitch thereof. As a result, the line width, i.e., the cross-sectional area, of the write word line WWL is assured, so that the current density thereof can be suppressed. Thus, improved reliability of the MRAM device can be achieved. As described before, for the improved operation reliability, it is also effective to select a material of these wirings in view of electromigration resistance.

First Modification of Eighth Embodiment

Figure 61:
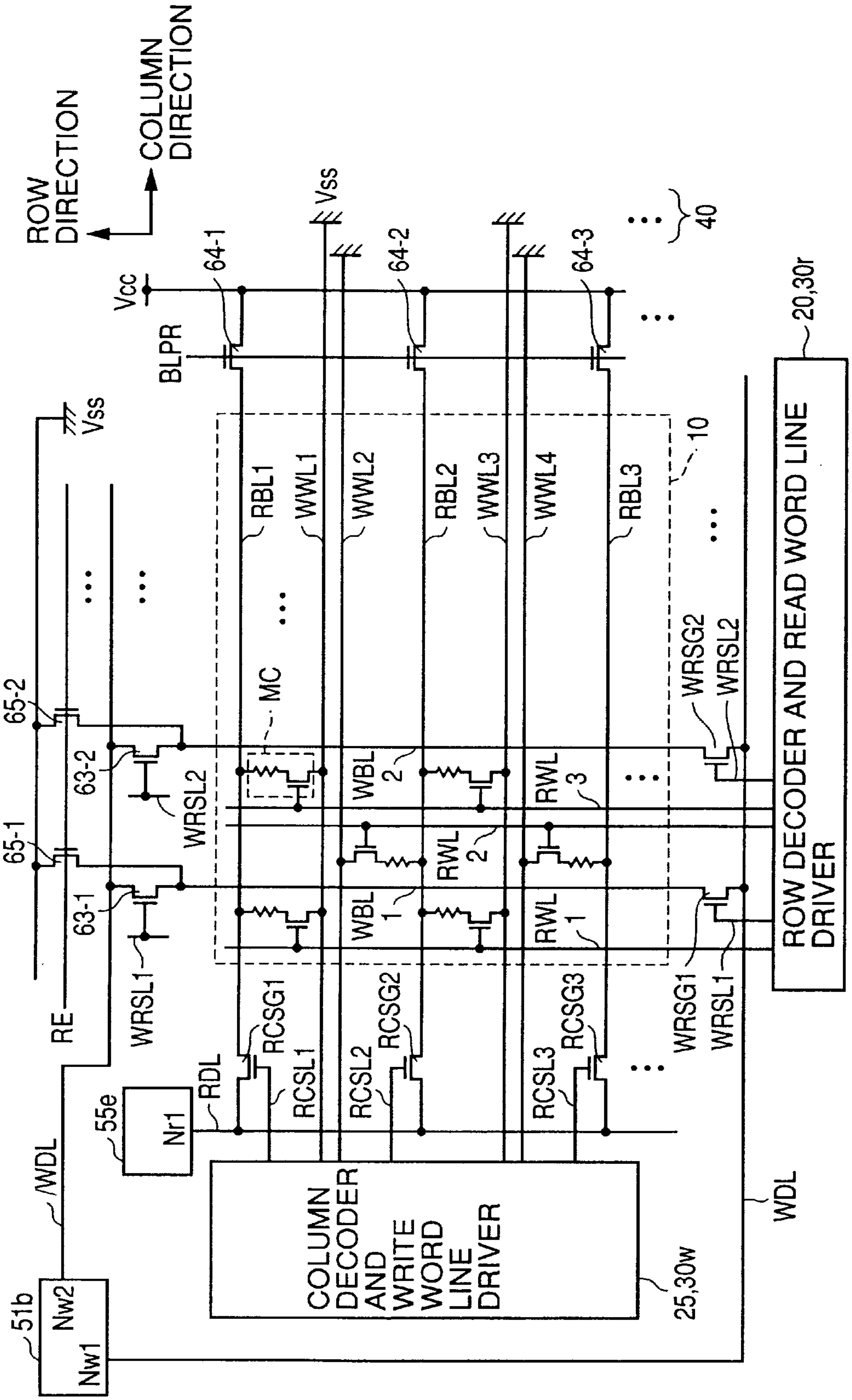
FIG. 61 is a diagram illustrating the structure of a memory array 10 and its peripheral circuitry according to a first modification of the eighth embodiment.

Referring to FIG. 61, in the memory array according to the first modification of the eighth embodiment, adjacent memory cells share the same read bit line RBL. For example, the memory cell group of the second and third memory cell columns shares the same read bit line RBL2. In the following memory cell columns as well, the read bit lines RBL are arranged similarly.

In order to conduct the data read operation normally, a plurality of memory cells MC must not be present at the intersection of the same read word line RWL and the same read bit line RBL. Accordingly, the memory cells MC are arranged alternately.

Moreover, adjacent memory cells share the same write bit line WBL. For example, the memory cell group of the first and second memory cell rows shares the same write bit line WBL1. In the following memory cell rows as well, the write bit lines WBL are arranged similarly.

In order to conduct the data write operation normally, a plurality of memory cells MC must not be present at the intersection of the same write word line WWL and the same write bit line WBL.

Since the structure of the peripheral circuitry associated with the data read and write operations through the read bit line RBL and write bit line WBL, as well as the memory cell operation in reading and writing the data are the same as those of the eighth embodiment, detailed description thereof will not be repeated.

With such a structure, the pitches of the read bit lines RBL and the write bit lines WBL in the memory array 10 can be widened. As a result, the memory cells MC can be efficiently arranged, whereby improved integration of the memory array 10 as well as reduced chip area of the MRAM device can be achieved.

Second Modification of Eighth Embodiment

Figure 62:
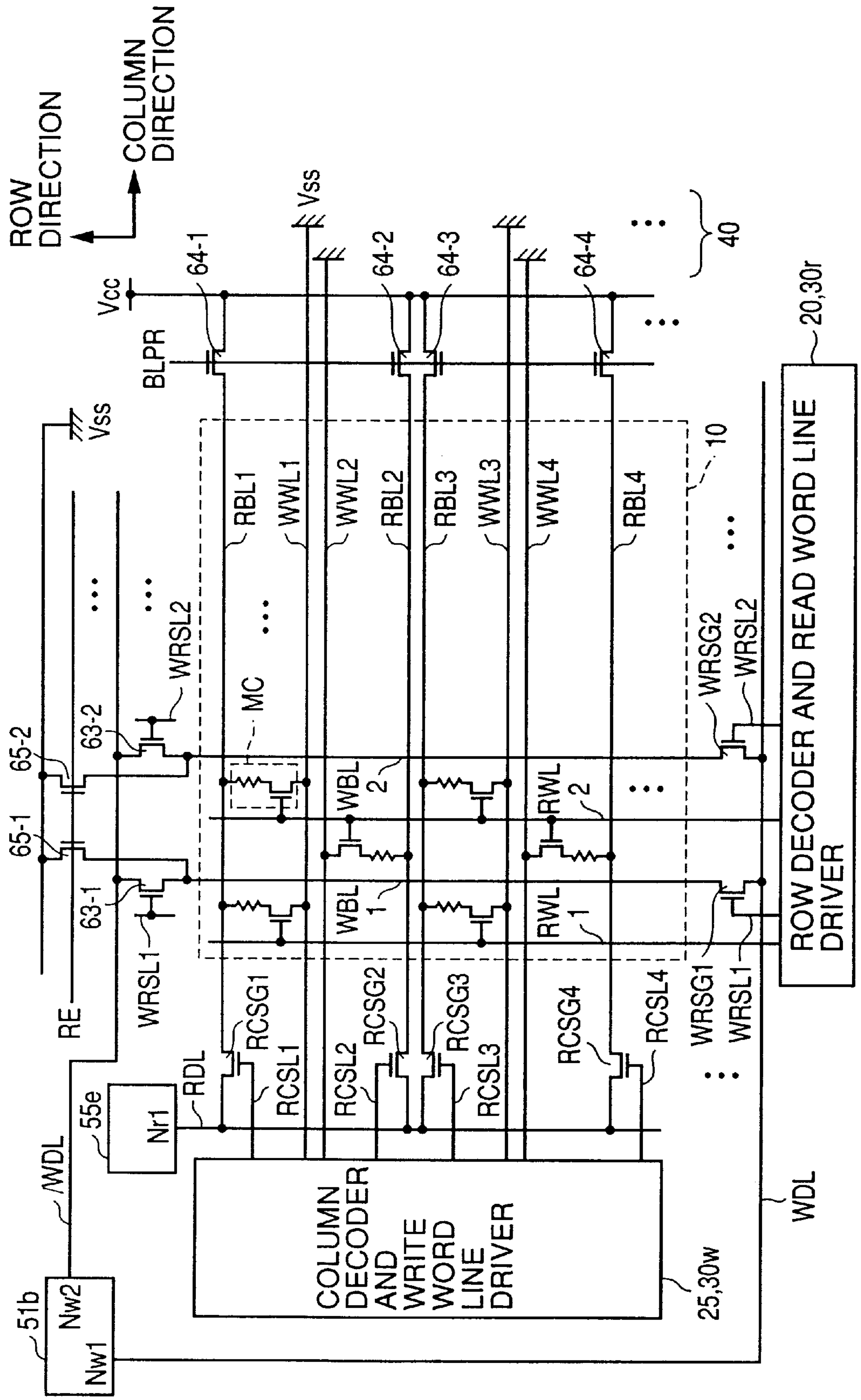
FIG. 62 is a diagram illustrating the structure of a memory array 10 and its peripheral circuitry according to a second modification of the eighth embodiment.

Referring to FIG. 62, in the memory array according to the second modification of the eighth embodiment, adjacent memory cells in the column direction share the same read word line RWL. For example, the memory cell group of the second and third memory cell rows shares the same read word line RWL2. In the following memory cell rows as well, the read word lines RWL are arranged similarly.

Moreover, adjacent memory cells in the column direction share the same write bit line WBL. For example, the memory cell group of the first and second memory cell rows shares the same write bit line WBL1. In the following memory cell rows as well, the write bit lines WBL are arranged similarly.

In order to conduct the data read operation normally, a plurality of memory cells MC selected by the same read word line RWL must not be simultaneously coupled to the same read bit line RBL. Accordingly, the read bit line RBL is provided in every memory cell column, and the memory cells MC are arranged alternately.

Since the structure is otherwise the same as that of the eighth embodiment, detailed description thereof will not be repeated.

With such a structure, the pitch of the read word lines RWL in the memory array 10 can be widened. As a result, the memory cells MC can be efficiently arranged, whereby improved integration of the memory array 10 as well as reduced chip area of the MRAM device can be achieved.

Third Modification of Eighth Embodiment

Figure 63:
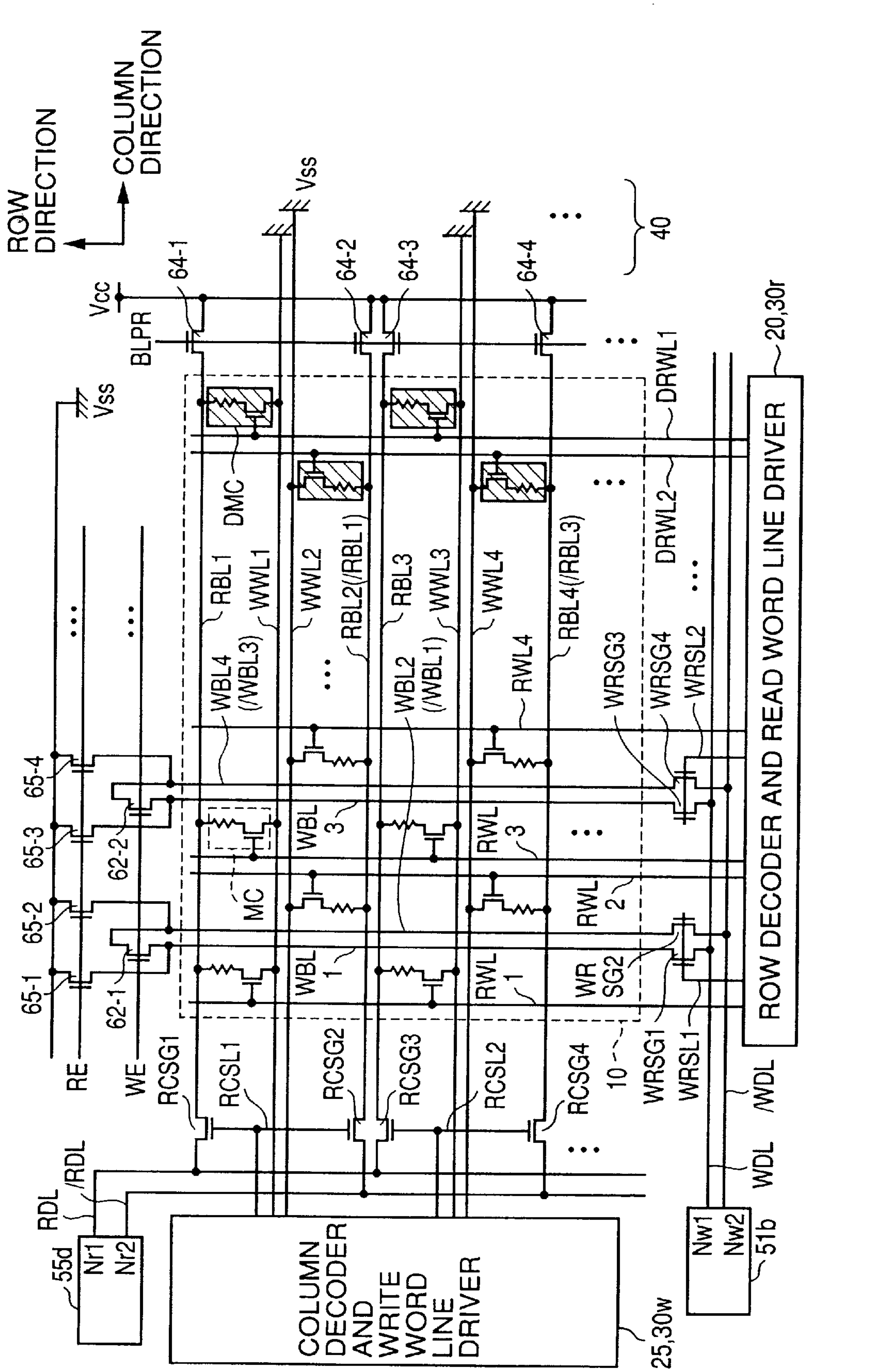
FIG. 63 is a diagram illustrating the structure of a memory array 10 and its peripheral circuitry according to a third modification of the eighth embodiment.

Referring to FIG. 63, for the memory cells having the structure of the eighth embodiment and arranged in rows and columns, the folded bit line structure is realized in every set of adjacent two memory cell columns, using corresponding two read bit lines RBL. For example, a read bit line pair can be formed from the read bit lines RBL1 and RBL2 (/RBL1) respectively corresponding to the first and second memory cell columns.

Similarly, the folded bit line structure is realized in every set of adjacent two memory cell rows, using corresponding two write bit lines WBL. For example, a write bit line pair can be formed from the write bit lines WBL1 and WBL2 (/WBL1) respectively corresponding to the first and second memory cell rows.

The structure of the peripheral circuitry for conducting row selection from the write bit lines WBL and /WBL of the write bit line pairs and supplying the data write current ±Iw thereto, and for conducting column selection from the read bit lines RBL and /RBL of the read bit line pairs and supplying the sense current Is thereto is the same as that shown in FIG. 39. Therefore, detailed description thereof will not be repeated.

Accordingly, even when the memory cells according to the eighth embodiment are arranged in rows and columns, the data read and write operation margins can be ensured using the folded bit line structure.

Fourth Modification of Eighth Embodiment

In the fourth modification of the eighth embodiment, the write word line WWL is shared between adjacent memory cells, in addition to the folded bit line structure shown in the third modification of the eighth embodiment.

Figure 64:
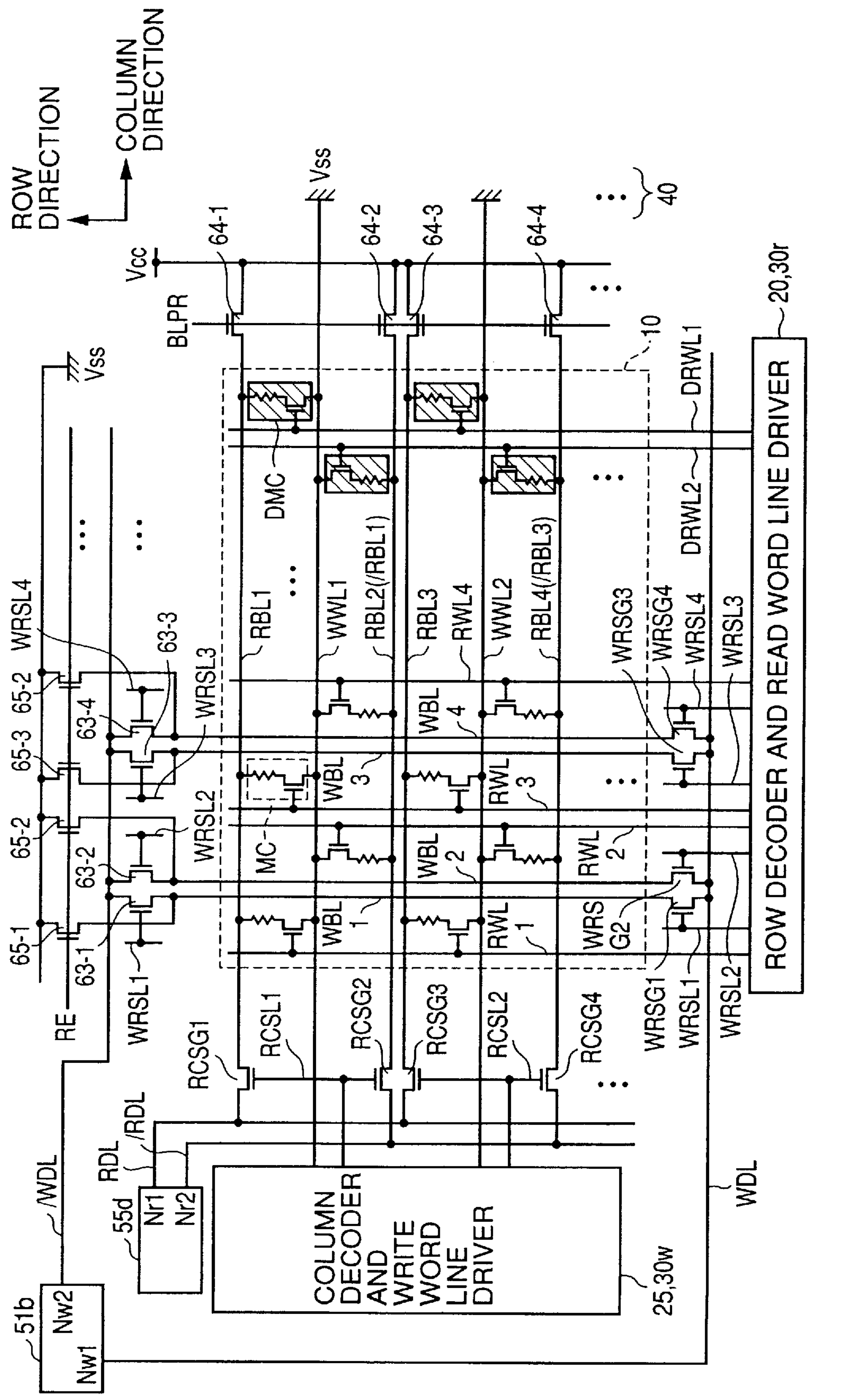
FIG. 64 is a diagram illustrating the structure of a memory array 10 and its peripheral circuitry according to a fourth modification of the eighth embodiment.

Referring to FIG. 64, in the memory array according to the fourth modification of the eighth embodiment, adjacent memory cells in the row direction share the same write word line WWL.

In the read operation, the read word line RWL is activated. In each read bit line RBL, the memory cells are provided every other read word line RWL. Moreover, the memory cells are arranged alternately between every adjacent read bit lines RBL. Therefore, every set of adjacent two memory cell columns form a read bit line pair, so that the data read operation can be conducted based on the folded bit line structure in the same manner as that of the third modification of the eighth embodiment.

On the other hand, the data write operation cannot be conducted based on the folded bit line structure because the write word line WWL is shared. Accordingly, in the fourth modification of the eighth embodiment, the peripheral circuitry associated with selection of the write bit line WBL is arranged in the same manner as that shown in FIG. 60. Thus, as in the case of the eighth embodiment, the data write operation can be conducted using the data write circuit 51*b* having a simple structure.

Although the data write operation cannot be conducted based on the folded bit line structure, the pitch of the write word lines WWL in the memory array 10 can be widened. As a result, further improved integration of the memory array 10 and thus further reduced chip area of the MRAM device can be achieved.

Note that, although FIG. 64 shows the structure in which the write word line WWL out of the signal wirings associated with the data write operation is shared between adjacent memory cells, it is also possible to share the write bit line WBL instead of the write word line WWL. In this case, however, the write word line WWL cannot be shared, and must be provided in every memory cell column. Which of the wirings should be shared to widen the wiring pitch can be determined in view of the distance from the magnetic tunnel junction MTJ, and the like.

Fifth Modification of Eighth Embodiment

In the fifth modification of the eighth embodiment, the read word line RWL is shared between adjacent memory cells, in addition to the folded bit line structure of the third modification of the eighth embodiment.

Figure 65:
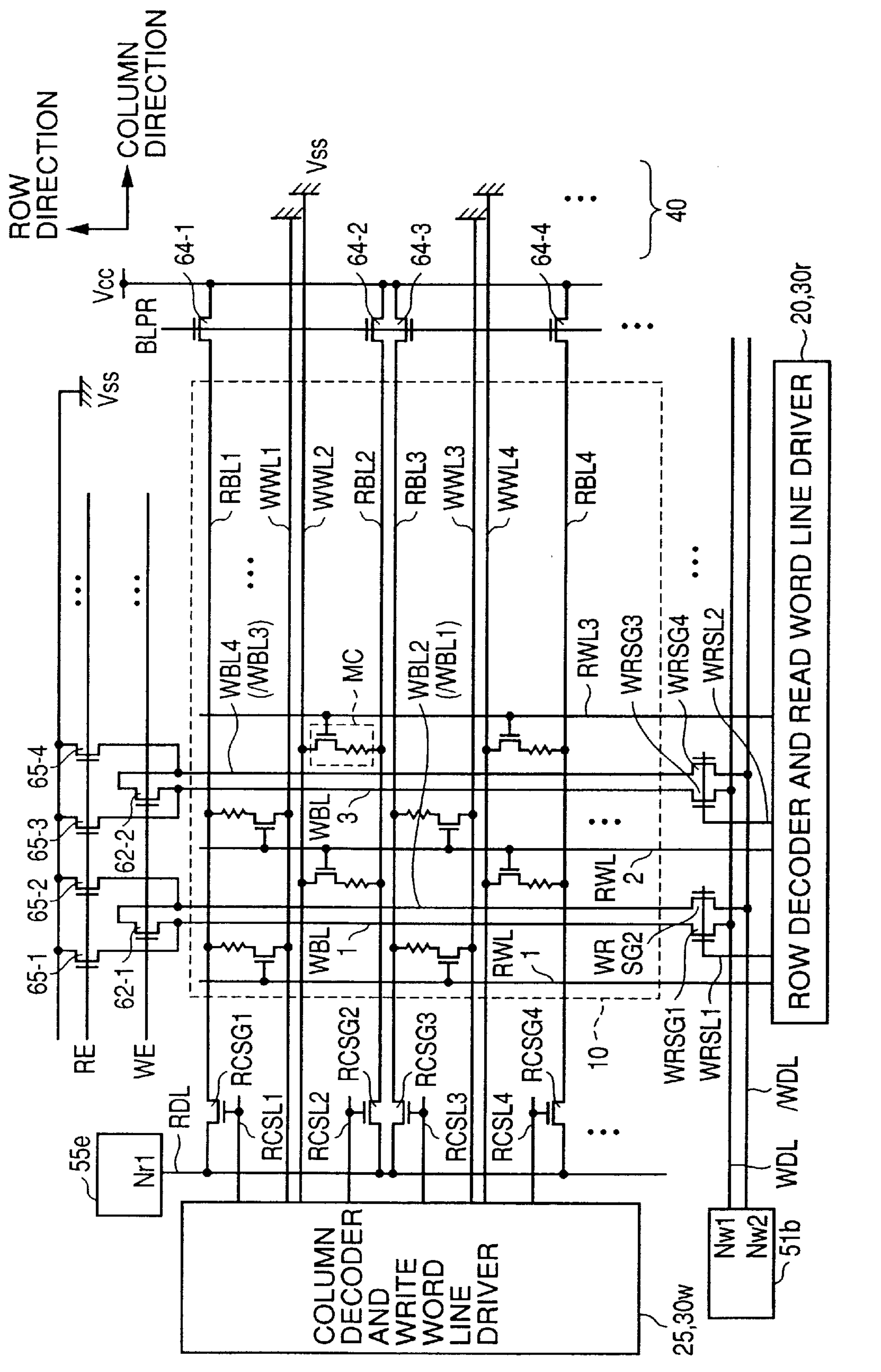
FIG. 65 is a diagram illustrating the structure of a memory array 10 and its peripheral circuitry according to a fifth modification of the eighth embodiment.

Referring to FIG. 65, in the memory array according to the fifth modification of the eighth embodiment, adjacent memory cells in the column direction share the same read word line RWL.

The read/write control circuit 60 includes the equalizing transistors 62, precharging transistors 64 and write bit line voltage control transistors 65, which are arranged in the same manner as that of the third modification of the eighth embodiment.

In the data write operation, the write word line WWL is activated. In each write bit line WBL, the memory cells are provided every other write word line WWL. Moreover, the memory cells are arranged alternately between every adjacent write bit lines WBL. Therefore, every set of adjacent two memory cell rows can form a write bit line pair. As a result, the data write operation can be conducted based on the folded bit line structure in the same manner as that of the third modification of the eighth embodiment, so that the same effects can be obtained.

On the other hand, in the data read operation, the read word line RWL shared by a plurality of memory cell rows is activated. Therefore, the data read operation cannot be conducted based on the folded bit line structure. Accordingly, in the fifth modification of the eighth embodiment, the peripheral circuitry associated with selection of the read bit line RBL is arranged in the same manner as that shown in FIG. 60.

With such a structure, the read operation margin based on the folded bit line structure cannot be ensured, but the pitch of the read word lines RWL in the memory array 10 can be widened, and the data read operation can be conducted normally. As a result, improved integration of the memory array 10 and thus reduced chip area of the MRAM device can be achieved.

Accordingly, by conducting the data write operation based on the folded bit line structure using the memory cells of the eighth embodiment, the write operation margin can be ensured as well as a simplified structure of the peripheral circuitry and reduced data write noise can be achieved. Moreover, by sharing the read word line RWL, improved integration of the memory array 10 can also be achieved simultaneously.

Note that, although FIG. 65 shows the structure in which the read word line RWL out of the signal wirings associated with the data read operation is shared between adjacent memory cells, it is also possible to share the read bit line RBL instead of the read word line RWL. In this case, however, the read word line RWL cannot be shared, and must be provided in every memory cell row. Which of the wirings should be shared to widen the wiring pitch can be determined as appropriate in view of the structural conditions, design and the like.

Ninth Embodiment

Figure 66:
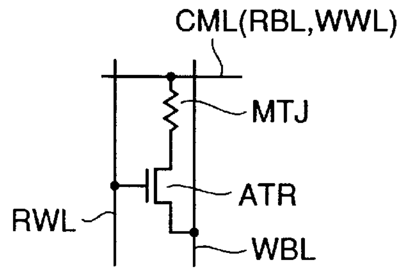
FIG. 66 is a circuit diagram showing the connection of an MTJ memory cell according to a ninth embodiment of the present invention.

Referring to FIG. 66, in the MTJ memory cell according to the ninth embodiment, the access transistor ATR is electrically coupled between the magnetic tunnel junction MTJ and the write bit line WBL. The magnetic tunnel junction MTJ is coupled between the access transistor ATR and a common line CML. The access transistor ATR has its gate coupled to the read word line RWL. In the structure of FIG. 66 as well, the common line CML serving as a write word line WWL and the read word line RWL extend perpendicularly to each other. Therefore, the respective drive circuits for the common line CML and the read word line RWL can be separately provided, whereby the freedom of layout design can be improved.

Figure 67:
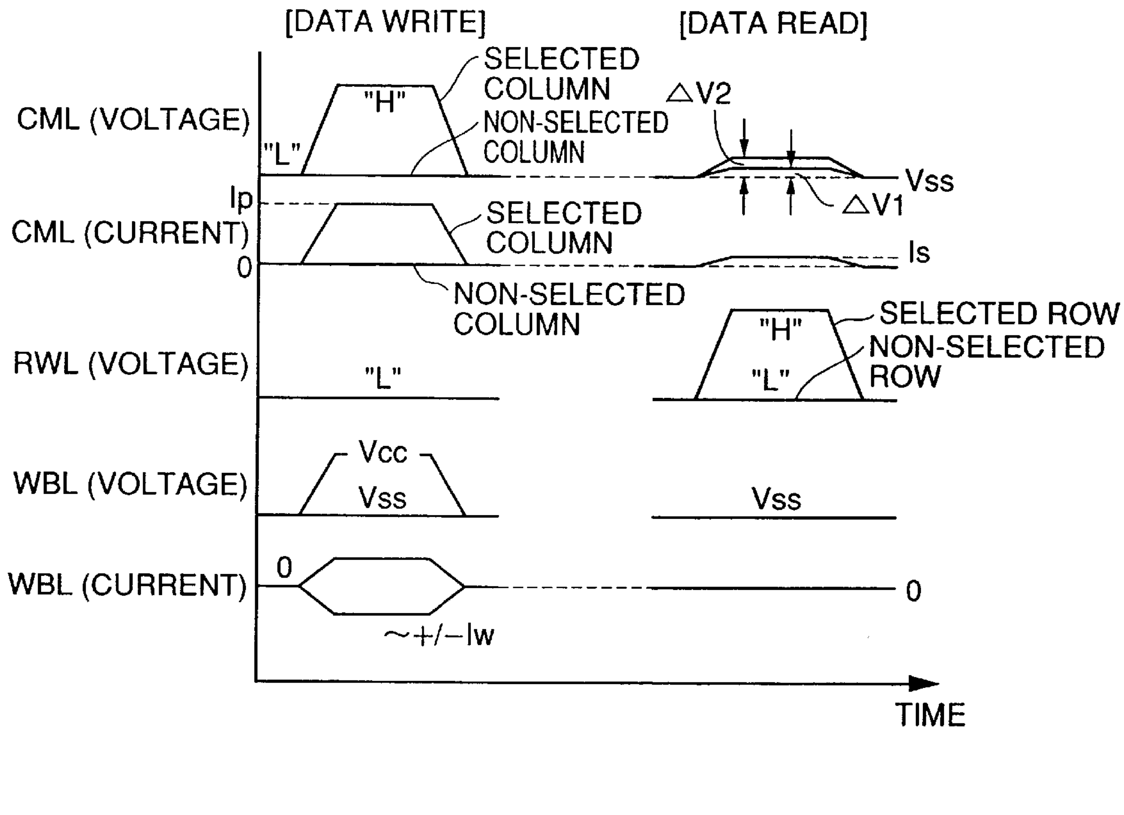
FIG. 67 is a timing chart illustrating the data write and read operation to and from the MTJ memory cell according to the ninth embodiment.

FIG. 67 is a timing chart illustrating the data write and read operations to and from the MTJ memory cell according to the ninth embodiment.

Referring to FIG. 67, in the data write operation, the data write current ±Iw is supplied to the write bit line WBL. Moreover, in response to turning-ON of a current control transistor described below, the data write current Ip flows through the common line CML corresponding to the selected column, according to the column selection result. Thus, the voltage and current on the common line CML in the data write operation are set in the same manner as those of the write word line WWL shown in FIG. 33.

As a result, the magnetic field corresponding to the level of the write data DIN can be written to the magnetic tunnel junction MTJ. Moreover, as shown in FIG. 33, the read bit lines RBL are not required during the data write operation. Therefore, the respective functions of the read bit line RBL and the write word line WWL can be integrated into the common line CML.

In the operation other than the data write operation, the aforementioned current control transistors are turned OFF. The common lines CML are precharged to the ground voltage Vss before the data read operation.

In the data read operation, the voltage level on the write bit lines WBL is set to the ground voltage level Vss. Moreover, the sense current Is for the data read operation is supplied to the common line CML. Accordingly, in the data read operation, the read word line RWL is activated to the selected state (H level) so as to turn ON the access transistor ATR. Thus, the sense current Is can be supplied through the path formed by the common line CML, magnetic tunnel junction MTJ, access transistor ATR, and write bit line WBL.

When the current path of the sense current Is is formed in the MTJ memory cell, a voltage change (rise) corresponding to the storage data is produced on the common line CML.

It is now assumed in FIG. 67 that the fixed magnetic layer FL and the free magnetic layer VL have the same magnetic field direction when the storage data level is "1". In this case, the common line CML has a small voltage change ΔV1 when the storage data is "1", and has a voltage change ΔV2 larger than ΔV1 when the storage data is "0". The storage data in the MTJ memory cell can be read by sensing the difference between the voltage changes ΔV1 and ΔV2 on the common line CML.

Moreover, as shown in FIG. 33, the write word lines WWL are not required during the data read operation. Therefore, the write word lines WWL and the read bit lines RBL can be integrated into the common lines CML.

Thus, the same data write and read operations can be conducted even with the MTJ memory cell that uses the common line CML integrating the respective functions of the write word line WWL and the read bit line RBL so as to reduce the number of wirings.

The precharge voltage of the common lines CML functioning as the read bit lines RBL in the data read operation is set to the same voltage level as that of the common lines CML in the data write operation, i.e., the ground voltage Vss. As a result, a precharge operation in preparation for the read data operation can be performed more efficiently, whereby the data read operation speed can be increased.

Figure 68:
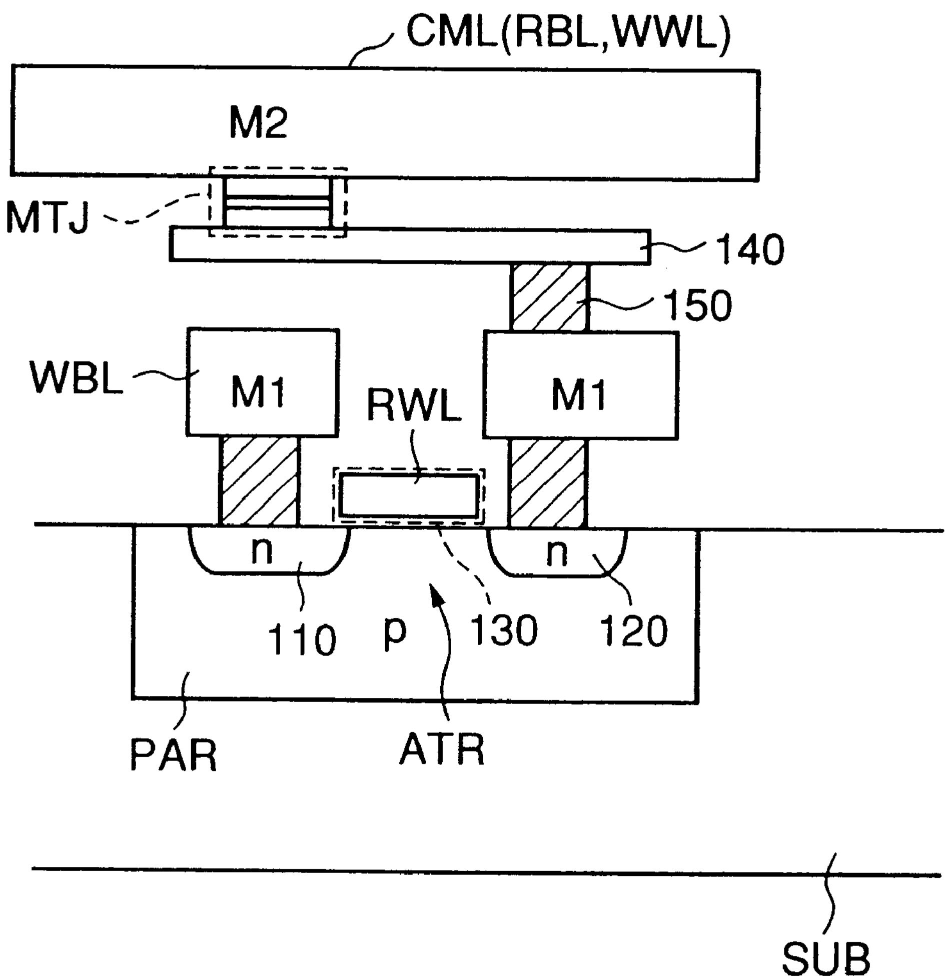
FIG. 68 is a structural diagram showing the MTJ memory cell arrangement according to the ninth embodiment.

Referring to FIG. 68, in the MTJ memory cell according to the ninth embodiment, the write bit line WBL is provided in the first metal wiring layer M1, and the read word line RWL is provided in the same layer as that of the gate 130 of the access transistor ATR. The write bit line WBL is electrically coupled to the source/drain region 110 of the access transistor ATR. The other source/drain region 120 is coupled to the magnetic tunnel junction MTJ through the metal wiring provided in the first metal wiring layer M1, the barrier metal 140, and the metal film 150 provided in the contact hole.

The common line CML is provided in the second metal wiring layer M2 so as to be electrically coupled to the magnetic tunnel junction MTJ. Since the common line CML has both functions of the read bit line RBL and the write word line WWL, reduction in the number of wirings as well as the number of metal wiring layers, and thus reduction in the manufacturing cost can be achieved in addition to the effects obtained by the MTJ memory cell according to the sixth embodiment.

In the MTJ memory cell according to the ninth embodiment, the write bit line WBL is located farther from the magnetic tunnel junction MTJ than is the common line CML functioning as write word line WWL. Therefore, in the MTJ memory cell of the ninth embodiment, a relatively large data write current must be applied to the write bit line WBL.

Figure 69:
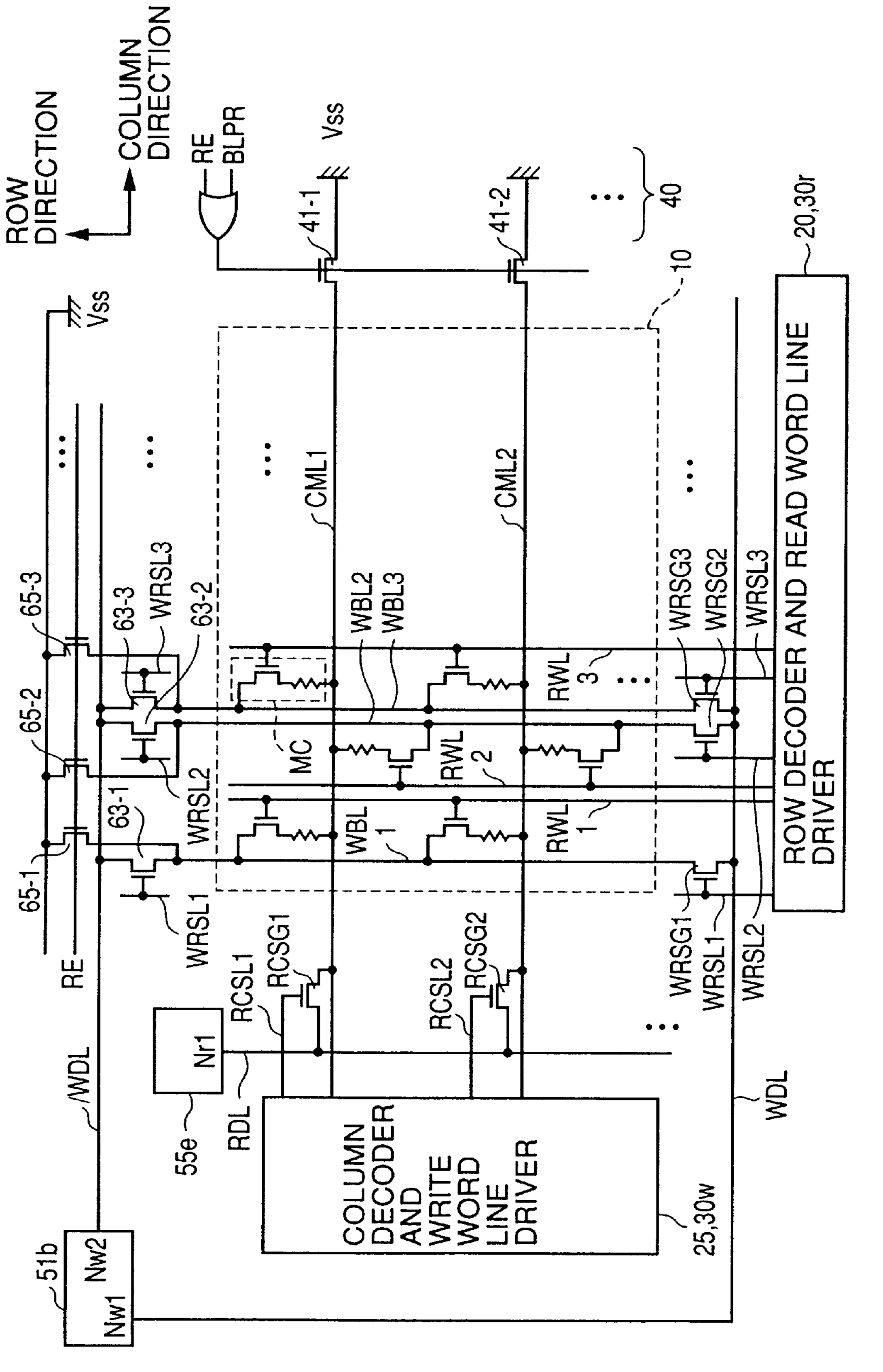
FIG. 69 is a diagram illustrating the structure of a memory array 10 and its peripheral circuitry according to the ninth embodiment.

Referring to FIG. 69, in the memory array according to the ninth embodiment, the memory cells MC shown in FIG. 66 are arranged in rows and columns. The read word lines RWL and the write bit lines WBL extend in the row direction. The common lines CML extend in the column direction. Like the read word lines RWL and the like, the common lines CML are also generally denoted with CML, and a specific common line is denoted with CML1, and the like.

Adjacent memory cells in the row direction share the same common line CML.

For example, the memory cell group of the first and second memory cell columns shares the same common line CML1, and the memory cell group of the third and fourth memory cell columns shares the same common line CML2. In the following memory cell columns as well, the common lines CML are arranged similarly.

If the data is to be read from or written to a plurality of memory cells MC of the same common line CML, data collision occurs. Accordingly, the memory cells MC are arranged alternately.

With such a structure, the pitch of the common lines CML in the memory array 10 can be widened. As a result, the memory cells MC can be efficiently arranged, whereby improved integration of the memory array 10 as well as reduced chip area of the MRAM device can be achieved.

The peripheral circuitry for selectively supplying the sense current, which is provided for the read bit lines RBL in FIG. 35, is provided for the common lines CML.

Current control transistors are provided corresponding to the respective common lines CML. FIG. 69 exemplarily shows the current control transistors 41-1 and 41-2 respectively corresponding to the common lines CML1 and CML2. Hereinafter, the current control transistors are generally denoted with 41.

The current control transistor 41 is provided between the corresponding common line CML and the ground voltage Vss. In the data write operation in which the common line CML functions as a write word line WWL, the current control transistor 41 is turned ON in response to activation of the control signal WE, so that the write word line driver 30*w* can supply the data write current Ip to the common line CML activated to the selected state (power supply voltage Vcc).

As described in connection with FIG. 67, the common lines CML are precharged to the ground voltage Vss before the data read operation. Therefore, the precharging transistors 44 can be omitted by making the current control transistors 41 operate also in response to the bit line precharging signal BLPR.

Since the structure of the peripheral circuitry for selectively supplying the data write current to the write bit line WBL is the same as that of FIG. 35, detailed description thereof will not be repeated.

First Modification of Ninth Embodiment

Figure 70:
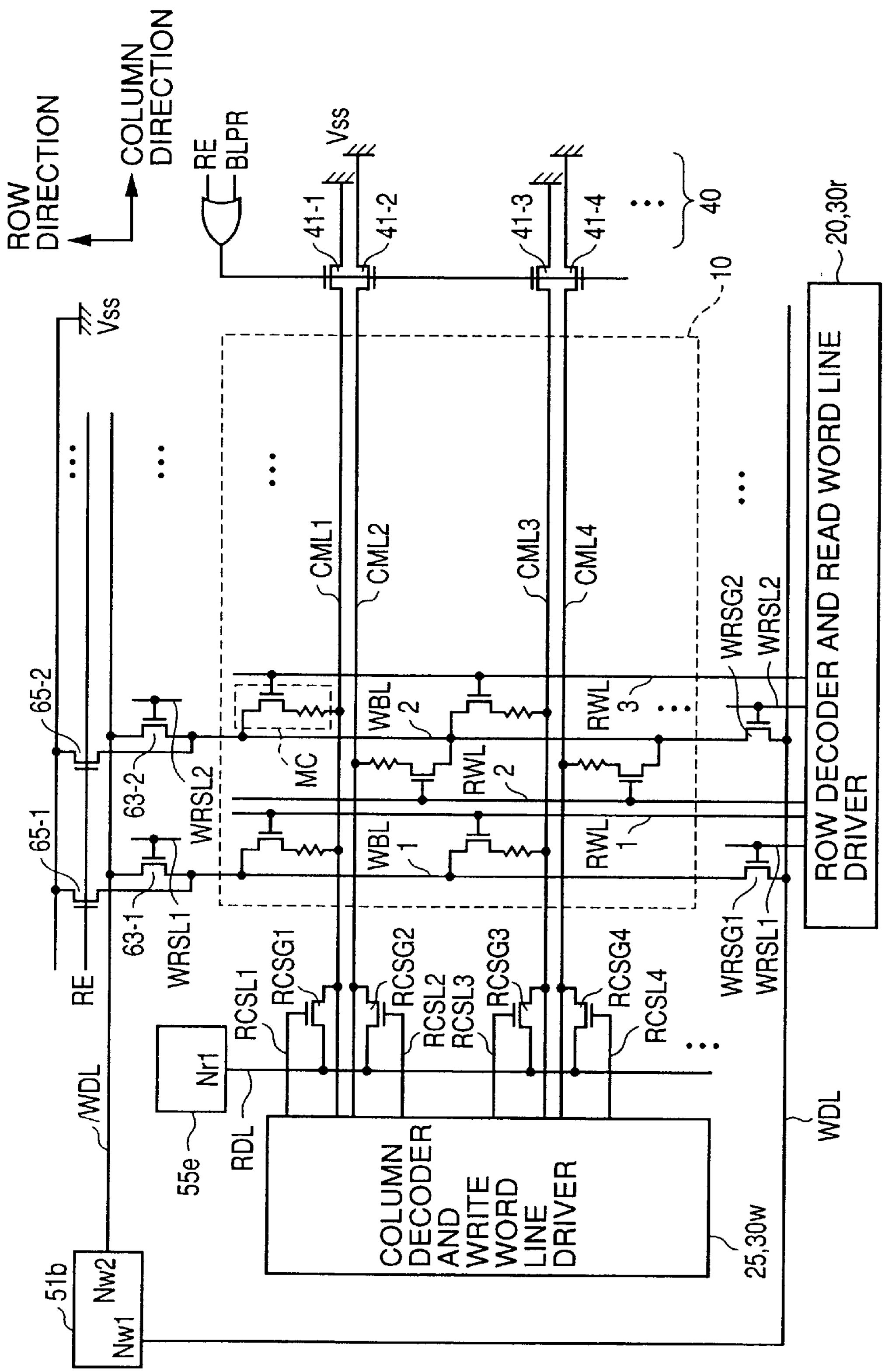
FIG. 70 is a diagram illustrating the structure of a memory array 10 and its peripheral circuitry according to a first modification of the ninth embodiment.

Referring to FIG. 70, in the memory array according to the first modification of the ninth embodiment, adjacent memory cells share the same write bit line WBL. For example, the memory cell group of the second and third memory cell rows shares the same write bit line WBL2. In the following memory cell columns as well, the write bit lines WBL are arranged similarly.

In order to conduct the data write operation normally, a plurality of memory cells MC must not be present at the intersection of the same common line CML and the same write bit line WBL. Accordingly, the common line CML is provided in every column, and the memory cells MC are arranged alternately.

Since the structure of the peripheral circuitry associated with the data read and write operations through the common line CML and write bit line WBL, as well as the memory cell operation in reading and writing the data are the same as those of the ninth embodiment, detailed description thereof will not be repeated.

With such a structure, the pitch of the write bit lines WBL in the memory array 10 can be widened. As a result, the memory cells MC can be efficiently arranged, whereby improved integration of the memory array 10 as well as reduced chip area of the MRAM device can be achieved.

As described before, in the MTJ memory cell of the ninth embodiment, a relatively large data write current must be applied to the write bit line WBL. Accordingly, the write bit line WBL is shared between adjacent memory cells so as to ensure the line pitch thereof. As a result, the line width, i.e., the cross-sectional area, of the write bit line WBL is assured, so that the current density thereof can be suppressed. As a result, improved reliability of the MRAM device can be achieved. As described before, for the improved operation reliability, it is also effective to select a material of these wirings in view of electromigration resistance.

Second Modification of Ninth Embodiment

Figure 71:
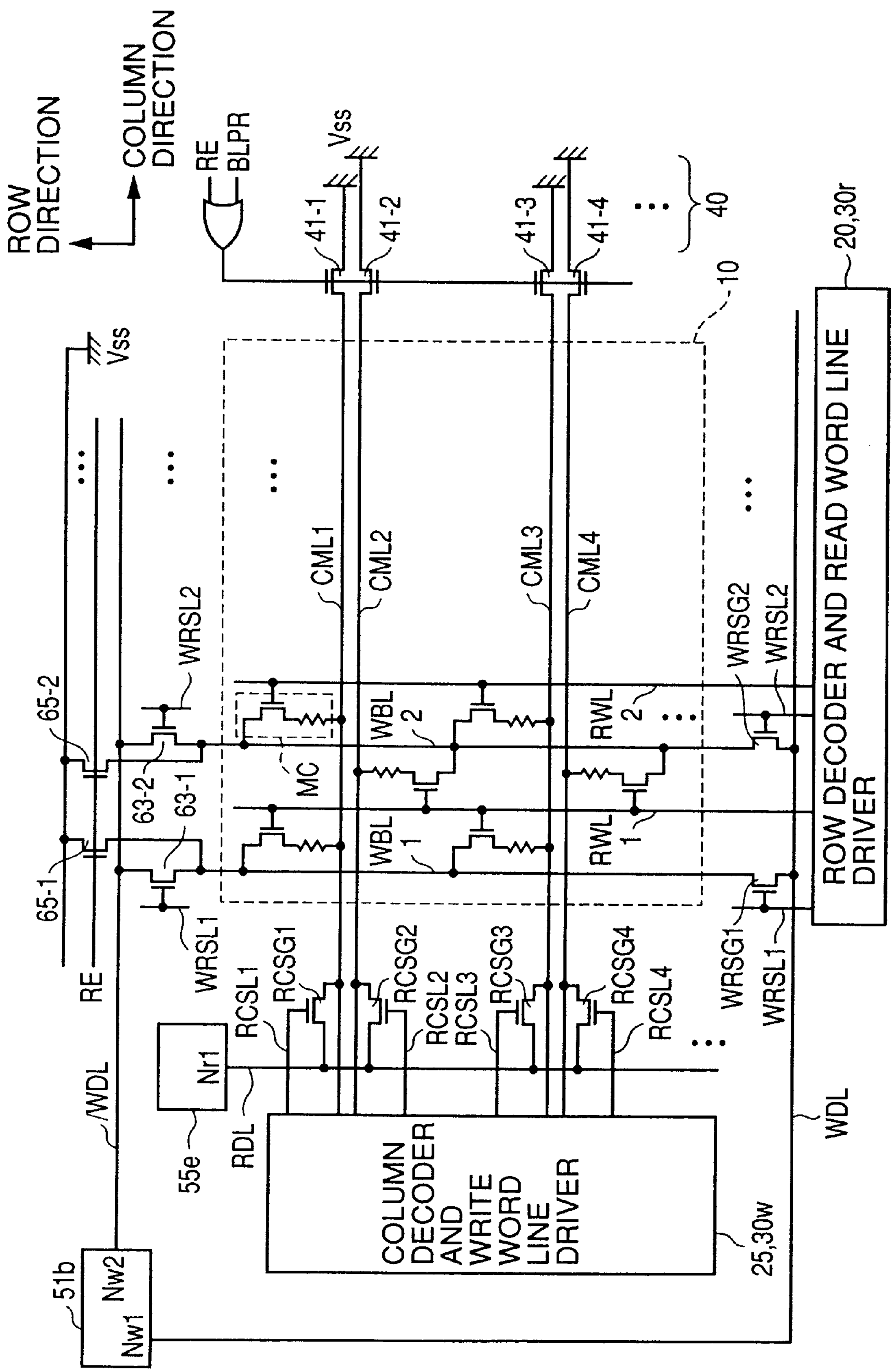
FIG. 71 is a diagram illustrating the structure of a memory array 10 and its peripheral circuitry according to a second modification of the ninth embodiment.

Referring to FIG. 71, in the memory array according to the second modification of the ninth embodiment, adjacent memory cells in the column direction share the same read word line RWL. For example, the memory cell group of the first and second memory cell rows shares the same read word line RWL1. In the following memory cell rows as well, the read word lines RWL are arranged similarly.

Moreover, adjacent memory cells in the column direction share the same write bit line WBL. For example, the memory cell group of the second and third memory cell rows shares the same write bit line WBL2. In the following memory cell rows as well, the write bit lines WBL are arranged similarly.

In order to conduct the data read operation normally, a plurality of memory cells MC selected by the same read word line RWL must not be simultaneously coupled to the same common line CML. Accordingly, the common line CML is provided in every memory cell column, and the memory cells MC are arranged alternately.

Since the structure is otherwise the same as that of the ninth embodiment, detailed description thereof will not be repeated.

With such a structure, the pitches of the read word lines RWL and write bit lines WBL in the memory array 10 can be widened. As a result, the memory cells MC can be efficiently arranged, whereby improved integration of the memory array 10 as well as reduced chip area of the MRAM device can be achieved.

Third Modification of Ninth Embodiment

Figure 72:
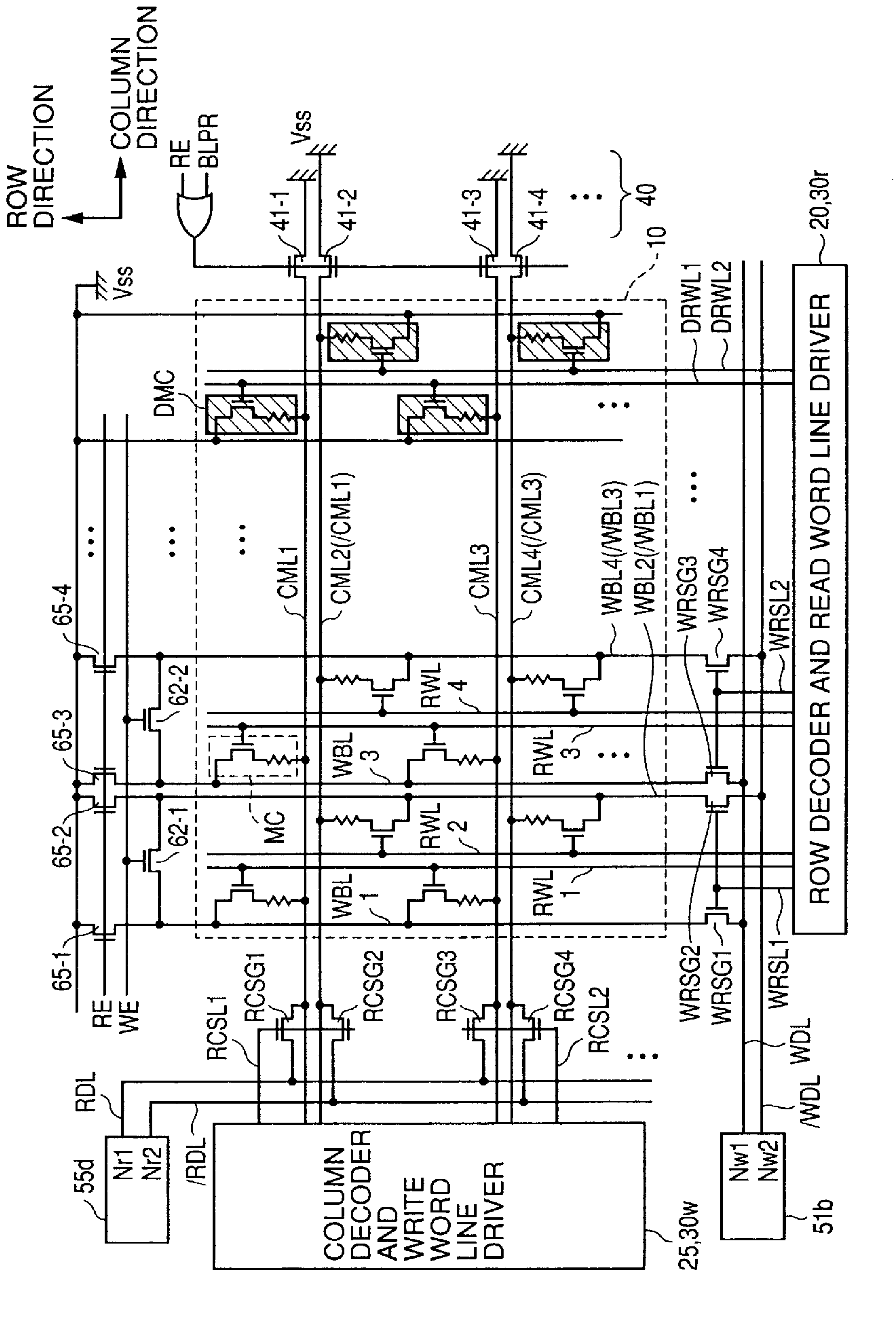
FIG. 72 is a diagram illustrating the structure of a memory array 10 and its peripheral circuitry according to a third modification of the ninth embodiment.

Referring to FIG. 72, for the memory cells having the structure of the ninth embodiment and arranged in rows and columns, the folded bit line structure is realized in every set of adjacent two memory cell columns, using corresponding two common lines CML. For example, a data line pair corresponding to a read bit line pair can be formed from the common lines CML1 and CML2 (/CML1) respectively corresponding to the first and second memory cell columns.

Similarly, the folded bit line structure is realized in every set of adjacent two memory cell rows, using corresponding two write bit lines WBL. For example, a write bit line pair can be formed from the write bit lines WBL1 and WBL2 (/WBL1) respectively corresponding to the first and second memory cell rows.

The structure of the peripheral circuitry for conducting row selection from the write bit lines WBL and /WBL of the write bit line pairs and supplying the data write current ±Iw thereto is the same as that shown in FIG. 39. Therefore, detailed description thereof will not be repeated.

Moreover, provided that one of the common lines forming each data line pair in the data read operation is generally denoted with CML and the other is generally denoted with /CML, the peripheral circuitry for conducting column selection from the read bit lines RBL and /RBL in the structure of FIG. 39 and supplying the sense current Is thereto is provided corresponding to the common lines CML and /CML.

Accordingly, even when the memory cells according to the ninth embodiment are arranged in rows and columns, the data read and write operation margins can be ensured using the folded bit line structure.

Fourth Modification of Ninth Embodiment

In the fourth modification of the ninth embodiment, the write bit line WBL is shared between adjacent memory cells, in addition to the folded bit line structure shown in the third modification of the ninth embodiment.

Figure 73:
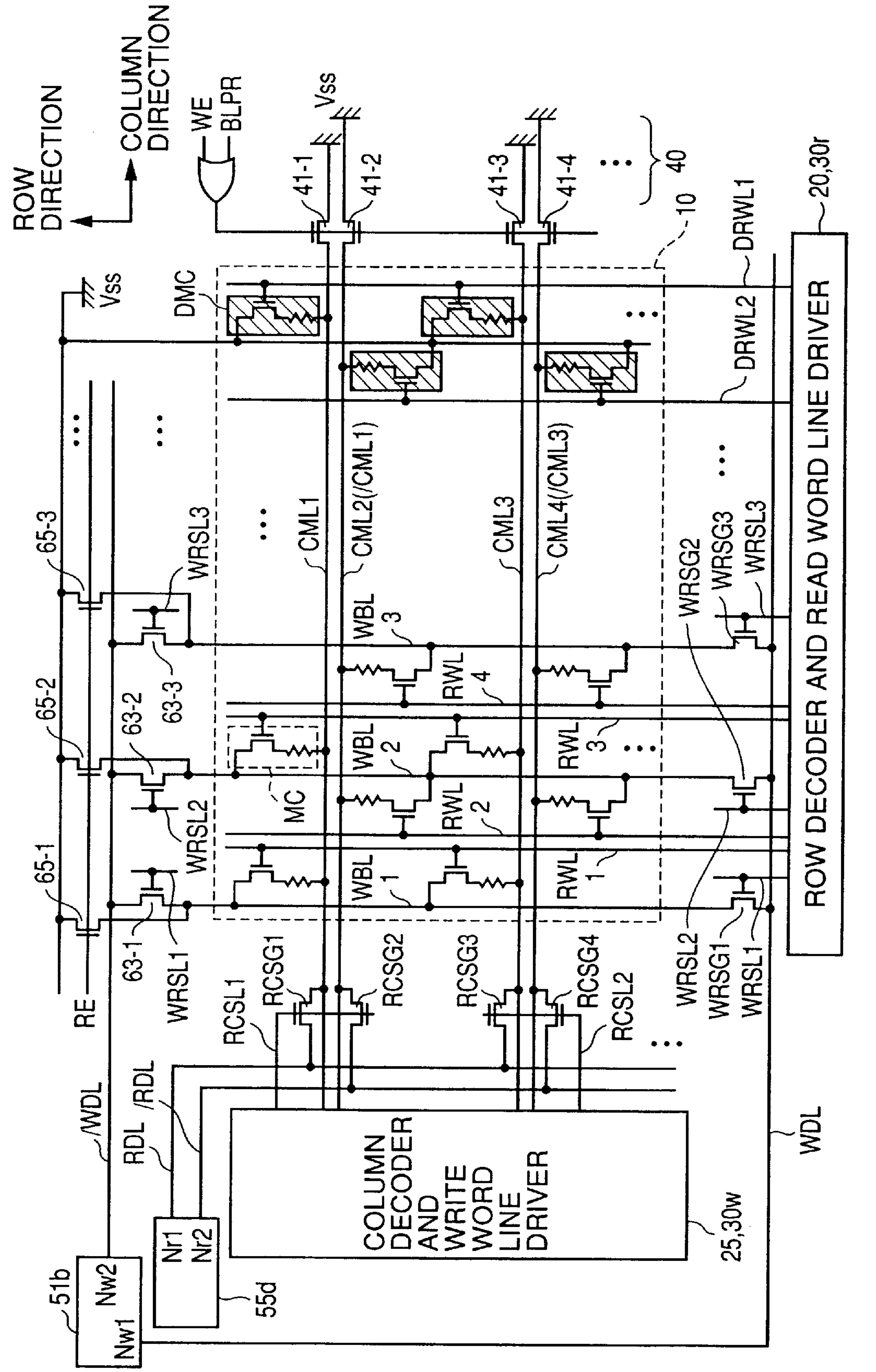
FIG. 73 is a diagram illustrating the structure of a memory array 10 and its peripheral circuitry according to a fourth modification of the ninth embodiment.

Referring to FIG. 73, in the memory array according to the fourth modification of the ninth embodiment, adjacent memory cells in the column direction share the same write bit line WBL.

In the read operation, the read word line RWL is activated. In each common line CML functioning as a read bit line RBL, the memory cells are provided every other read word line RWL. Moreover, the memory cells are arranged alternately between every adjacent common lines CML. Therefore, every set of adjacent two memory cell columns form a data line pair, so that the data read operation can be conducted based on the folded bit line structure in the same manner as that of the third modification of the ninth embodiment.

On the other hand, the data write operation cannot be conducted based on the folded bit line structure because the write bit line WBL is shared. Accordingly, in the fourth modification of the ninth embodiment, the peripheral circuitry associated with selection of the write bit line WBL is arranged in the same manner as that shown in FIG. 69. Thus, as in the ninth embodiment, the data write operation can be conducted using the data write circuit 51*b* having a simple structure.

Although the data write operation cannot be conducted based on the folded bit line structure, the pitch of the write word lines WWL in the memory array 10 can be widened. As a result, further improved integration of the memory array 10 and thus further reduced chip area of the MRAM device can be achieved.

Fifth Modification of Ninth Embodiment

In the fifth modification of the ninth embodiment, the read word line RWL is shared between adjacent memory cells, in addition to the folded bit line structure of the third modification of the ninth embodiment.

Figure 74:
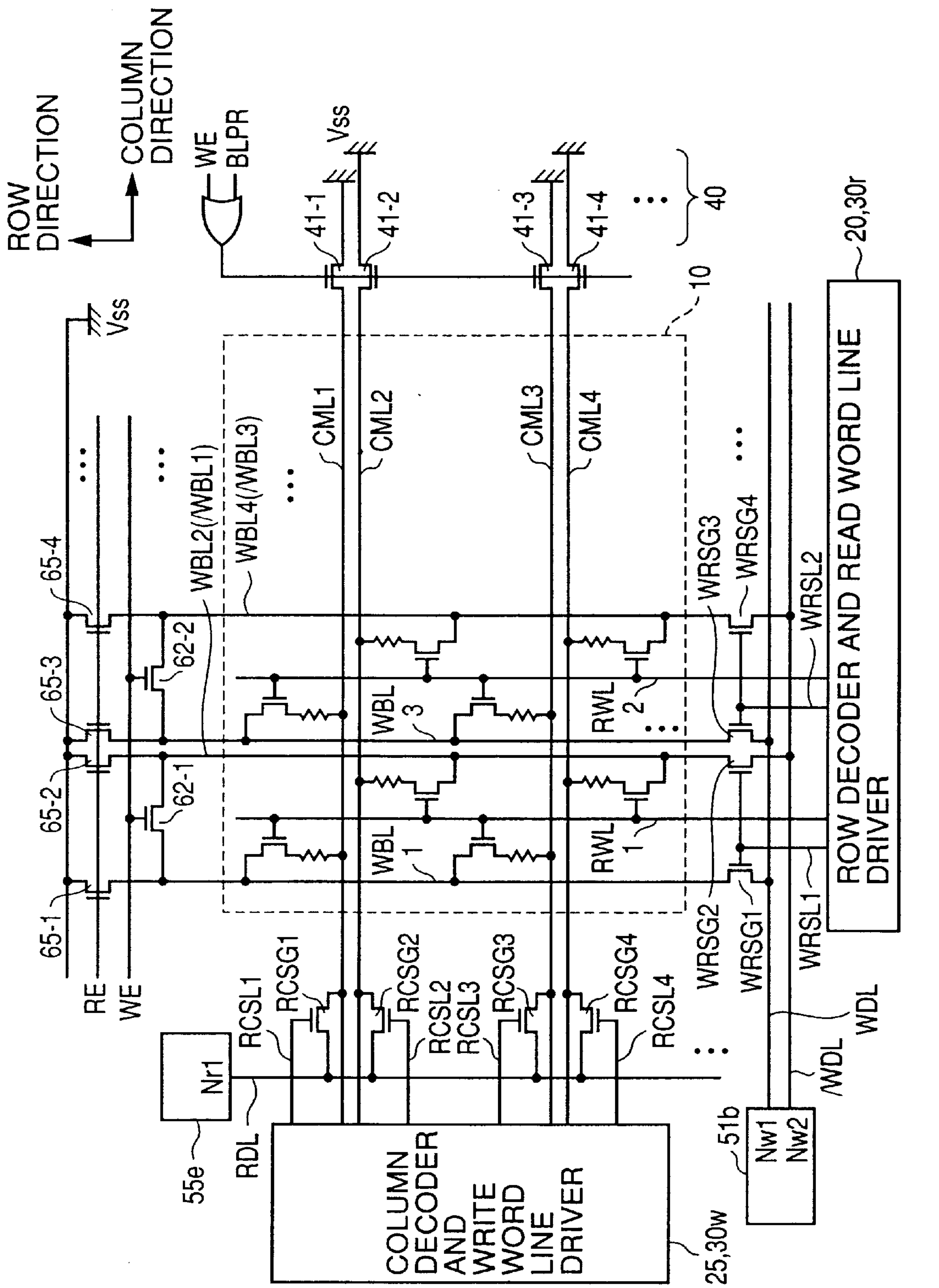
FIG. 74 is a diagram illustrating the structure of a memory array 10 and its peripheral circuitry according to a fifth modification of the ninth embodiment.

Referring to FIG. 74, in the memory array according to the fifth modification of the ninth embodiment, adjacent memory cells in the column direction share the same read word line RWL.

The read/write control circuit 60 includes the equalizing transistors 62 and the write bit line voltage control transistors 65, which are arranged in the same manner as that of the third modification of the ninth embodiment.

In each write bit line WBL, the memory cells are provided every other common line CML. Moreover, the memory cells are arranged alternately between every adjacent write bit lines WBL. Therefore, in the data write operation, every set of adjacent two memory cell rows can form a write bit line pair. As a result, the data write operation can be conducted based on the folded bit line structure in the same manner as that of the third modification of the ninth embodiment, so that the same effects can be obtained.

On the other hand, in the data read operation, the read word line RWL shared by a plurality of memory cell rows is activated. Therefore, the data read operation cannot be conducted based on the folded bit line structure. Accordingly, in the fifth modification of the ninth embodiment, the peripheral circuitry associated with selection of the common line CML functioning as a read bit line RBL is arranged in the same manner as that shown in FIG. 69.

With such a structure, the read operation margin based on the folded bit line structure cannot be ensured, but the pitch of the read word lines RWL in the memory array 10 can be widened, and the data read operation can be conducted normally. As a result, improved integration of the memory array 10 and thus reduced chip area of the MRAM device can be achieved.

Accordingly, by conducting the data write operation based on the folded bit line structure using the memory cells of the ninth embodiment, the write operation margin can be ensured as well as a simplified structure of the peripheral circuitry and reduced data write noise can be achieved. Moreover, by sharing the read word line RWL, improved integration of the memory array 10 can also be achieved simultaneously.

Tenth Embodiment

Figure 75:
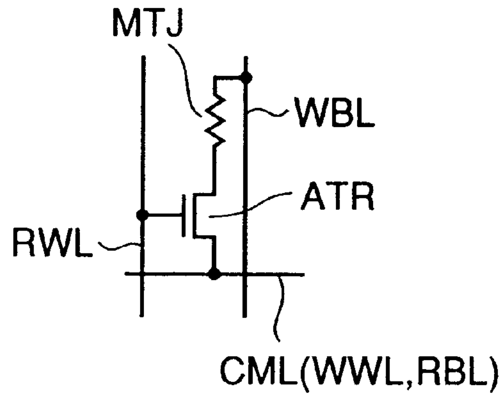
FIG. 75 is a circuit diagram showing the connection of an MTJ memory cell according to a tenth embodiment of the present invention.

Referring to FIG. 75, in the MTJ memory cell according to the tenth embodiment, the access transistor ATR is coupled between the common line CML and the magnetic tunnel junction MTJ. The read word line RWL is coupled to the gate of the access transistor ATR. The write bit line WBL extends in the same direction as that of the read word line RWL, and is electrically coupled to the magnetic tunnel junction MTJ.

In the data write operation, like the write word line WWL, the common line CML is selectively activated by the write word line driver 30*w*. In the data read operation, the sense current Is is supplied to the common line CML.

In the data write operation, in response to turning-ON of the current control transistor 41-1 to 41-*m*, the data write current Ip flows through the common line CML activated to the selected state (H level), like the write word line WWL. In the data read operation, the current control transistor 41-1 to 41-*m* is turned OFF, whereby the sense current Is flows through the path formed by the common line CML, magnetic tunnel junction MTJ, access transistor ATR and write bit line WBL (ground voltage Vss). As a result, a voltage change corresponding to the storage data of the magnetic tunnel junction MTJ is produced on the common line CML, as described in connection with FIG. 67.

Thus, as in the ninth embodiment, the common line CML functions as a write word line WWL in the data write operation and as a read bit line RBL in the data read operation, whereby the number of wirings can be reduced.

Moreover, the read word line RWL and the common line CML functioning as a write word line in the data write operation extend perpendicularly to each other. Therefore, the read word line driver 30*r* and the write word line driver 30*w* can be independently provided, whereby the same effects as those of the sixth embodiment can be obtained.

Figure 76:
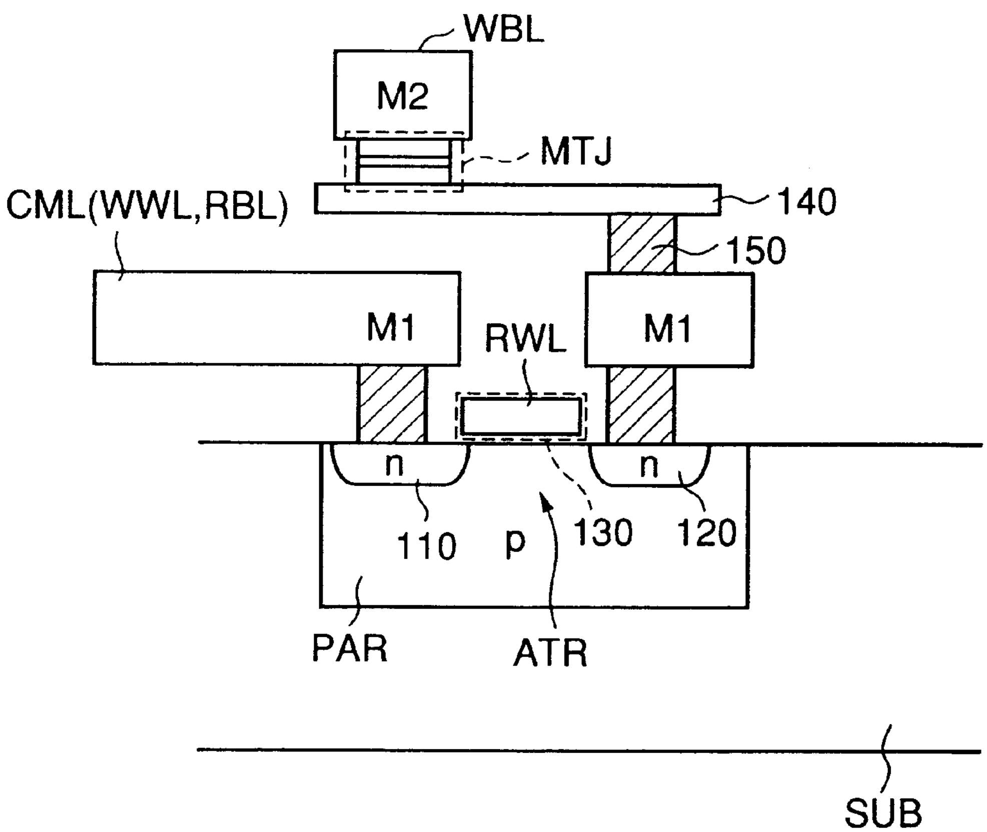
FIG. 76 is a structural diagram showing the MTJ memory cell arrangement according to the tenth embodiment.

Referring to FIG. 76, in the MTJ memory cell according to the tenth embodiment, the common line CML is provided in the first metal wiring layer M1 so as to be electrically coupled to the source/drain region 110 of the access transistor ATR. The read word line RWL is formed in the same layer as that of the gate 130 of the access transistor ATR.

The source/drain region 120 is coupled to the magnetic tunnel junction MTJ through the metal wiring formed in the first metal wiring layer M1, the barrier metal 140, and the metal film 150 formed in the contact hole. The write bit line WBL is provided in the second metal wiring layer M2 so as to be electrically coupled to the magnetic tunnel junction MTJ.

The common line CML and the magnetic tunnel junction MTJ are coupled to each other through the access transistor ATR. Therefore, the common line CML is coupled to the magnetic tunnel junction MTJ only when the access transistor ATR is turned ON. As a result, the capacitance of the common line CML functioning as a read bit line RBL in the data read operation is reduced, whereby the data read operation speed can further be increased.

Note that, in the MTJ memory cell of the tenth embodiment, the voltage and current waveforms of each wiring in the data read and write operations are the same as those of the ninth embodiment. Therefore, detailed description thereof will not be repeated.

In the MTJ memory cell of the tenth embodiment, the common line CML functioning as a write word line WWL is located farther from the magnetic tunnel junction MTJ than is the write bit line WBL. Therefore, in the MTJ memory cell of the tenth embodiment, a relatively large data write current must be applied to the common line CML.

Figure 77:
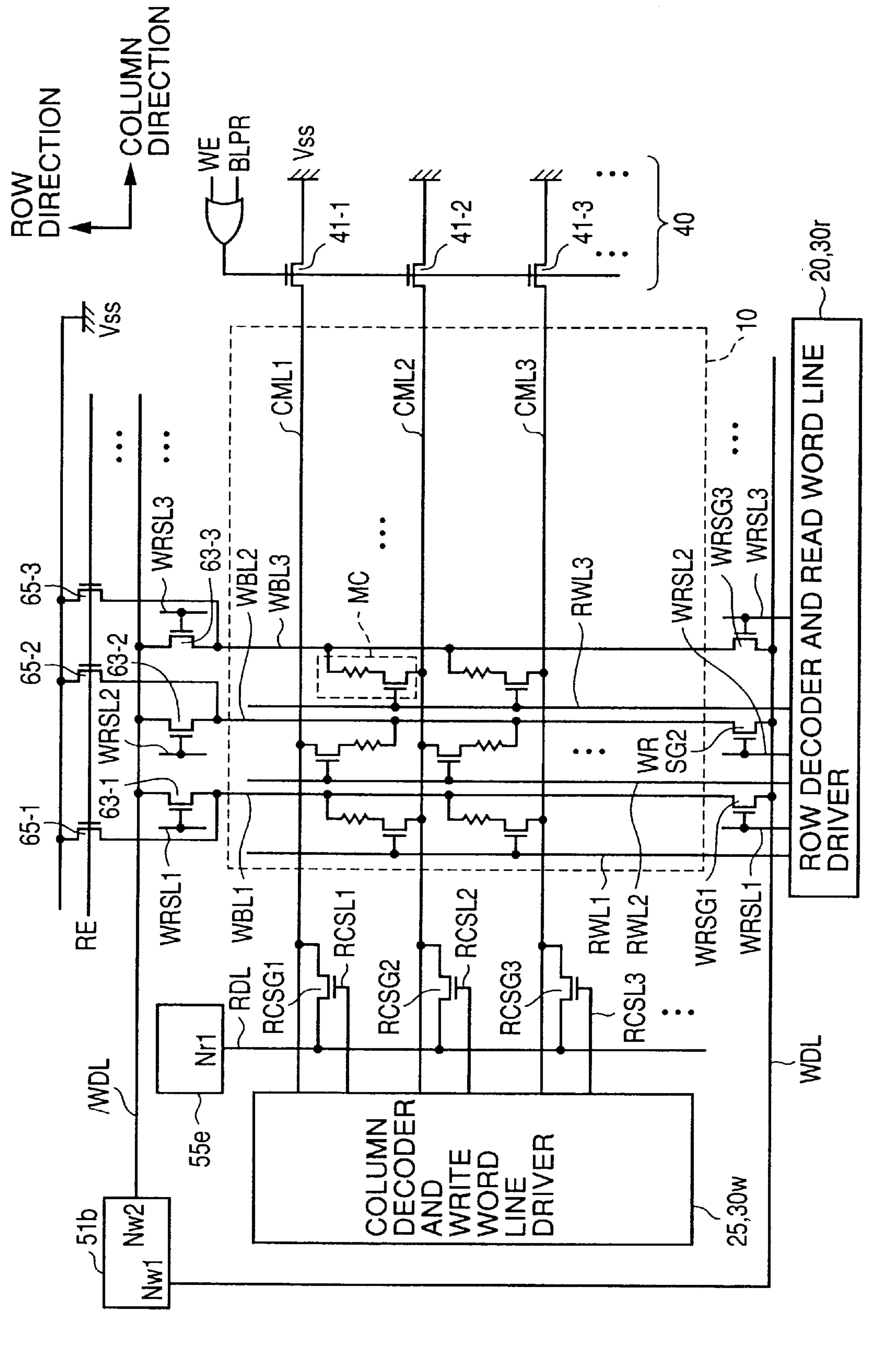
FIG. 77 is a diagram illustrating the structure of a memory array 10 and its peripheral circuitry according to the tenth embodiment.

Referring to FIG. 77, in the memory array according to the tenth embodiment, the memory cells MC shown in FIG. 75 are arranged in rows and columns.

The read word lines RWL and the write bit lines WBL extend in the row direction. The common lines CML extend in the column direction.

Adjacent memory cells in the row direction share the same common line CML.

For example, the memory cell group of the first and second memory cell columns shares the same common line CML1, and the memory cell group of the third and fourth memory cell columns shares the same common line CML2. In the following memory cell columns as well, the common lines CML are arranged similarly.

If the data is to be read from or written to a plurality of memory cells MC of the same common line CML, data collision occurs. Accordingly, the memory cells MC are arranged alternately.

With such a structure, the pitch of the common lines CML in the memory array 10 can be widened. As a result, the memory cells MC can be efficiently arranged, whereby improved integration of the memory array 10 as well as reduced chip area of the MRAM device can be achieved.

Since the structure of the peripheral circuitry for selectively supplying the data write current to the common line CML and the write bit line WBL is the same as that of FIG. 69, detailed description thereof will not be repeated.

As described before, in the MTJ memory cell of the tenth embodiment, a relatively large data write current must be applied to the common line CML. Accordingly, the common line CML is shared between adjacent memory cells so as to ensure the line pitch thereof. As a result, the line width, i.e., the cross-sectional area, of the common line CML is assured, so that the current density thereof can be suppressed. Thus, improved reliability of the MRAM device can be achieved. As described before, for the improved operation reliability, it is also effective to select a material of these wirings in view of electromigration resistance.

First Modification of Tenth Embodiment

Figure 78:
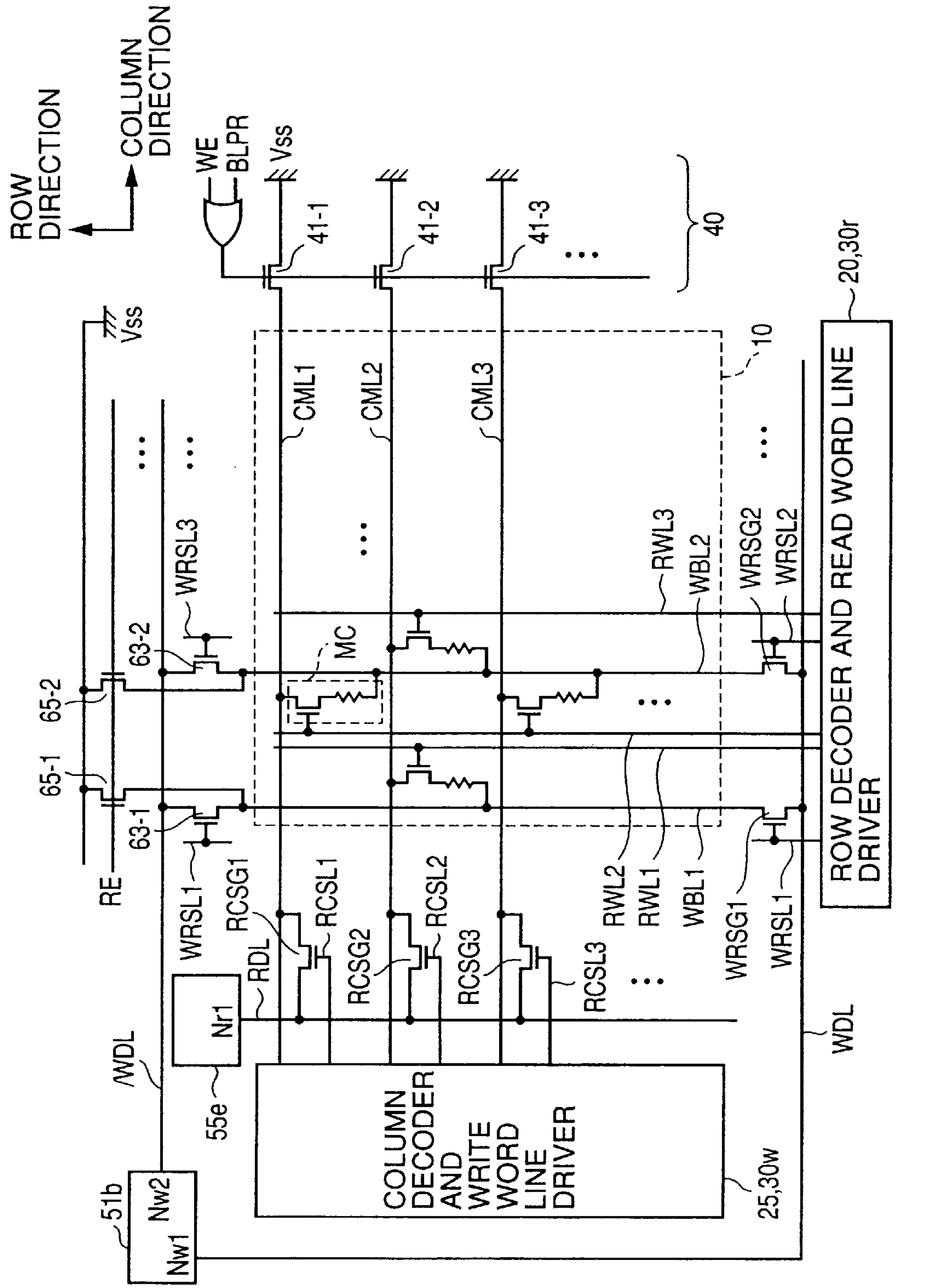
FIG. 78 is a diagram illustrating the structure of a memory array 10 and its peripheral circuitry according to a first modification of the tenth embodiment.

Referring to FIG. 78, in the memory array according to the first modification of the tenth embodiment, adjacent memory cells share the same write bit line WBL. For example, the memory cell group of the second and third memory cell rows shares the same write bit line WBL2. In the following memory cell rows as well, the write bit lines WBL are arranged similarly.

In order to conduct the data write operation normally, a plurality of memory cells MC must not be present at the intersection of the same common line CML and the same write bit line WBL. Accordingly, the common line CML is provided in every column, and the memory cells MC are arranged alternately.

Since the structure of the peripheral circuitry associated with the data read and write operations through the common line CML and write bit line WBL, as well as the memory cell operation in reading and writing the data are the same as those of the tenth embodiment, detailed description thereof will not be repeated.

With such a structure, the pitch of the write bit lines WBL in the memory array 10 can be widened. As a result, the memory cells MC can be efficiently arranged, whereby improved integration of the memory array 10 as well as reduced chip area of the MRAM device can be achieved.

Second Modification of Tenth Embodiment

Figure 79:
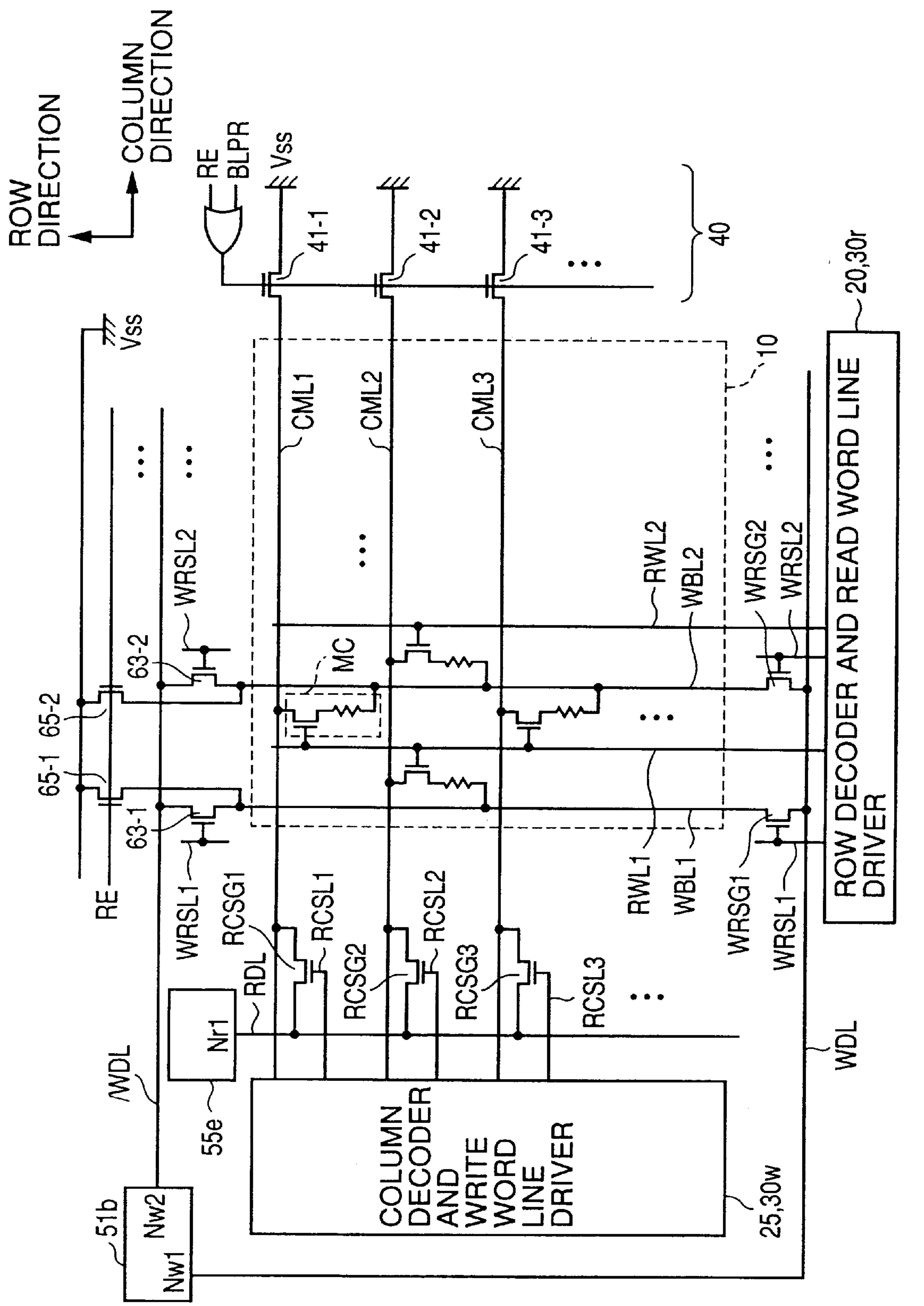
FIG. 79 is a diagram illustrating the structure of a memory array 10 and its peripheral circuitry according to a second modification of the tenth embodiment.

Referring to FIG. 79, in the memory array according to the second modification of the tenth embodiment, adjacent memory cells in the column direction share the same read word line RWL. For example, the memory cell group of the first and second memory cell rows shares the same read word line RWL1. In the following memory cell rows as well, the read word lines RWL are arranged similarly.

Moreover, adjacent memory cells in the column direction share the same write bit line WBL. For example, the memory cell group of the second and third memory cell rows shares the same write bit line WBL2. In the following memory cell rows as well, the write bit lines WBL are arranged similarly.

In order to conduct the data read operation normally, a plurality of memory cells MC selected by the same read word line RWL must not be simultaneously coupled to the same common line CML. Accordingly, the common line CML is provided in every memory cell column, and the memory cells MC are arranged alternately.

Since the structure is otherwise the same as that of the tenth embodiment, detailed description thereof will not be repeated.

With such a structure, the pitches of the read word lines RWL and write bit lines WBL in the memory array 10 can be widened. As a result, the memory cells MC can be efficiently arranged, whereby improved integration of the memory array 10 as well as reduced chip area of the MRAM device can be achieved.

Third Modification of Tenth Embodiment

Figure 80:
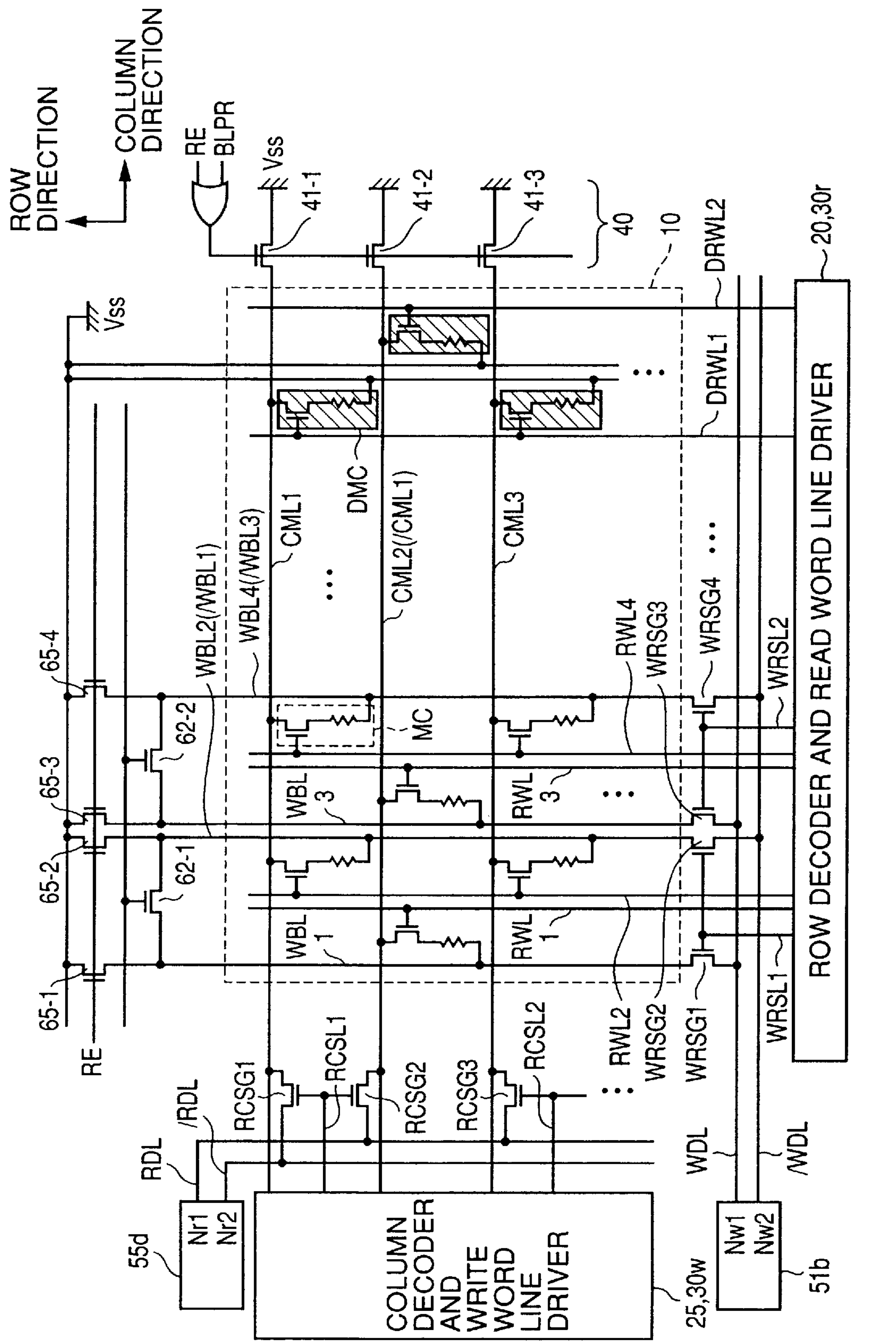
FIG. 80 is a diagram illustrating the structure of a memory array 10 and its peripheral circuitry according to a third modification of the tenth embodiment.

Referring to FIG. 80, for the memory cells having the structure of the tenth embodiment and arranged in rows and columns, the folded bit line structure is realized in every set of adjacent two memory cell columns, using corresponding two common lines CML. For example, a data line pair corresponding to a read bit line pair can be formed from the common lines CML1 and CML2 (/CML1) respectively corresponding to the first and second memory cell columns.

Similarly, the folded bit line structure is realized in every set of adjacent two memory cell rows, using corresponding two write bit lines WBL. For example, a write bit line pair can be formed from the write bit lines WBL1 and WBL2 (/WBL1) respectively corresponding to the first and second memory cell rows.

The structure of the peripheral circuitry for conducting row selection from the write bit lines WBL and /WBL of the write bit line pairs and supplying the data write current ±Iw thereto is the same as that shown in FIG. 72. Therefore, detailed description thereof will not be repeated.

Similarly, the structure of the peripheral circuitry for conducting column selection from the common lines CML and /CML forming the data line pairs in the data read operation, and supplying the sense current Is thereto is the same as that shown in FIG. 72. Therefore, detailed description thereof will not be repeated.

Accordingly, even when the memory cells according to the tenth embodiment are arranged in rows and columns, the data read and write operation margins can be ensured using the folded bit line structure.

Fourth Modification of Tenth Embodiment

In the fourth modification of the tenth embodiment, the write bit line WBL is shared between adjacent memory cells, in addition to the folded bit line structure shown in the third modification of the tenth embodiment.

Figure 81:
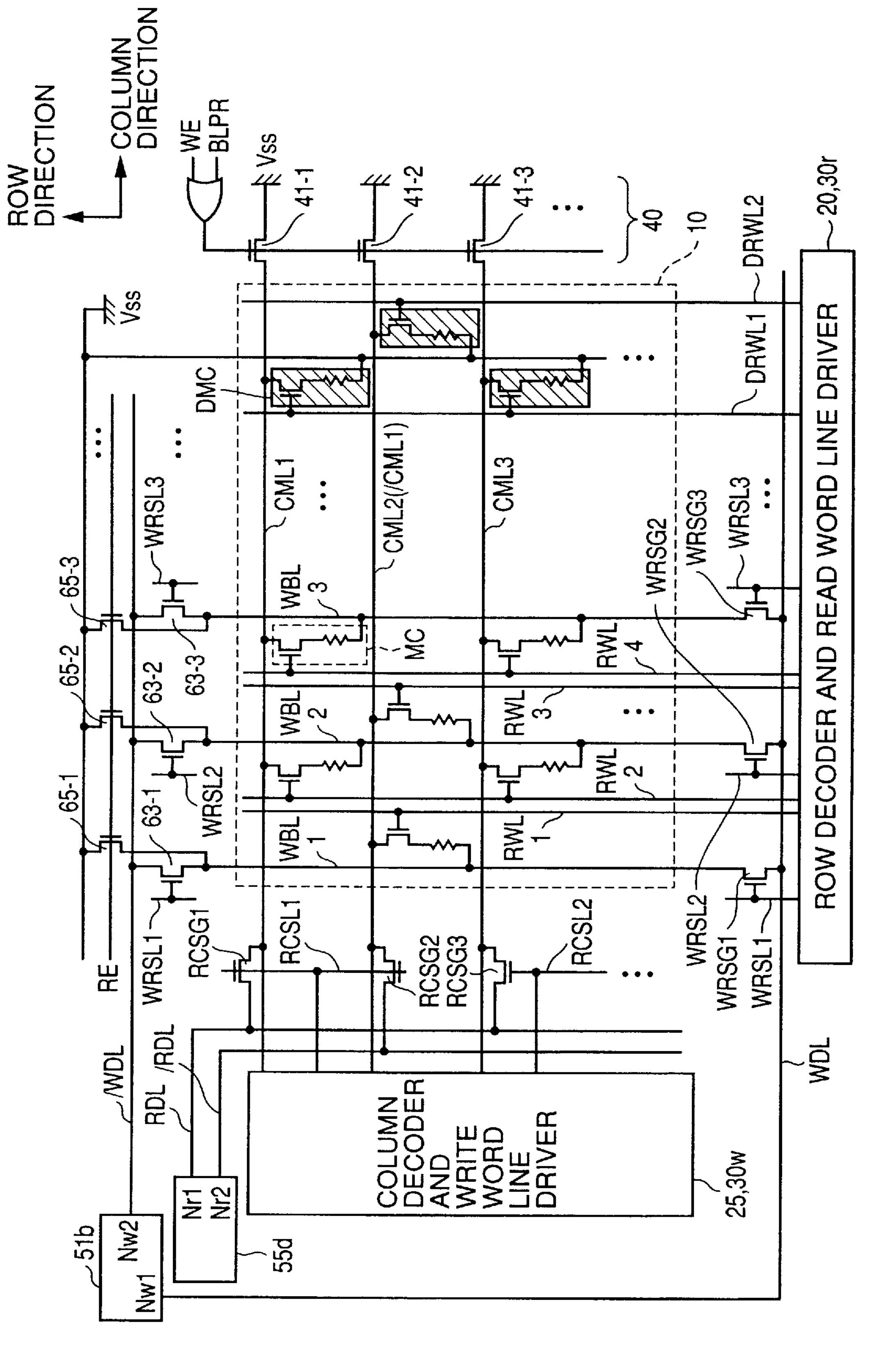
FIG. 81 is a diagram illustrating the structure of a memory array 10 and its peripheral circuitry according to a fourth modification of the tenth embodiment.

Referring to FIG. 81, in the memory array according to the fourth modification of the tenth embodiment, adjacent memory cells in the column direction share the same write bit line WBL.

In the read operation, the read word line RWL is activated. In each common line CML functioning as a read bit line RBL, the memory cells are provided every other read word line RWL. Moreover, the memory cells are arranged alternately between every adjacent common lines CML. Therefore, every set of adjacent two memory cell columns form a data line pair, so that the data read operation can be conducted based on the folded bit line structure in the same manner as that of the third modification of the tenth embodiment.

On the other hand, the data write operation cannot be conducted based on the folded bit line structure because the write bit line WBL is shared. Accordingly, in the fourth modification of the tenth embodiment, the peripheral circuitry associated with selection of the write bit line WBL is arranged in the same manner as that shown in FIG. 77. Thus, as in the tenth embodiment, the data write operation can be conducted using the data write circuit 51*b* having a simple structure.

Although the data write operation cannot be conducted based on the folded bit line structure, the pitch of the write word lines WWL in the memory array 10 can be widened. As a result, further improved integration of the memory array 10 and thus further reduced chip area of the MRAM device can be achieved.

Fifth Modification of Tenth Embodiment

In the fifth modification of the tenth embodiment, the read word line RWL is shared between adjacent memory cells, in addition to the folded bit line structure of the third modification of the tenth embodiment.

Figure 82:
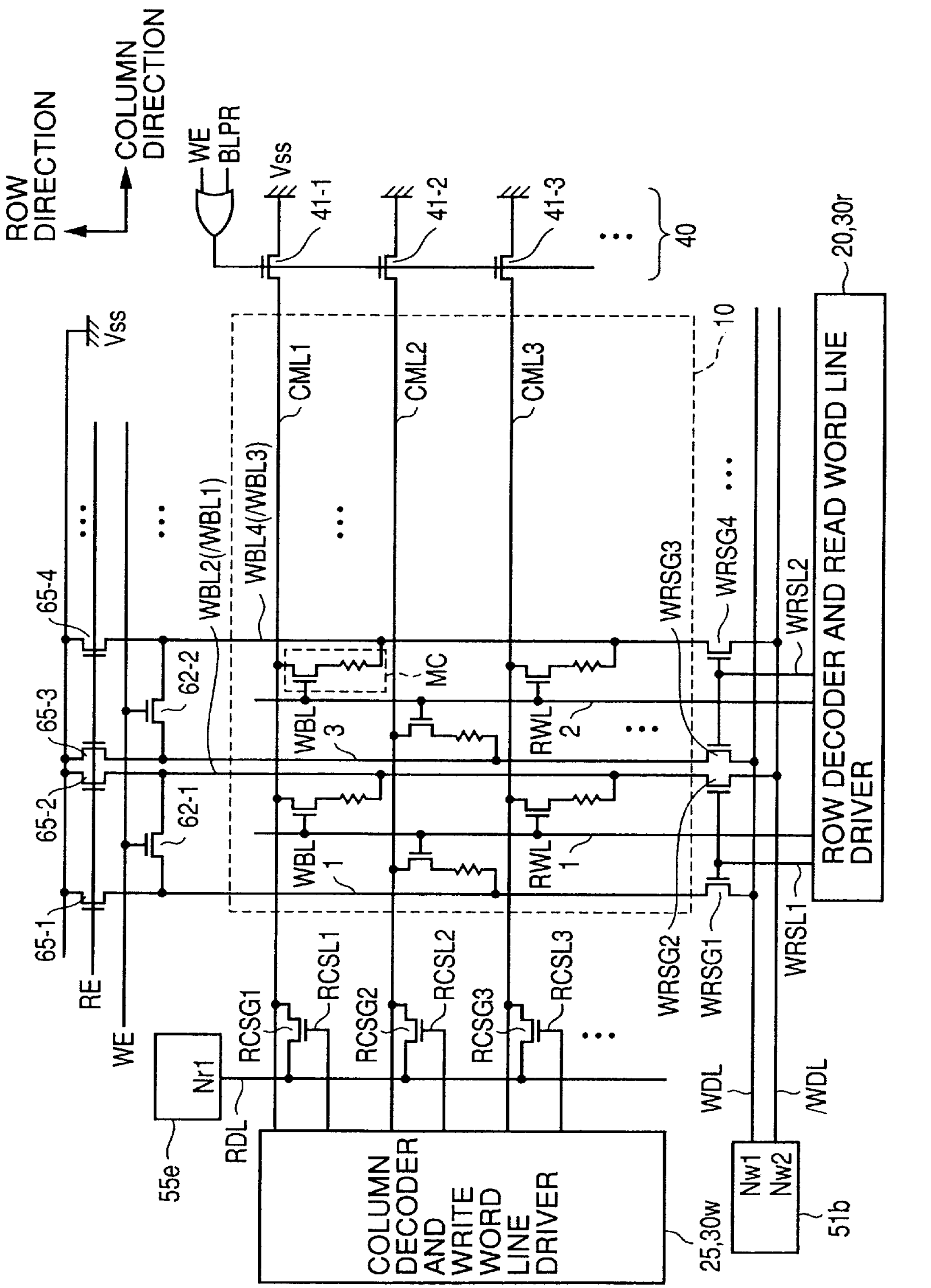
FIG. 82 is a diagram illustrating the structure of a memory array 10 and its peripheral circuitry according to a fifth modification of the tenth embodiment.

Referring to FIG. 82, in the memory array according to the fifth modification of the tenth embodiment, adjacent memory cells in the column direction share the same read word line RWL. The read/write control circuit 60 includes the equalizing transistors 62 and the write bit line voltage control transistors 65, which are arranged in the same manner as that of the third modification of the tenth embodiment.

In each write bit line WBL, the memory cells are provided every other common line CML. Moreover, the memory cells are arranged alternately between every adjacent write bit lines WBL. Therefore, in the data write operation, every set of adjacent two memory cell rows can form a write bit line pair. As a result, the data write operation can be conducted based on the folded bit line structure in the same manner as that of the third modification of the tenth embodiment, so that the same effects can be obtained.

On the other hand, in the data read operation, the read word line RWL shared by a plurality of memory cell rows is activated. Therefore, the data read operation cannot be conducted based on the folded bit line structure. Accordingly, in the fifth modification of the tenth embodiment, the peripheral circuitry associated with selection of the common line CML functioning as a read bit line RBL is arranged in the same manner as that shown in FIG. 69.

With such a structure, the read operation margin based on the folded bit line structure cannot be ensured, but the pitch of the read word lines RWL in the memory array 10 can be widened, and the data read operation can be conducted normally. As a result, improved integration of the memory array 10 and thus reduced chip area of the MRAM device can be achieved.

Accordingly, by conducting the data write operation based on the folded bit line structure using the memory cells of the tenth embodiment, the write operation margin can be ensured as well as a simplified structure of the peripheral circuitry and reduced data write noise can be achieved. Moreover, by sharing the read word line RWL, improved integration of the memory array 10 can also be achieved simultaneously.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A thin film magnetic memory device, comprising:

a memory array including a plurality of magnetic memory cells arranged in rows and columns, each of said plurality of magnetic memory cells having either a first or second resistance value according a storage data level thereof;

a plurality of first bit lines provided corresponding to the respective columns of the magnetic memory cells;

a plurality of read word lines provided corresponding to the respective rows of the magnetic memory cells, for electrically coupling the magnetic memory cells corresponding to an addressed row between said plurality of first bit lines each being set to a first voltage and a second voltage so as to pass a data read current through the magnetic memory cells;

a first read data line for transmitting read data;

a read gate circuit for setting a voltage of said first read data line according to a voltage on one of said plurality of first bit lines that corresponds to an addressed column; and a data read circuit for setting a level of the read data according to the voltage on the first read data line.

2. The thin film magnetic memory device according to claim 1, further comprising a pull-up circuit for coupling said plurality of first bit lines to said first voltage in a data read operation.

3. The thin film magnetic memory device according to claim 2, further comprising a selection portion for electrically coupling the first bit line corresponding to the addressed column to said pull-up circuit in the data read operation.

4. The thin film magnetic memory device according to claim 3, further comprising:

a data write current supply circuit for supplying a data write current for writing the storage data to the magnetic memory cell; and a write data line pair for transmitting said data write current, wherein said selection portion includes a switch circuit for coupling said data write current supply circuit and said pull-up circuit to said write data line pair respectively in a data write operation and the data read operation, and a plurality of column selection portions provided between said write data line pair and said plurality of first bit lines, respectively, wherein one of said plurality of column selection lines that corresponds to the addressed column is turned ON both in the data write operation and the data read operation.

5. The thin film magnetic memory device according to claim 1, further comprising:

a precharging circuit for precharging said plurality of first bit lines to said first voltage prior to a data read operation, wherein the data read circuit includes a voltage amplifying circuit for amplifying a difference between a voltage at an input node and a predetermined voltage for output, a gate circuit for transmitting the voltage on the first bit line corresponding to the addressed column to said input node at a predetermined timing, and a latch circuit for latching the output of the voltage amplifying circuit to produce the read data at a predetermined timing.

6. The thin film magnetic memory device according to claim 1, further comprising:

a second read data line provided hierarchically with respect to the plurality of first bit lines, and selectively coupled to the first bit line corresponding to the addressed column in the data read operation, wherein said read gate circuit includes a current control circuit for forming a current path between said first read data line and said second voltage, corresponding to a voltage on said second read data line.

7. The thin film magnetic memory device according to claim 1, wherein said read gate circuit is provided in every column of said magnetic memory cells, and each of the read gate circuits includes a plurality of current control circuits for forming a current path between said first read data line and said second voltage, corresponding to a voltage on the corresponding one of said plurality of first bit lines.

8. The thin film magnetic memory device according to claim 1, further comprising:

a plurality of second bit lines respectively provided as complementary bit lines of said plurality of first bit lines;

a second read data line provided as a complementary data line of said first read data line;

a plurality of dummy memory cells each having an intermediate resistance value of said first and second resistance values, and each coupled to either the corresponding first or second bit line; and a plurality of dummy read word lines for selecting the plurality of dummy memory cells, wherein said plurality of read word lines electrically couple the magnetic memory cells corresponding to the selected row between one of said plurality of first bit lines and said plurality of second bit lines, which are set to said first voltage, and said second voltage, respectively, in the data read operation, said plurality of dummy read word lines electrically couple the dummy memory cells between the other of said plurality of first bit lines and said plurality of second bit lines, which are set to said first voltage, and said second voltage, respectively, in said data read operation, said read gate circuit sets voltage levels on said first and second read data lines, according to voltage levels on one of said plurality of first bit lines and one of said plurality of second bit lines corresponding to the selected column, and said data read circuit sets the level of the read data according to a voltage difference between said first and second read data lines.

9. A thin film magnetic memory device, comprising:

a memory array including a plurality of magnetic memory cells arranged in rows and columns, each of said plurality of magnetic memory cells including a magnetic storage portion having either a first or second resistance value according to a level of storage data written when a data write magnetic field applied by first and second data write currents is larger than a predetermined magnetic field;

a plurality of write word lines provided corresponding to the respective rows of the magnetic memory cells, and each selectively activated according an address selection result so as to pass said first data write current therethrough in a data write operation; and a plurality of bit line pairs provided corresponding to the respective columns of the magnetic memory cells, for passing said second data write current therethrough, each of said plurality of bit line pairs including first and second bit lines, said first and second bit lines are respectively formed by using wirings respectively formed in first and second metal wiring layers with the magnetic storage portions interposed therebetween on a semiconductor substrate;

a plurality of coupling circuits provided respectively corresponding to said plurality of bit line pairs, each for electrically coupling the corresponding first and second bit lines to each other, wherein said second data write current flows as a reciprocating current through the first and second bit lines electrically coupled to each other by the corresponding coupling circuit.

10. The thin film magnetic memory device according to claim 9, wherein each said first bit line includes a wiring formed in said first metal wiring layer, each said first bit line includes a wiring formed in said second metal wiring layer, the thin film magnetic memory device further comprising:

a data write circuit for setting one end of the first bit line in one bit line pair to one of a high potential state and a low potential state, and setting one end of the second bit line included in said one bit line pair to the other potential state, said one bit line pair being selected from said plurality of bit line pairs according to an address selection result, wherein each of said coupling circuits electrically couples the other end of said first bit line to the other end of said second bit line in the data write operation.

11. The thin film magnetic memory device according to claim 9, wherein the first and second bit lines are formed by using the first and second metal wiring layers so as to cross each other in a predetermined region on the memory array, and each of said magnetic memory cells is coupled to either the first or second bit line in the first metal wiring layer, the thin film magnetic memory device further comprising:

a plurality of read word lines provided corresponding to the respective rows of the magnetic memory cells, each selectively activated according to the address selection result in the data read operation;

a plurality of dummy memory cells each having an intermediate resistance value of said first and second resistance values, and each coupled to either the corresponding first or second bit line;

a plurality of dummy read word lines for selecting the plurality of dummy memory cells; and a data read circuit for setting a level of read data according to a voltage difference between the first and second bit lines corresponding to a selected column, wherein said plurality of read word lines and said plurality of dummy read word lines are activated so as to electrically couple the magnetic memory cells and the dummy memory cells between the plurality of first and second bit lines that are set to a first voltage, and a second voltage, respectively, in order to pass a data write current therethrough according to the address selection result.

12. A thin film magnetic memory device, comprising:

a memory array including a plurality of magnetic memory cells arranged in rows and columns, each of said plurality of magnetic memory cells including a magnetic storage portion having a different resistance value according to a level of storage data written when a data write magnetic field applied by first and second data write currents is larger than a predetermined magnetic field;

a plurality of bit lines provided corresponding to the respective columns of the magnetic memory cells, each for passing said first data write current therethrough in a data write operation; and a plurality of write word lines provided corresponding to the respective rows of the magnetic memory cells, and selectively activated according an address selection result so as to pass said second data write current therethrough in the data write operation, wherein each of said write word lines includes first and second sub write word lines respectively formed in first and second metal wiring layers with the magnetic storage portions interposed therebetween in a vertical direction on a semiconductor substrate, the thin film magnetic memory device further comprising:

a plurality of coupling circuit provided respectively corresponding to said plurality of write word lines, each for electrically coupling the corresponding first and second sub write word lines to each other, wherein the second data write current flows as a reciprocating current through the first and second sub write word lines electrically coupled to each other by a corresponding one of said plurality coupling circuit.

13. The thin film magnetic memory device according to claim 12, further comprising:

a plurality of write word drivers provided respectively corresponding to said plurality of write word lines, for setting one end of the first sub write word line in a corresponding write word line to a first voltage, according to the address selection result, one end of each of said second sub write word lines is coupled to a second voltage, and each of said coupling circuit includes a wiring for coupling the other ends of the corresponding first and second sub write word lines to each other.

14. The thin film magnetic memory device according to claim 13, wherein said plurality of write word drivers are separately provided such that the write word drivers corresponding to a predetermined number of rows are provided in each region located adjacent to said memory array in the row direction.

15. The thin film magnetic memory device according to claim 12, wherein one end of each of the first and second sub write word lines are respectively coupled to first and second voltages, and said coupling circuit includes a plurality of switch circuits provided respectively corresponding to said plurality of write word lines, each for electrically coupling the other ends of the first and second sub write word lines in a corresponding one of said plurality of write word lines to each other according to the address selection result.

* * * * *